US012302751B2

(12) United States Patent
Kang et al.

(10) Patent No.: US 12,302,751 B2
(45) Date of Patent: May 13, 2025

(54) COMPOSITION FOR ORGANIC OPTOELECTRONIC DEVICE, ORGANIC OPTOELECTRONIC DEVICE, AND DISPLAY DEVICE

(71) Applicants: SAMSUNG SDI CO., LTD., Yongin-si (KR); SAMSUNG ELECTRONICS CO., LTD., Suwon-si (KR)

(72) Inventors: Dong Min Kang, Suwon-si (KR); Jun Seok Kim, Suwon-si (KR); Jongwoo Won, Suwon-si (KR); Byoungkwan Lee, Suwon-si (KR); Sangshin Lee, Suwon-si (KR); Jinhyun Lui, Suwon-si (KR); Eun Sun Yu, Suwon-si (KR); Namheon Lee, Suwon-si (KR); Jinseok Jang, Suwon-si (KR); Ho Kuk Jung, Suwon-si (KR)

(73) Assignees: SAMSUNG SDI CO., LTD., Yongin-si (KR); SAMSUNG ELECTRONICS CO., LTD., Suwon-si (KR)

( * ) Notice: Subject to any disclaimer, the term of this patent is extended or adjusted under 35 U.S.C. 154(b) by 861 days.

(21) Appl. No.: 16/972,705

(22) PCT Filed: Apr. 18, 2019

(86) PCT No.: PCT/KR2019/004712

§ 371 (c)(1),
(2) Date: Dec. 7, 2020

(87) PCT Pub. No.: WO2019/240368

PCT Pub. Date: Dec. 19, 2019

(65) Prior Publication Data

US 2021/0273176 A1 Sep. 2, 2021

(30) Foreign Application Priority Data

Jun. 12, 2018 (KR) ........................ 10-2018-0067599

(51) Int. Cl.
*H10K 85/60* (2023.01)
*H10K 50/12* (2023.01)

(52) U.S. Cl.
CPC ......... *H10K 85/654* (2023.02); *H10K 85/633* (2023.02); *H10K 85/6574* (2023.02); *H10K 50/12* (2023.02)

(58) Field of Classification Search
CPC ............... H10K 85/633; H10K 85/654; H10K 85/6574; H10K 85/6576
See application file for complete search history.

(56) References Cited

U.S. PATENT DOCUMENTS 5,061,569 A 10/1991 Vanslyke et al.
2016/0072073 A1 3/2016 Lee et al.
(Continued)

FOREIGN PATENT DOCUMENTS

CN 102558121 A 7/2012
CN 105218525 A 1/2016
(Continued)

OTHER PUBLICATIONS

Partial machine translation of KR-20160107975-A (generated Feb. 2, 2024).*
(Continued)

*Primary Examiner* — Kregg T Brooks
(74) *Attorney, Agent, or Firm* — Lee IP Law, P.C.

(57) ABSTRACT

Disclosed are a composition for an organic optoelectronic device including a first compound for an organic optoelectronic device represented by a combination of Chemical Formula 1 and Chemical Formula 2 and a second compound for an organic optoelectronic device represented by Chemical Formula 3, an organic optoelectronic device, and a display device.

(Continued)

In Chemical Formula 1 to Chemical Formula 3, definitions of each substituent are the same as defined in the specification.

9 Claims, 1 Drawing Sheet

(56) References Cited

U.S. PATENT DOCUMENTS

| | | | | |
|---|---|---|---|---|
| 2018/0337348 | A1* | 11/2018 | Jung | H10K 85/622 |
| 2019/0165280 | A1* | 5/2019 | Jang | H10K 85/6574 |
| 2019/0165281 | A1* | 5/2019 | Jang | H10K 99/00 |
| 2020/0075866 | A1* | 3/2020 | Lee | C07D 405/04 |
| 2020/0111967 | A1* | 4/2020 | Lee | C07D 405/12 |
| 2020/0227644 | A1* | 7/2020 | Lee | C07D 405/10 |
| 2021/0111350 | A1* | 4/2021 | Lui | H10K 85/615 |

FOREIGN PATENT DOCUMENTS

| | | | | | |
|---|---|---|---|---|---|
| JP | 1993-009471 | A | | 1/1993 | |
| JP | 1995-126615 | A | | 5/1995 | |
| JP | 1998-095973 | A | | 4/1998 | |
| KR | 10-2012-0009761 | A | | 2/2012 | |
| KR | 10-2013-0094903 | A | | 8/2013 | |
| KR | 10-1423173 | B1 | | 7/2014 | |
| KR | 10-2015-0007139 | A | | 1/2015 | |
| KR | 20160107975 | A | * | 9/2016 | |
| KR | 10-2017-0018276 | A | | 2/2017 | |
| KR | 10-2017-0023388 | A | | 3/2017 | |
| KR | 10-2017-0099231 | A | | 8/2017 | |
| KR | 10-2018-0060619 | A | | 6/2018 | |
| TW | 201819372 | A | | 6/2018 | |
| WO | WO 1995-009147 | A1 | | 4/1995 | |
| WO | WO 2006-108497 | A1 | | 10/2006 | |
| WO | WO 2012-011756 | A1 | | 1/2012 | |
| WO | WO 2014-075382 | A1 | | 5/2014 | |
| WO | WO-2017171420 | A1 | * | 10/2017 | C07D 251/24 |
| WO | WO-2018004095 | A1 | * | 1/2018 | C07D 209/86 |
| WO | WO-2018004096 | A1 | * | 1/2018 | C07D 209/86 |
| WO | WO-2019022458 | A1 | * | 1/2019 | C07D 213/16 |

OTHER PUBLICATIONS

International Search Report dated Jul. 22, 2019 for PCT/KR2019/004712.

Chinese Office Action (including a search report) dated Feb. 7, 2024, for corresponding Chinese Patent Application No. 201980039096.3.

* cited by examiner

【Figure 1】
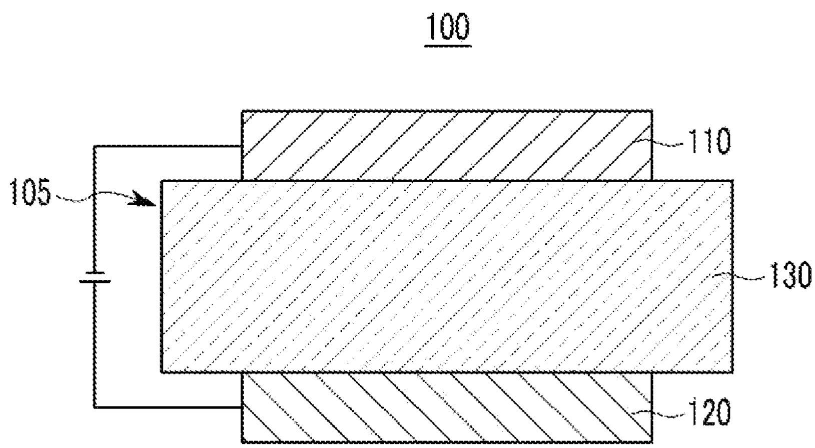
【Figure 2】
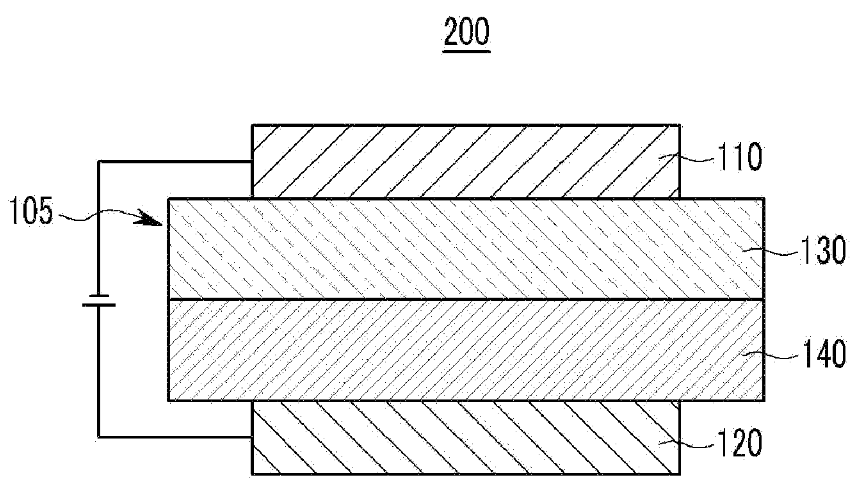

COMPOSITION FOR ORGANIC OPTOELECTRONIC DEVICE, ORGANIC OPTOELECTRONIC DEVICE, AND DISPLAY DEVICE

CROSS REFERENCE TO RELATED APPLICATIONS

This is the U.S. national phase application based on PCT Application No. PCT/KR2019/004712, filed Apr. 18, 2019, which is based on Korean Patent Application No. 10-2018-0067599, filed Jun. 12, 2018, the entire contents of all of which are hereby incorporated by reference.

TECHNICAL FIELD

A composition for an organic optoelectronic device, an organic optoelectronic device, and a display device are disclosed.

BACKGROUND ART

An organic optoelectronic device is a device that converts electrical energy into photoenergy, and vice versa.

An organic optoelectronic device may be classified as follows in accordance with its driving principles. One is a photoelectric device where excitons are generated by photoenergy, separated into electrons and holes, and are transferred to different electrodes to generate electrical energy, and the other is a light emitting device where a voltage or a current is supplied to an electrode to generate photoenergy from electrical energy.

Examples of the organic optoelectronic device may be an organic photoelectric device, an organic light emitting diode, an organic solar cell, and an organic photo conductor drum.

Of these, an organic light emitting diode (OLED) has recently drawn attention due to an increase in demand for flat panel displays. The organic light emitting diode converts electrical energy into light by applying current to an organic light emitting material and Performance of an organic light emitting diode may be affected by organic materials disposed between electrodes.

DISCLOSURE

An embodiment provides a composition for an organic optoelectronic device capable of realizing an organic optoelectronic device having high efficiency and a long life-span.

Another embodiment provides an organic optoelectronic device including the composition for an organic optoelectronic device.

Yet another embodiment provides a display device including the organic optoelectronic device.

According to an embodiment, a composition for an organic optoelectronic device includes a first compound for an organic optoelectronic device represented by a combination of Chemical Formula 1 and Chemical Formula 2 and a second compound for an organic optoelectronic device represented by Chemical Formula 3.

[Chemical Formula 1]

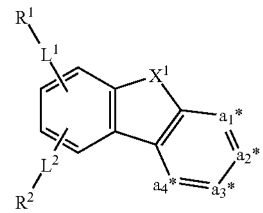

[Chemical Formula 2]

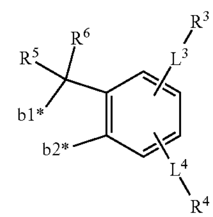

In Chemical Formula 1 and Chemical Formula 2, $X^1$ is O or S, adjacent two of $a_1$* to $a_4$* are linked with $b_1$* and $b_2$*, respectively, remaining two of $a_1$* to $a_4$* not being linked with $b_1$* and $b_2$* are independently C-$L^a$-$R^a$, $L^a$ and $L^1$ to $L^4$ are independently a single bond, a substituted or unsubstituted C6 to C20 arylene group, a substituted or unsubstituted C2 to C20 heterocyclic group, or a combination thereof, $R^a$ and $R^1$ to $R^6$ are independently hydrogen, deuterium, a cyano group, a substituted or unsubstituted amine group, a substituted or unsubstituted C1 to C30 alkyl group, a substituted or unsubstituted C6 to C30 aryl group, a substituted or unsubstituted C2 to C30 heterocyclic group, or a combination thereof, and at least one of $R^1$ to $R^4$ is a group represented by Chemical Formula a,

[Chemical Formula a]

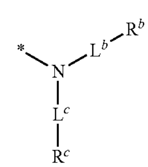

wherein, in Chemical Formula a, $L^b$ and $L^c$ are independently a single bond, a substituted or unsubstituted C6 to C20 arylene group, a substituted or unsubstituted C2 to C20 heterocyclic group, or a combination thereof, $R^b$ and $R^c$ are independently a substituted or unsubstituted C6 to C30 aryl group, a substituted or unsubstituted C2 to C30 heterocyclic group, or a combination thereof, and

* is a linking point with $L^a$ and $L^1$ to $L^4$;

[Chemical Formula 3]

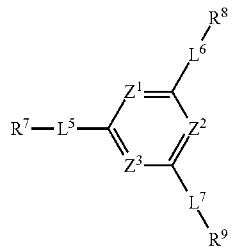

wherein, in Chemical Formula 3, $Z^1$ to $Z^3$ are independently N or $CR^d$, wherein $R^d$ is hydrogen, deuterium, a substituted or unsubstituted C1 to C30 alkyl group, a substituted or unsubstituted C6 to C30 aryl group, a substituted or unsubstituted C3 to C30 heterocyclic group, a substituted or unsubstituted silyl group, a substituted or unsubstituted amine group, a halogen, a cyano group, or a combination thereof, at least two of $Z^1$ to $Z^3$ are N, $L^5$ to $L^7$ are independently a single bond, a substituted or unsubstituted C6 to C20 arylene group, a substituted or unsubstituted C2 to C20 heterocyclic group, or a combination thereof, $R^7$ to $R^9$ are independently a substituted or unsubstituted C6 to C30 aryl group, a substituted or unsubstituted C2 to C30 heterocyclic group, or a combination thereof, and at least one of $R^7$ to $R^9$ is a group represented by Chemical Formula b,

[Chemical Formula b]

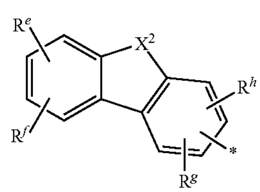

wherein, in Chemical Formula b, $X^2$ is O or S, $R^e$ to $R^h$ are independently hydrogen, deuterium, a substituted or unsubstituted C1 to C30 alkyl group, a substituted or unsubstituted C6 to C30 aryl group, a substituted or unsubstituted C2 to C30 heterocyclic group, a substituted or unsubstituted silyl group, a substituted or unsubstituted amine group, a halogen, a cyano group, or a combination thereof, $R^e$ and $R^f$ are independently present or adjacent groups thereof are linked with each other to form a substituted or unsubstituted aliphatic, aromatic or hetero aromatic ring, $R^g$ and $R^h$ are independently present or adjacent groups thereof are linked with each other to form a substituted or unsubstituted aliphatic, aromatic or hetero aromatic ring, and

* is a linking point with one of $L^5$ to $L^7$.

According to another embodiment, an organic optoelectronic device includes an anode and a cathode facing each other, and at least one organic layer disposed between the anode and the cathode, wherein the organic layer includes the composition for an organic optoelectronic device.

According to another embodiment, a display device including the organic optoelectronic device is provided.

An organic optoelectronic device having high efficiency and a long life-span may be realized.

DESCRIPTION OF THE DRAWINGS

FIGS. 1 and 2 are cross-sectional views showing organic light emitting diodes according to embodiments.

DESCRIPTION OF SYMBOLS

100, 200: organic light emitting diode
105: organic layer
110: cathode
120: anode
130: light emitting layer
140: hole auxiliary layer

BEST MODE

Hereinafter, embodiments of the present invention are described in detail. However, these embodiments are exemplary, the present invention is not limited thereto and the present invention is defined by the scope of claims.

In the present specification when a definition is not otherwise provided, "substituted" refers to replacement of at least one hydrogen of a substituent or a compound by deuterium, a halogen, a hydroxyl group, an amino group, a substituted or unsubstituted C1 to C30 amine group, a nitro group, a substituted or unsubstituted C1 to C40 silyl group, a C1 to C30 alkyl group, a C1 to C10 alkylsilyl group, a C6 to C30 arylsilyl group, a C3 to C30 cycloalkyl group, a C3 to C30 heterocycloalkyl group, a C6 to C30 aryl group, a C2 to C30 heteroaryl group, a C1 to C20 alkoxy group, a C1 to C10 trifluoroalkyl group, a cyano group, or a combination thereof.

In examples of the present invention, the "substituted" refers to replacement of at least one hydrogen of a substituent or a compound by deuterium, a C1 to C30 alkyl group, a C1 to C10 alkylsilyl group, a C6 to C30 arylsilyl group, a C3 to C30 cycloalkyl group, a C3 to C30 heterocycloalkyl group, a C6 to C30 aryl group, or a C2 to C30 heteroaryl group. In addition, in specific examples of the present invention, the "substituted" refers to replacement of at least one hydrogen of a substituent or a compound by deuterium, a C1 to C20 alkyl group, a C6 to C30 aryl group, or a C2 to C30 heteroaryl group. In addition, specific examples of the present invention, the "substituted" refers to replacement of at least one hydrogen of a substituent or a compound by deuterium, a C1 to C5 alkyl group, a C6 to C18 aryl group, a pyridinyl group, quinolinyl group, an isoquinolinyl group, a dibenzofuranyl group, a dibenzothiophenyl group, or a carbazolyl group. In addition, specific examples of the present invention, the "substituted" refers to replacement of at least one hydrogen of a substituent or a compound by deuterium, a C1 to C5 alkyl group, a C6 to C18 aryl group, a dibenzofuranyl group, or a dibenzothiophenyl group. In addition, specific examples of the present invention, the "substituted" refers to replacement of at least one hydrogen of a substituent or a compound by deuterium, a methyl group, an ethyl group, a propanyl group, a butyl group, a phenyl group, a biphenyl group, a terphenyl group, a naphthyl group, a triphenyl group, a dibenzofuranyl group, or a dibenzothiophenyl group.

In the present specification when a definition is not otherwise provided, "hetero" refers to one including one to three heteroatoms selected from N, O, S, P, and Si, and remaining carbons in one functional group.

In the present specification, "aryl group" refers to a group including at least one hydrocarbon aromatic moiety, and all the elements of the hydrocarbon aromatic moiety have p-orbitals which form conjugation, for example a phenyl group, a naphthyl group, and the like, two or more hydrocarbon aromatic moieties may be linked by a sigma bond and may be, for example a biphenyl group, a terphenyl group, a quarterphenyl group, and the like, and two or more hydrocarbon aromatic moieties are fused directly or indirectly to provide a non-aromatic fused ring, for example a fluorenyl group.

The aryl group may include a monocyclic, polycyclic or fused ring polycyclic (i.e., rings sharing adjacent pairs of carbon atoms) functional group.

In the present specification, "heterocyclic group" is a generic concept of a heteroaryl group, and may include at least one heteroatom selected from N, O, S, P, and Si instead of carbon (C) in a cyclic compound such as an aryl group, a cycloalkyl group, a fused ring thereof, or a combination thereof. When the heterocyclic group is a fused ring, the entire ring or each ring of the heterocyclic group may include one or more heteroatoms.

For example, "heteroaryl group" may refer to an aryl group including at least one heteroatom selected from N, O, S, P, and Si. Two or more heteroaryl groups are linked by a sigma bond directly, or when the heteroaryl group includes two or more rings, the two or more rings may be fused. When the heteroaryl group is a fused ring, each ring may include one to three heteroatoms.

More specifically, the substituted or unsubstituted C6 to C30 aryl group may be a substituted or unsubstituted phenyl group, a substituted or unsubstituted naphthyl group, a substituted or unsubstituted anthracenyl group, a substituted or unsubstituted phenanthrenyl group, a substituted or unsubstituted naphthacenyl group, a substituted or unsubstituted pyrenyl group, a substituted or unsubstituted biphenyl group, a substituted or unsubstituted p-terphenyl group, a substituted or unsubstituted m-terphenyl group, a substituted or unsubstituted o-terphenyl group, a substituted or unsubstituted chrysenyl group, a substituted or unsubstituted triphenylene group, a substituted or unsubstituted perylenyl group, a substituted or unsubstituted fluorenyl group, a substituted or unsubstituted indenyl group, or a combination thereof, but is not limited thereto.

More specifically, the substituted or unsubstituted C2 to C30 heterocyclic group may be a substituted or unsubstituted furanyl group, a substituted or unsubstituted thiophenyl group, a substituted or unsubstituted pyrrolyl group, a substituted or unsubstituted pyrazolyl group, a substituted or unsubstituted imidazolyl group, a substituted or unsubstituted triazolyl group, a substituted or unsubstituted oxazolyl group, a substituted or unsubstituted thiazolyl group, a substituted or unsubstituted oxadiazolyl group, a substituted or unsubstituted thiadiazolyl group, a substituted or unsubstituted pyridyl group, a substituted or unsubstituted pyrimidinyl group, a substituted or unsubstituted pyrazinyl group, a substituted or unsubstituted triazinyl group, a substituted or unsubstituted benzofuranyl group, a substituted or unsubstituted benzothiophenyl group, a substituted or unsubstituted benzimidazolyl group, a substituted or unsubstituted indolyl group, a substituted or unsubstituted quinolinyl group, a substituted or unsubstituted isoquinolinyl group, a substituted or unsubstituted quinazolinyl group, a substituted or unsubstituted quinoxalinyl group, a substituted or unsubstituted naphthyridinyl group, a substituted or unsubstituted benzoxazinyl group, a substituted or unsubstituted benzthiazinyl group, a substituted or unsubstituted acridinyl group, a substituted or unsubstituted phenazinyl group, a substituted or unsubstituted phenothiazinyl group, a substituted or unsubstituted phenoxazinyl group, a substituted or unsubstituted dibenzofuranyl group, or a substituted or unsubstituted dibenzothiophenyl group, or a combination thereof, but is not limited thereto.

In the present specification, hole characteristics refer to an ability to donate an electron to form a hole when an electric field is applied and that a hole formed in the anode may be easily injected into the light emitting layer and transported in the light emitting layer due to conductive characteristics according to a highest occupied molecular orbital (HOMO) level.

In addition, electron characteristics refer to an ability to accept an electron when an electric field is applied and that electron formed in the cathode may be easily injected into the light emitting layer and transported in the light emitting layer due to conductive characteristics according to a lowest unoccupied molecular orbital (LUMO) level.

In the present specification "being linked with each other to form a ring" refers to adjacent groups being linked with to form a substituted or unsubstituted aliphatic ring, a substituted or unsubstituted aromatic ring, or a substituted or unsubstituted heteroaromatic ring.

For example, "being linked with each other to form a ring" refers to adjacent groups being linked with to form a substituted or unsubstituted aromatic ring, and more specifically, adjacent groups being linked with to form a substituted or unsubstituted phenyl group.

Hereinafter, a composition for an organic optoelectronic device according to an embodiment is described.

A composition for an organic optoelectronic device according to an embodiment includes a first compound for an organic optoelectronic device having hole characteristics and a second compound for an organic optoelectronic device having electron characteristics.

The first compound for an organic optoelectronic device is represented by a combination of Chemical Formula 1 and Chemical Formula 2.

[Chemical Formula 1]

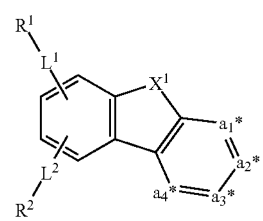

[Chemical Formula 2]

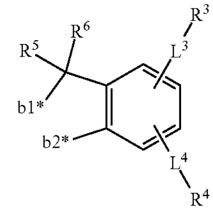

In Chemical Formula 1 and Chemical Formula 2, $X^1$ is O or S, adjacent two of $a_1$* to $a_4$* are linked with $b_1$* and $b_2$*, respectively, remaining two of $a_1$* to $a_4$* not being linked with $b_1$* and $b_2$* are independently C-$L^a$-$R^a$, $L^a$ and $L^1$ to $L^4$ are independently a single bond, a substituted or unsubstituted C6 to C20 arylene group, a substituted or unsubstituted C2 to C20 heterocyclic group, or a combination thereof, $R^a$ and $R^1$ to $R^6$ are independently hydrogen, deuterium, a cyano group, a substituted or unsubstituted amine group, a substituted or unsubstituted C1 to C30 alkyl group, a substituted or unsubstituted C6 to C30 aryl group, a substituted or unsubstituted C2 to C30 heterocyclic group, or a combination thereof, and at least one of $R^1$ to $R^4$ is a group represented by Chemical Formula a,

[Chemical Formula a]

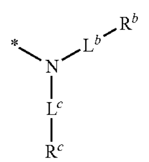

wherein, in Chemical Formula a, $L^b$ and $L^c$ are independently a single bond, a substituted or unsubstituted C6 to C20 arylene group, a substituted or unsubstituted C2 to C20 heterocyclic group, or a combination thereof, $R^b$ and $R^c$ are independently a substituted or unsubstituted C6 to C30 aryl group, a substituted or unsubstituted C2 to C30 heterocyclic group, or a combination thereof, and

* is a linking point with $L^a$ and $L^1$ to $L^4$.

The first compound for an organic optoelectronic device has a structure where a fused heterocycle of 6-membered ring-5-membered ring-6-membered ring-5-membered ring-6-membered ring is linked with an aryl group and/or amine substituted with a heteroaryl group, thereby a HOMO electron cloud is expanded from amine into the fused heterocycle and thus hole injection and transport characteristics may be improved due to high HOMO energy.

In addition, the fused heterocycle of 6-membered ring-5-membered ring-6-membered ring-5-membered ring-6-membered ring has relatively high HOMO energy compared with bicarbazole and indolocarbazole, a device having a low driving voltage may be realized due to the structure where the fused heterocycle is linked with the amine.

In addition, the bicarbazole and the indolocarbazole are not appropriate as a red host due to high T1 energy, but the structure where the fused heterocycle is linked with the amine has a desirable T1 energy as a red host.

The intramolecular symmetry may be reduced and the crystallization between the compounds may be suppressed due to the fused heterocycle, so that the dark spot generation caused by the crystallization of the compound upon deposition of the material in the device fabrication process may be suppressed and thus a life-span of the device may be improved.

Accordingly, a device including the first compound for an organic optoelectronic device according to the present invention may realize high efficiency/long life-span characteristics.

Meanwhile, it may be included with the second compound for an organic optoelectronic device to exhibit good interface characteristics and transport capability of holes and electrons, and thus a driving voltage of a device including the same may be lowered.

For example, $L^b$ and $L^c$ may independently be a single bond or a substituted or unsubstituted C6 to C12 arylene group.

For example, $L^b$ and $L^c$ may independently be a single bond, a substituted or unsubstituted phenylene group, or a substituted or unsubstituted biphenylene group.

For example, $R^b$ and $R^c$ may independently be a substituted or unsubstituted phenyl group, a substituted or unsubstituted biphenyl group, a substituted or unsubstituted terphenyl group, a substituted or unsubstituted anthracenyl group, a substituted or unsubstituted naphthyl group, a substituted or unsubstituted phenanthrenyl group, a substituted or unsubstituted triphenylene group, a substituted or unsubstituted fluorenyl group, a substituted or unsubstituted carbazolyl group, a substituted or unsubstituted dibenzofuranyl group, a substituted or unsubstituted dibenzothiophenyl group, or a fused ring represented by a combination of Chemical Formulae 1 and 2.

For specific examples, $R^b$ and $R^c$ may independently be a substituted or unsubstituted phenyl group, a substituted or unsubstituted biphenyl group, a substituted or unsubstituted naphthyl group, a substituted or unsubstituted fluorenyl group, a substituted or unsubstituted carbazolyl group, a substituted or unsubstituted dibenzofuranyl group, a substituted or unsubstituted dibenzothiophenyl group, or a fused ring represented by a combination of Chemical Formulae 1 and 2.

For example, $R^b$ and $R^c$ may independently be a substituted or unsubstituted, phenyl group, a substituted or unsubstituted biphenyl group, a substituted or unsubstituted naphthyl group, or a substituted or unsubstituted fluorenyl group.

For example, $L^a$ and $L^1$ to $L^4$ may independently be a single bond or a substituted or unsubstituted C6 to C20 arylene group.

For specific examples, $L^a$ and $L^1$ to $L^4$ may independently be a single bond, a substituted or unsubstituted phenylene group, a substituted or unsubstituted biphenylene group, or a substituted or unsubstituted naphthylene group.

For example, $L^a$ and $L^1$ to $L^4$ may independently be a single bond or a substituted or unsubstituted p-phenylene group.

For example, $R^a$ and $R^1$ to $R^4$ may independently be hydrogen, deuterium, a cyano group, a substituted or unsubstituted C1 to C10 alkyl group, or a substituted or unsubstituted C6 to C20 aryl group.

For example, $R^a$ and $R^1$ to $R^4$ may independently be hydrogen, but is not limited thereto.

For example, $R^5$ and $R^6$ may independently be a substituted or unsubstituted C1 to C10 alkyl group, or a substituted or unsubstituted C6 to C20 aryl group.

For example, $R^5$ and $R^6$ may independently be a substituted or unsubstituted C1 to C4 alkyl group, or a substituted or unsubstituted C6 to C12 aryl group.

For example, the first compound for an organic optoelectronic device may be for example represented by one of Chemical Formula 1A to Chemical Formula 1F according to a fusion point of Chemical Formula 1 and Chemical Formula 2.

[Chemical Formula 1A]

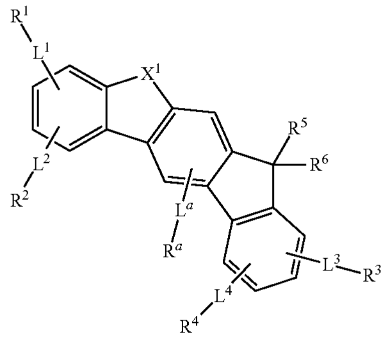

[Chemical Formula 1B]

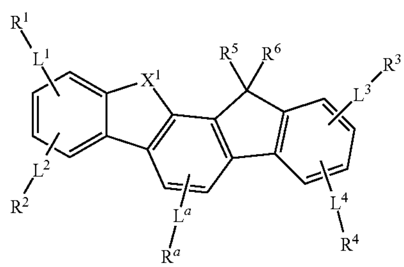

[Chemical Formula 1C]

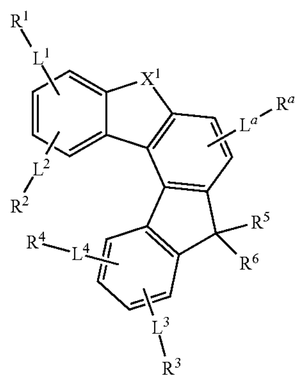

[Chemical Formula 1D]

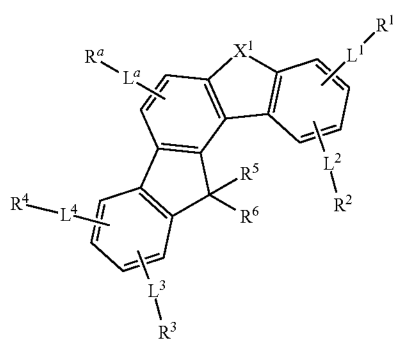

-continued

[Chemical Formula 1E]

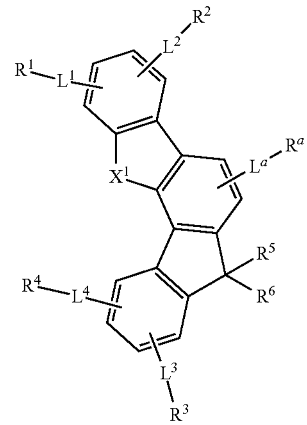

[Chemical Formula 1F]

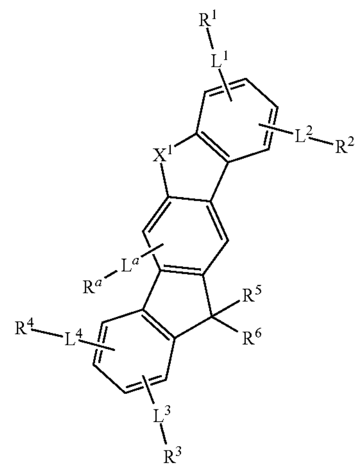

In Chemical Formula 1A to Chemical Formula 1F, $X^1$, $L^a$, $L^1$ to $L^4$, $R^a$, and $R^1$ to $R^6$ are the same as described above.

For example, Chemical Formula A may be represented by one of Chemical Formula 1A-1 or Chemical Formula 1A-2 according to a substitution position of the group represented by Chemical Formula a.

[Chemical Formula 1A-1]

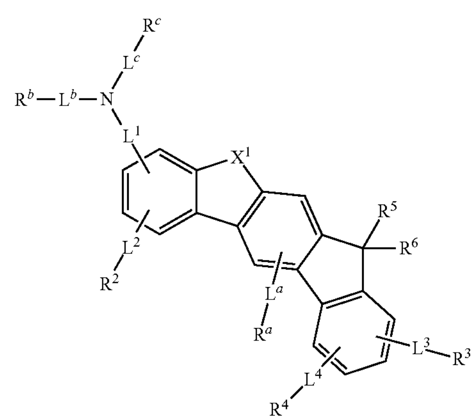

-continued

[Chemical Formula 1A-2]

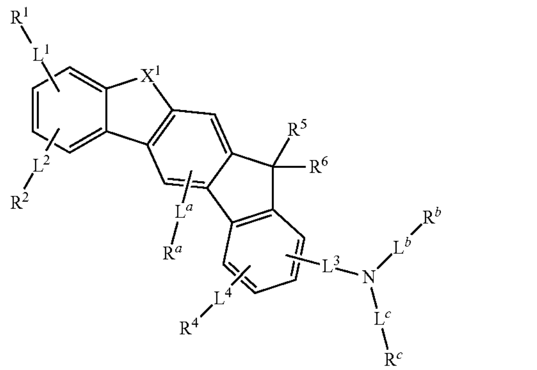

In Chemical Formula 1A-1 and Chemical Formula 1A-2, $X^1$, $L^a$, $L^b$, $L^c$, $L^1$ to $L^4$, $R^a$, $R^1$ to $R^6$, $R^b$, and $R^c$ are the same as described above.

For example, Chemical Formula 1A-1 may be represented by one of Chemical Formula 1A-1-1 to Chemical Formula 1A-1-4 according to a substitution position of the group represented by Chemical Formula a.

[Chemical Formula 1A-1-1]

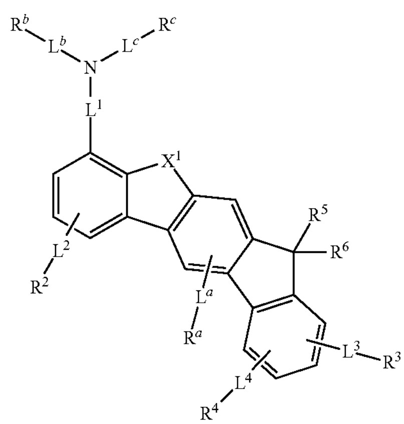

[Chemical Formula 1A-1-2]

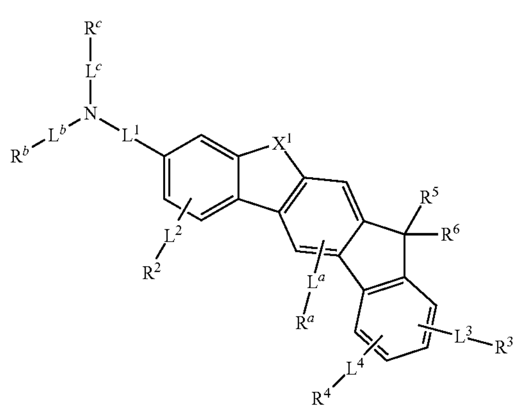

-continued

[Chemical Formula 1A-1-3]

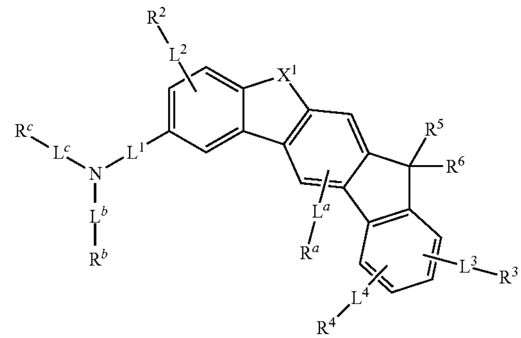

[Chemical Formula 1A-1-4]

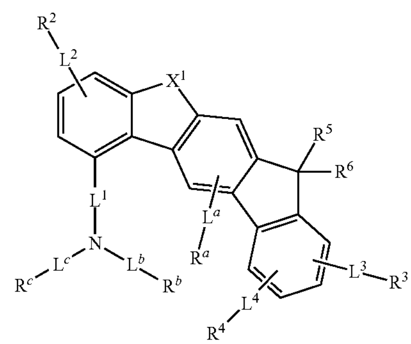

In Chemical Formula 1A-1-1 to Chemical Formula 1A-1-4, $X^1$, $L^a$, $L^b$, $L^c$, $L^1$ to $L^4$, $R^a$, $R^1$ to $R^6$, $R^b$, and $R^c$ are the same as described above.

For example, Chemical Formula 1A-2 may be represented by one of Chemical Formula 1A-2-1 to Chemical Formula 1A-2-4 according to a substitution position of the group represented by Chemical Formula a.

[Chemical Formula 1A-2-1]

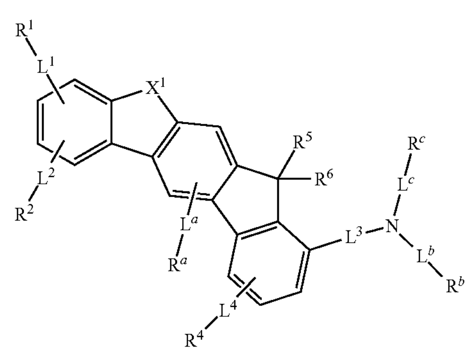

-continued

[Chemical Formula 1A-2-2]

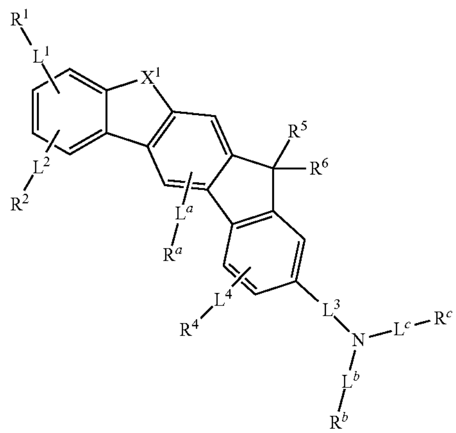

[Chemical Formula 1A-2-3]

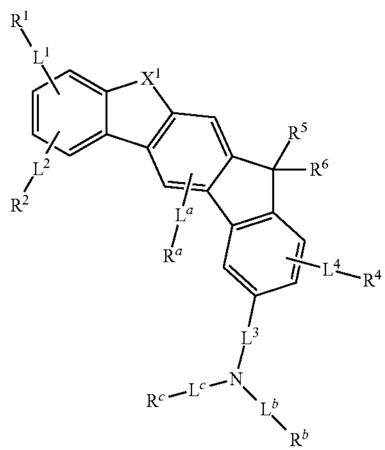

[Chemical Formula 1A-2-4]

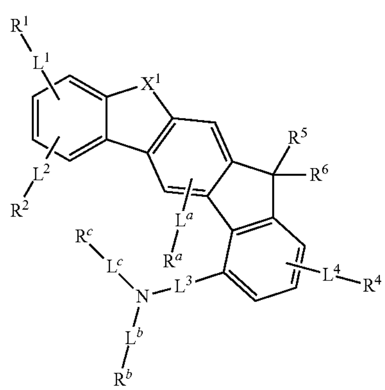

In Chemical Formula 1A-2-1 to Chemical Formula 1A-2-4, $X^1$, $L^a$, $L^b$, $L^c$, $L^1$ to $L^4$, $R^a$, $R^1$ to $R^6$, $R^b$, and $R^c$ are the same as described above.

In an example embodiment, Chemical Formula 1A may be represented by one of Chemical Formula 1A-1-1, Chemical Formula 1A-2-2, and Chemical Formula 1A-2-3.

For example, Chemical Formula 1B may be represented by one of Chemical Formula 1B-1 or Chemical Formula 1B-2 according to a substitution position of the group represented by Chemical Formula a.

[Chemical Formula 1B-1]

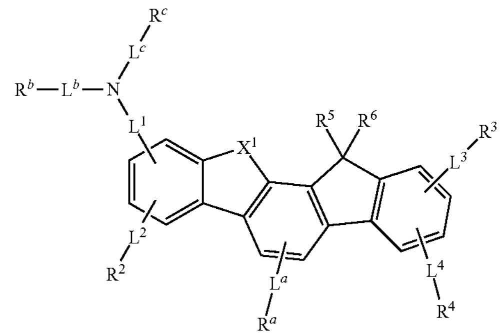

[Chemical Formula 1B-2]

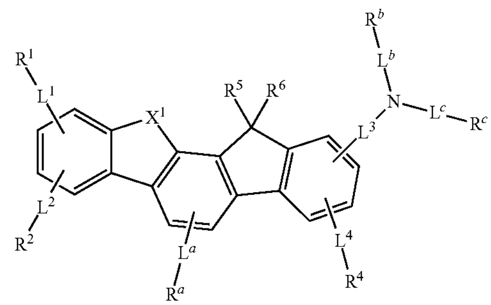

In Chemical Formula 1B-1 and Chemical Formula 1B-2, $X^1$, $L^a$, $L^b$, $L^c$, $L^1$ to $L^4$, $R^a$, $R^1$ to $R^6$, $R^b$, and $R^c$ are the same as described above.

For example, Chemical Formula 1B-1 may be represented by one of Chemical Formula 1B-1-1 to Chemical Formula 1B-1-4 according to a substitution position of the group represented by Chemical Formula a.

[Chemical Formula 1B-1-1]

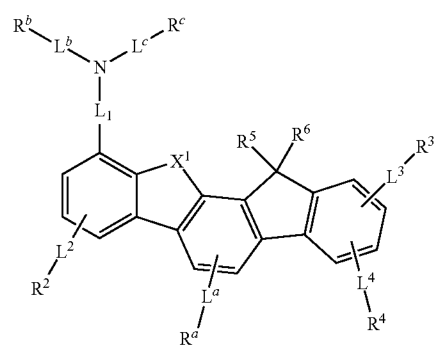

[Chemical Formula 1B-1-2]

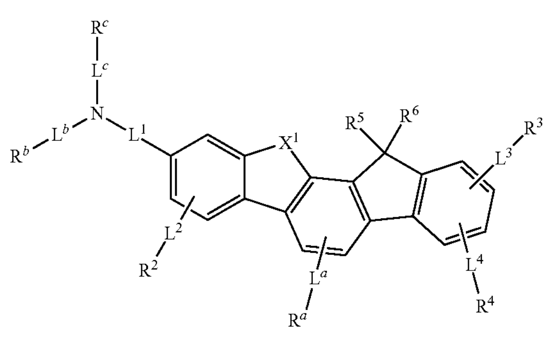

-continued

[Chemical Formula 1B-1-3]

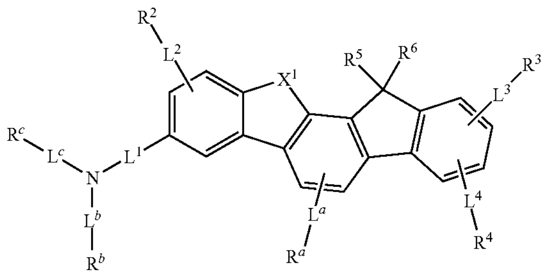

[Chemical Formula 1B-1-4]

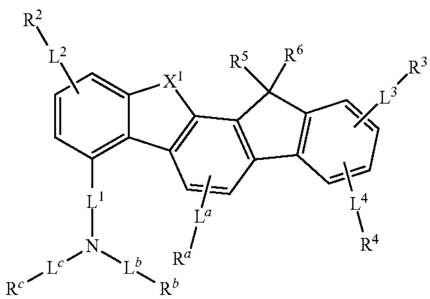

In Chemical Formula 1B-1-1 to Chemical Formula 1B-1-4, $X^1$, $L^a$, $L^b$, $L^c$, $L^1$ to $L^4$, $R^a$, $R^1$ to $R^6$, $R^b$, and $R^c$ are the same as described above.

For example, Chemical Formula 1B-2 may be represented by one of Chemical Formula 1B-2-1 to Chemical Formula 1B-2-4 according to a substitution position of the group represented by Chemical Formula a.

[Chemical Formula 1B-2-1]

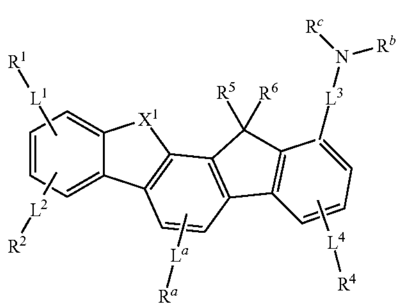

[Chemical Formula 1B-2-2]

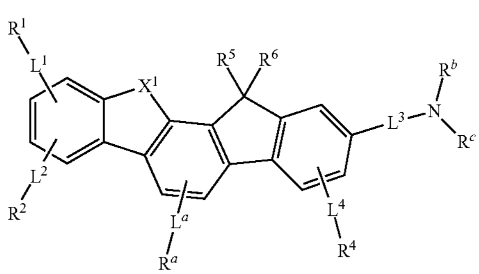

-continued

[Chemical Formula 1B-2-3]

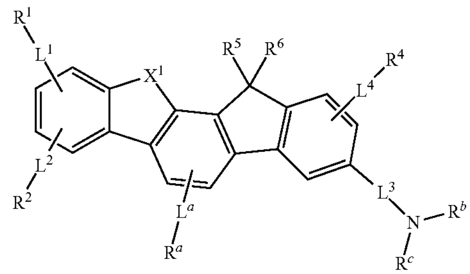

[Chemical Formula 1B-2-4]

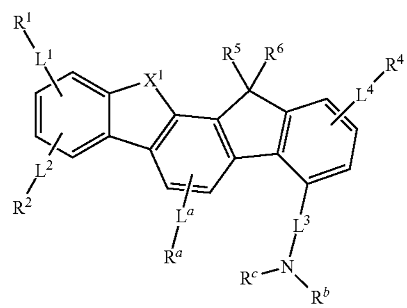

In Chemical Formula 1B-2-1 to Chemical Formula 1B-2-4, $X^1$, $L^a$, $L^b$, $L^c$, $L^1$ to $L^4$, $R^a$, $R^1$ to $R^6$, $R^b$, and $R^c$ are the same as described above.

In an example embodiment, Chemical Formula 1B may be represented by one of Chemical Formula 1B-1-1, Chemical Formula 1B-2-2, and Chemical Formula 1B-2-3.

For example, Chemical Formula 1C may be represented by one of Chemical Formula 1C-1 or Chemical Formula 1C-2 according to a substitution position of the group represented by Chemical Formula a.

[Chemical Formula 1C-1]

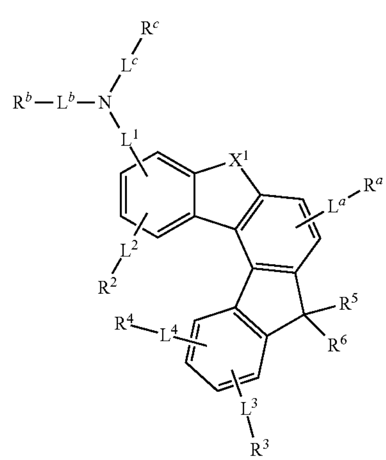

-continued

[Chemical Formula 1C-2]

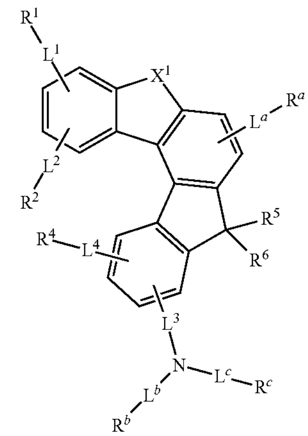

In Chemical Formula 1C-1 and Chemical Formula 1C-2, $X^1$, $L^a$, $L^b$, $L^c$ and $L^1$ to $L^4$, $R^a$, $R^1$ to $R^6$, $R^b$, and $R^c$ are the same as described above.

For example, Chemical Formula 1C-1 may be represented by one of Chemical Formula 1C-1-1 to Chemical Formula 1C-1-4 according to a specific substitution position of the group represented by Chemical Formula a.

[Chemical Formula 1C-1-1]

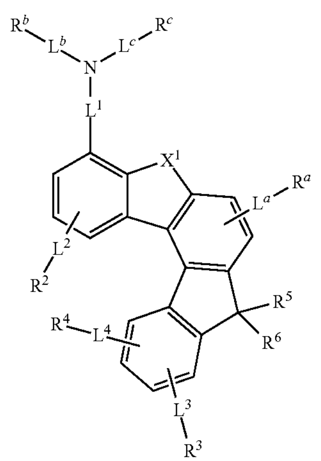

[Chemical Formula 1C-1-2]

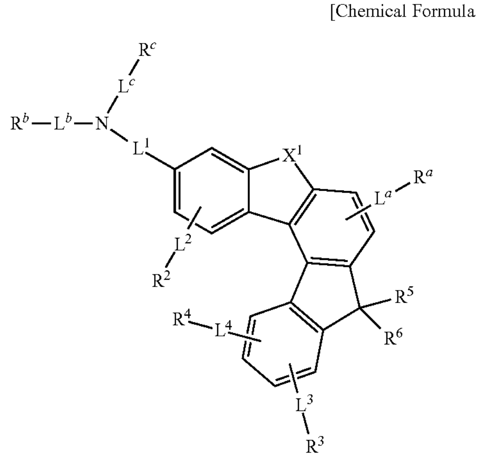

-continued

[Chemical Formula 1C-1-3]

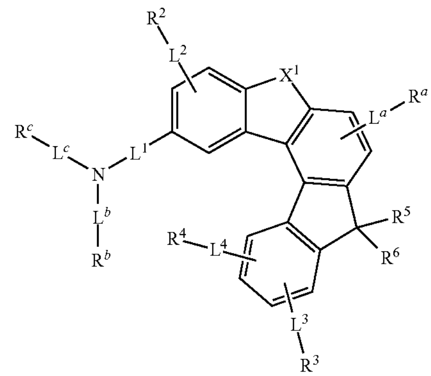

[Chemical Formula 1C-1-4]

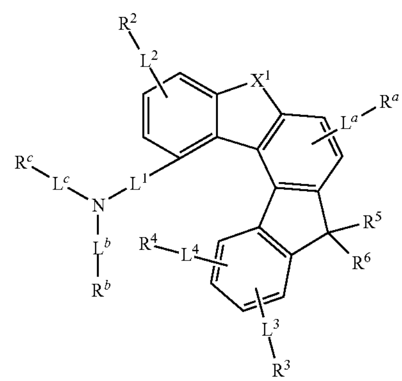

In Chemical Formula 1C-1-1 to Chemical Formula 1C-1-4, $X^1$, L, $L^b$, $L^c$ and $L^1$ to $L^4$, $R^a$, $R^1$ to $R^6$, $R^b$, and $R^c$ are the same as described above.

For example, Chemical Formula 1C-2 may be represented by one of Chemical Formula 1C-2-1 to Chemical Formula 1C-2-4 according to a specific substitution position of the group represented by Chemical Formula a.

[Chemical Formula 1C-2-1]

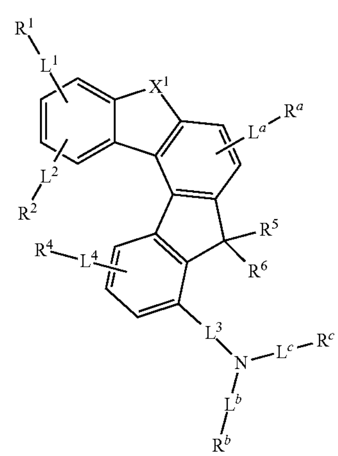

-continued

[Chemical Formula 1C-2-2]

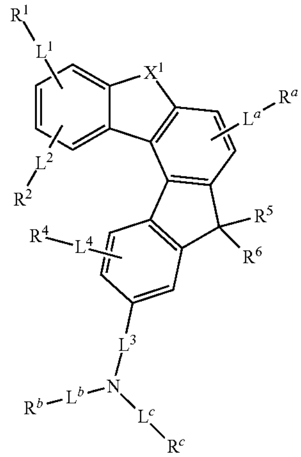

[Chemical Formula 1C-2-3]

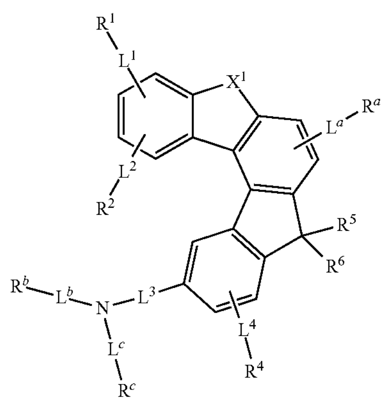

[Chemical Formula 1C-2-4]

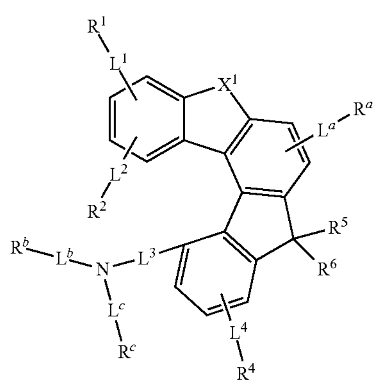

In Chemical Formula 1C-2-1 and Chemical Formula 1C-2-4, $X^1$, $L^a$, $L^b$, $L^c$, $L^1$ to $L^4$, $R^1$, $R^2$, $R^4$ to $R^6$, $R^a$, $R^b$, and $R^c$ are the same as described above.

In an example embodiment, Chemical Formula 1C may be represented by one of Chemical Formula 1C-1-1, Chemical Formula 1C-2-2, and Chemical Formula 1C-2-3.

For example, Chemical Formula 1D may be represented by Chemical Formula 1D-1 or Chemical Formula 1D-2 according to a substitution position of the group represented by Chemical Formula a.

[Chemical Formula 1D-1]

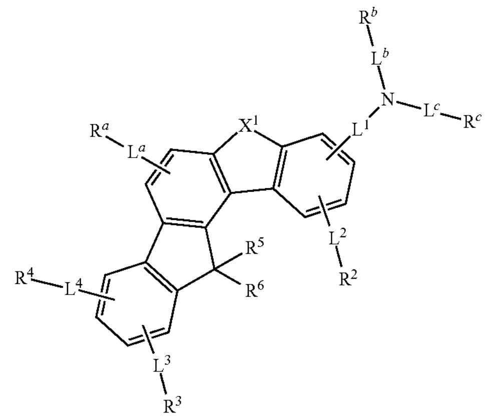

[Chemical Formula 1D-2]

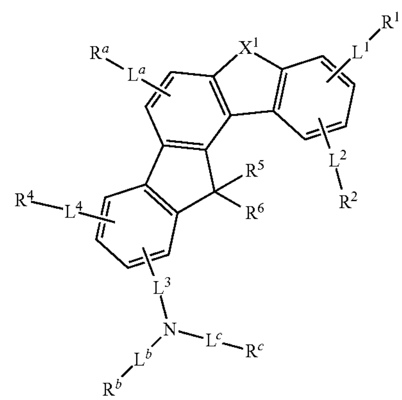

In Chemical Formula 1D-1 and Chemical Formula 1D-2, $X^1$, $L^a$, $L^b$, $L^c$, $L^1$ to $L^4$, $R^a$, $R^1$ to $R^6$, $R^b$, and $R^C$ are the same as described above.

For example, Chemical Formula 1D-1 may be represented by one of Chemical Formula 1D-1-1 to Chemical Formula 1D-1-4 according to a specific substitution position of the group represented by Chemical Formula a.

[Chemical Formula 1D-1-1]

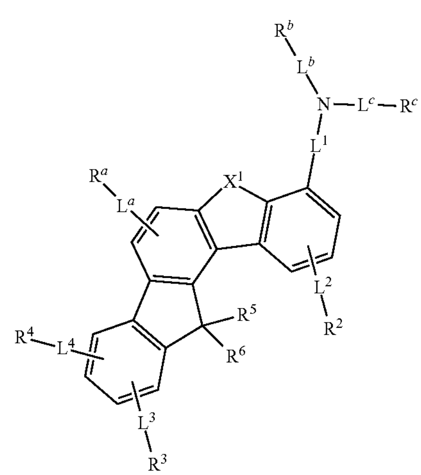

-continued

[Chemical Formula 1D-1-2]

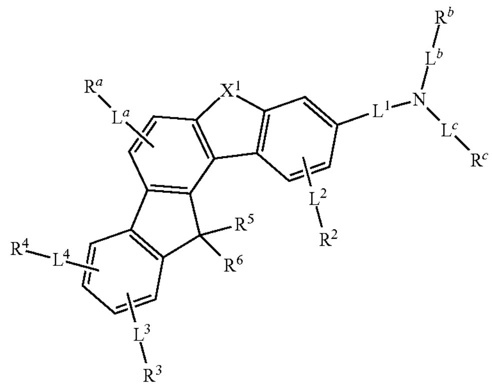

[Chemical Formula 1D-1-3]

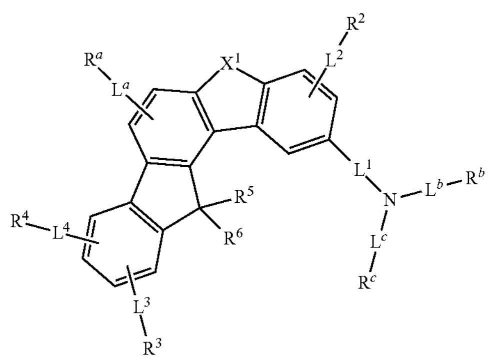

[Chemical Formula 1D-1-4]

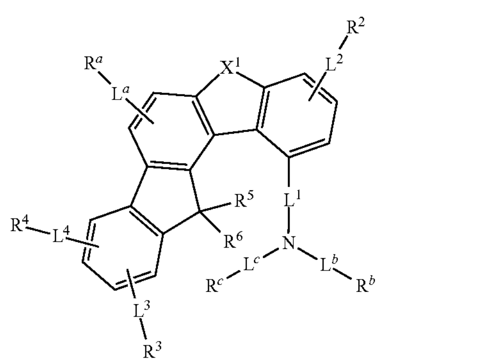

In Chemical Formula 1D-1-1 to Chemical Formula 1D-1-4, $X^1$, $L^a$, $L^b$, $L^c$, $L^1$ to $L^4$, $R^a$, $R^1$ to $R^6$, $R^b$, and $R^c$ are the same as described above.

For example, Chemical Formula 1D-2 may be represented by one of Chemical Formula 1D-2-1 to Chemical Formula 1D-2-4 according to a specific substitution position of the group represented by Chemical Formula a.

[Chemical Formula 1D-2-1]

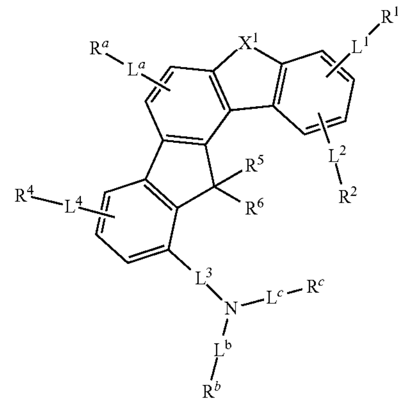

[Chemical Formula 1D-2-2]

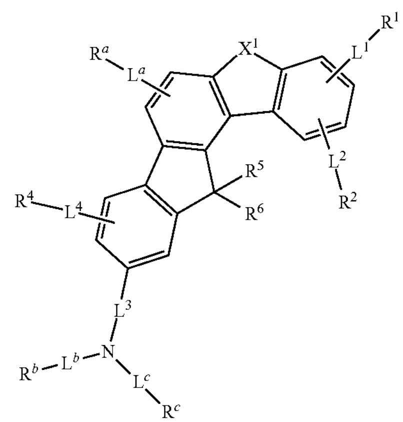

[Chemical Formula 1D-2-3]

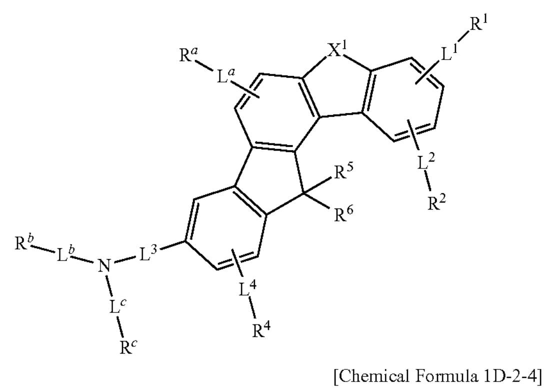

[Chemical Formula 1D-2-4]

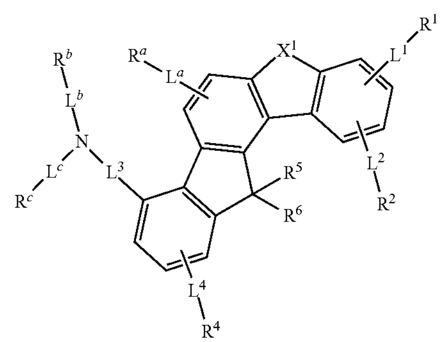

In Chemical Formula 1D-2-1 to Chemical Formula 1D-2-4, $X^1$, $L^a$, $L^b$, $L^c$, $L^1$ to $L^4$, $R^a$, $R^1$ to $R^6$, $R^b$, and $R^c$ are the same as described above.

In an example embodiment, Chemical Formula 1D may be represented by one of Chemical Formula 1D-1-1, Chemical Formula 1D-2-2, and Chemical Formula 1D-2-3.

For example, Chemical Formula 1E may be represented by one of Chemical Formula 1E-1 or Chemical Formula 1E-2 according to a substitution position of the group represented by Chemical Formula a.

[Chemical Formula 1E-1]

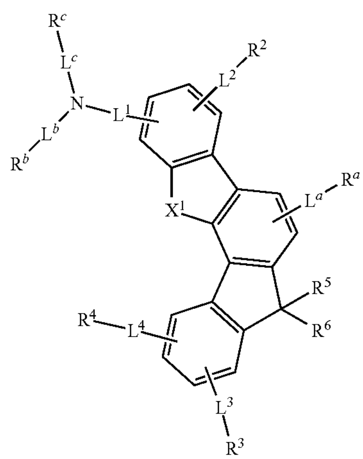

[Chemical Formula 1E-2]

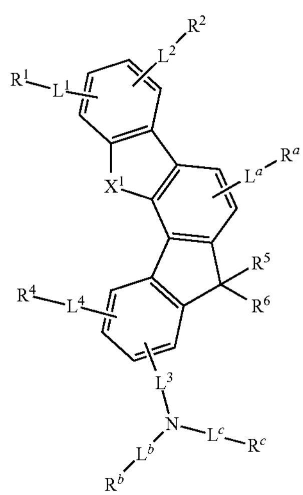

In Chemical Formula 1E-1 and Chemical Formula 1E-2, $X^1$, $L^a$, $L^b$, $L^c$, $L^1$ to $L^4$, $R^a$, $R^1$ to $R^6$, $R^b$, and $R^c$ are the same as described above.

For example, Chemical Formula 1E-1 may be represented by one of Chemical Formula 1E-1-1 to Chemical Formula 1E-1-4 according to a specific substitution position of the group represented by Chemical Formula a.

[Chemical Formula 1E-1-1]

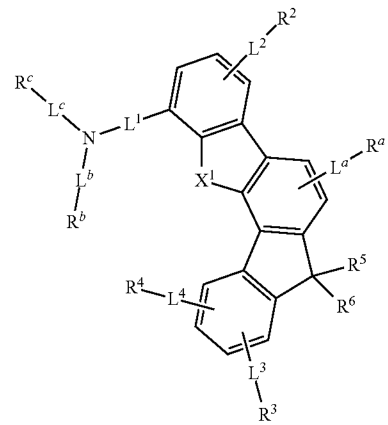

[Chemical Formula 1E-1-2]

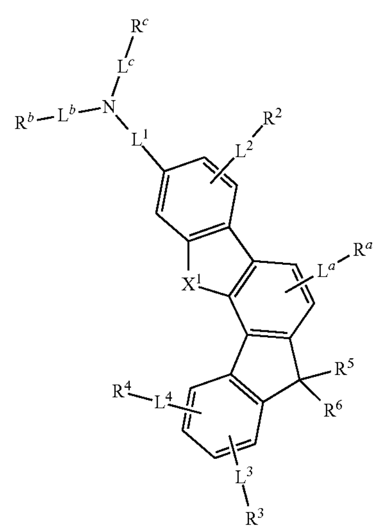

-continued

[Chemical Formula 1E-1-3]

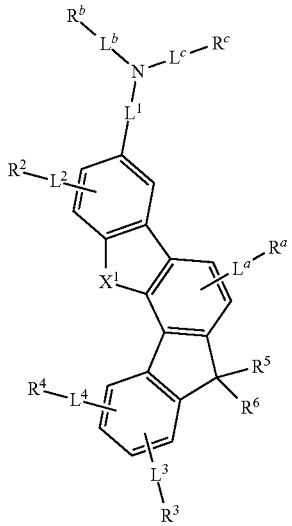

[Chemical Formula 1E-1-4]

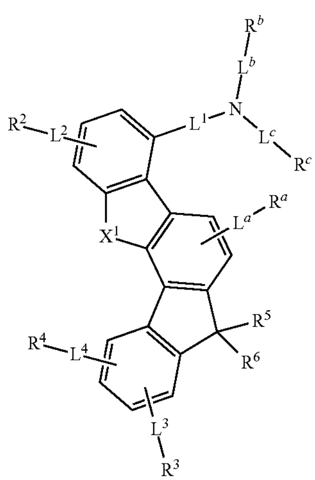

In Chemical Formula 1E-1-1 to Chemical Formula 1E-1-4, $X^1$, $L^a$, $L^b$, $L^c$, $L^1$ to $L^4$, $R^a$, $R^1$ to $R^6$, $R^b$, and $R^c$ are the same as described above.

For example, Chemical Formula 1E-2 may be represented by one of Chemical Formula 1E-2-1 to Chemical Formula 1E-2-4 according to a specific substitution position of the group represented by Chemical Formula a.

[Chemical Formula 1E-2-1]

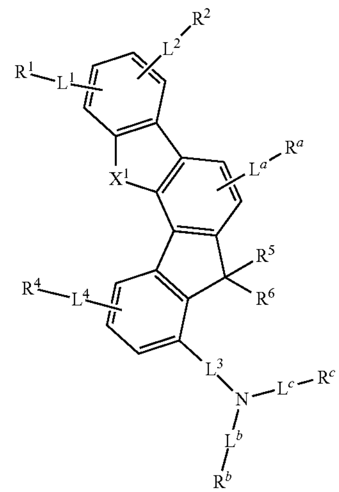

[Chemical Formula 1E-2-2]

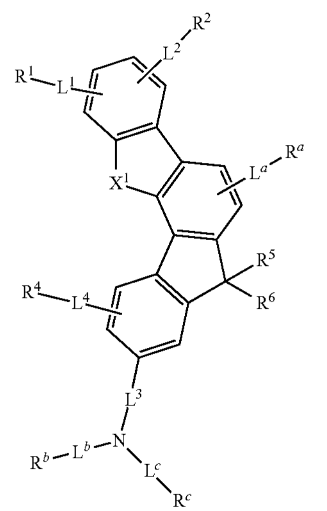

[Chemical Formula 1E-2-3]

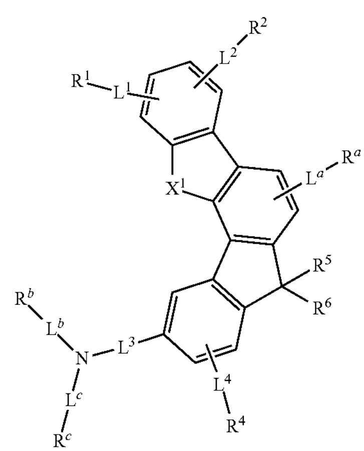

-continued

[Chemical Formula 1E-2-4]

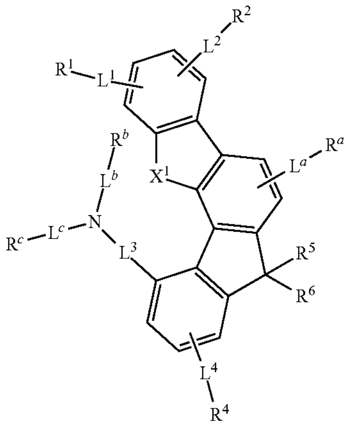

In Chemical Formula 1E-2-1 to Chemical Formula 1E-2-4, $X^1$, $L^a$, $L^b$, $L^c$, $L^1$ to $L^4$, $R^a$, $R^1$ to $R^6$, $R^b$, and $R^c$ are the same as described above.

In an example embodiment, Chemical Formula 1E may be represented by one of Chemical Formula 1E-1-1 to Chemical Formula 1E-1-4, and Chemical Formula 1E-2-1 to Chemical Formula 1E-2-4.

For example, Chemical Formula 1F may be represented by Chemical Formula 1F-1 or Chemical Formula 1F-2 according to a substitution position of the group represented by Chemical Formula a.

[Chemical Formula 1F-1]

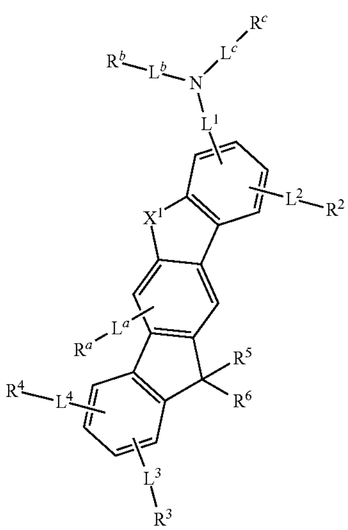

-continued

[Chemical Formula 1F-2]

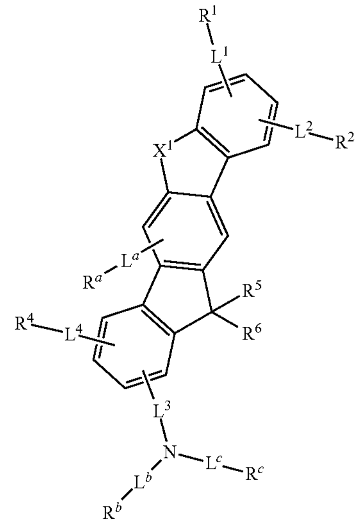

In Chemical Formula 1F-1 and Chemical Formula 1F-2, $X^1$, $L^a$, $L^b$, $L^c$, $L^1$ to $L^4$, $R^a$, $R^1$ to $R^6$, $R^b$, and $R^c$ are the same as described above.

For example, Chemical Formula 1F-1 may be represented by one of Chemical Formula 1F-1-1 to Chemical Formula 1F-1-4 according to a specific substitution position of the group represented by Chemical Formula a.

[Chemical Formula 1F-1-1]

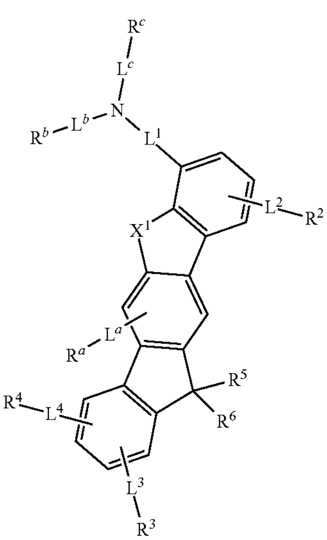

-continued

[Chemical Formula 1F-1-2]

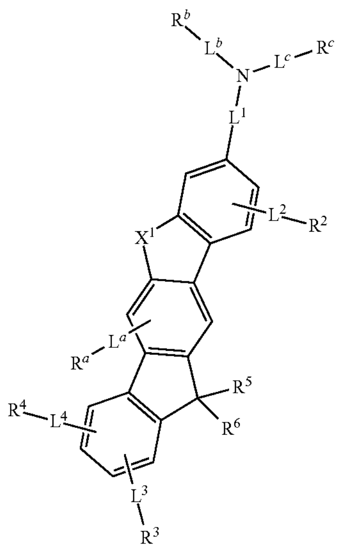

[Chemical Formula 1F-1-3]

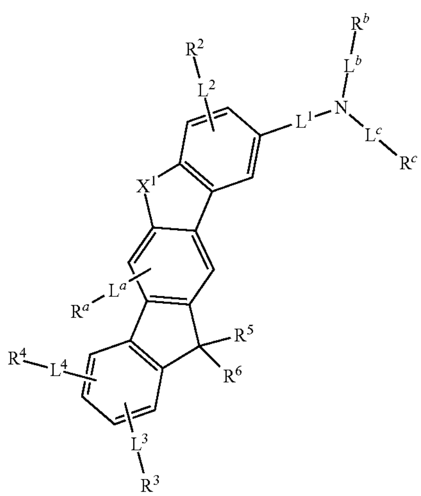

[Chemical Formula 1F-1-4]

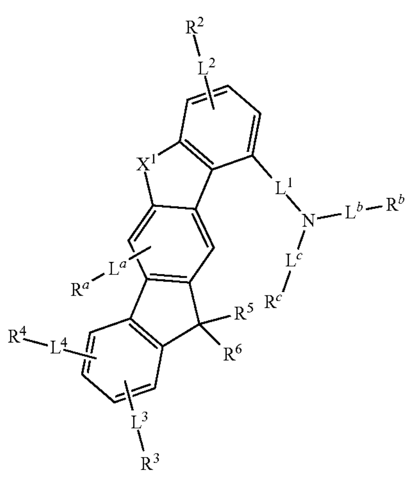

In Chemical Formula 1F-1-1 to Chemical Formula 1F-1-4, $X^1$, $L^a$, $L^b$, $L^c$, $L^1$ to $L^4$, $R^1$ to $R^6$, $R^a$, $R^b$, and $R^c$ are the same as described above.

For example, Chemical Formula 1F-2 may be represented by one of Chemical Formula 1F-2-1 to Chemical Formula 1F-2-4 according to a specific substitution position of the group represented by Chemical Formula a.

[Chemical Formula 1F-2-1]

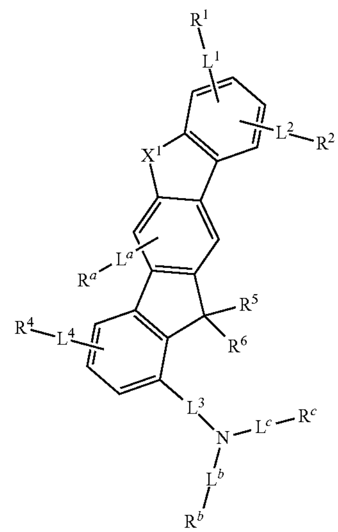

[Chemica Formula 1F-2-2]

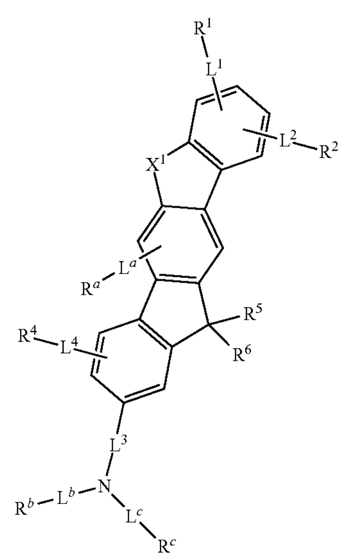

-continued

[Chemical Formula 1F-2-3]

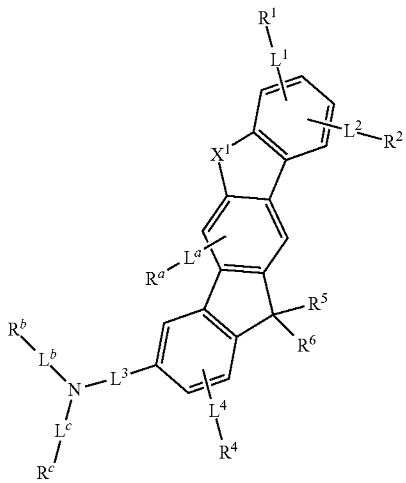

[Chemical Formula 1F-2-4]

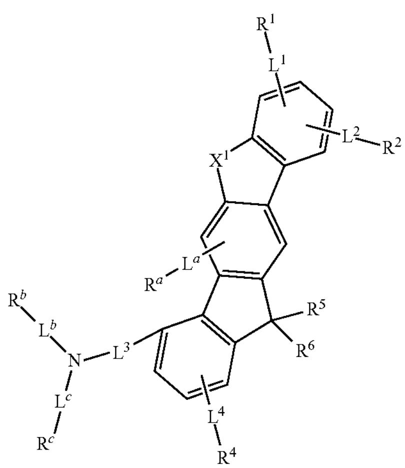

In Chemical Formula 1F-2-1 to Chemical Formula 1F-2-4, $X^1$, $L^a$, $L^b$, $L^c$, $L^1$ to $L^4$, $R^1$ to $R^6$, $R^a$, $R^b$, and $R^c$ are the same as described above.

In an embodiment, Chemical Formula 1F may be represented by one of Chemical Formula 1F-1-1, Chemical Formula 1F-2-2 and Chemical Formula 1F-2-3.

In a specific example embodiment of the present invention, the first compound for an organic optoelectronic device may be represented by Chemical Formula 1E-1-1 or Chemical Formula 1E-2-2, for example Chemical Formula 1E-2-2.

The first compound for an organic optoelectronic device may be for example one of compounds of Group 1, but is not limited thereto.

[Group 1]

[A-1]

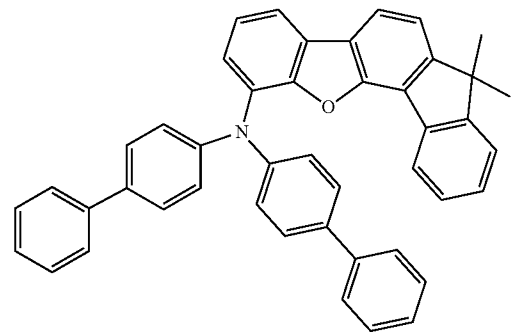

[A-2]

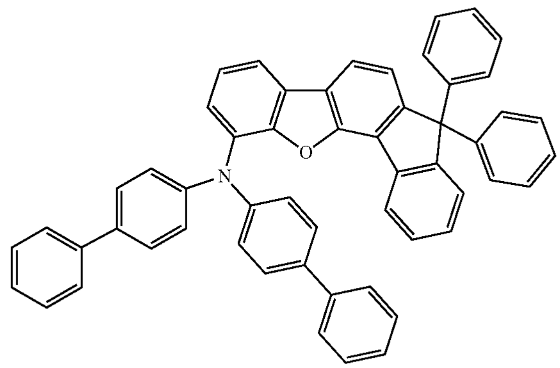

[A-3]

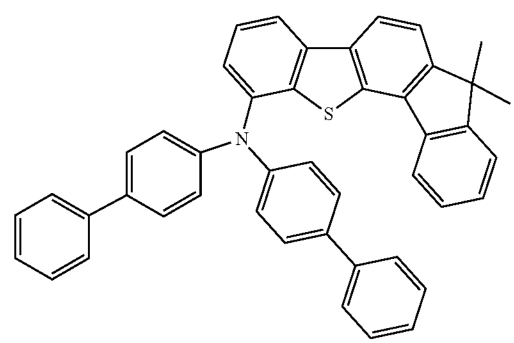

[A-4]

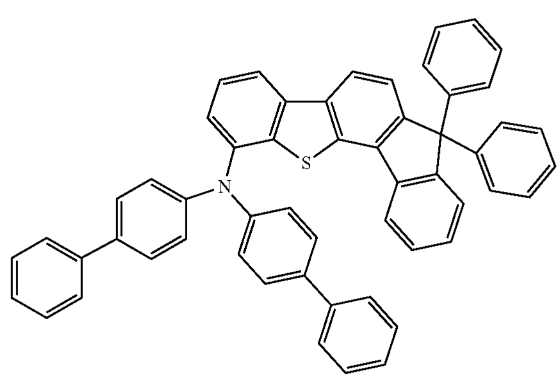

-continued
[A-5]
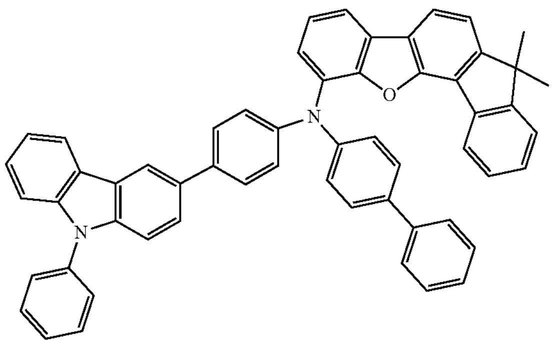
[A-6]
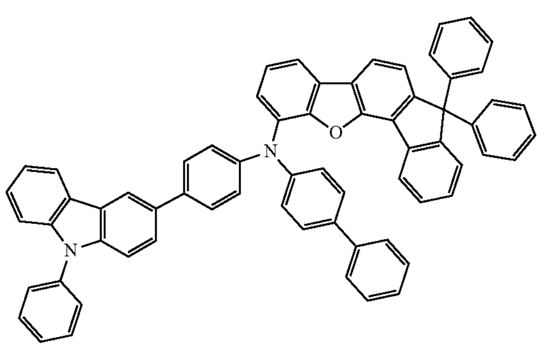
[A-7]
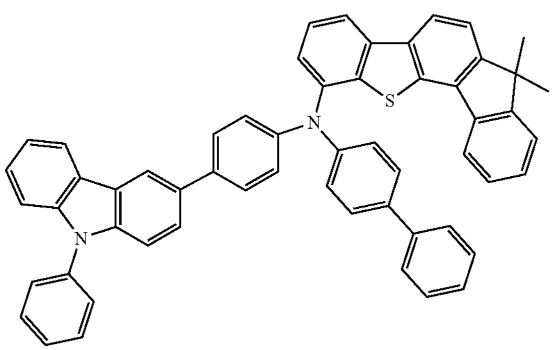
[A-9]
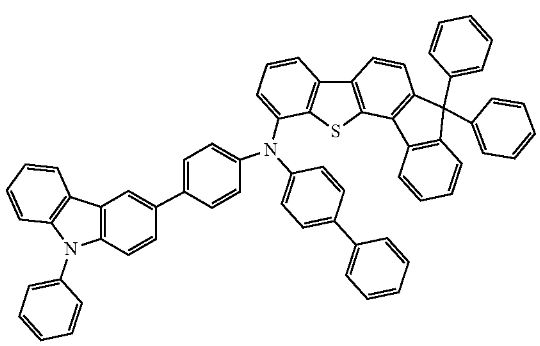
-continued
[A-10]
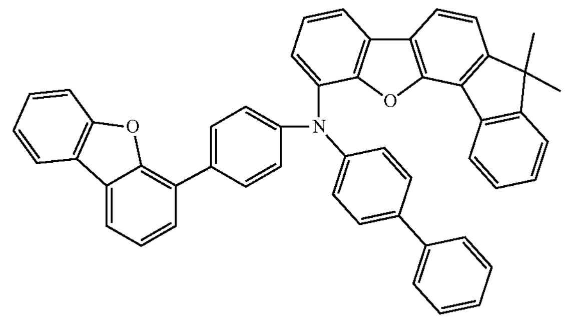
[A-11]
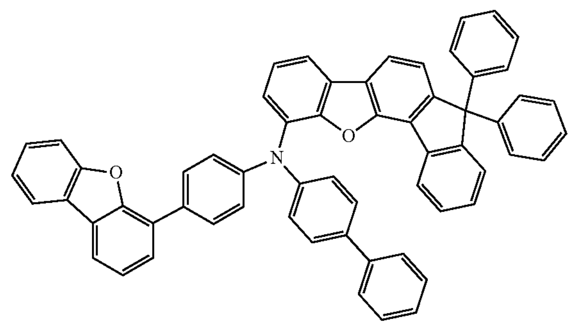
[A-12]
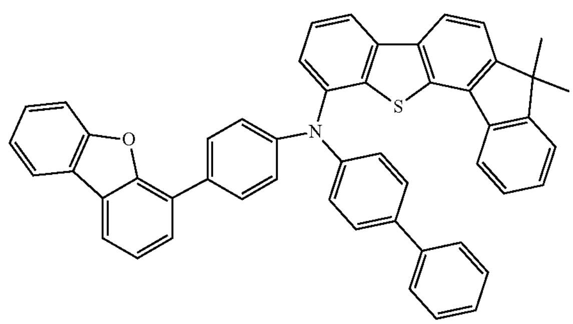
[A-13]
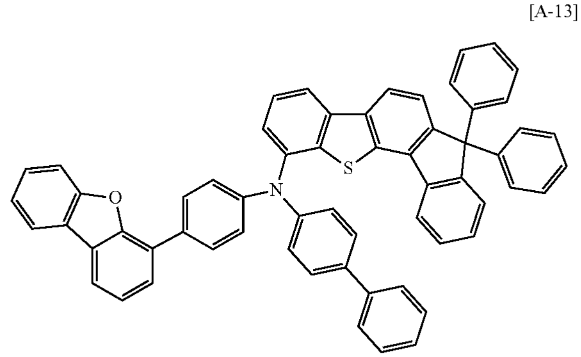

-continued
[A-14]
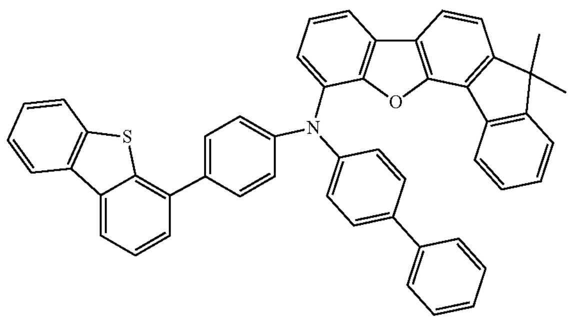
[A-15]
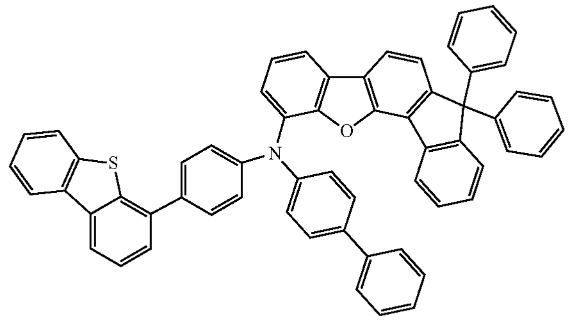
[A-16]
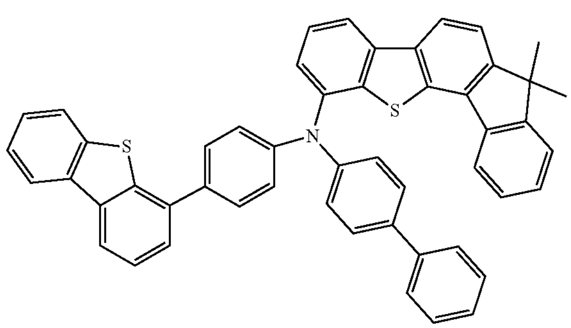
[A-17]
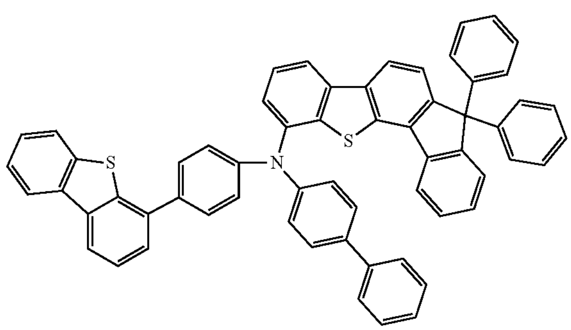
-continued
[A-18]
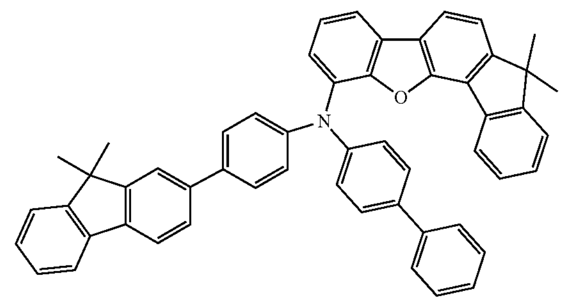
[A-19]
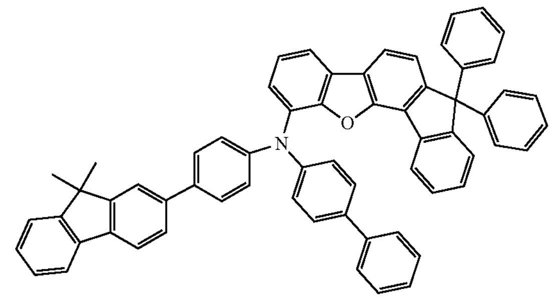
[A-20]
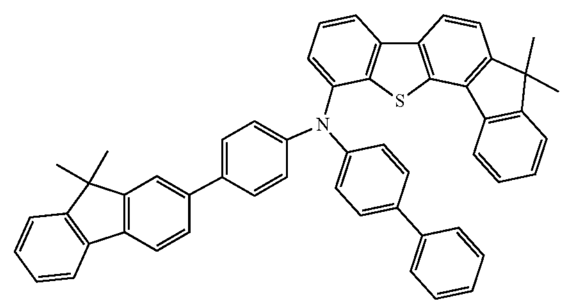
[A-21]
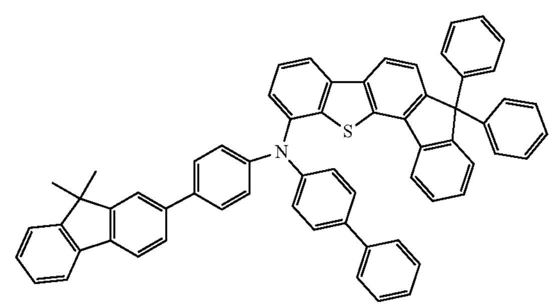

-continued
[A-22]
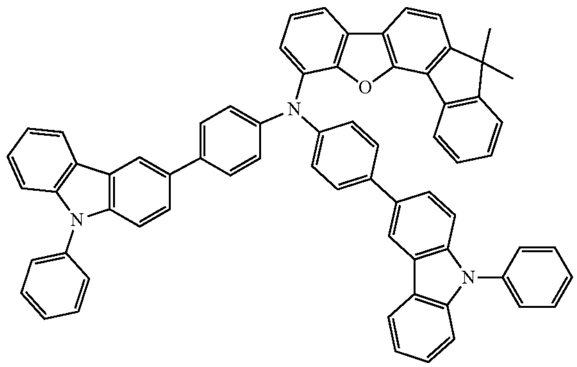
[A-23]
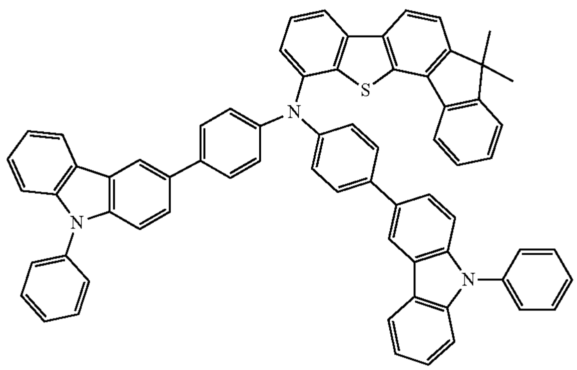
[A-24]
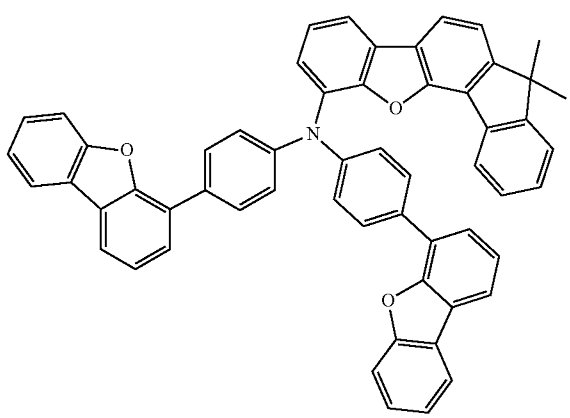
[A-25]
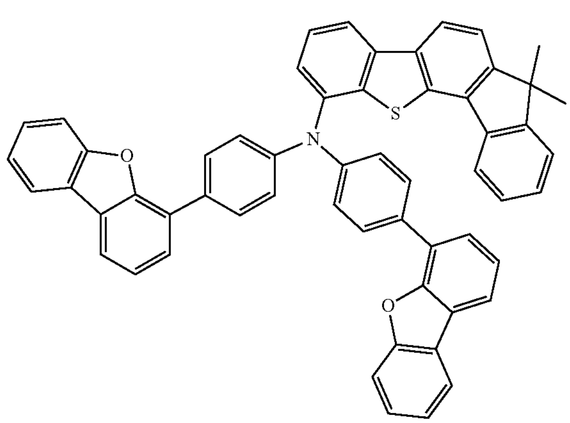
-continued
[A-26]
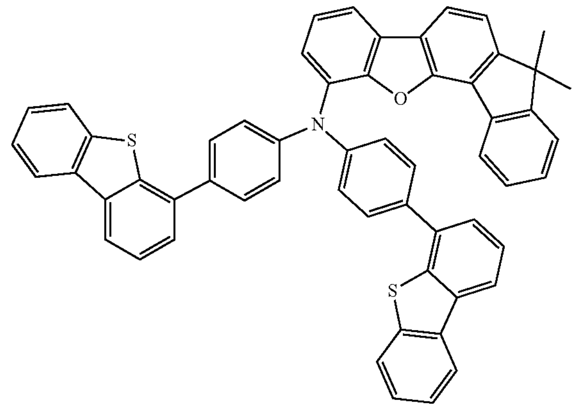
[A-27]
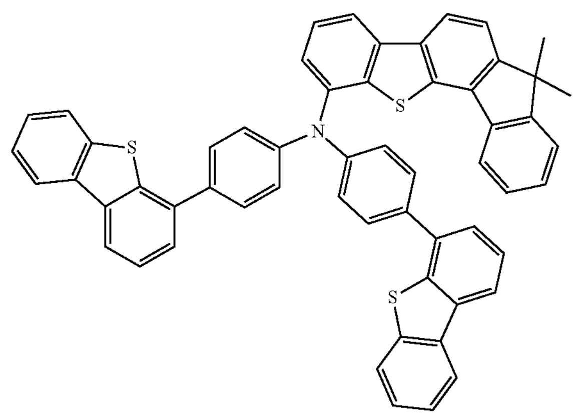
[A-28]
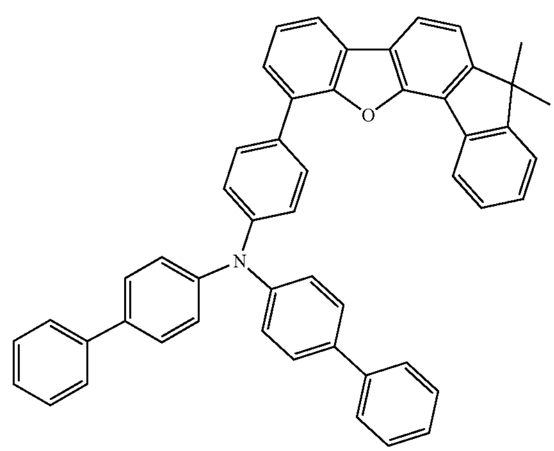

-continued
[A-29]
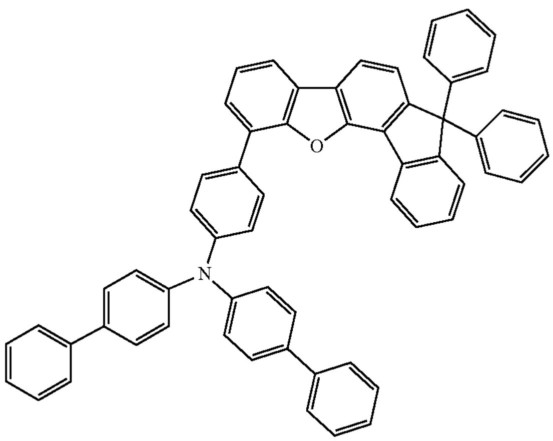
[A-30]
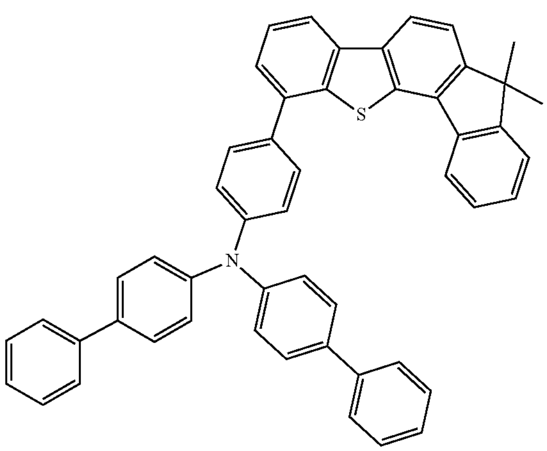
[A-31]
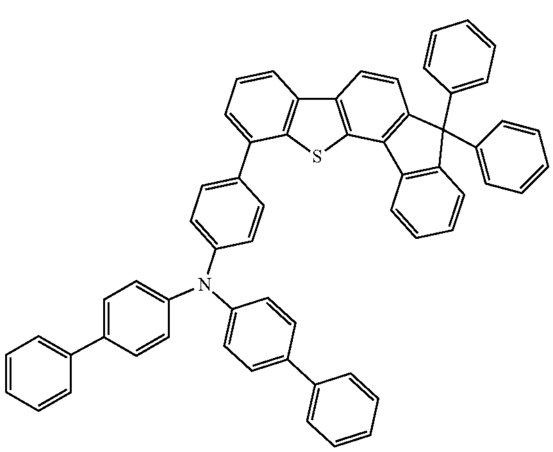
-continued
[A-32]
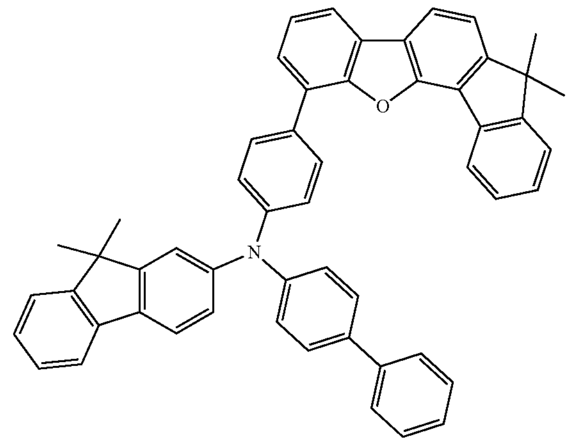
[A-33]
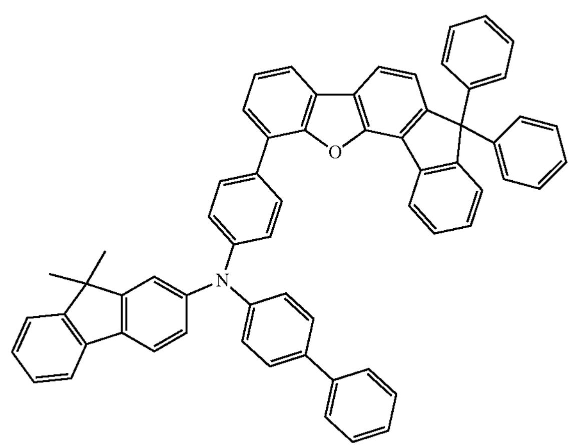
[A-34]
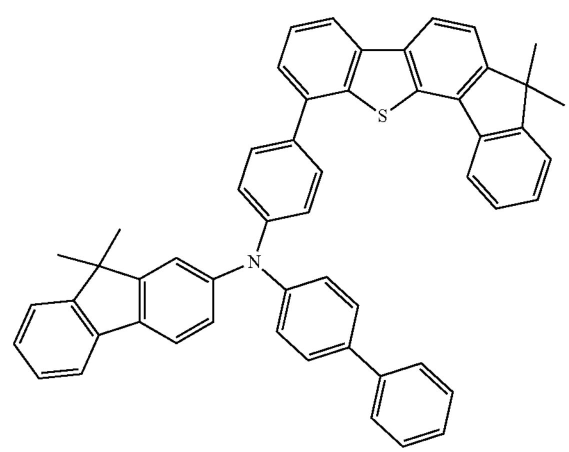

-continued
[A-35]
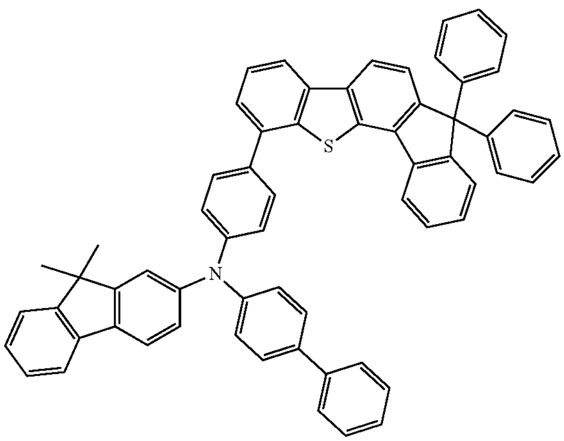
[A-36]
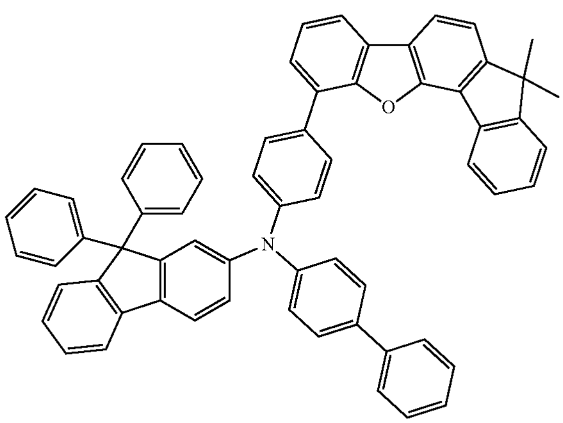
[A-37]
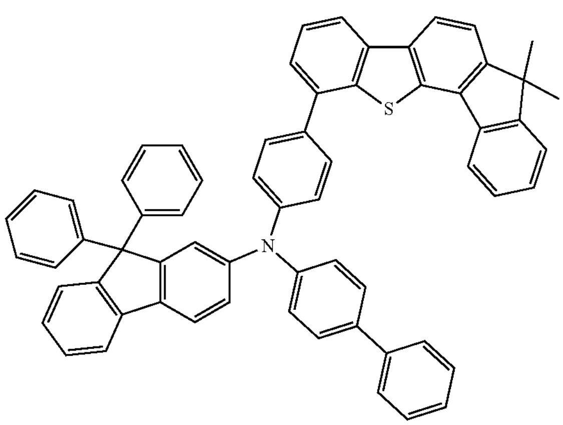
-continued
[A-38]
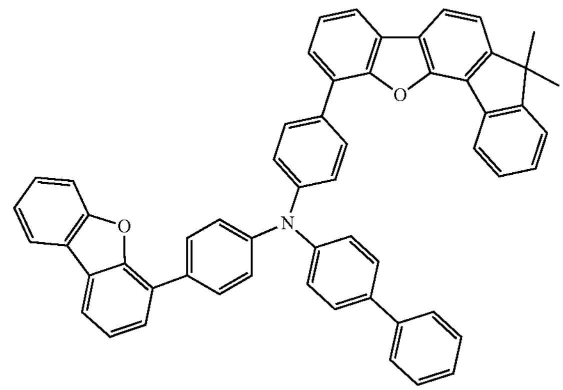
[A-39]
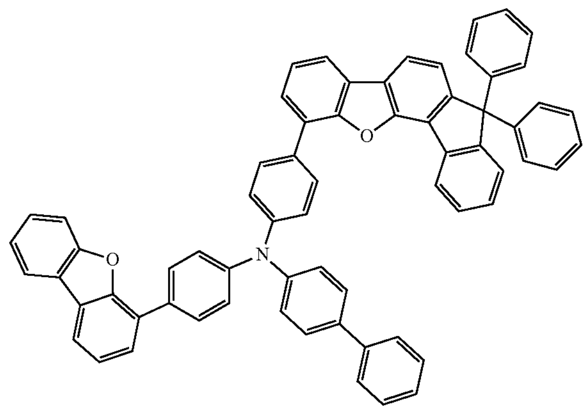
[A-40]
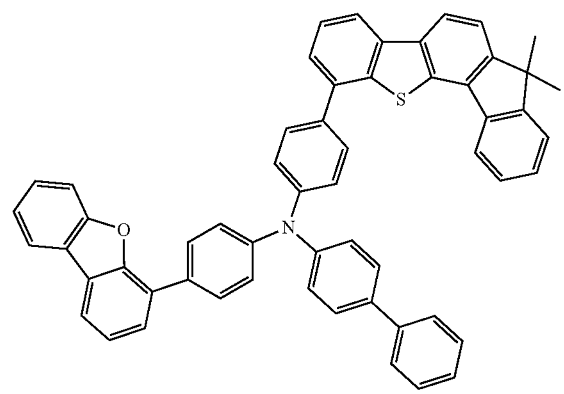

[A-41]
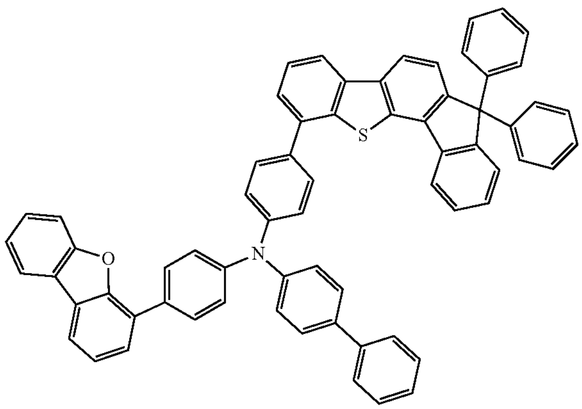
[A-42]
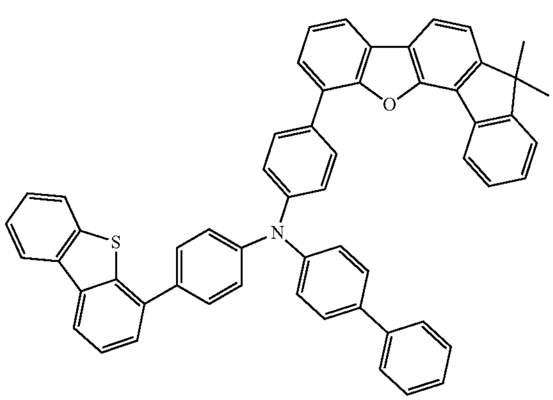
[A-43]
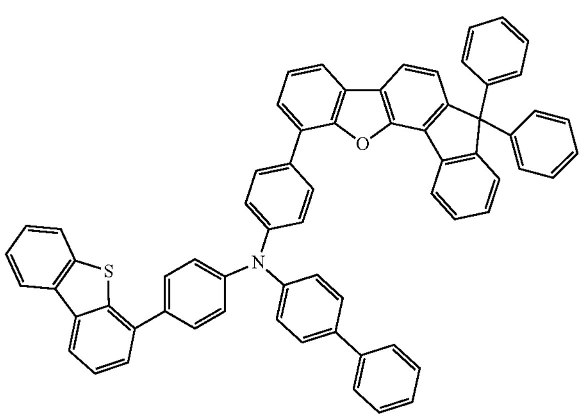
[A-44]
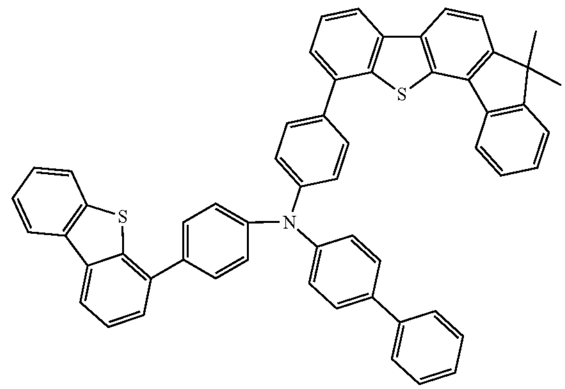
[A-45]
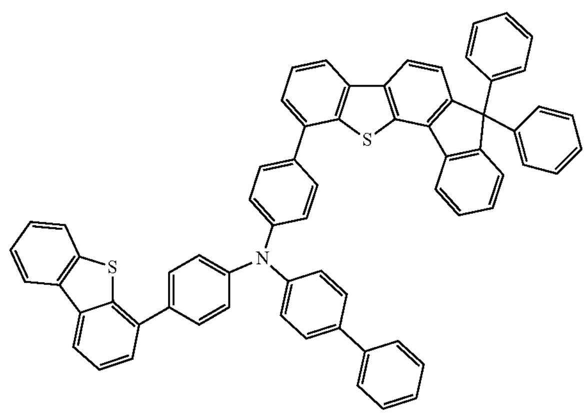
[A-46]
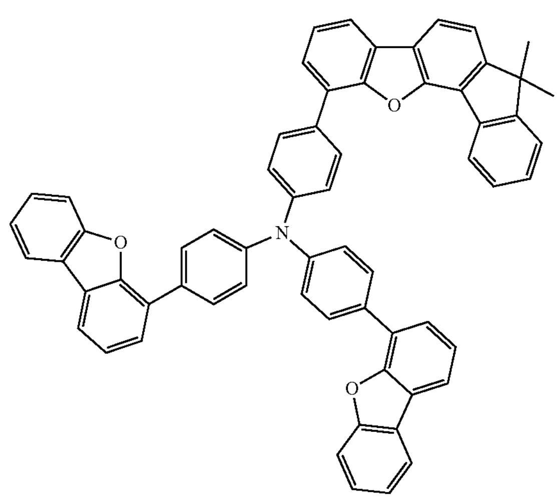

-continued
[A-47]
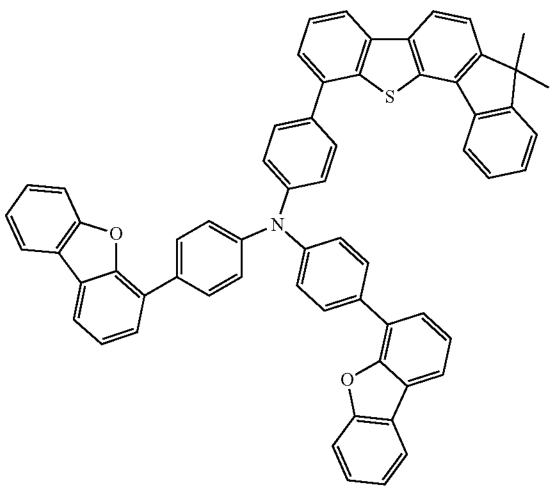
[A-48]
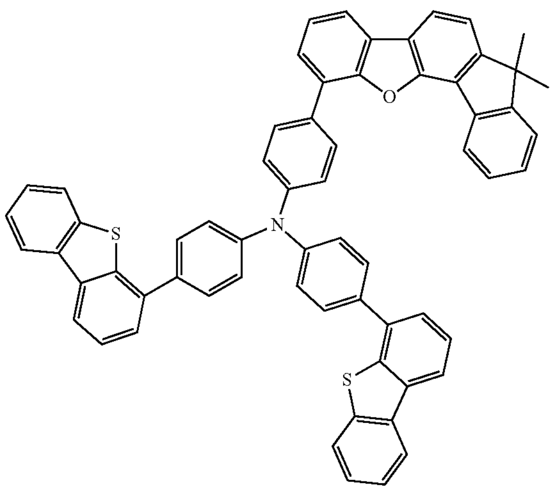
[A-49]
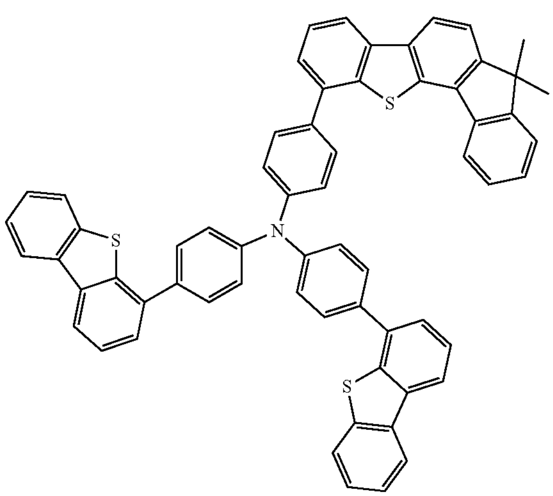
-continued
[A-50]
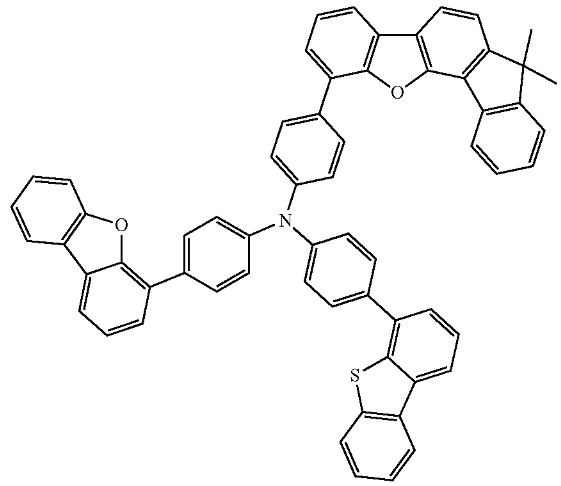
[A-51]
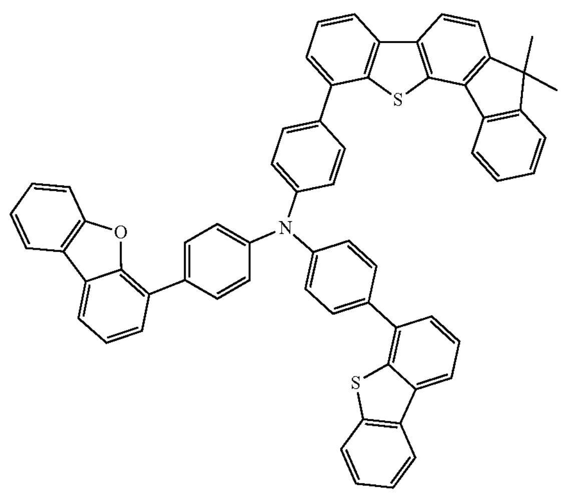
[A-52]
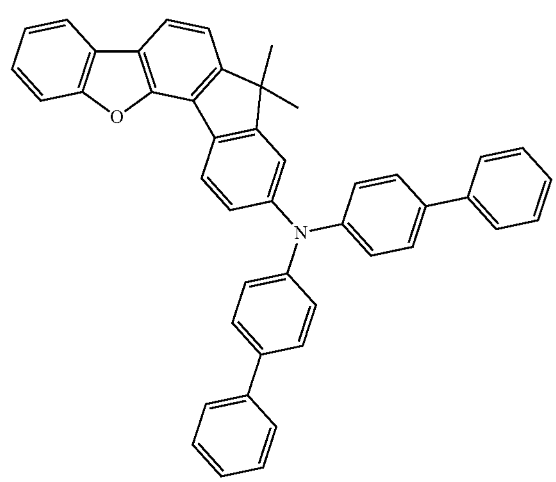

-continued
[A-53]
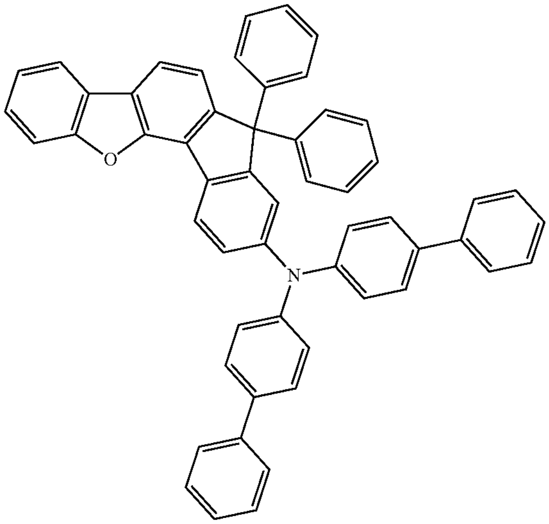
[A-54]
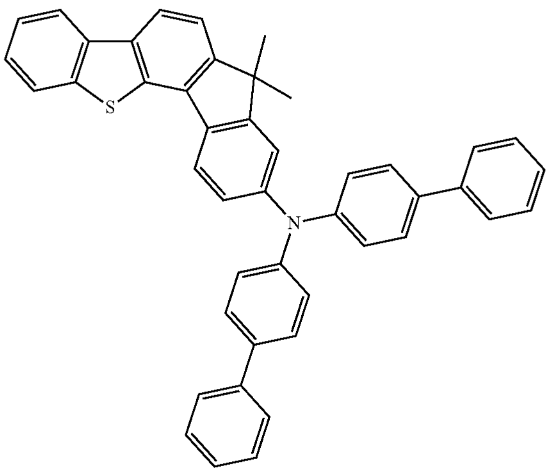
[A-55]
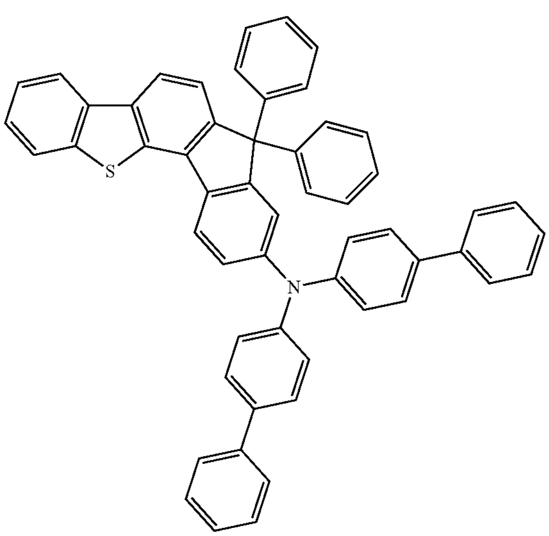
-continued
[A-56]
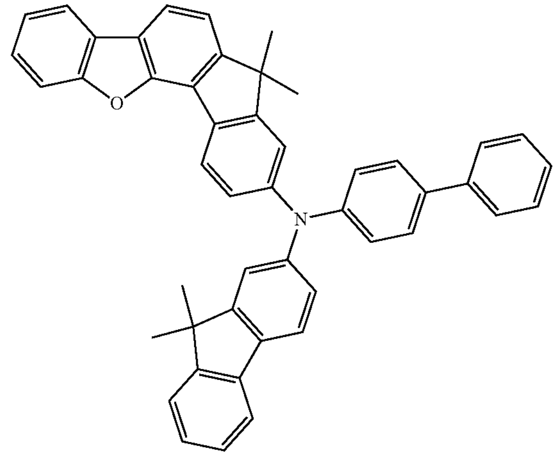
[A-57]
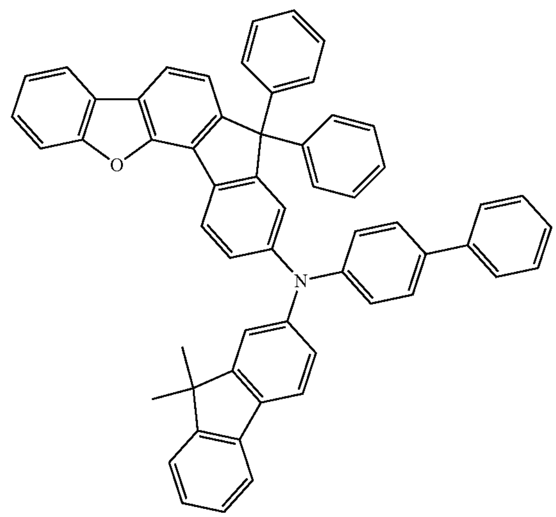
[A-58]
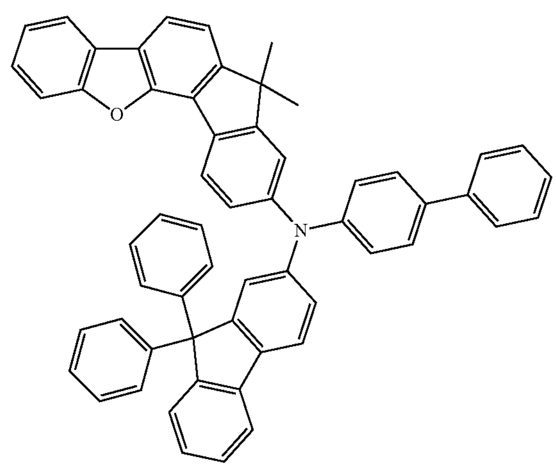

-continued
[A-59]
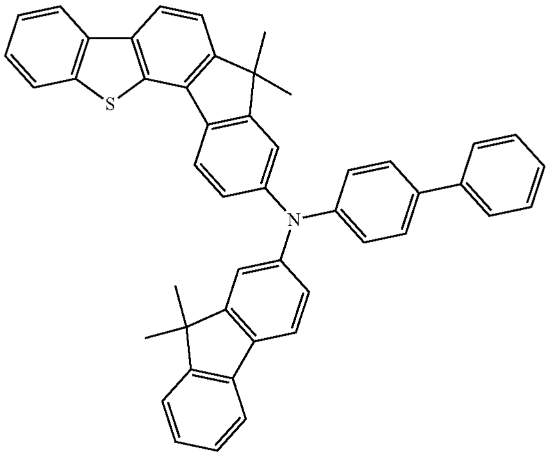
[A-60]
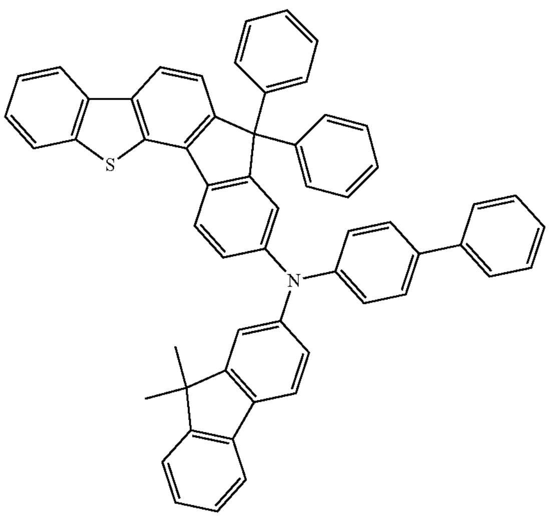
[A-61]
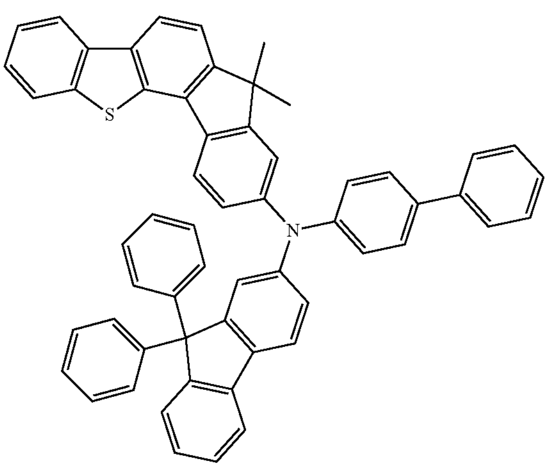
-continued
[A-62]
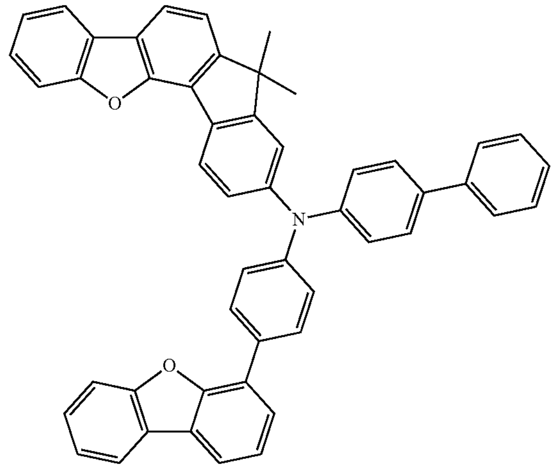
[A-63]
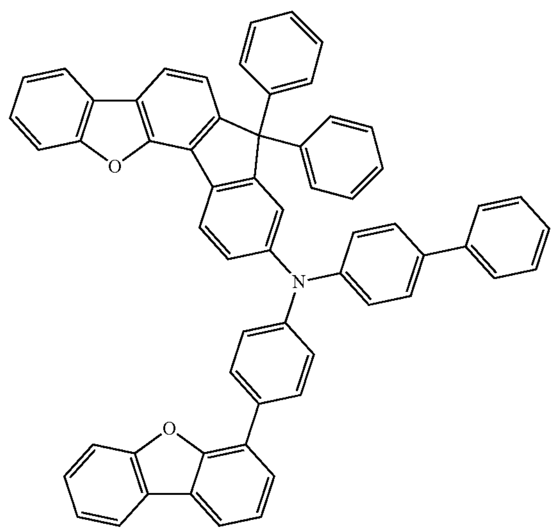
[A-64]
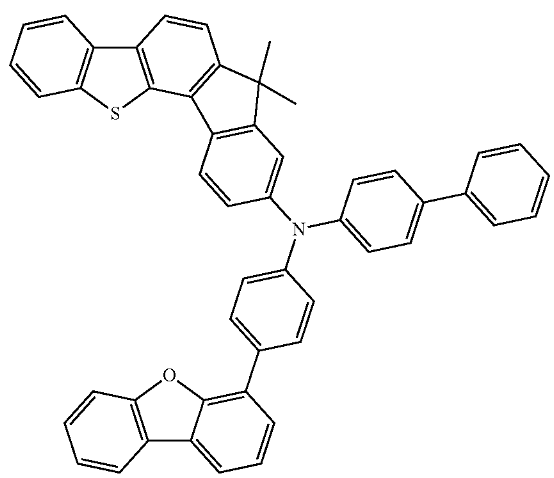

-continued
[A-65]
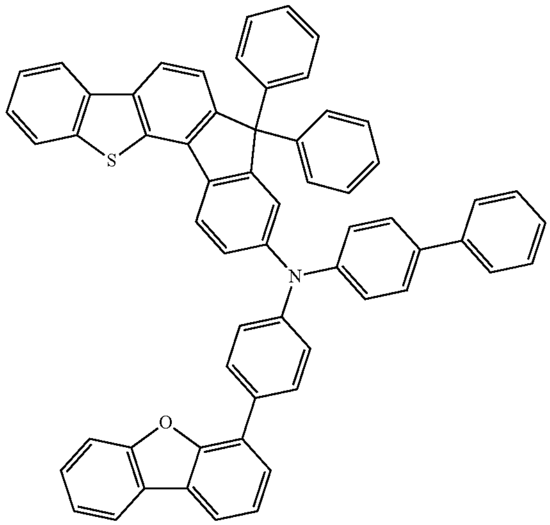
[A-66]
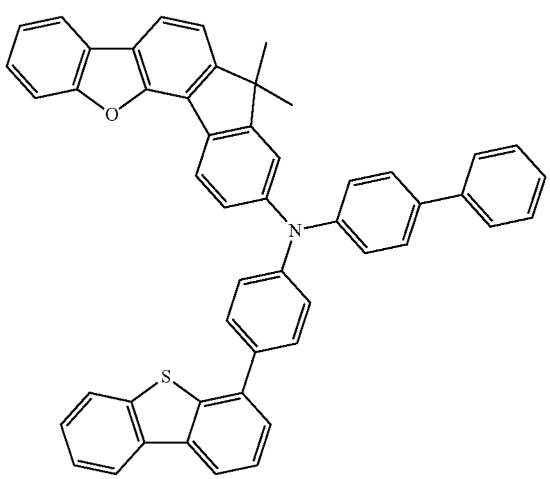
[A-67]
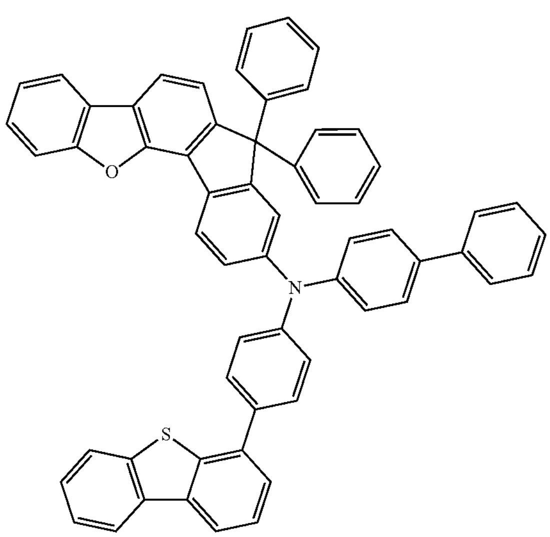
-continued
[A-68]
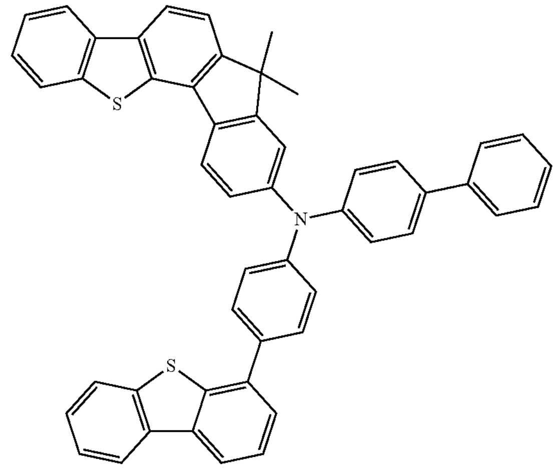
[A-69]
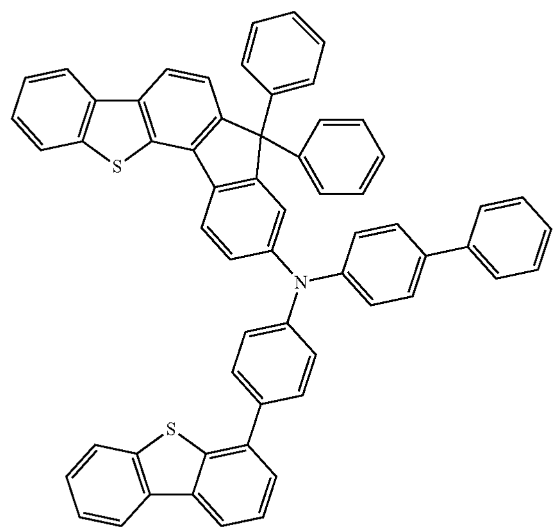
[A-70]
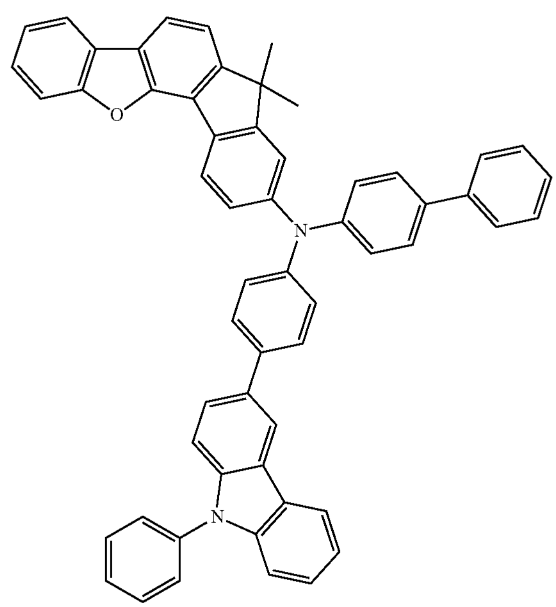

[A-71]
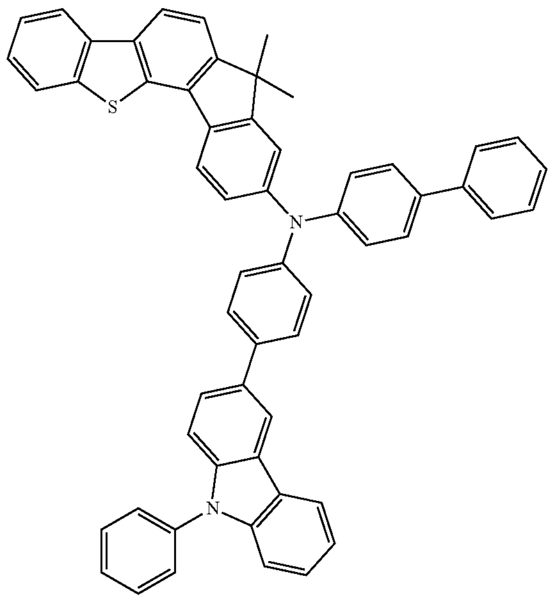
[A-72]
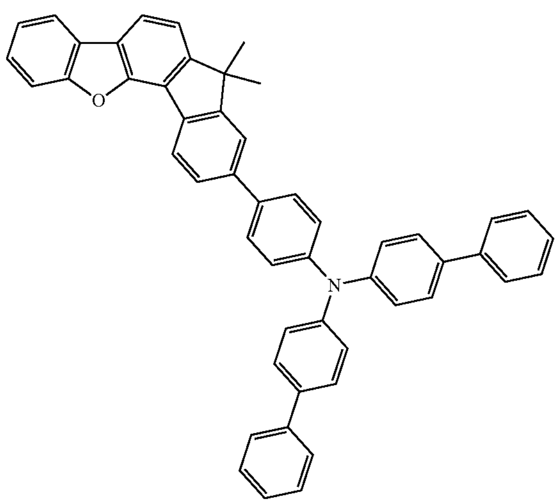
[A-73]
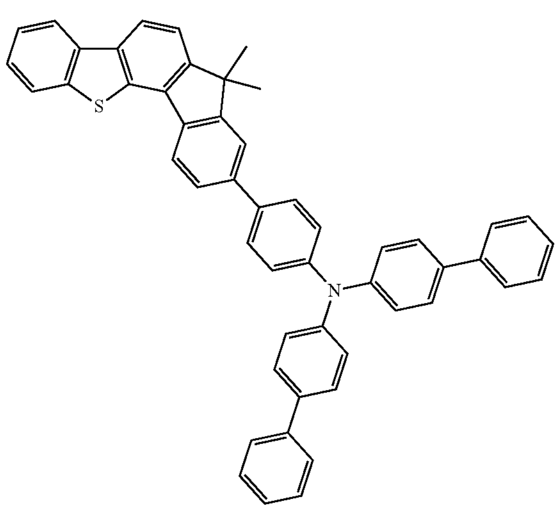
[A-74]
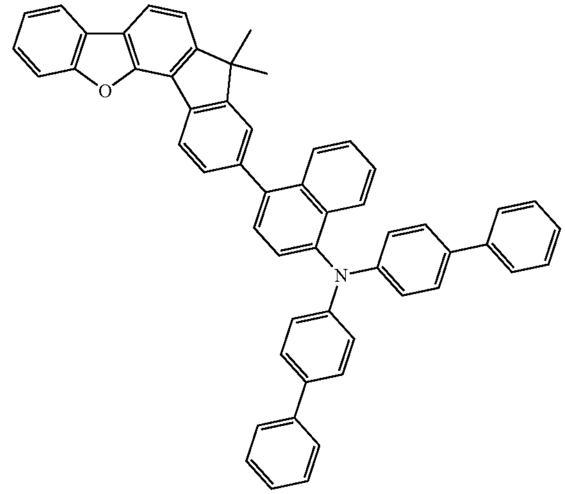
[A-75]
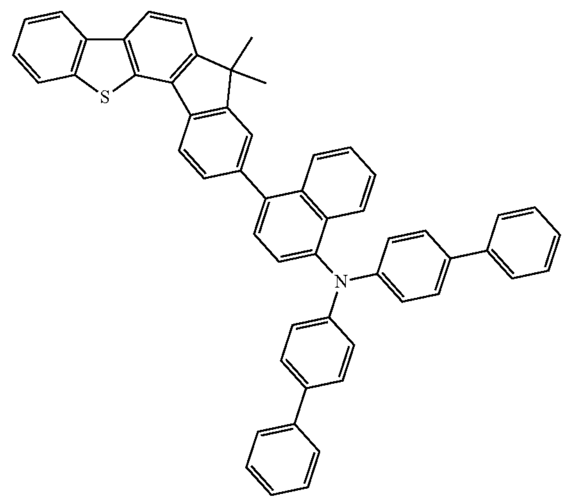
[A-76]
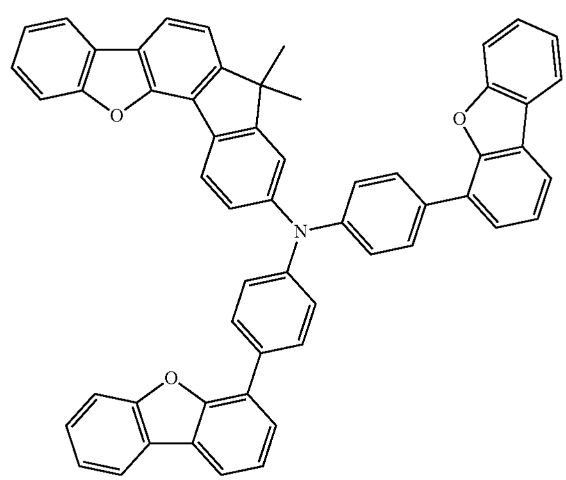

-continued
[A-77]
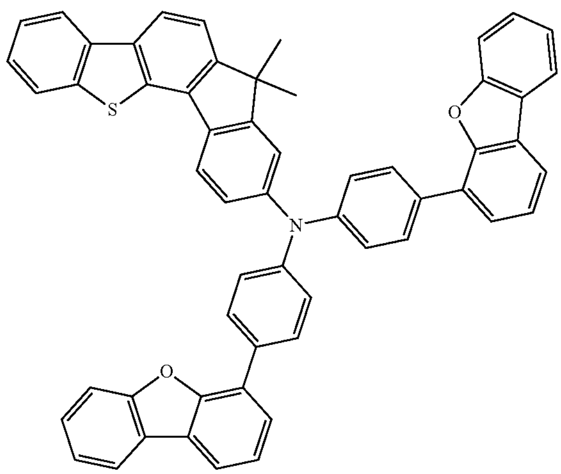
[A-78]
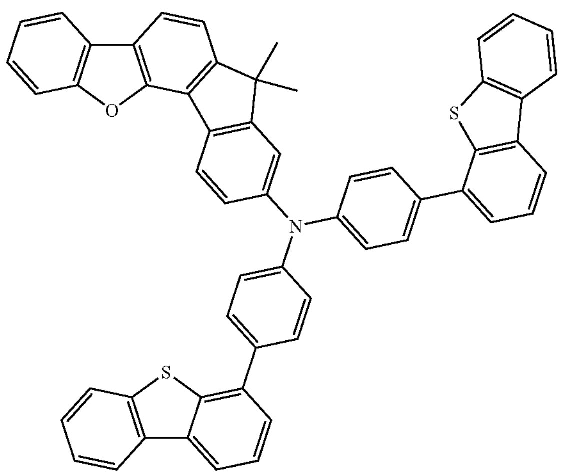
[A-79]
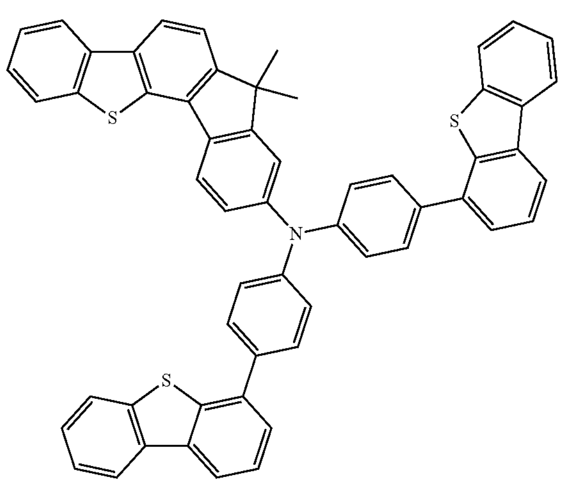
-continued
[A-80]
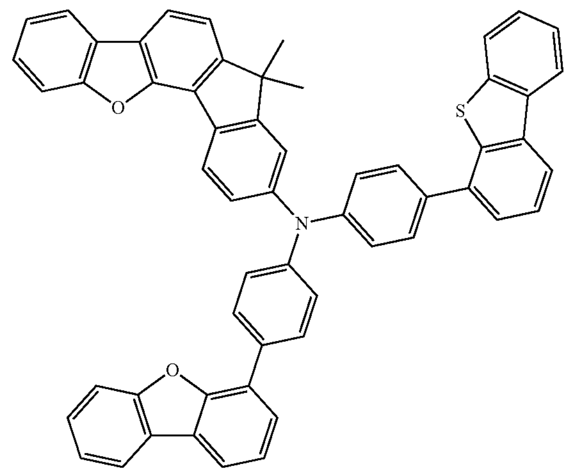
[A-81]
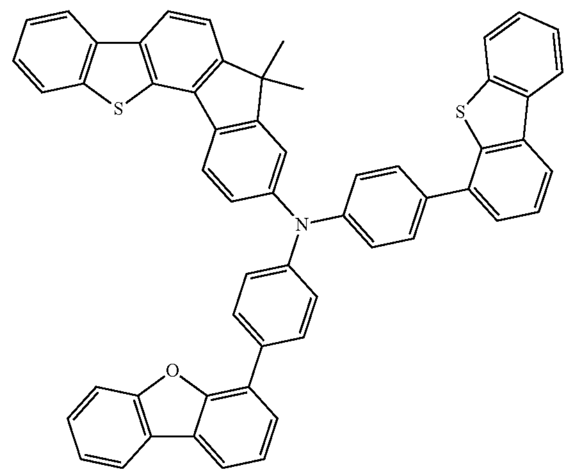
[A-82]
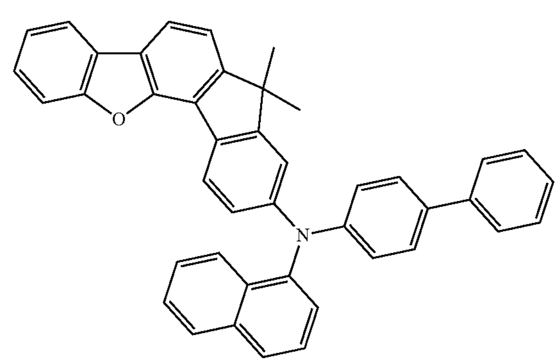

[A-83]
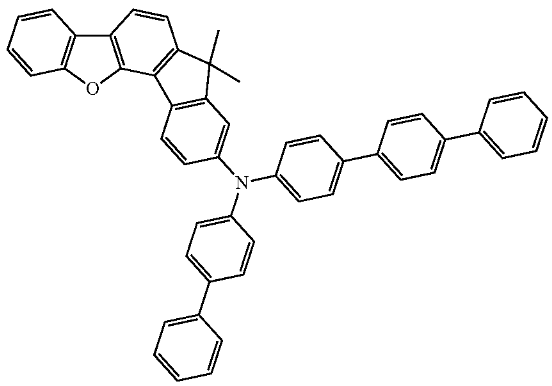
[A-84]
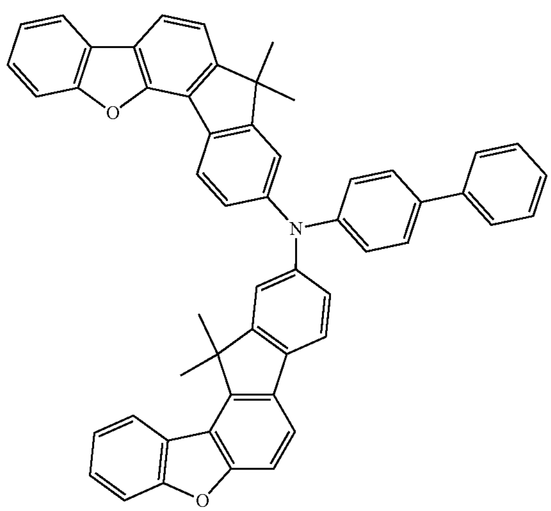
[A-85]
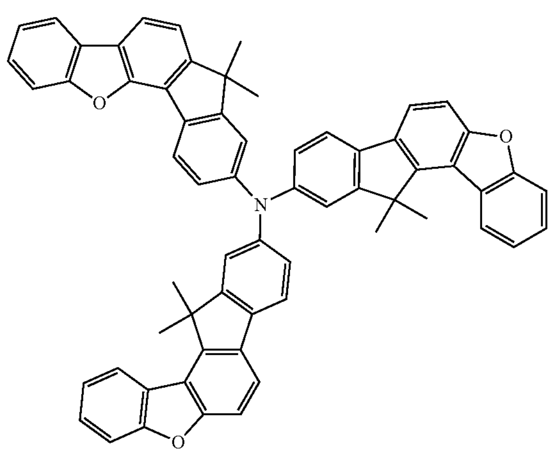
[A-86]
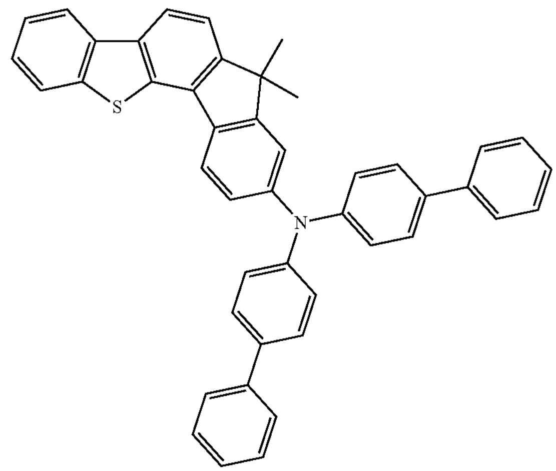
[A-87]
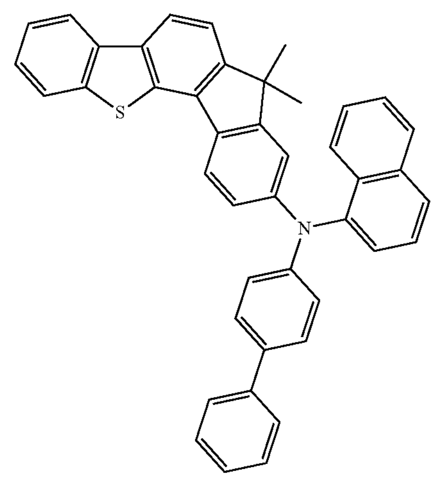
[A-88]
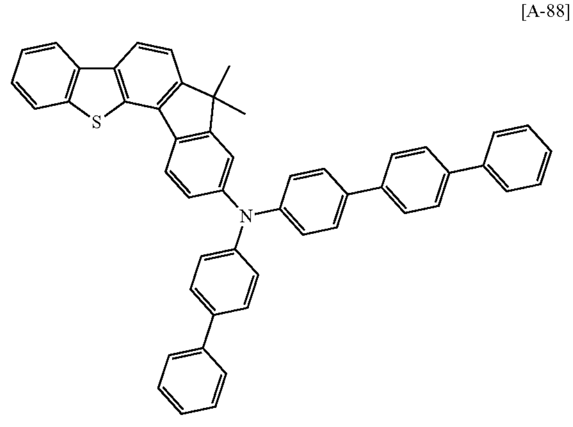

-continued
[A-89]
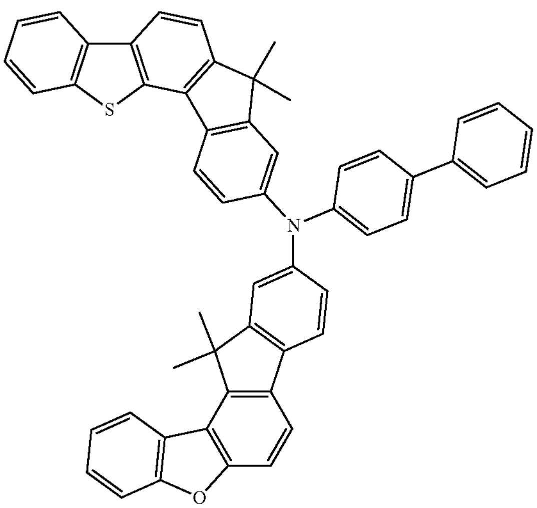
[A-90]
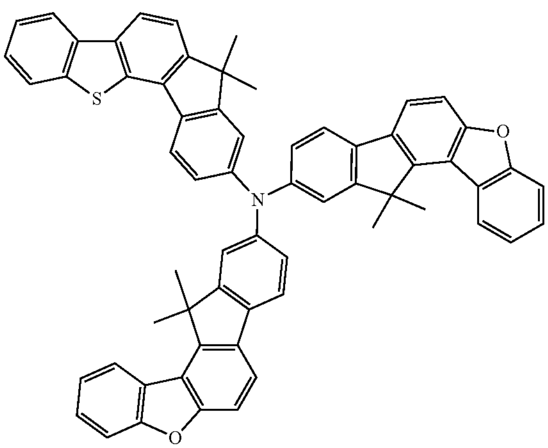
[A-91]
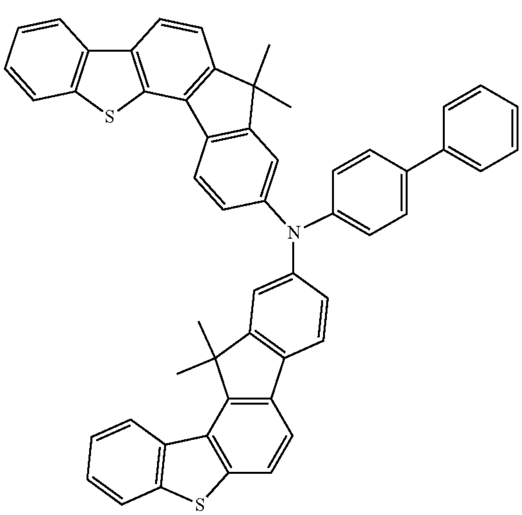
-continued
[A-92]
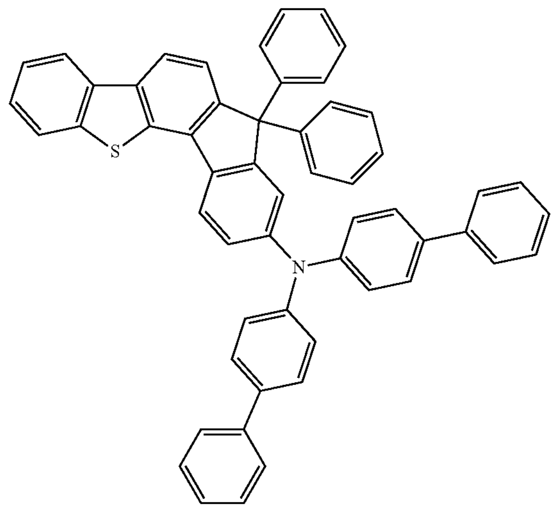
[A-93]
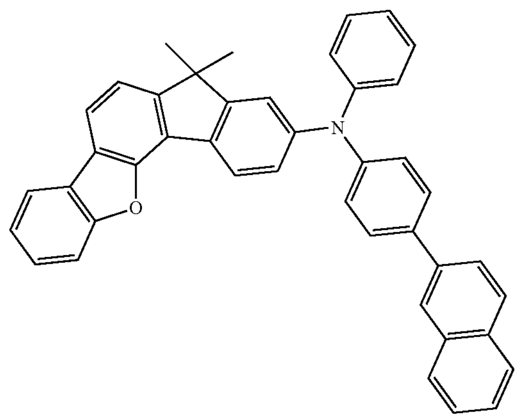
[A-94]
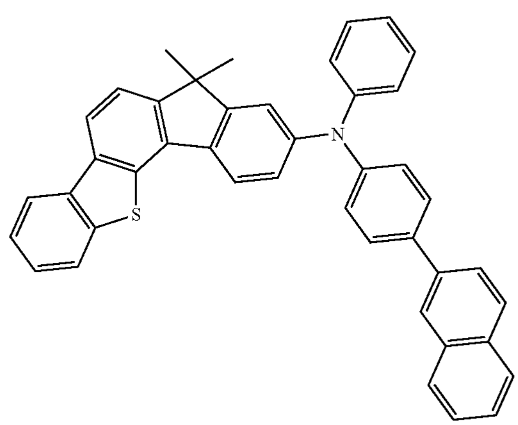

-continued
[A-95]
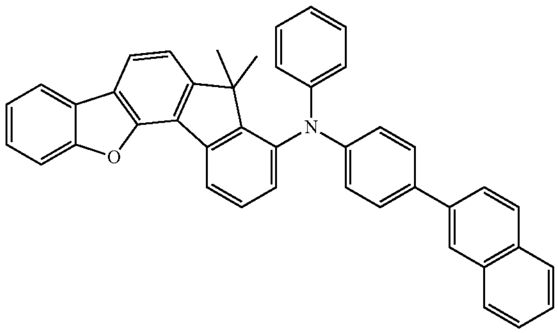
[A-96]
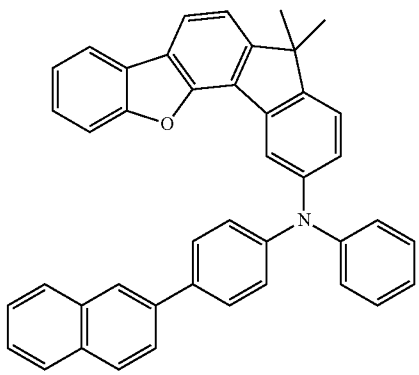
[A-97]
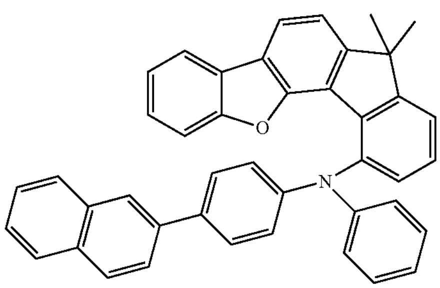
[A-98]
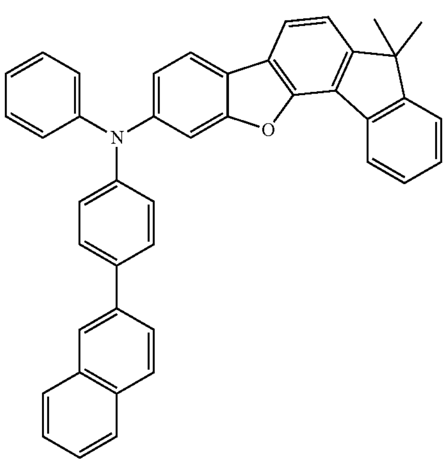
-continued
[A-99]
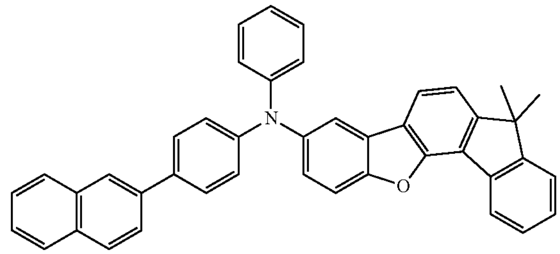
[A-100]
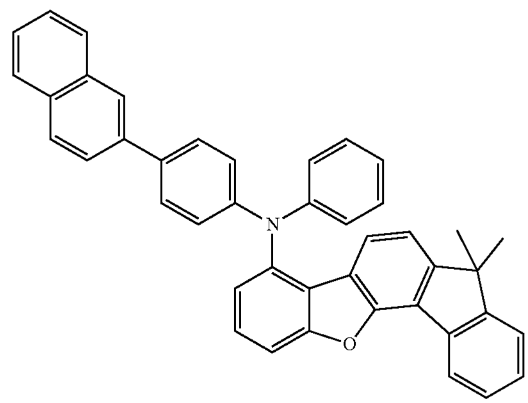
[A-101]
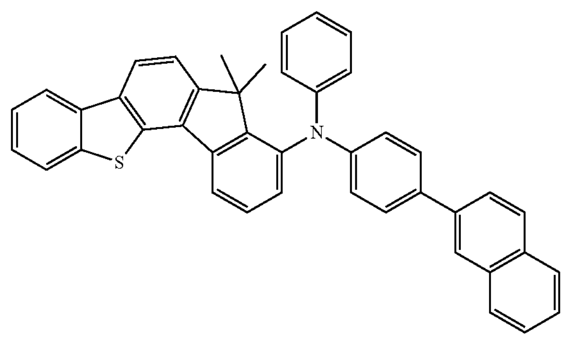
[A-102]
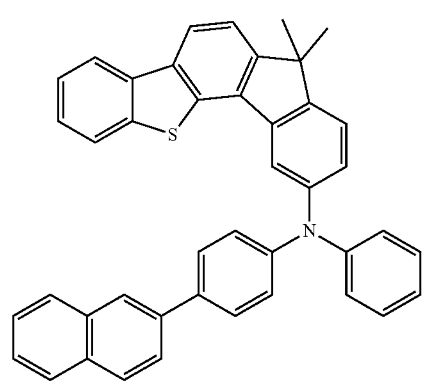

-continued
[A-103]
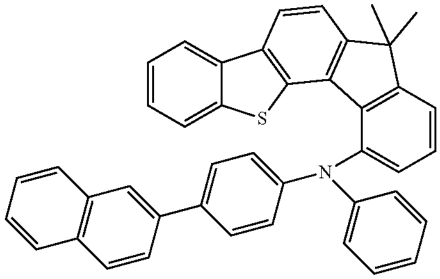
[A-104]
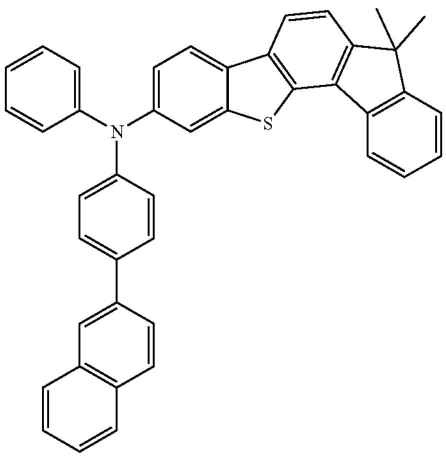
[A-105]
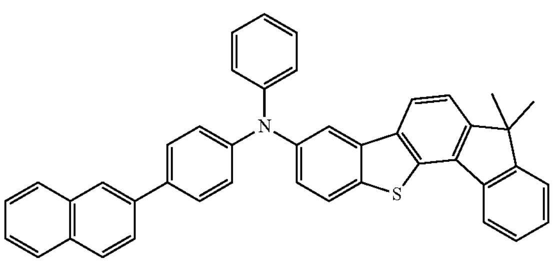
[A-106]
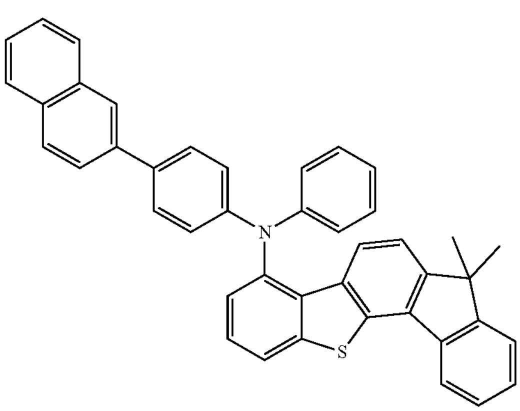
-continued
[A-107]
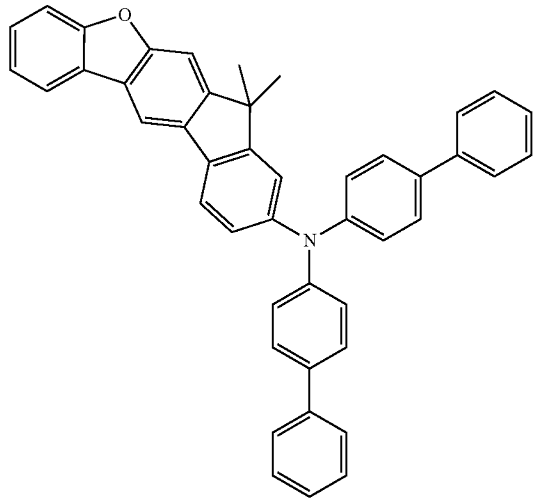
[A-108]
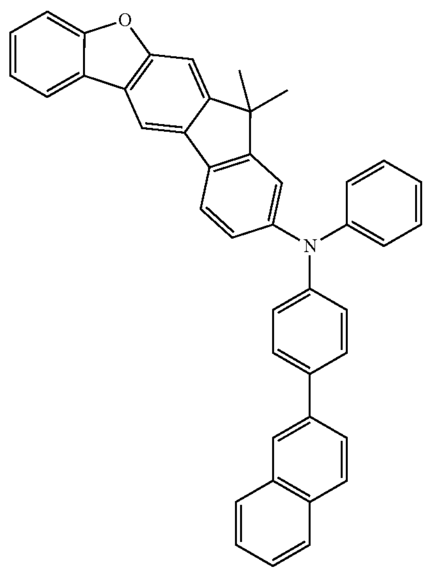
[A-109]
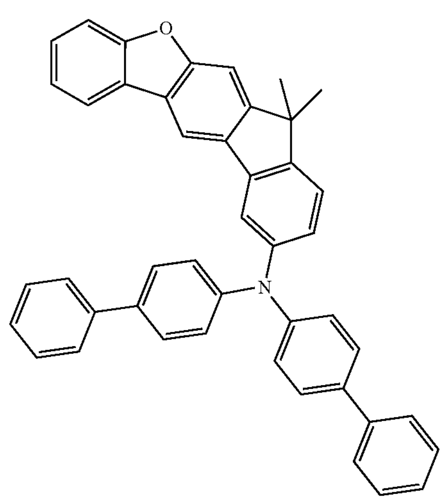

[A-110]
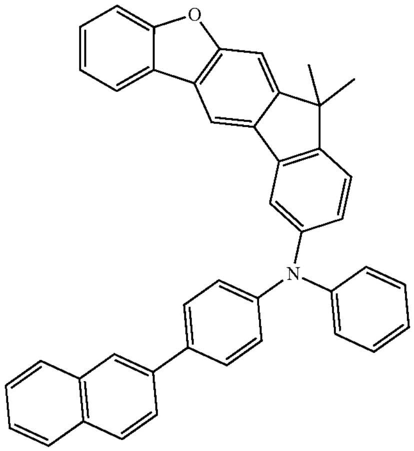
[A-111]
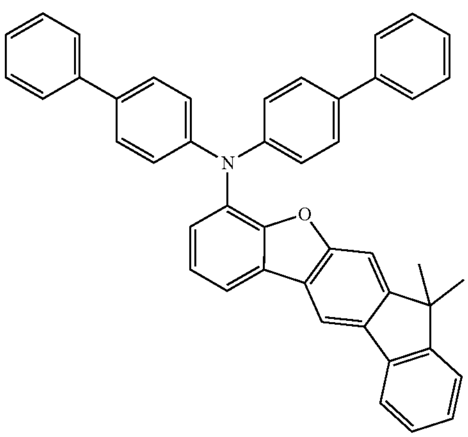
[A-112]
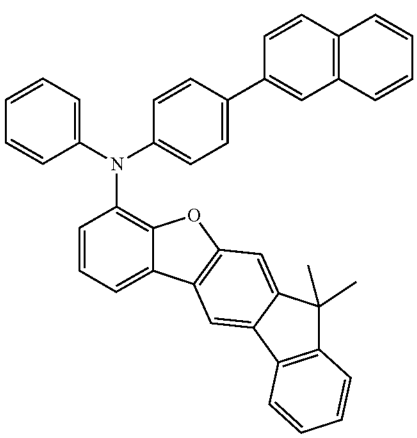
[A-113]
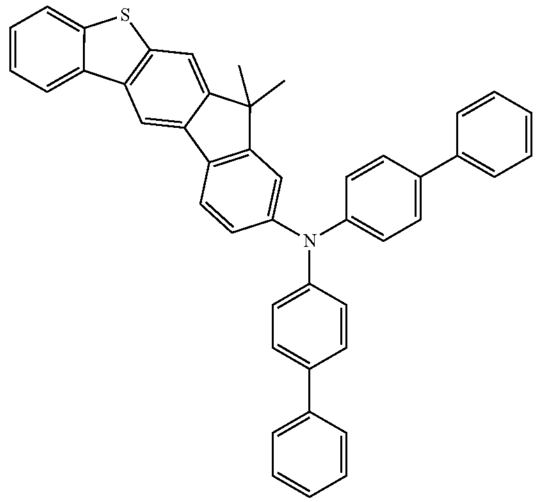
[A-114]
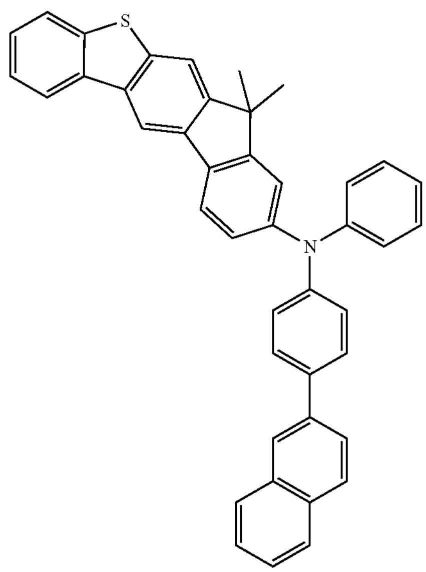
[A-115]
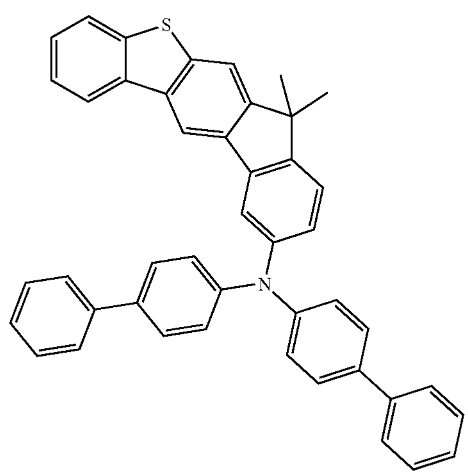

-continued
[A-116]
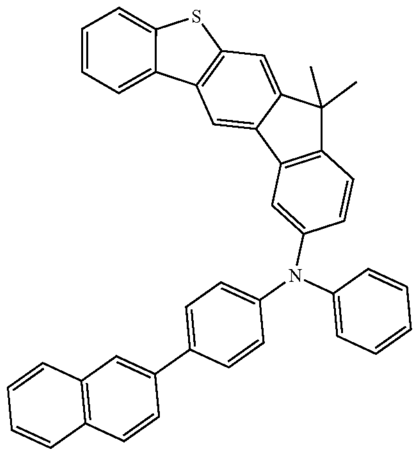
[A-117]
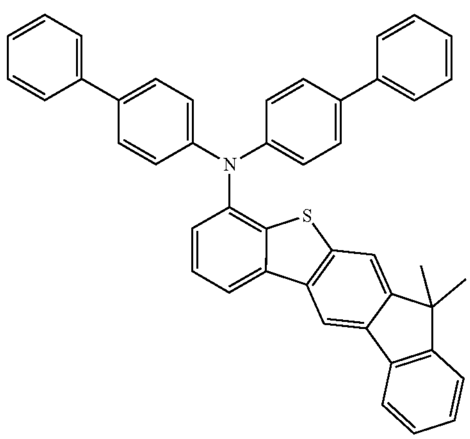
[A-118]
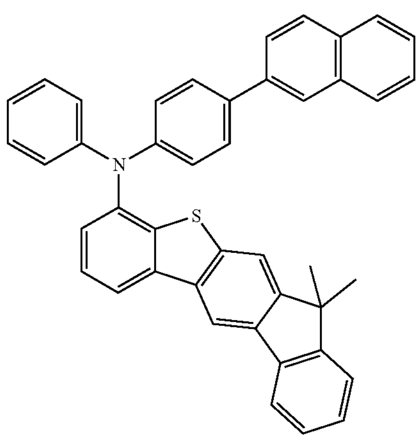
-continued
[A-119]
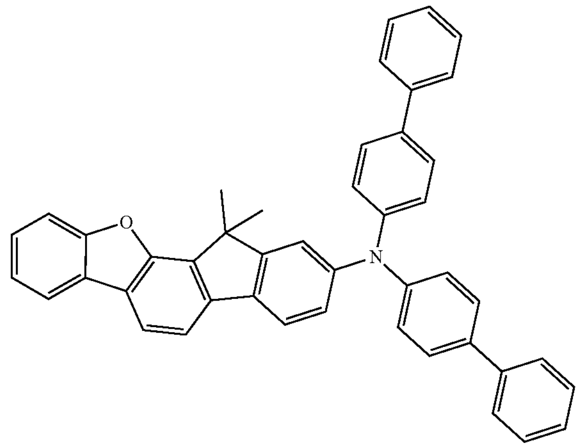
[A-120]
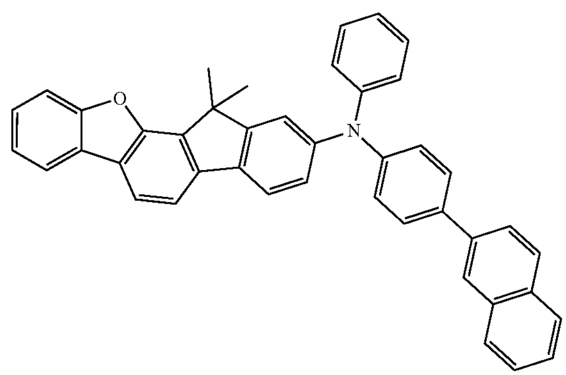
[A-121]
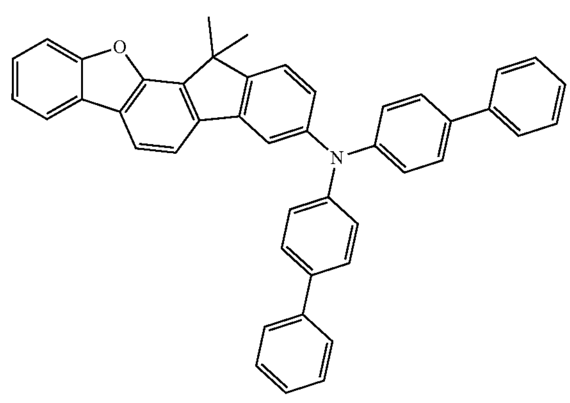

-continued
[A-122]
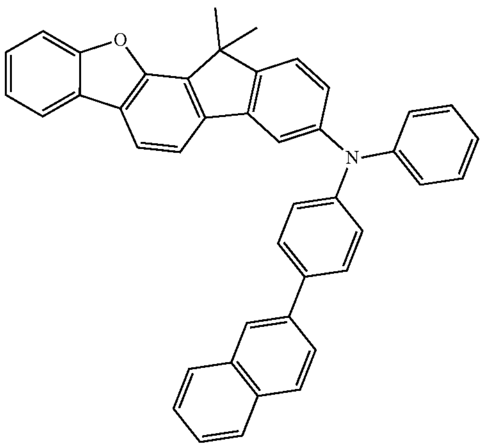
[A-123]
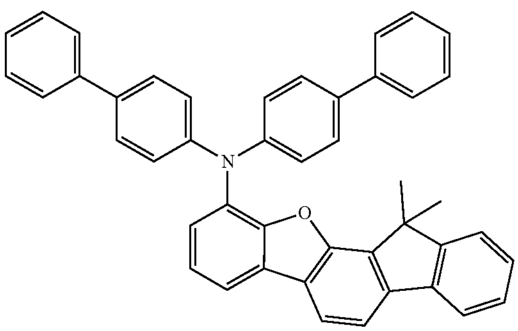
[A-124]
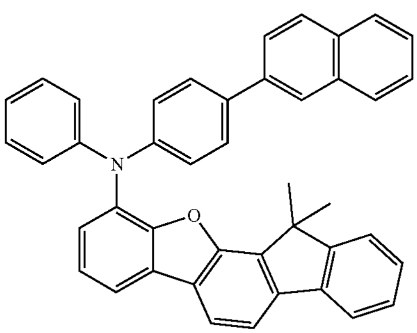
[A-125]
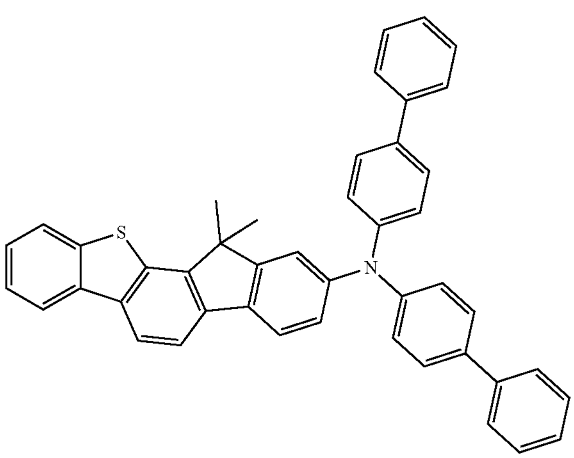
-continued
[A-126]
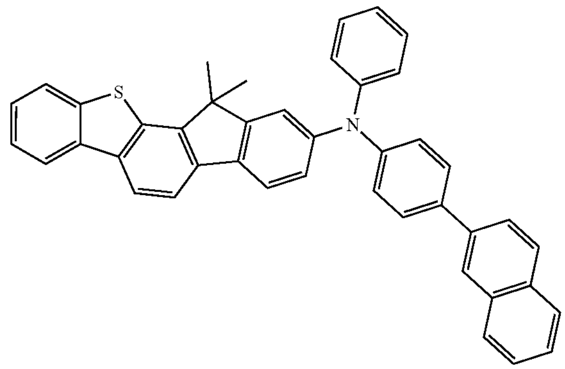
[A-127]
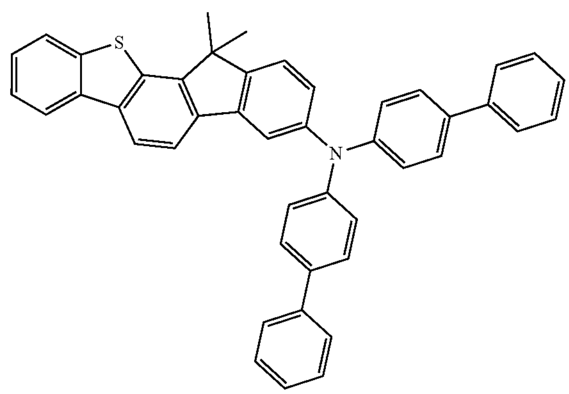
[A-128]
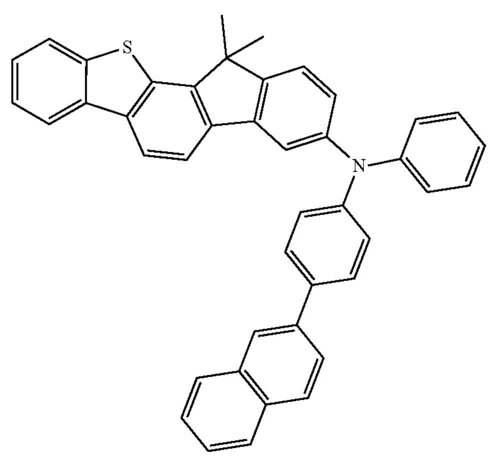
[A-129]
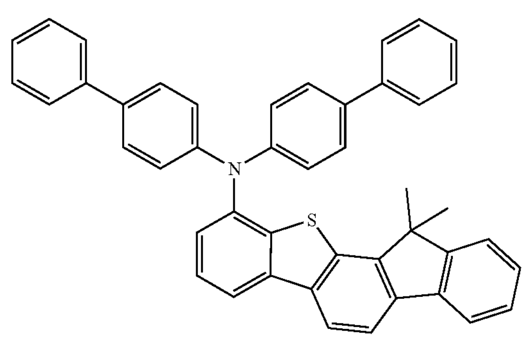

-continued
[A-130]
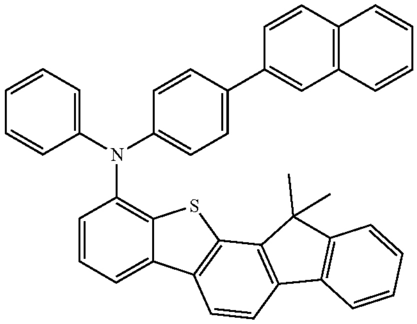
[A-131]
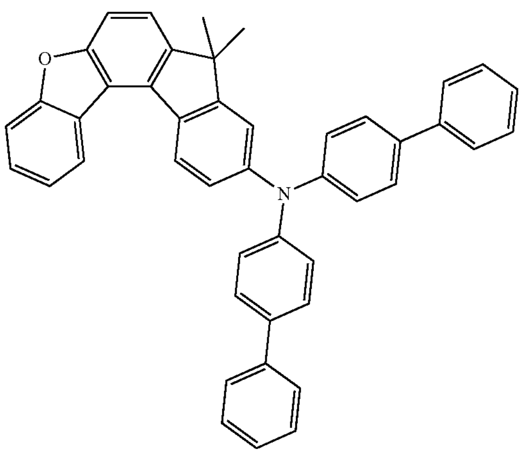
[A-132]
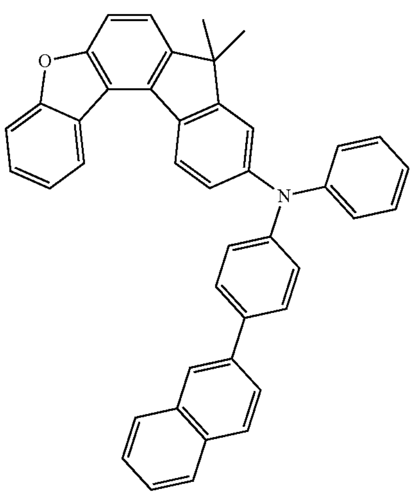
-continued
[A-133]
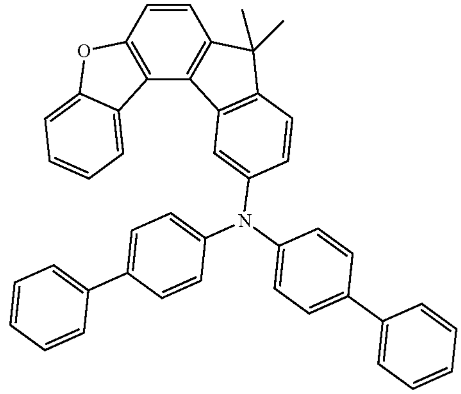
[A-134]
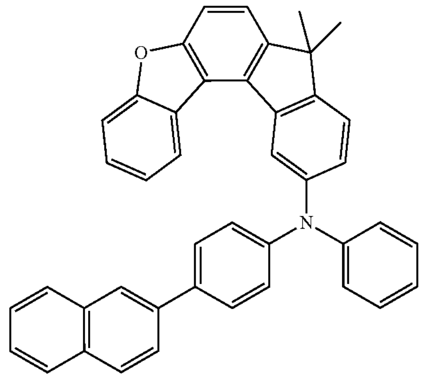
[A-135]
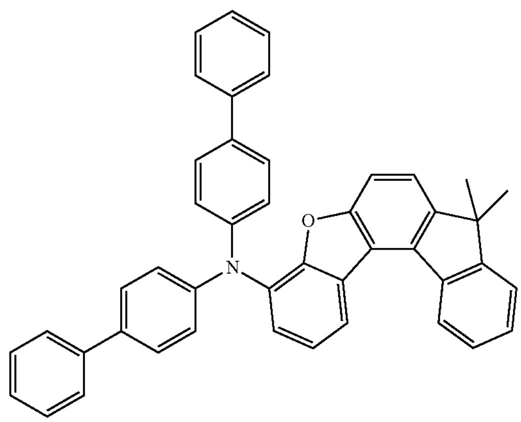
[A-136]
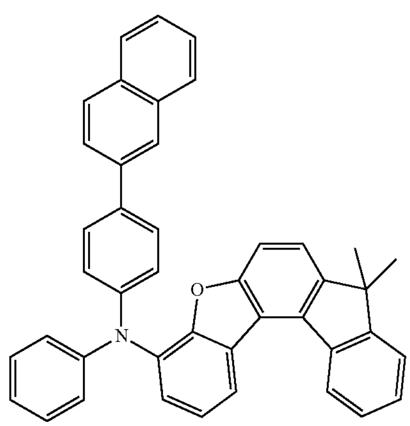

-continued
[A-137]
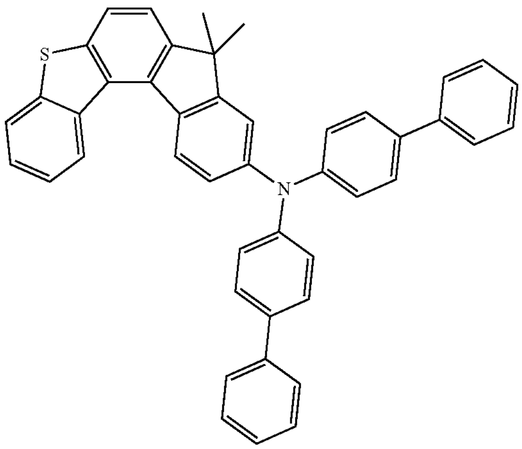
[A-138]
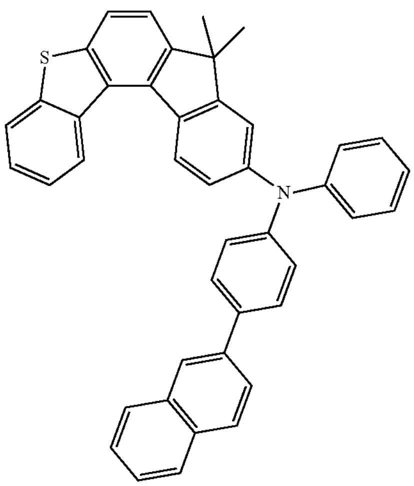
[A-139]
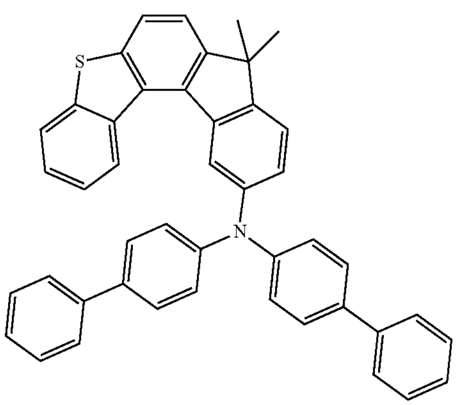
-continued
[A-140]
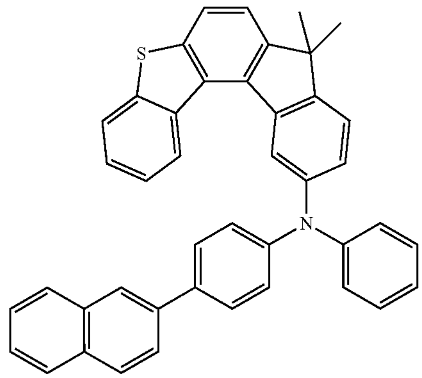
[A-141]
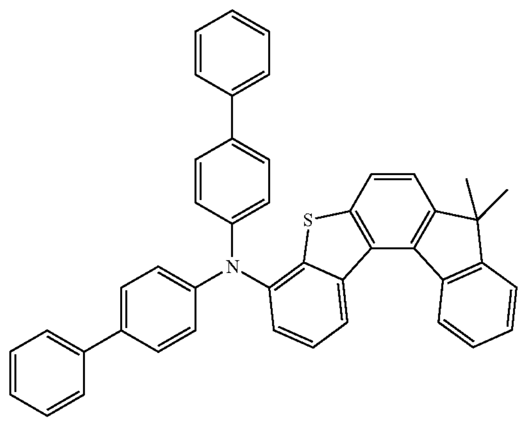
[A-142]
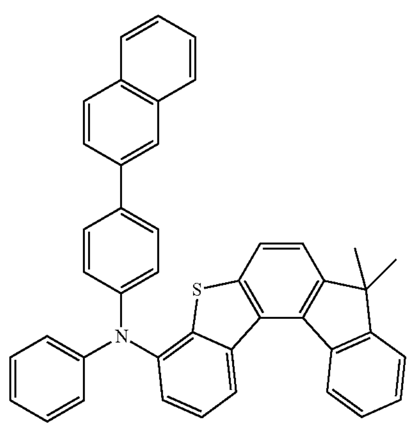

-continued
[A-143]
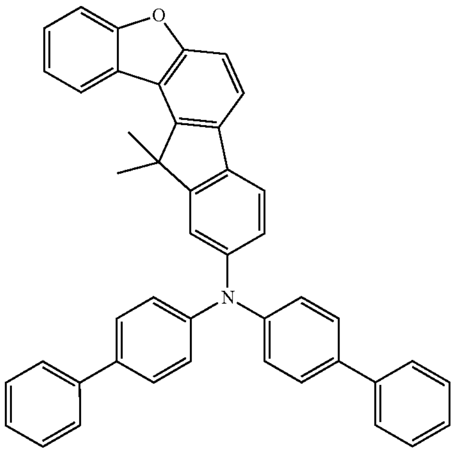
[A-144]
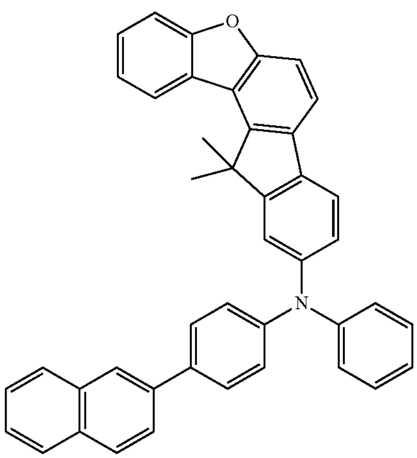
[A-145]
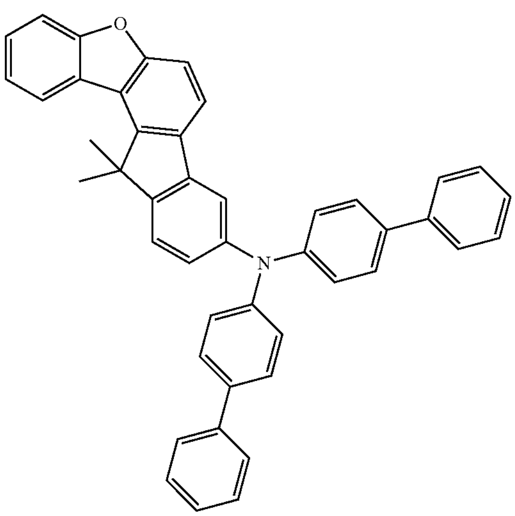
-continued
[A-146]
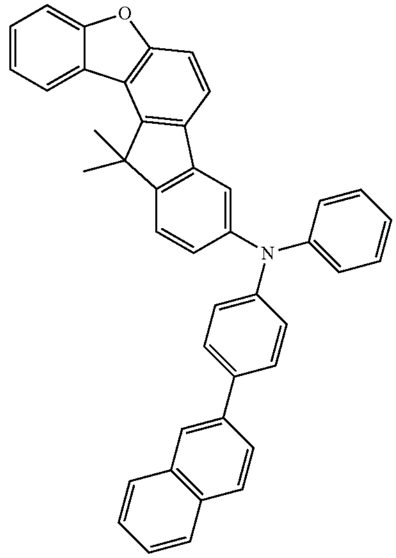
[A-147]
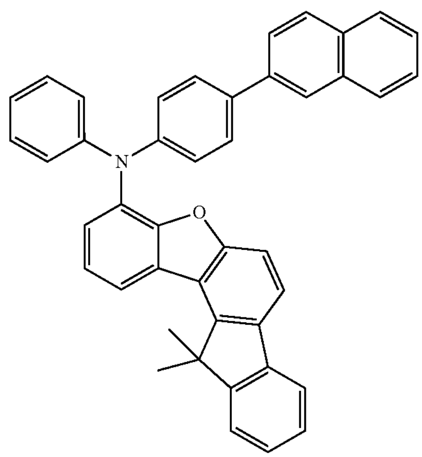
[A-148]
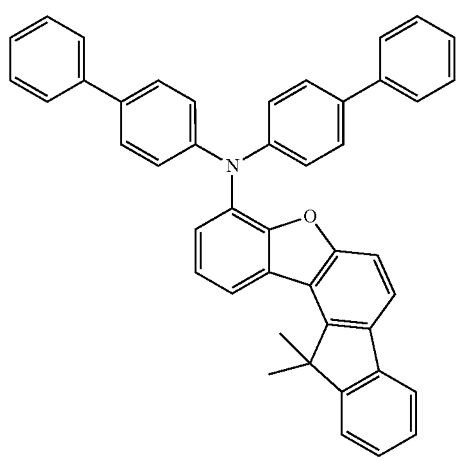

-continued
[A-149]
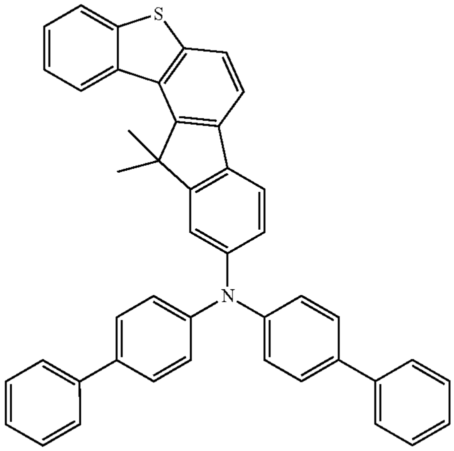
[A-150]
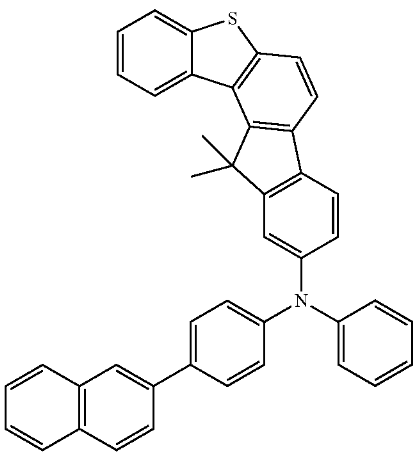
[A-151]
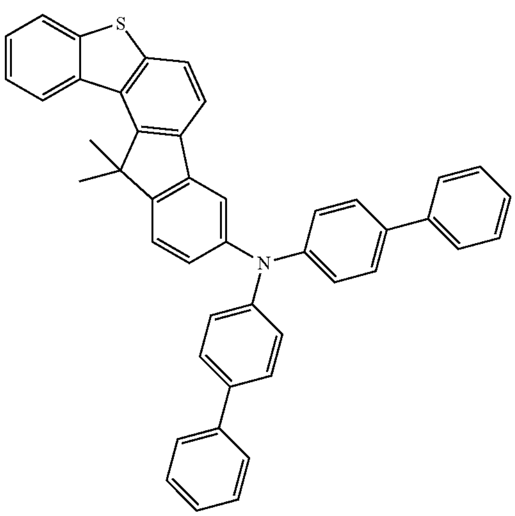
-continued
[A-152]
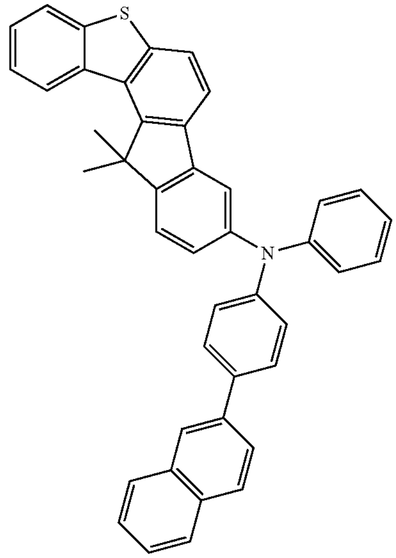
[A-153]
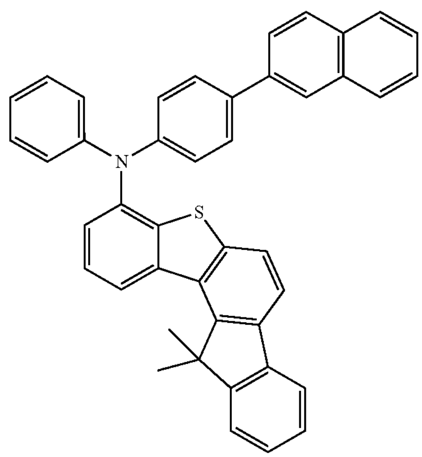
[A-154]
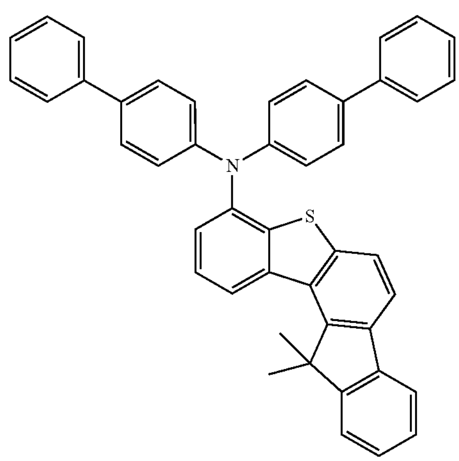

-continued
[A-155]
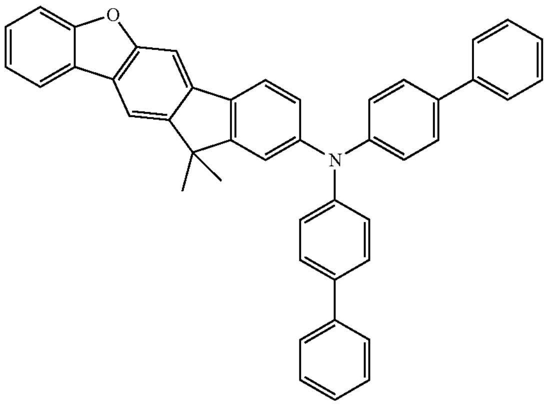
[A-156]
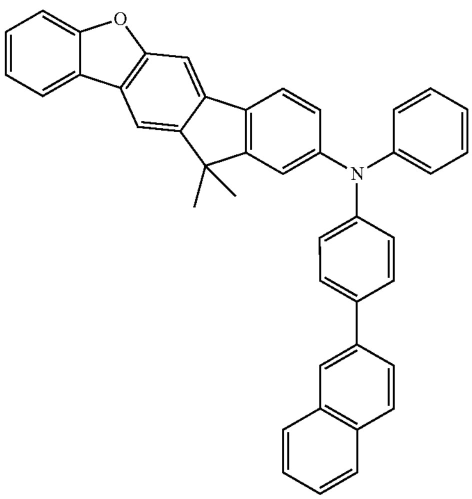
[A-157]
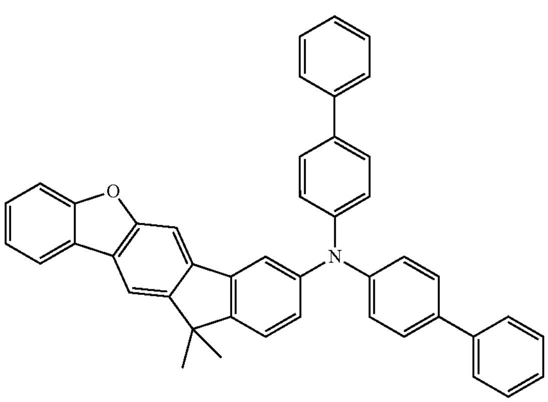
-continued
[A-158]
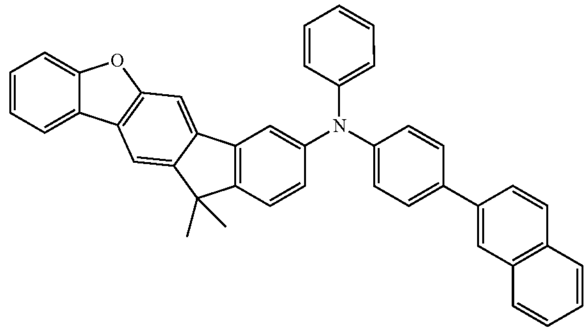
[A-159]
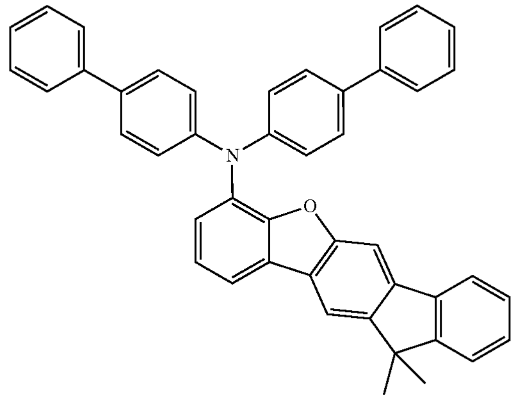
[A-160]
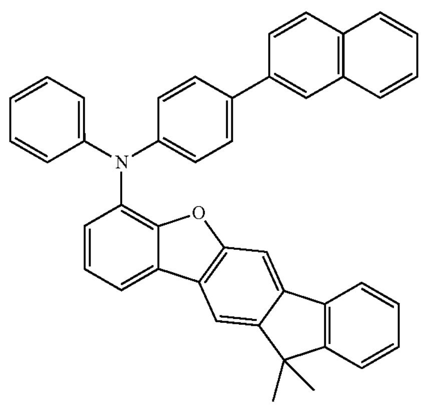
[A-161]
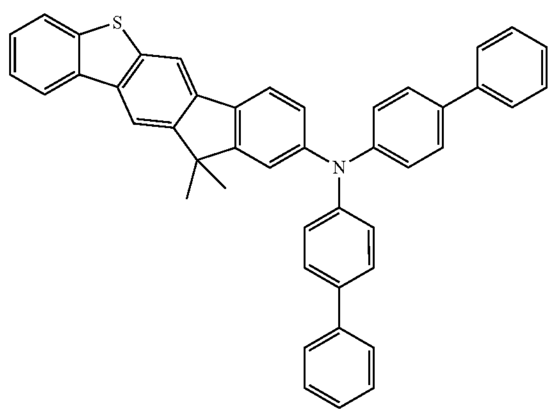

-continued

[A-162]

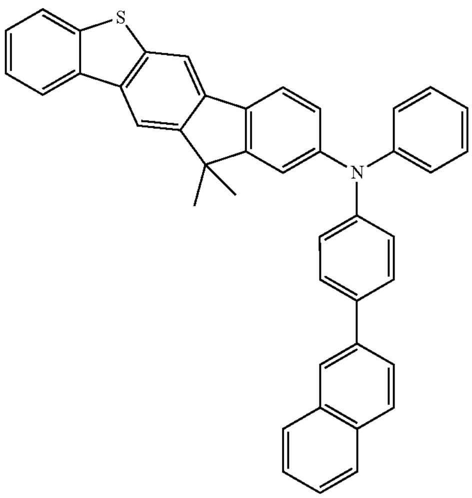

[A-163]

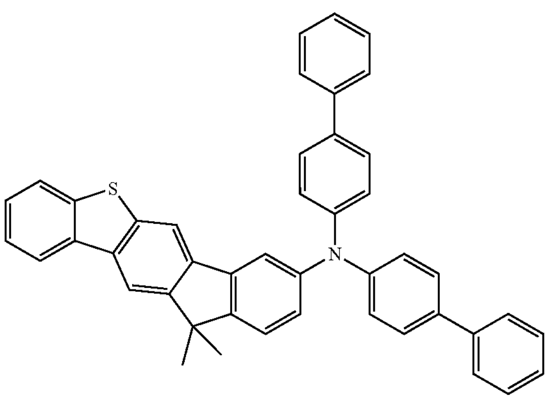

[A-164]

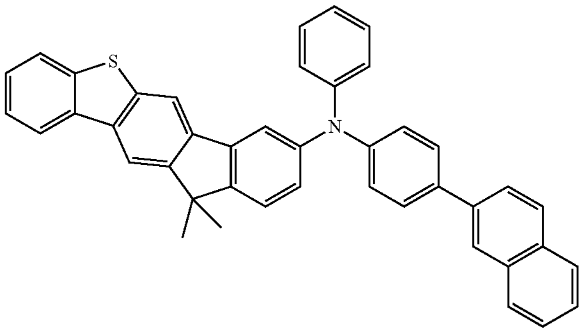

-continued

[A-165]

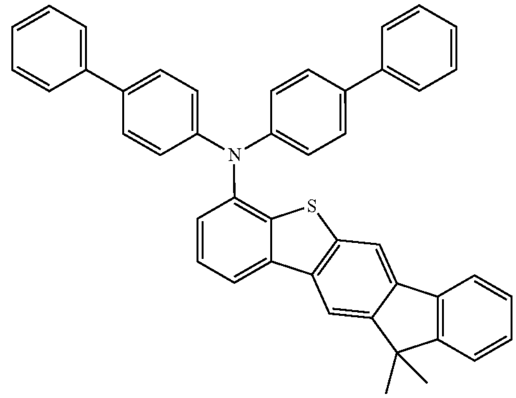

[A-166]

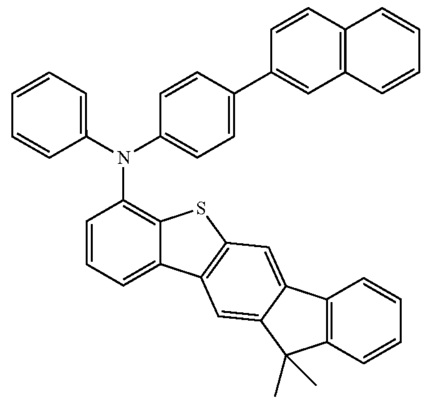

The second compound for an organic optoelectronic device is represented by Chemical Formula 3.

The second compound for an organic optoelectronic device may be a compound having electron characteristics, and may be included with the first compound for an organic optoelectronic device to provide bipolar characteristics.

[Chemical Formula 3]

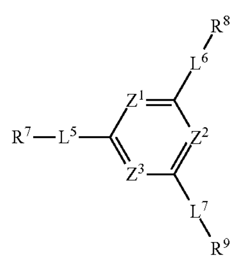

In Chemical Formula 3, $Z^1$ to $Z^3$ are independently N or $CR^d$, wherein $R^d$ is hydrogen, deuterium, a substituted or unsubstituted C1 to C30 alkyl group, a substituted or unsubstituted C6 to C30 aryl group, a substituted or unsubstituted C3 to C30 heterocyclic group, a substituted or unsubstituted silyl group, a substituted or unsubstituted amine group, a halogen, a cyano group, or a combination thereof, at least two of $Z^1$ to $Z^3$ are N, $L^5$ to $L^7$ are independently a single bond, a substituted or unsubstituted C6 to C20 arylene group, a substituted or unsubstituted C2 to C20 heterocyclic group, or a combination thereof, $R^7$ to $R^9$ are independently a substituted or unsubstituted C6 to C30 aryl group, a substituted or unsubstituted C2 to C30 heterocyclic group, or a combination thereof, and at least one of $R^7$ to $R^9$ is a group represented by Chemical Formula b,

[Chemical Formula b]

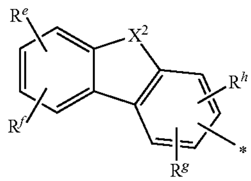

wherein, in Chemical Formula b, $X^2$ is O or S, $R^e$ to $R^h$ are independently hydrogen, deuterium, a substituted or unsubstituted C1 to C30 alkyl group, a substituted or unsubstituted C6 to C30 aryl group, a substituted or unsubstituted C2 to C30 heterocyclic group, a substituted or unsubstituted silyl group, a substituted or unsubstituted amine group, a halogen, a cyano group, or a combination thereof, $R^e$ and $R^f$ are independently present or adjacent groups thereof are linked with each other to form a substituted or unsubstituted aliphatic, aromatic or hetero aromatic ring, $R^g$ and $R^h$ are independently present or adjacent groups thereof are linked with each other to form a substituted or unsubstituted aliphatic, aromatic or hetero aromatic ring, and

* is a linking point with one of $L^5$ to $L^7$.

The second compound for an organic optoelectronic device is a compound capable of accepting electrons when an electric field is applied, that is a compound having electron characteristics, and specifically has a structure where the fused ring represented by at least one Chemical Formula b is linked with a nitrogen-containing ring, that is a pyrimidine or triazine ring, and thus a structure to easily accept electrons when an electric field is applied. Accordingly, it may have good interface characteristics and transport capability of holes and electrons together with the first compound for an organic optoelectronic device, and thus a driving voltage of an organic optoelectronic device including the same may be lowered.

For example, two of $Z^1$ to $Z^3$ may be nitrogen (N) and the other may be $CR^d$.

For example, $Z^1$ and $Z^2$ may be nitrogen and $Z^3$ may be $CR^d$.

For example, $Z^2$ and $Z^3$ may be nitrogen and $Z^1$ may be $CR^d$.

For example, $Z^1$ and $Z^3$ may be nitrogen and $Z^2$ may be $CR^d$.

For example, $Z^1$ to $Z^3$ may independently be nitrogen (N).

For example, $L^5$ to $L^7$ may independently be a single bond or a substituted or unsubstituted C6 to C20 arylene group.

For example, $L^5$ to $L^7$ may independently be a single bond, a substituted or unsubstituted phenylene group, a substituted or unsubstituted biphenylene group, a substituted or unsubstituted terphenylene group, or a substituted or unsubstituted naphthylene group.

For example, $L^5$ to $L^7$ may independently be a single bond, a substituted or unsubstituted m-phenylene group, a substituted or unsubstituted p-phenylene group, or a substituted or unsubstituted biphenylene group. Herein, "substituted" may for example refer to replacement of at least one hydrogen by deuterium, a C1 to C20 alkyl group, a C6 to C20 aryl group, a halogen, a cyano group, or a combination thereof, but is not limited thereto.

For example, $R^7$ to $R^9$ may independently be a substituted or unsubstituted phenyl group, a substituted or unsubstituted biphenyl group, a substituted or unsubstituted terphenyl group, a substituted or unsubstituted quaterphenyl group, a substituted or unsubstituted naphthyl group, a substituted or unsubstituted anthracenyl group, a substituted or unsubstituted phenanthrenyl group, a substituted or unsubstituted triphenylenyl group, a substituted or unsubstituted fluorenyl group, or the group represented by Chemical Formula b.

For example, $R^7$ to $R^9$ may independently be a substituted or unsubstituted phenyl group, a substituted or unsubstituted biphenyl group, a substituted or unsubstituted terphenyl group, a substituted or unsubstituted naphthyl group or the group represented by Chemical Formula b.

For example, the group represented by Chemical Formula b may be for example represented by one of Chemical Formula b-1 to Chemical Formula b-4 according to a binding position.

[Chemical Formula b-1]

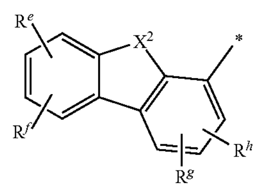

[Chemical Formula b-2]

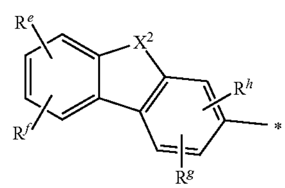

[Chemical Formula b-3]

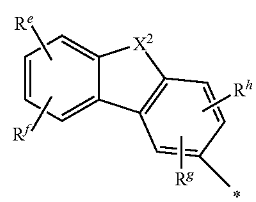

[Chemical Formula b-4]

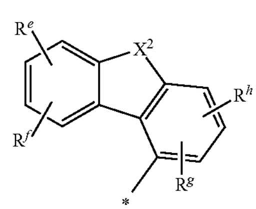

In Chemical Formula b-1 to Chemical Formula b-4, $X^2$ and $R^e$ to $R^h$ are the same as described above.

For example, the group represented by Chemical Formula b may be represented by Chemical Formula b-2 or Chemical Formula b-4.

The second compound for an organic optoelectronic device may be for example represented by one of Chemical Formula 3A to Chemical Formula 3C according to the number of the group represented by Chemical Formula b.

[Chemical Formula 3A]

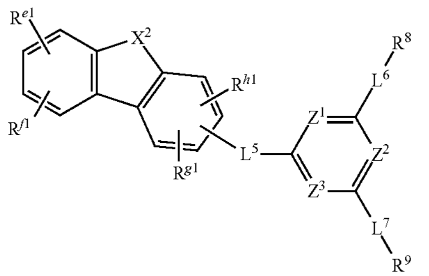

[Chemical Formula 3B]

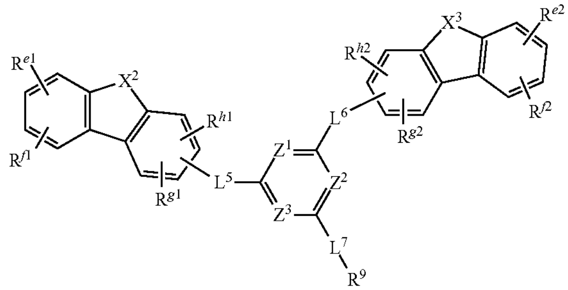

[Chemical Formula 3C]

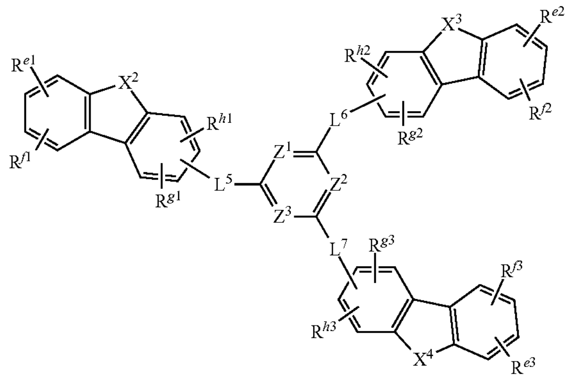

In Chemical Formulae 3A to 3C, $Z^1$ to $Z^3$, $L^5$ to $L^7$, $R^8$, and $R^9$ are the same as described above, $X^2$ to $X^4$ are independently O or S, and $R^{e1}$ to $R^{e2}$, $R^{f1}$ to $R^{f3}$, $R^{g1}$ to $R^{g3}$, and $R^{h1}$ to $R^{h3}$ are independently hydrogen, deuterium, a substituted or unsubstituted C1 to C30 alkyl group, a substituted or unsubstituted C6 to C30 aryl group, a substituted or unsubstituted C3 to C30 heterocyclic group, a substituted or unsubstituted silyl group, a substituted or unsubstituted amine group, a halogen, a cyano group, or a combination thereof.

For example, in Chemical Formula 3B, $X^2$ and $X^3$ may be the same or different.

For example, in Chemical Formula 3B, $X^2$ and $X^3$ may be the same and $X^2$ and $X^3$ may be independently O.

For example, in Chemical Formula 3B, $X^2$ and $X^3$ may be the same and $X^2$ and $X^3$ may be independently S.

For example, in Chemical Formula 3B, $X^2$ and $X^3$ may be different from each other, and $X^2$ may be S, $X^3$ may be O or $X^2$ may be O and $X^3$ may be S.

For example, in Chemical Formula 3C, $X^2$ to $X^4$ may be the same or different.

For example, in Chemical Formula 3C, $X^2$ to $X^4$ may be the same and $X^2$ to $X^4$ may be independently O.

For example, in Chemical Formula 3C, $X^2$ to $X^4$ may be the same and $X^2$ to $X^4$ may be independently S.

For example, in Chemical Formula 3C, one of $X^2$ to $X^4$ may be different, and two of $X^2$ to $X^4$ may be S and one of $X^2$ to $X^4$ may be O or two of $X^2$ to $X^4$ may be O and one of $X^2$ to $X^4$ may be S.

For example, the second compound for an organic optoelectronic device may be represented by Chemical Formula 3A or Chemical Formula 3B.

For example, Chemical Formula 3A may be represented by Chemical Formula 3A-1 or Chemical Formula 3A-2.

[Chemical Formula 3A-1]

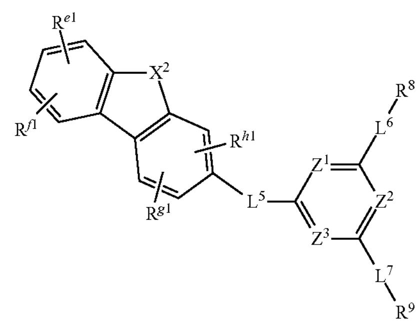

[Chemical Formula 3A-2]

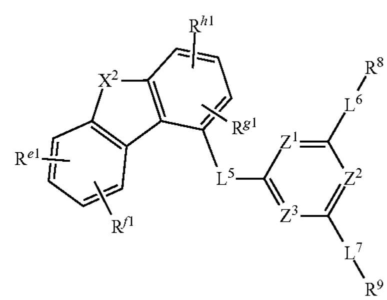

In Chemical Formula 3A-1 and Chemical Formula 3B-1, $X^2$, $Z^1$ to $Z^3$, $R^8$, $R^9$, $L^5$ to $L^7$, $R^{e1}$, $R^{f1}$, $R^{g1}$, and $R^{h1}$ are the same as described above.

For example, in Chemical Formula 3A-1 and Chemical Formula 3B-1, $X^2$ may be O, $Z^1$ to $Z^3$ may independently be N, $R^g$ and $R^9$ may independently be a substituted or unsubstituted phenyl group, a substituted or unsubstituted biphenyl group, a substituted or unsubstituted terphenyl group, or a substituted or unsubstituted naphthyl group, $L^5$ may be a single bond, $L^6$ and $L^7$ may independently be a single bond or a phenylene group, and $R^{e1}$, $R^{f1}$, $R^{g1}$, and $R^{h1}$ may independently be hydrogen or a phenyl group.

For example, Chemical Formula 3B may be represented by Chemical Formula 3B-1.

[Chemical Formula 3B-1]

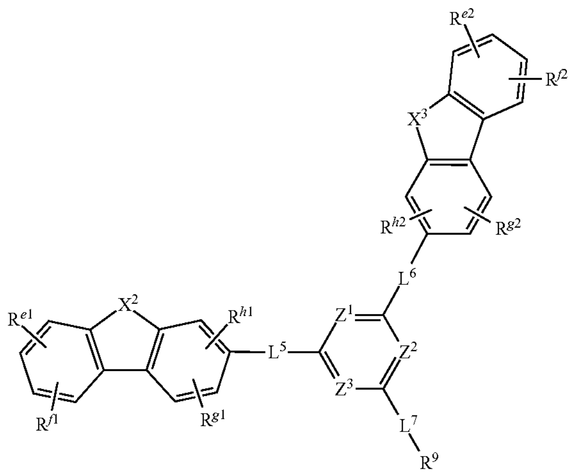

In Chemical Formula 3B-1, $X^2$, $X^3$, $Z^1$ to $Z^3$, $R^9$, $L^5$ to $L^7$, $R^{e1}$, $R^{e2}$, $R^{f1}$, $R^{f2}$, $R^{g1}$, $R^{g2}$, $R^{h1}$, and $R^{h2}$ are the same as described above.

For example, in Chemical Formula 3B-1, $X^2$ and $X^3$ may independently be O, $Z^1$ to $Z^3$ may independently be N, $R^9$ may be a substituted or unsubstituted phenyl group, or a substituted or unsubstituted biphenyl group, $L^5$ to $L^7$ may independently be a single bond or a phenylene group, and $R^{e1}$, $R^{e2}$, $R^{f1}$, $R^{f2}$, $R^{g1}$, $R^{g2}$, $R^{h1}$, and $R^{h2}$ may independently be hydrogen or a phenyl group.

The second compound for an organic optoelectronic device represented by Chemical Formula 3B-1 has an effectively expanded LUMO energy band and increased planarity of a molecular structure, thus may have a structure easily accepting electrons, when an electric field is applied, and accordingly, much lower a driving voltage of an organic optoelectronic device manufactured by applying the second compound for an organic optoelectronic device. In addition, this expansion of LUMO and the fusion of rings increases stability regarding electrons of the pyrimidine or triazine ring and thus effectively improves a life-span of the organic optoelectronic device manufactured by applying the second compound for an organic optoelectronic device.

The second compound for an organic optoelectronic device may be for example one of compounds of Group 2, but is not limited thereto.

[Group 2]

B-1

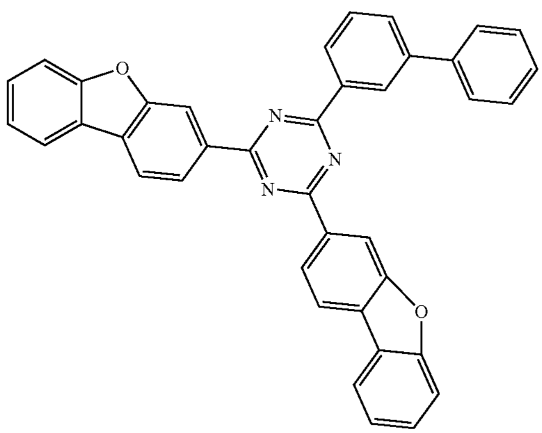

B-2

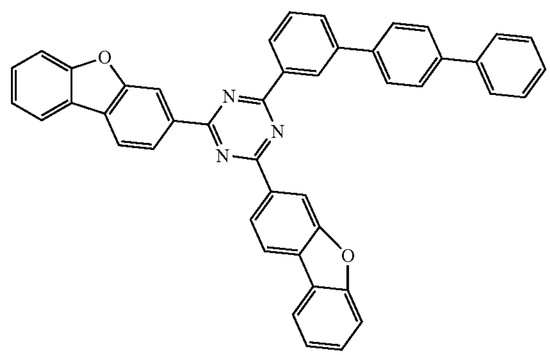

B-3

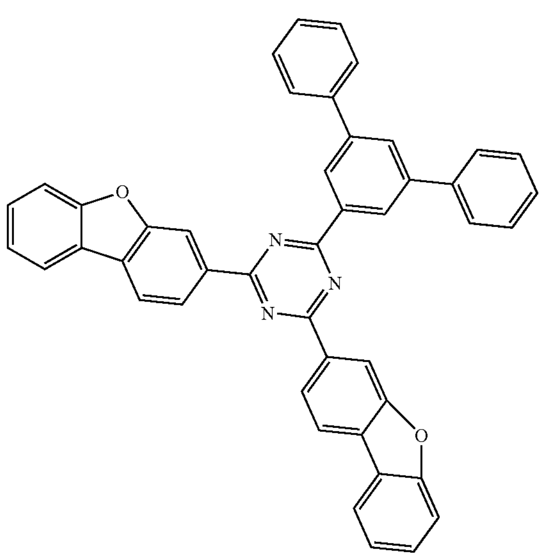

B-4

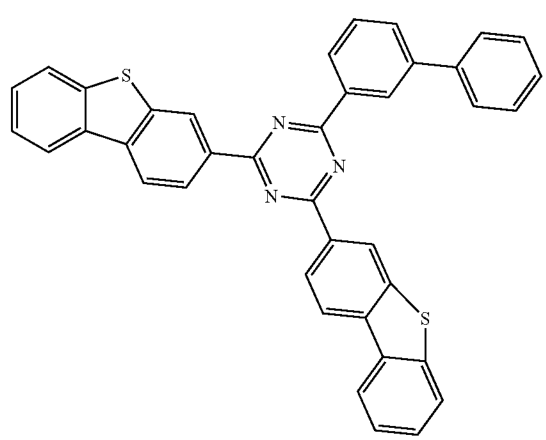

-continued
B-5
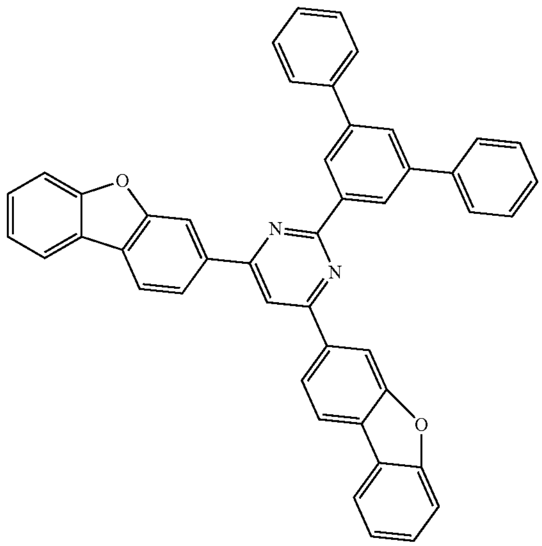
B-6
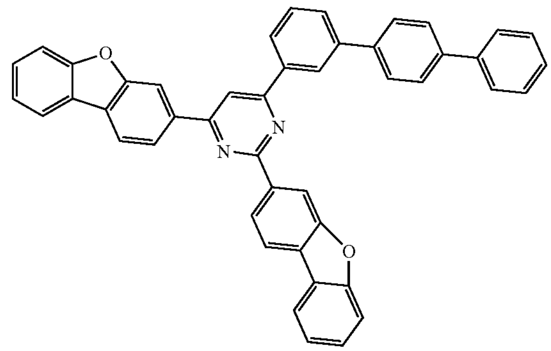
B-7
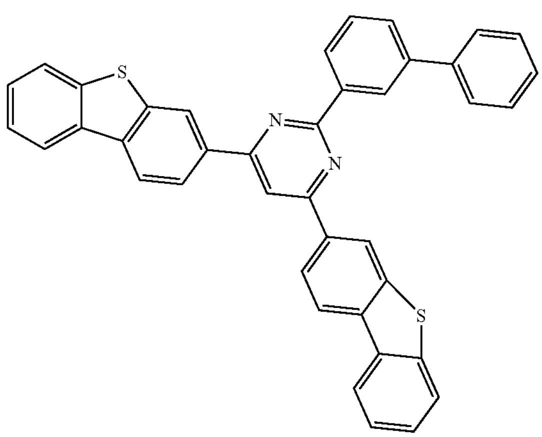
B-8
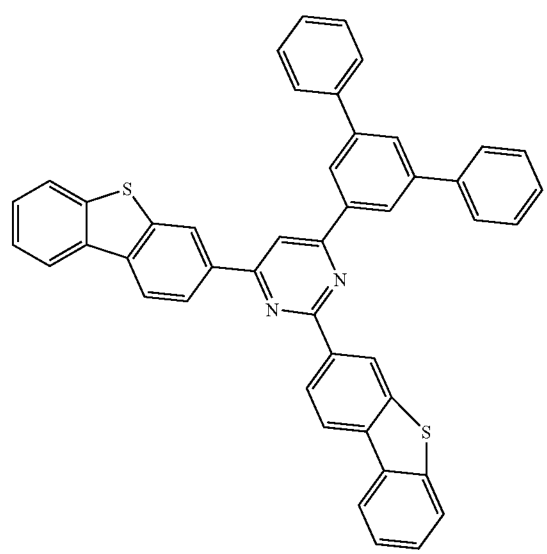
B-9
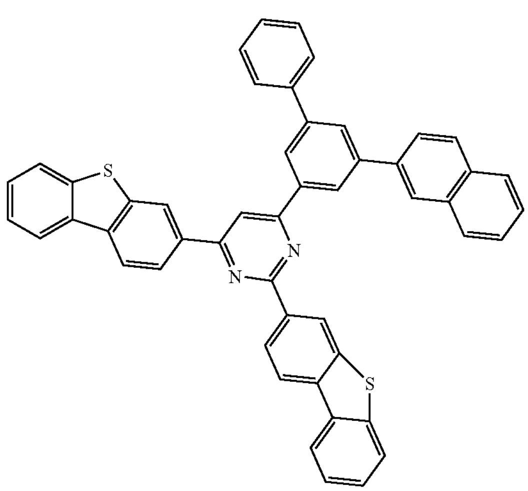
B-10
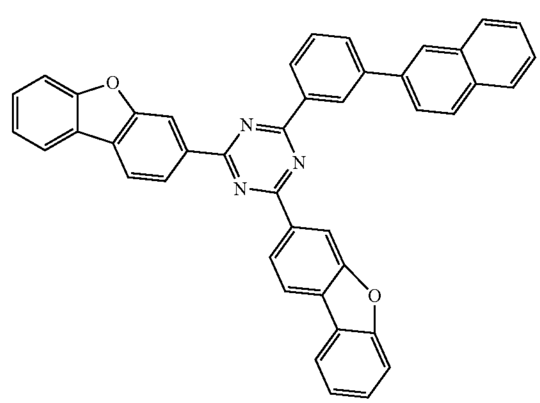

-continued
B-11
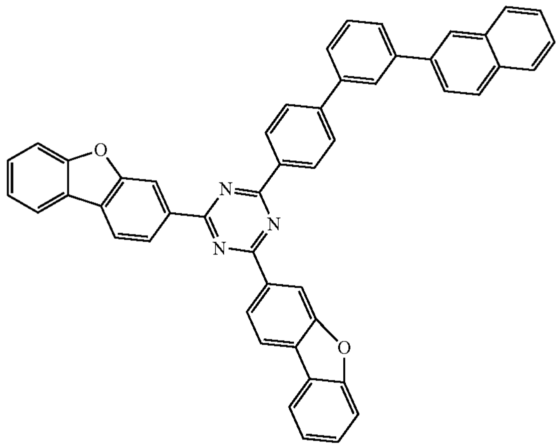
B-12
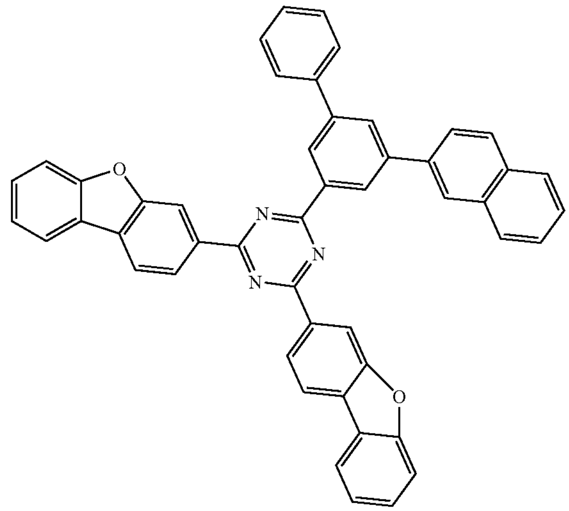
B-13
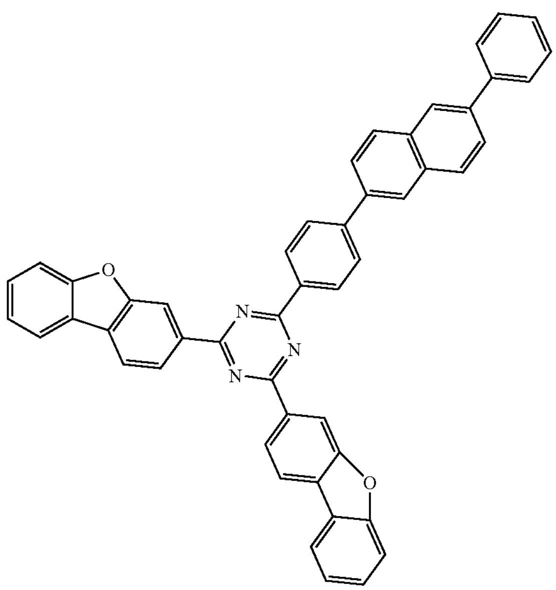
B-14
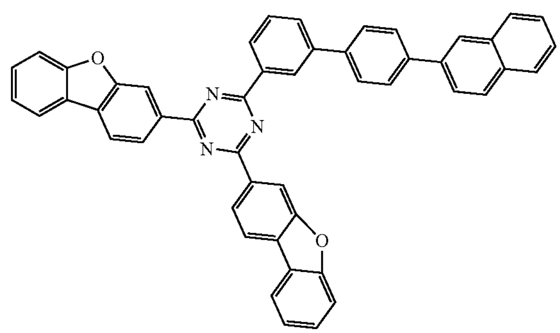
B-15
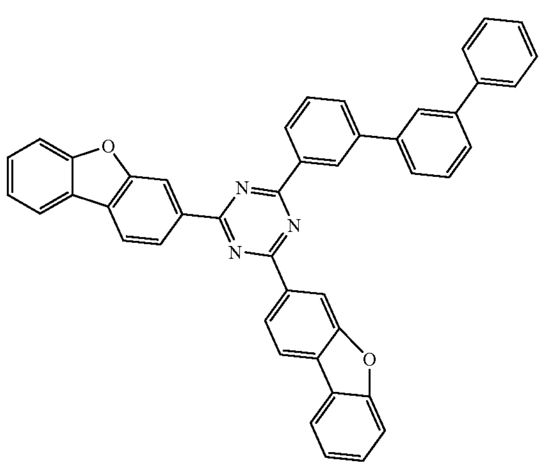
B-16
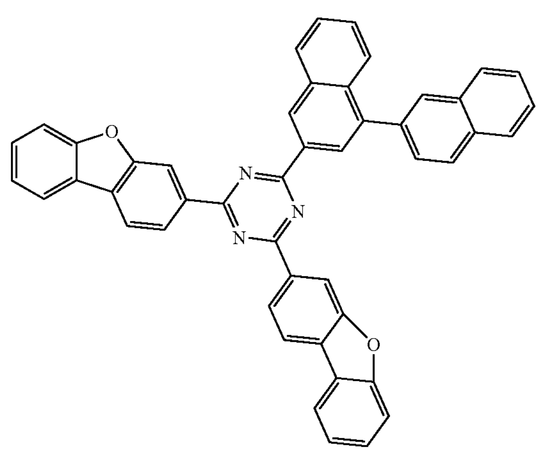

-continued
B-17
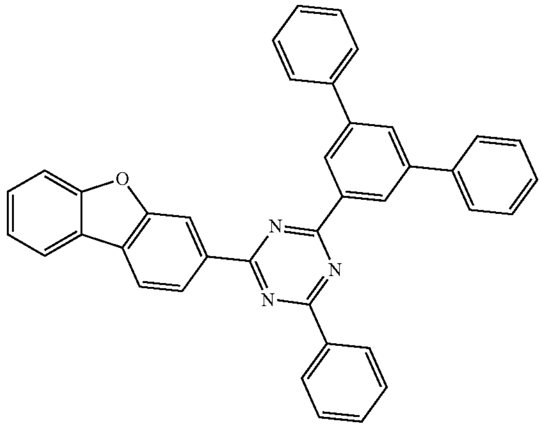
B-18
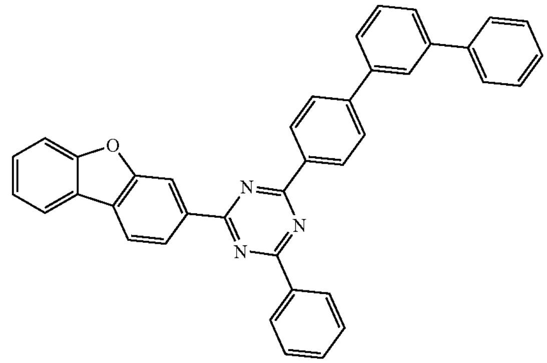
B-19
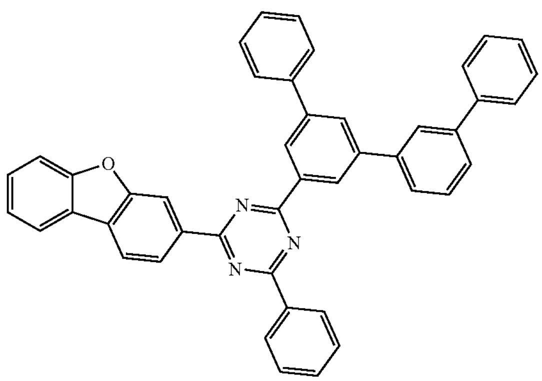
B-20
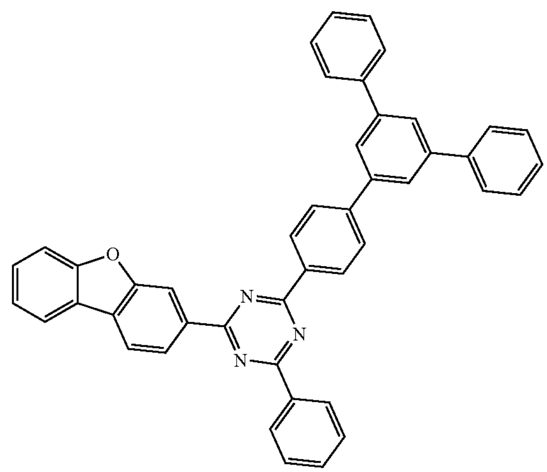
B-21
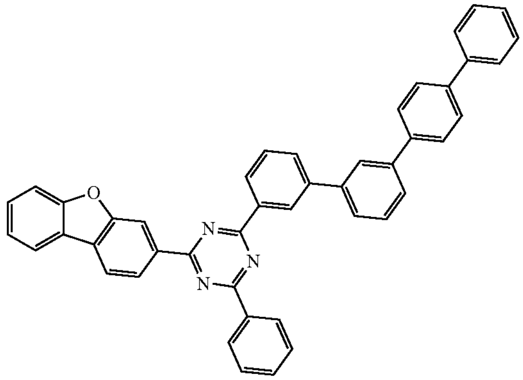
B-22
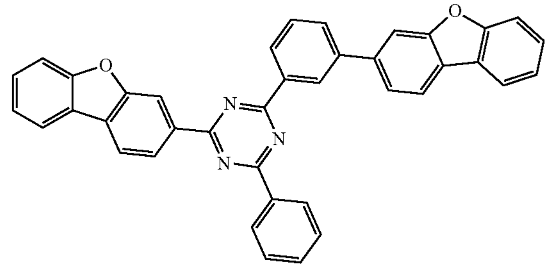

-continued
B-23
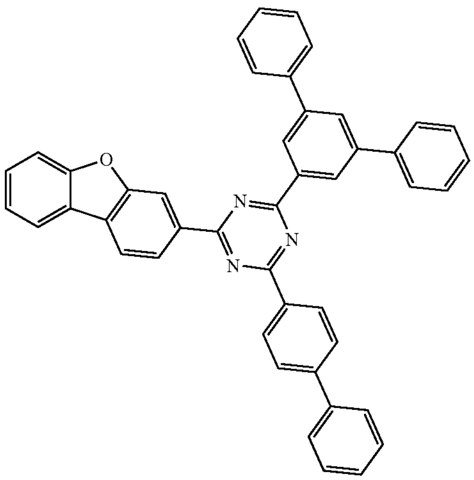
B-24
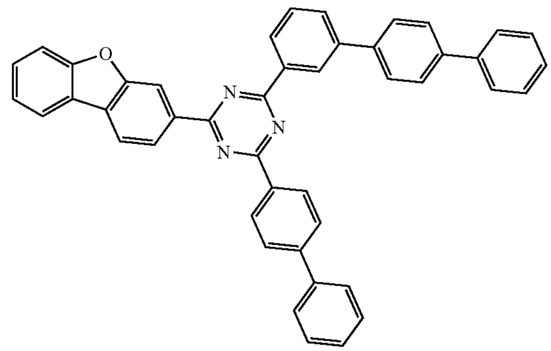
B-25
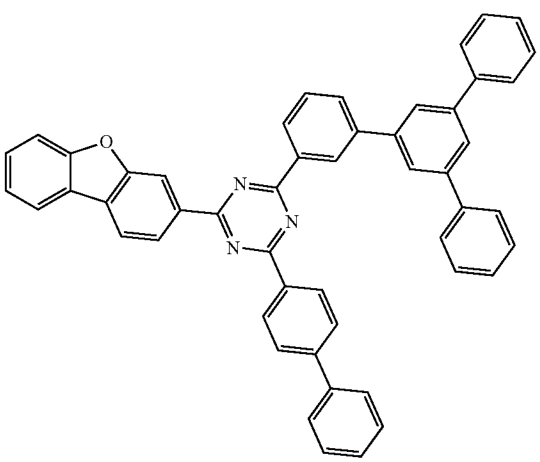
B-26
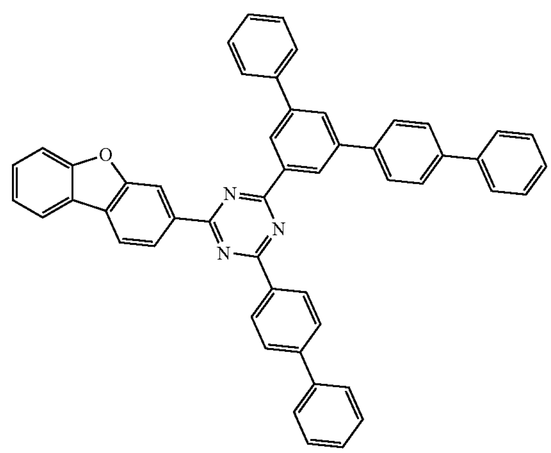
B-27
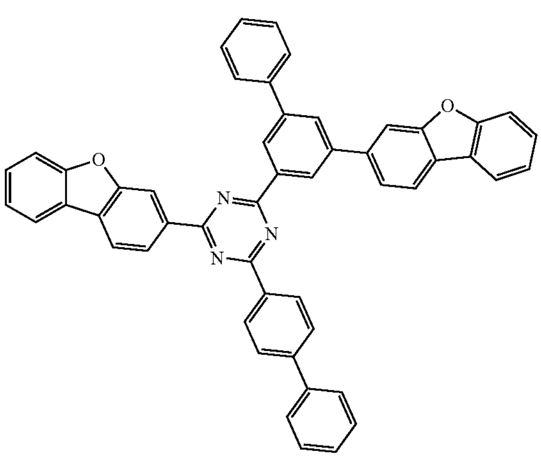
B-28
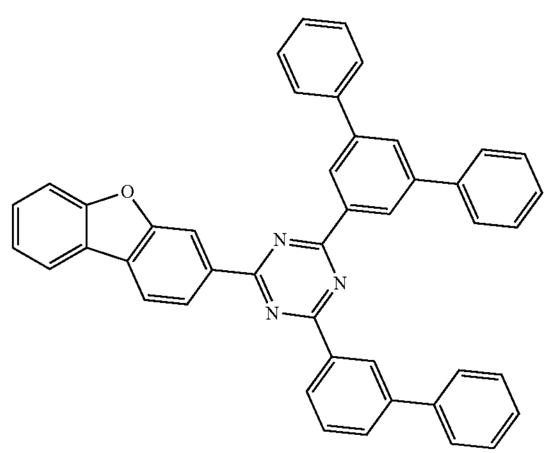

-continued
B-29
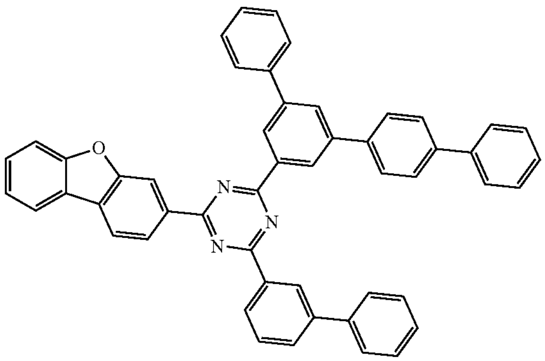
B-30
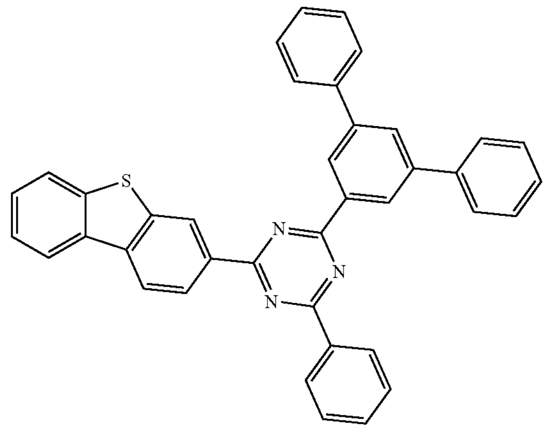
B-31
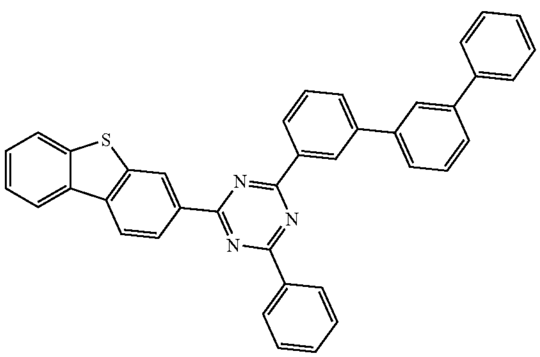
B-32
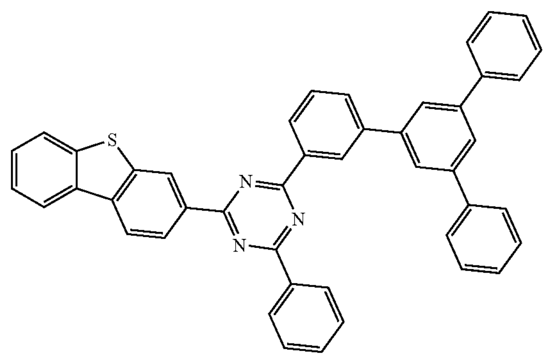
B-33
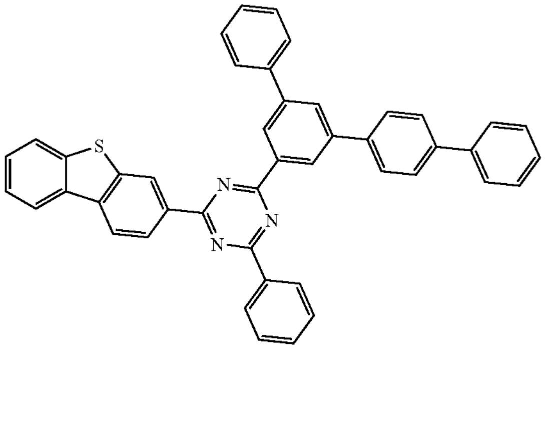
B-34
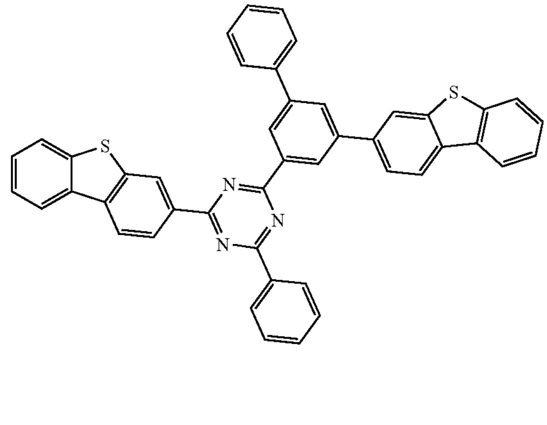

-continued
B-35
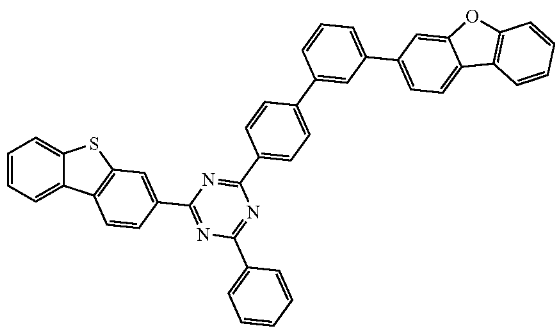
B-36
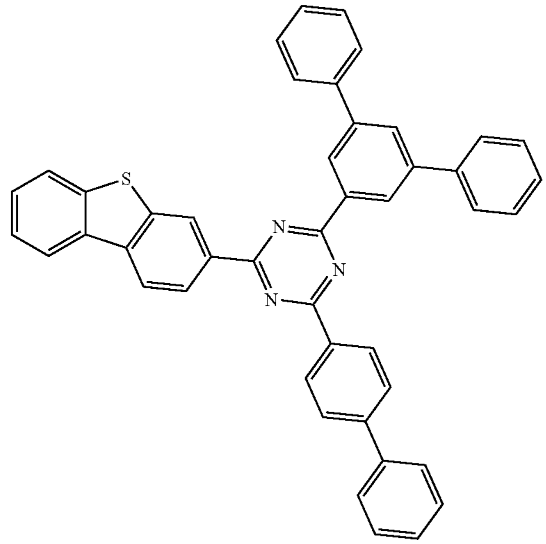
B-37
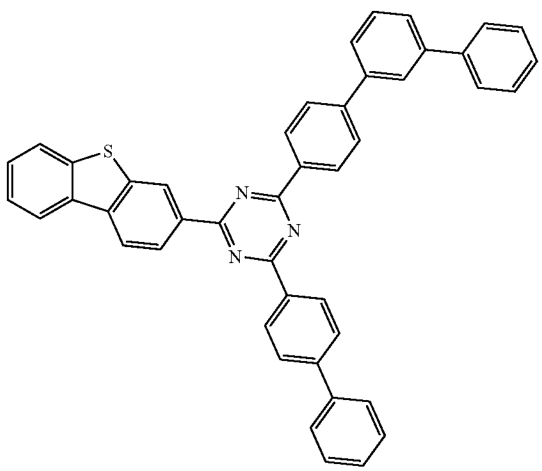
B-38
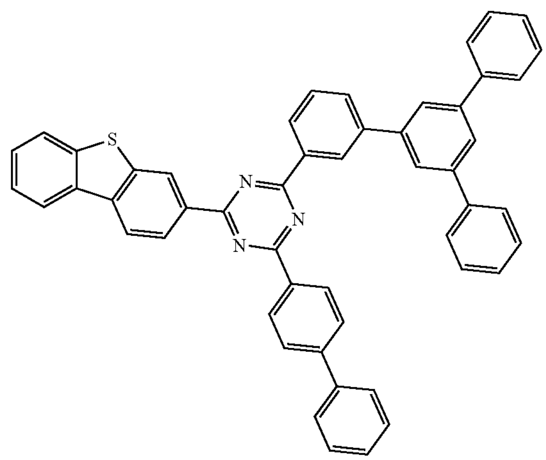
B-39
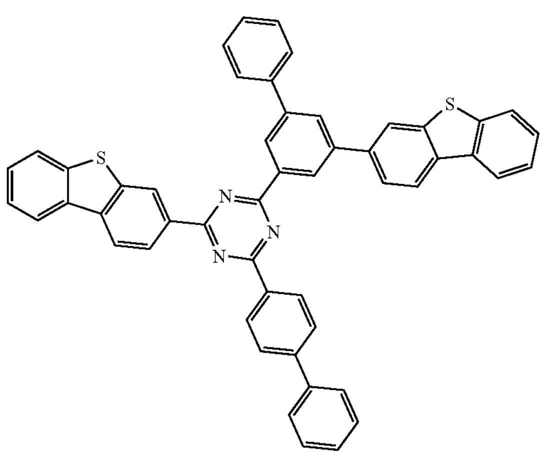
B-40
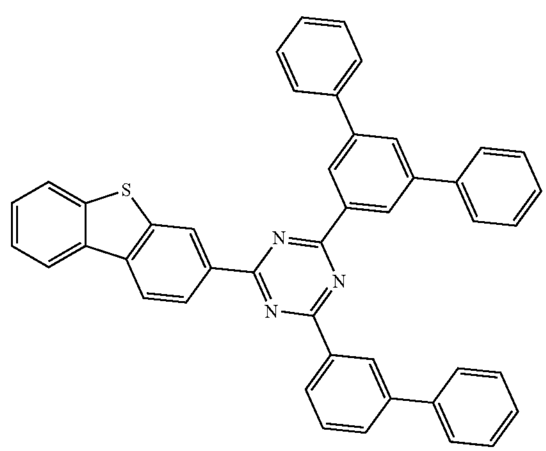

-continued
B-41
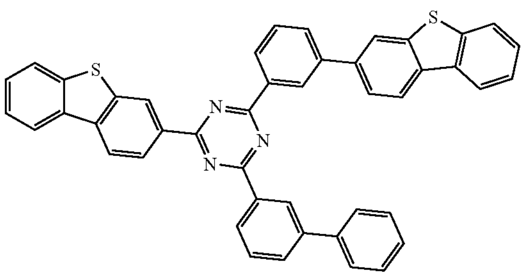
B-42
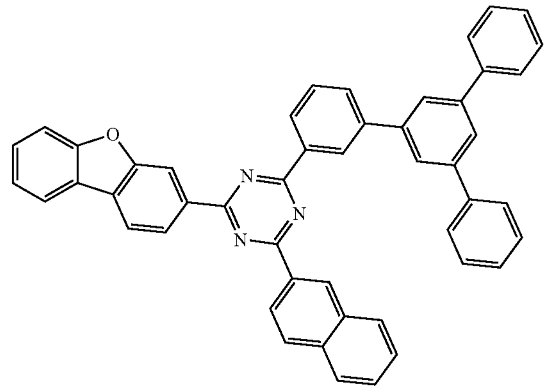
B-43
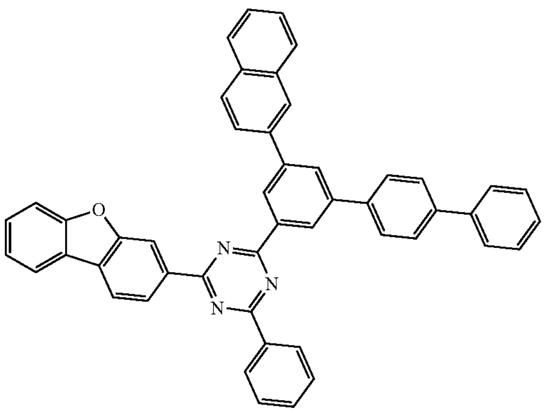
B-44
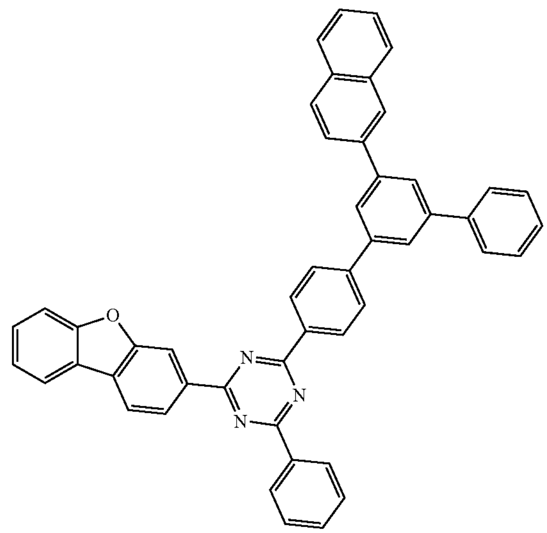
B-45
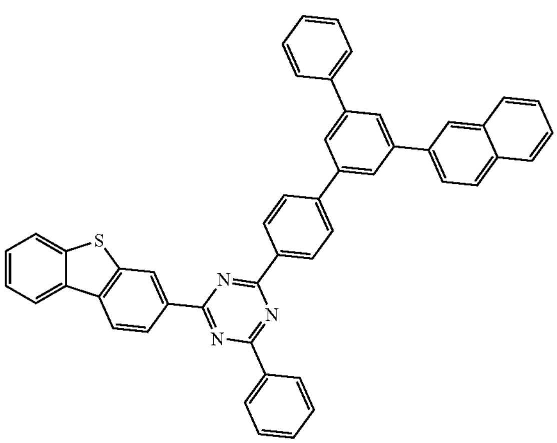
B-46
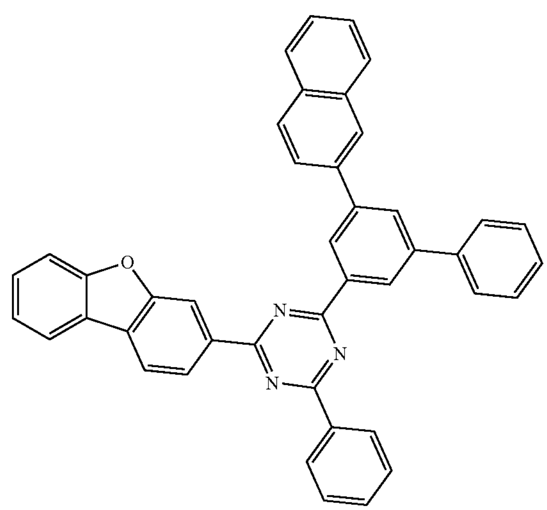

-continued
B-47
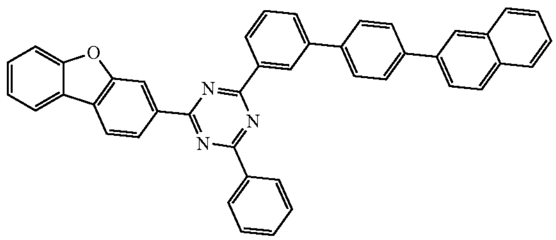
B-48
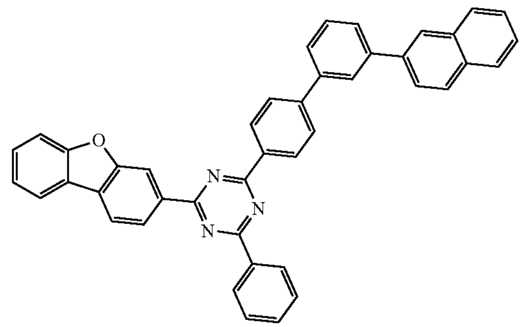
B-49
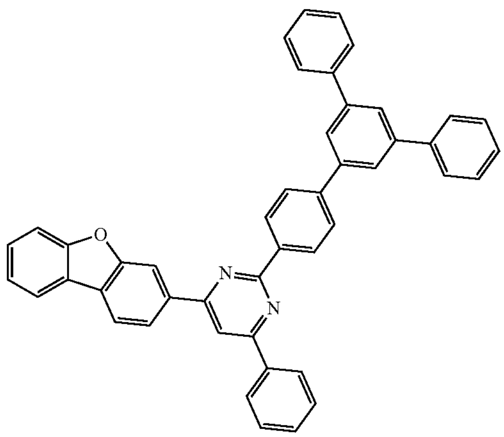
B-50
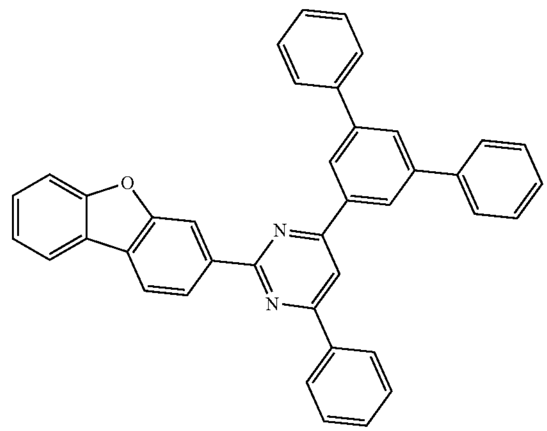
B-51
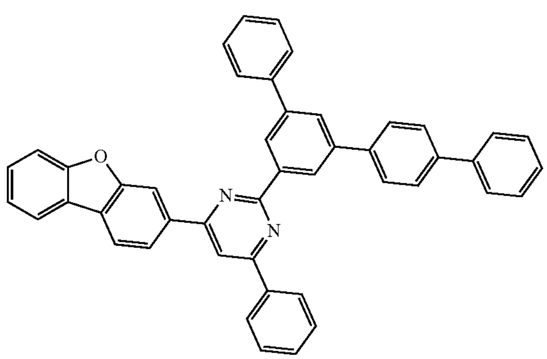
B-52
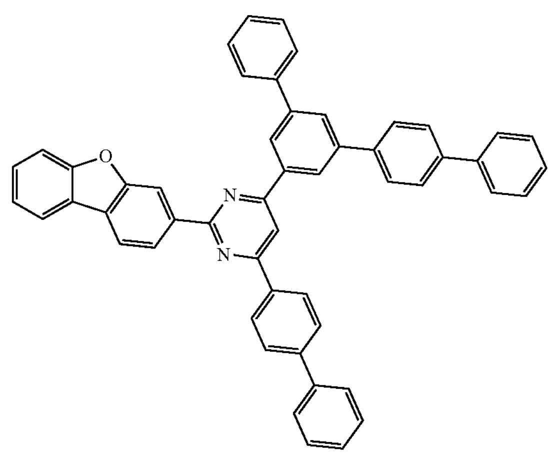
B-53
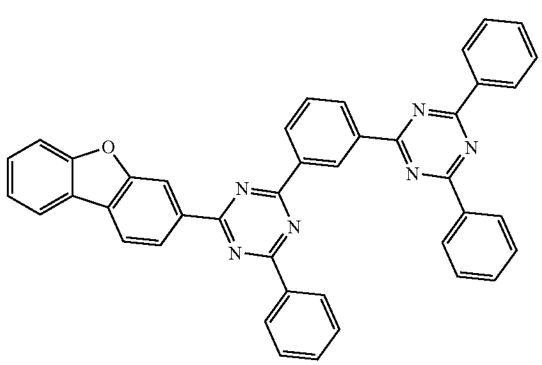
B-54
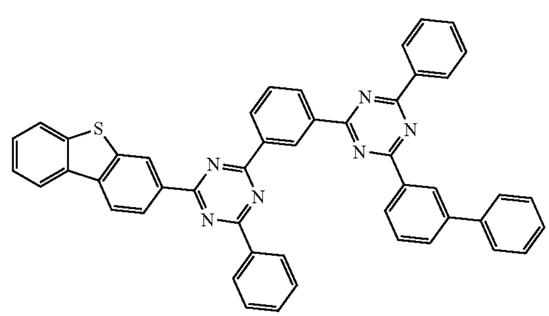

-continued
B-55
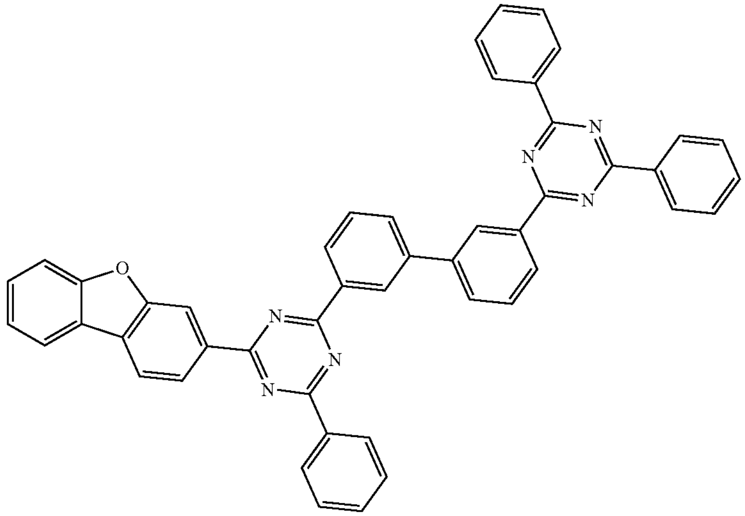
B-56
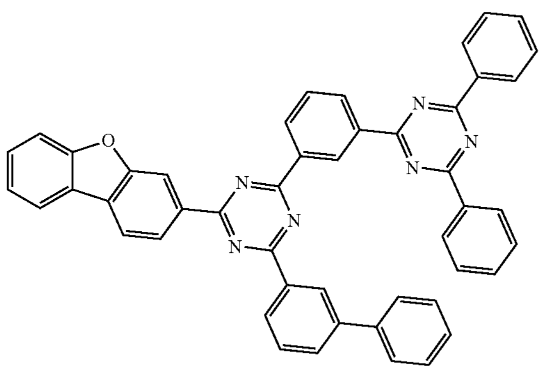
B-57
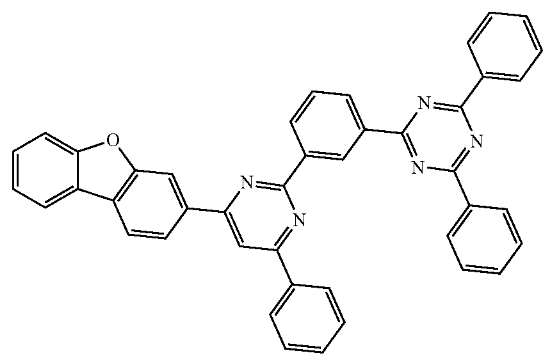
B-58
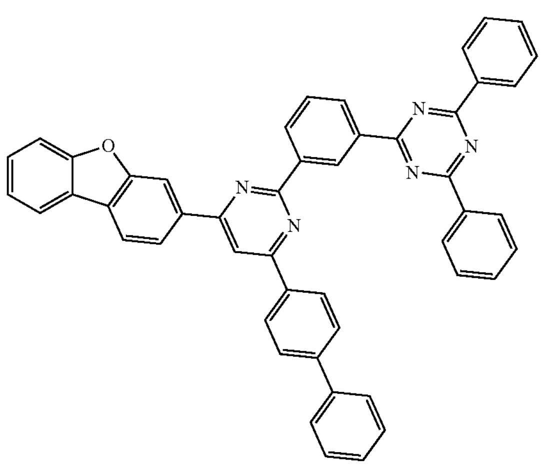
B-59
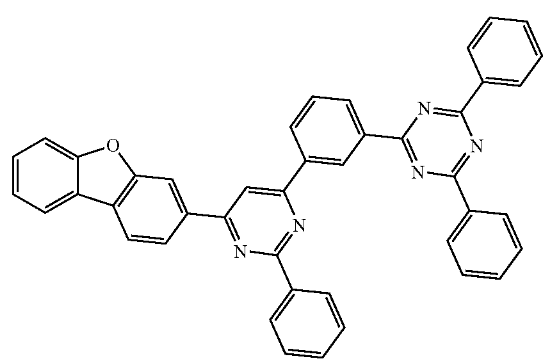

-continued
B-60
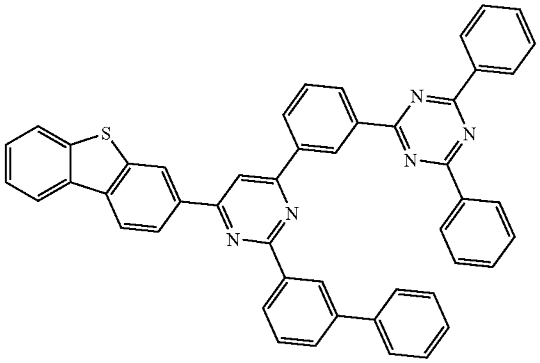
B-61
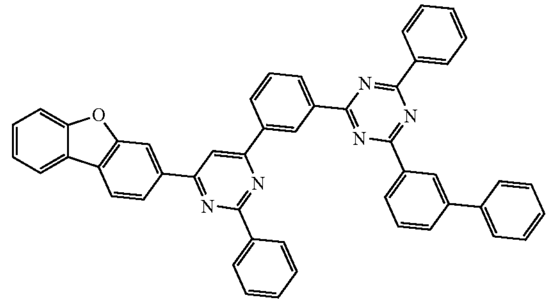
B-62
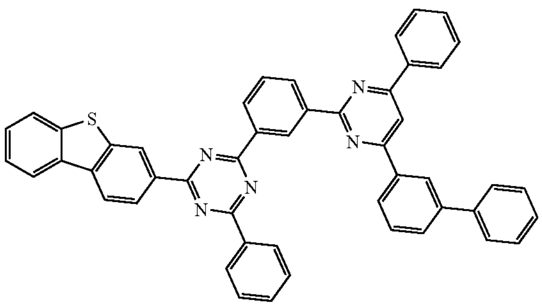
B-63
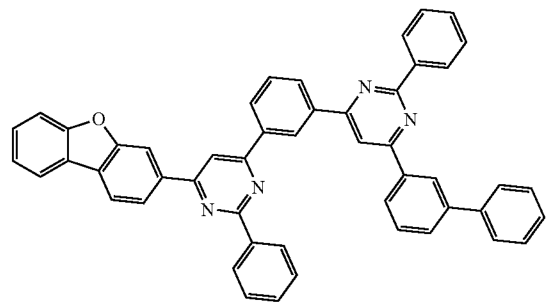
B-64
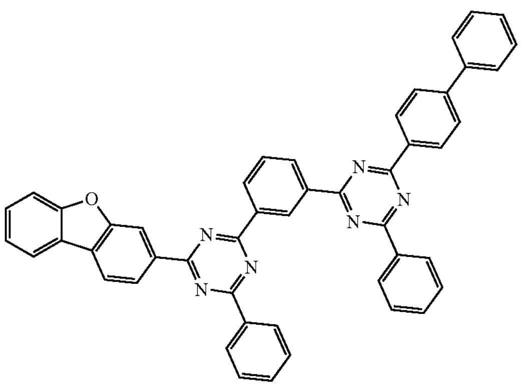
B-65
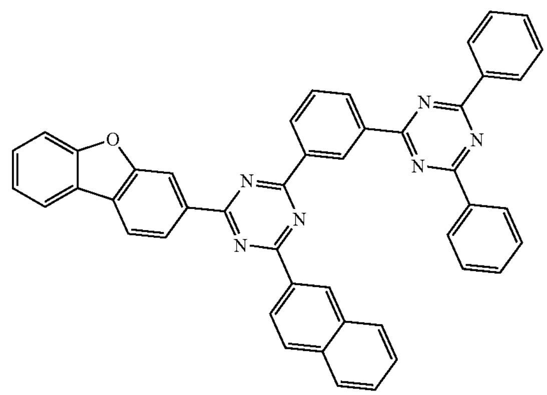
B-66
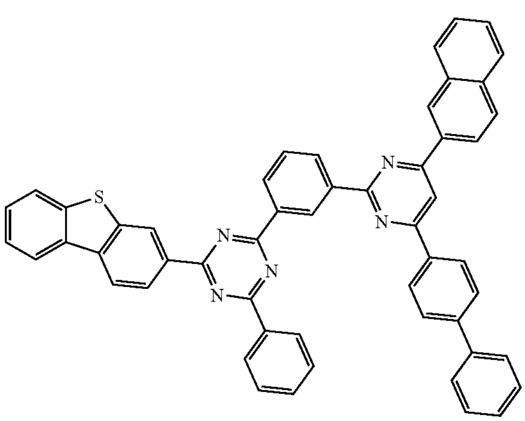

-continued
B-67
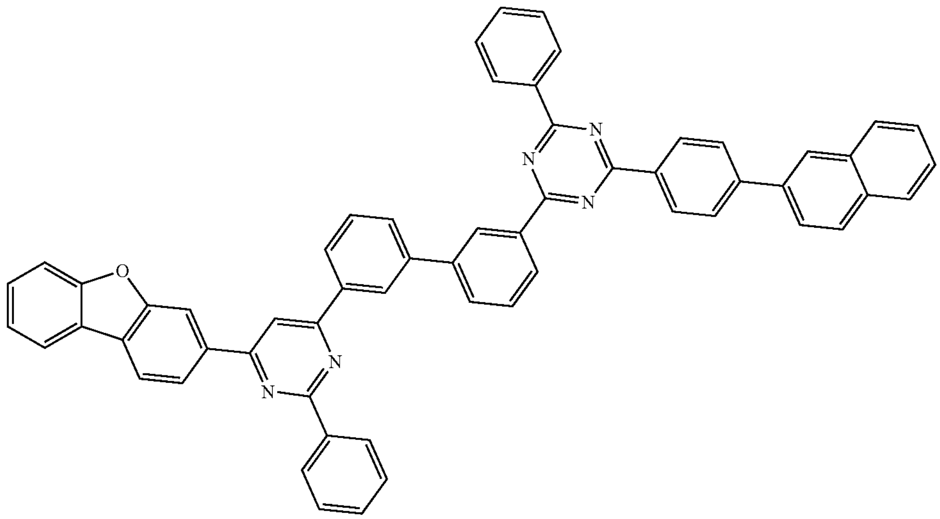
B-68
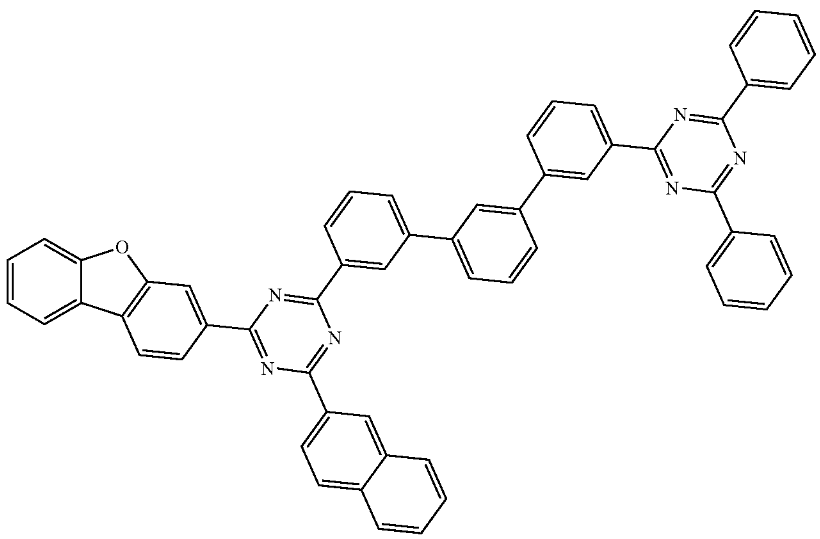
B-69
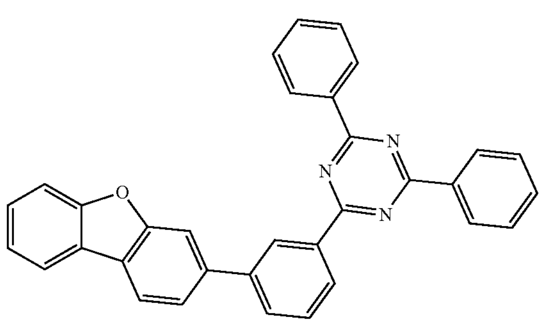
B-70
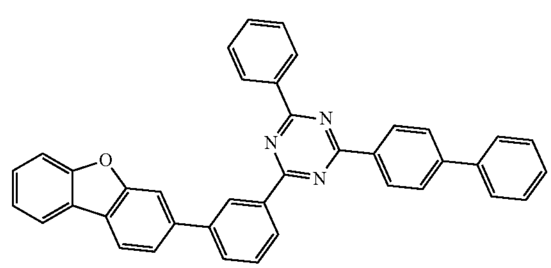

-continued
B-71
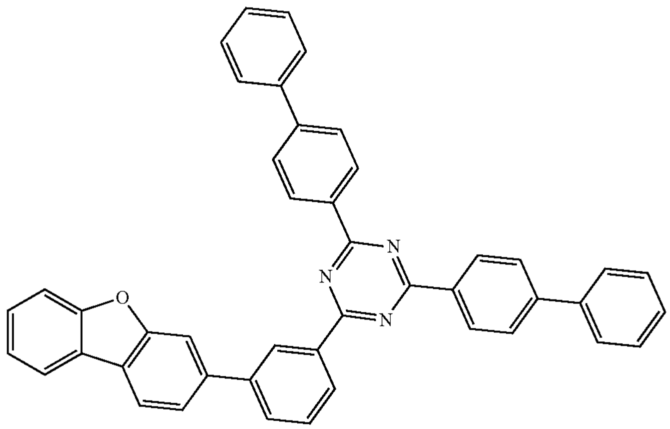
B-72
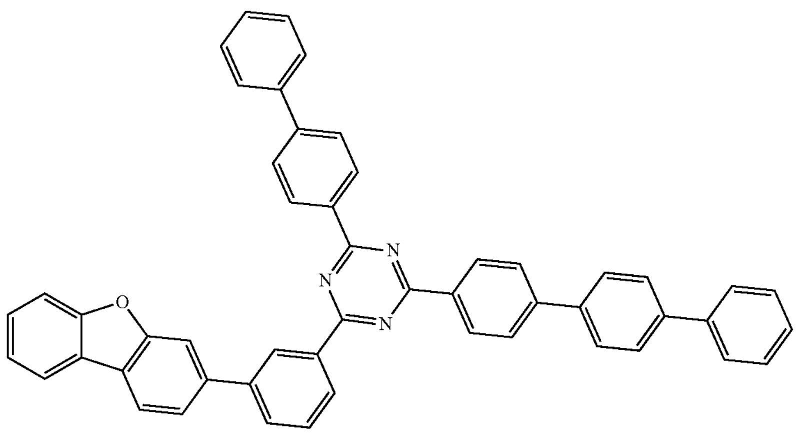
B-73
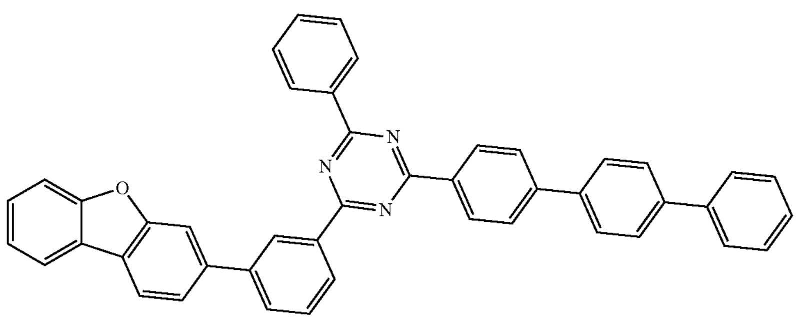
B-74
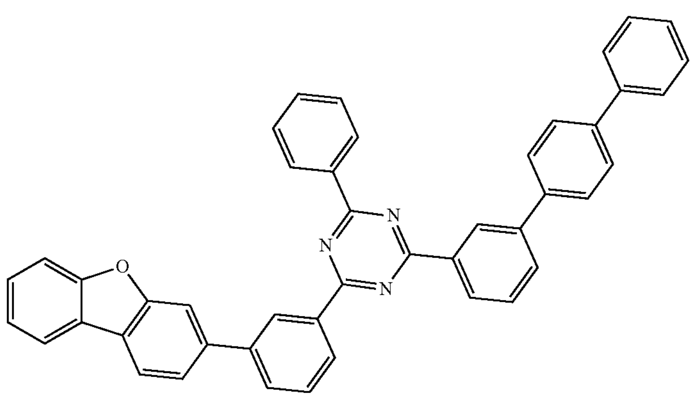

-continued
B-75
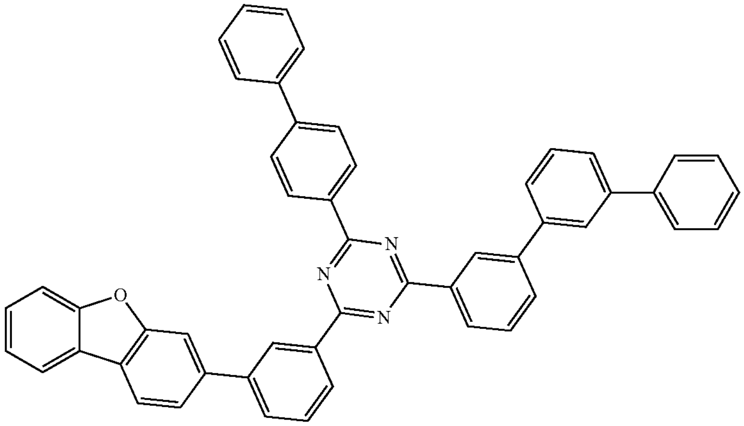
B-76
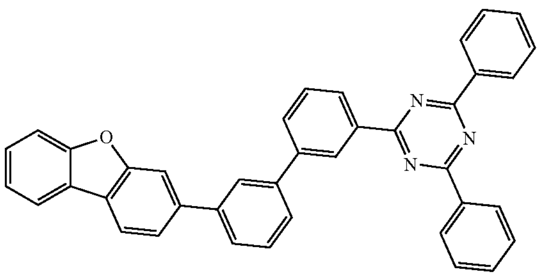
B-77
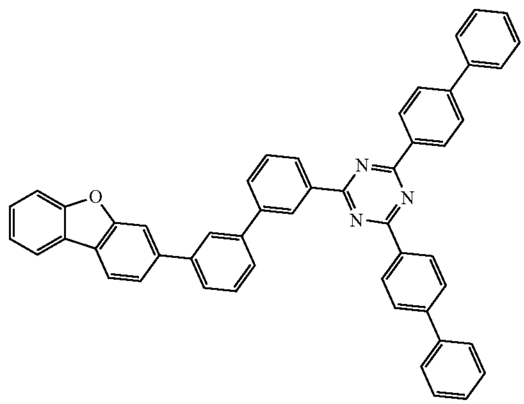
B-78
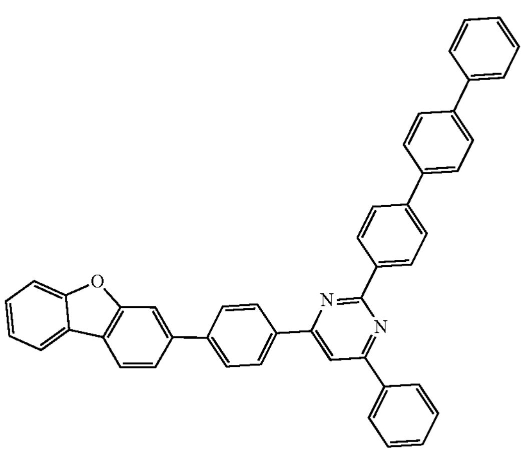
B-79
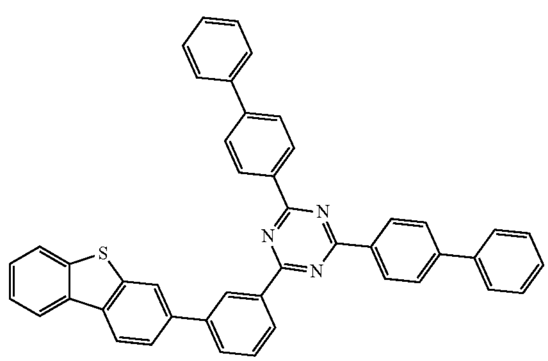

-continued
B-80
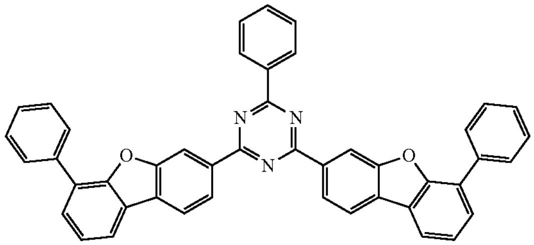
B-81
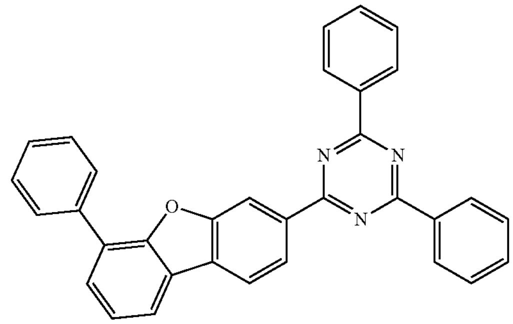
B-82
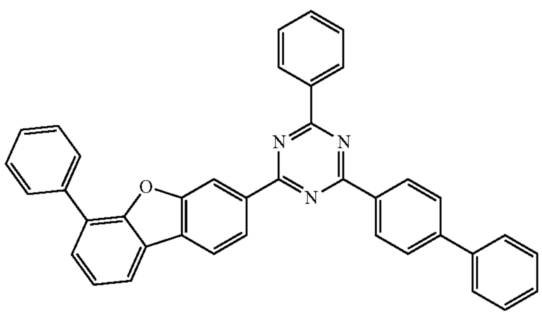
B-83
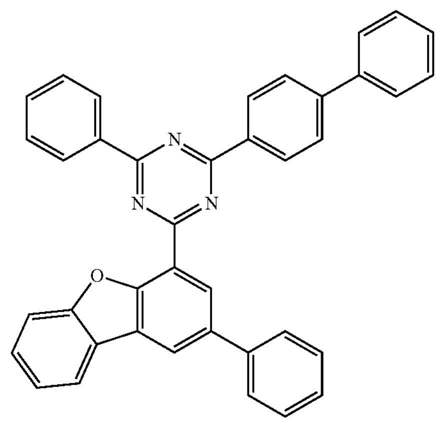
B-84
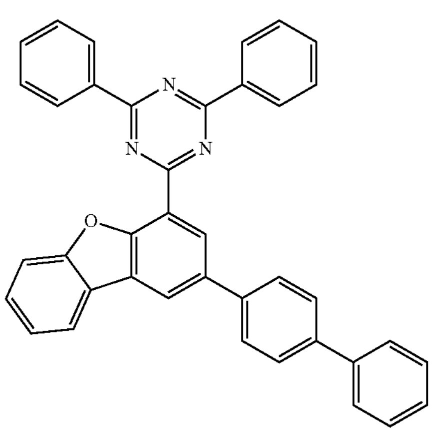
B-85
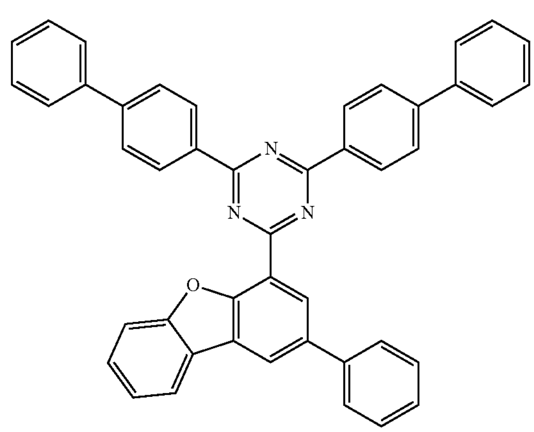

-continued
B-86
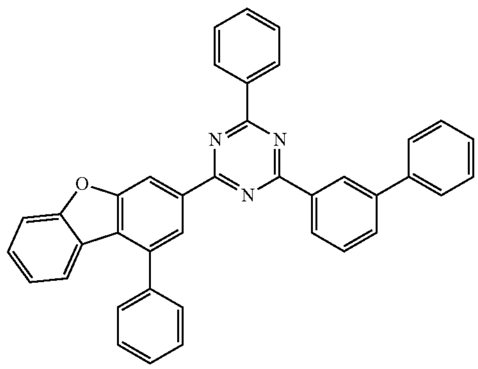
B-87
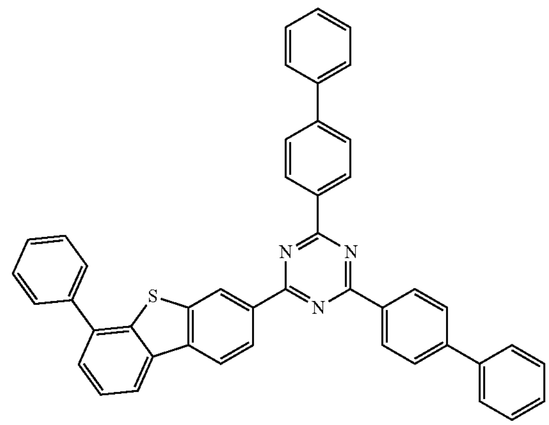
B-88
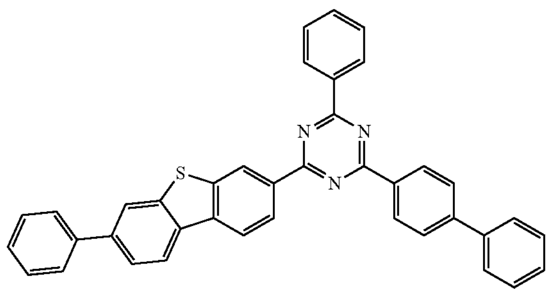
B-89
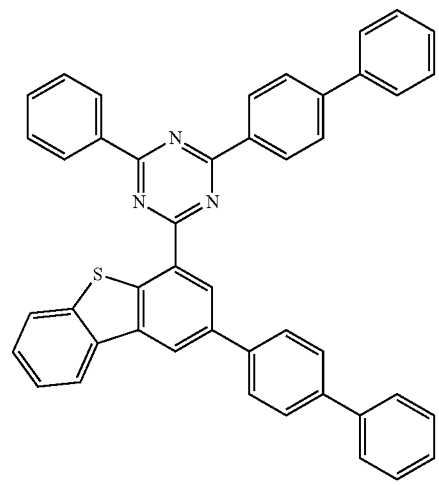
B-90
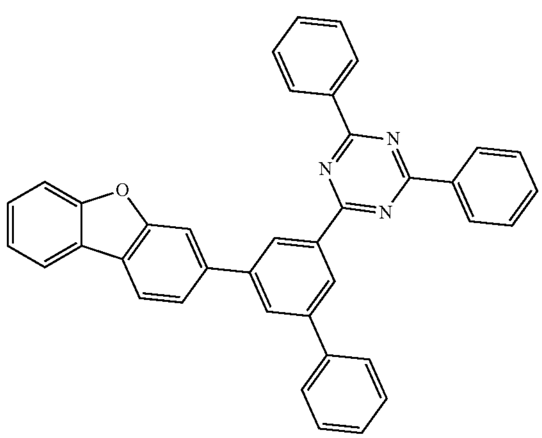
B-91
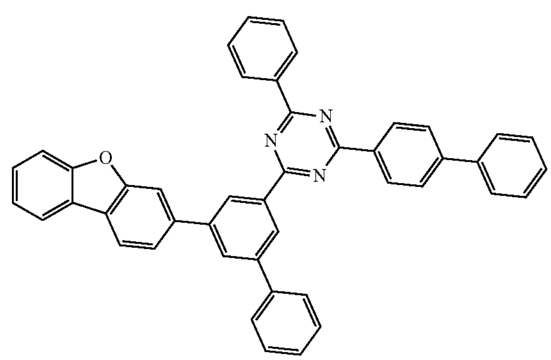

-continued
B-92
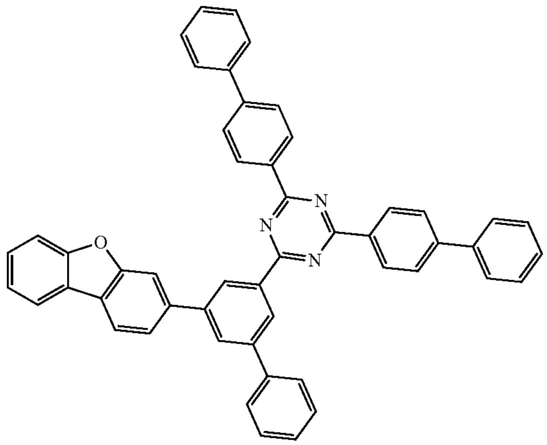
B-93
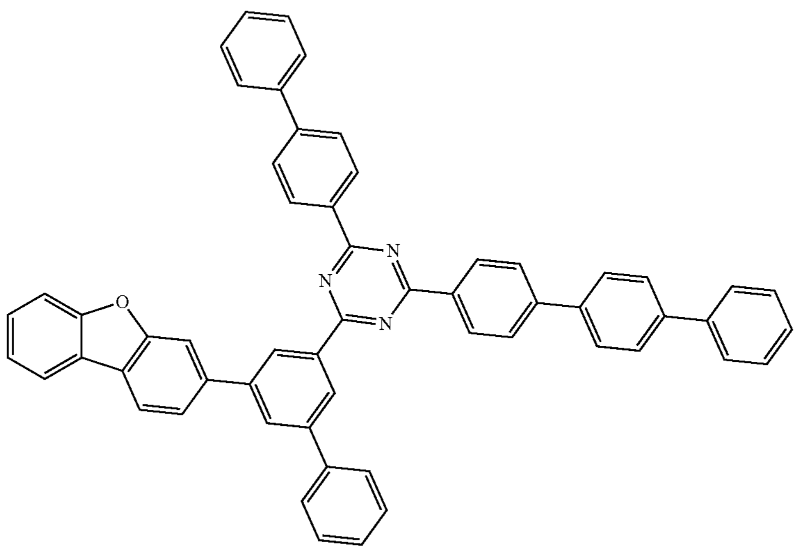
B-94
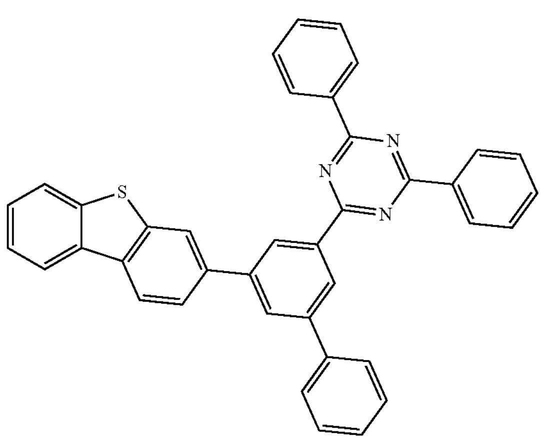
B-95
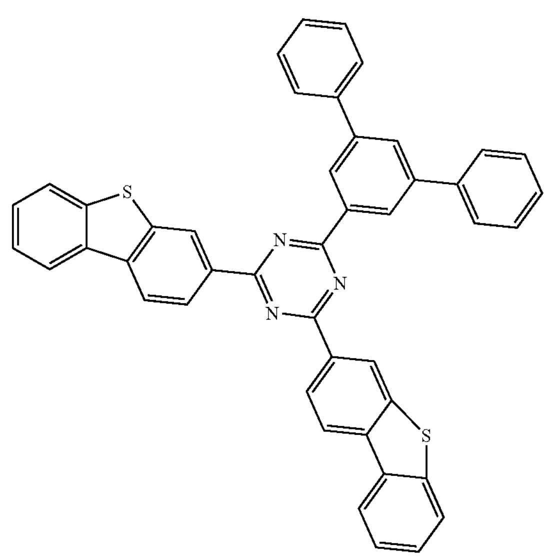

-continued
B-96
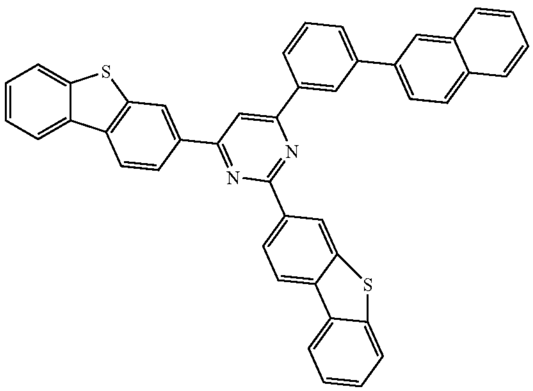
B-97
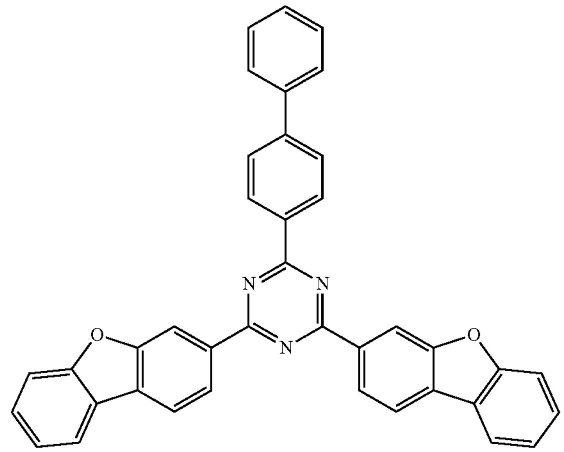
B-98
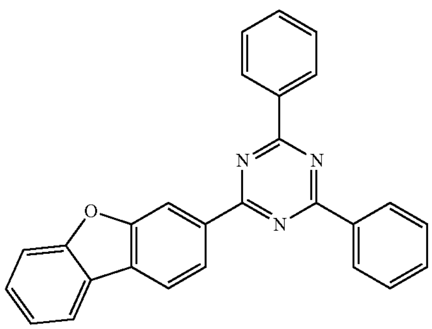
B-99
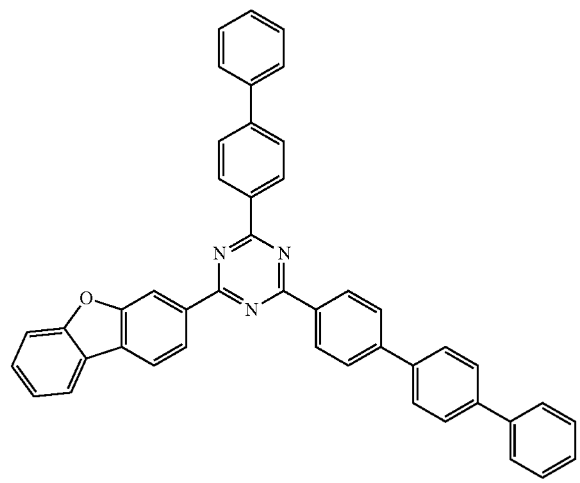
B-100
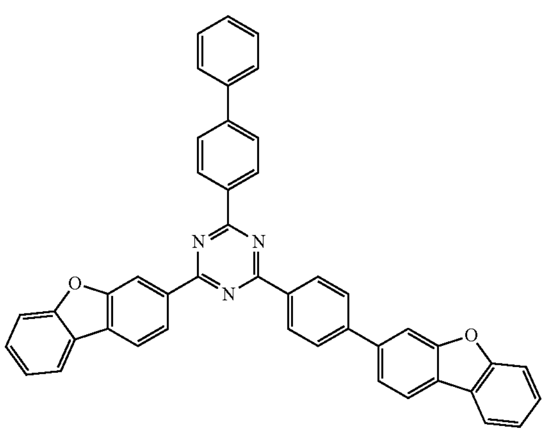
B-101
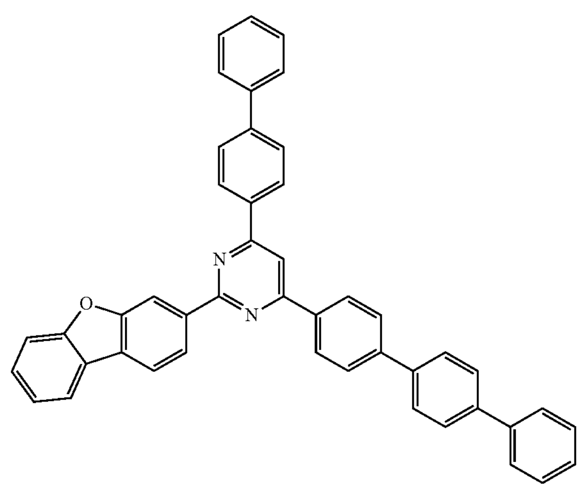

-continued
B-102
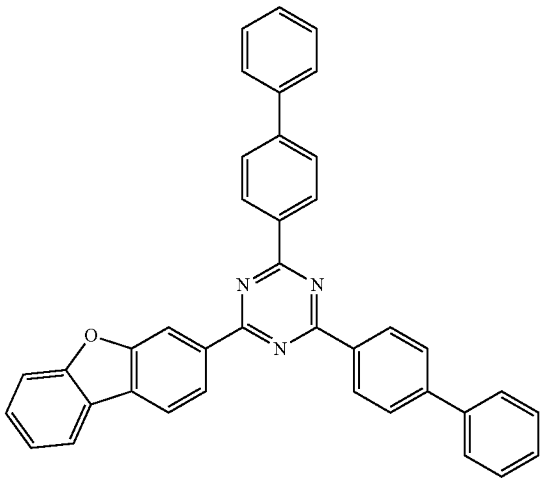
B-103
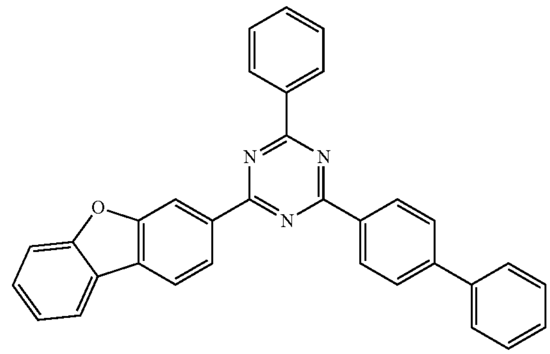
B-104
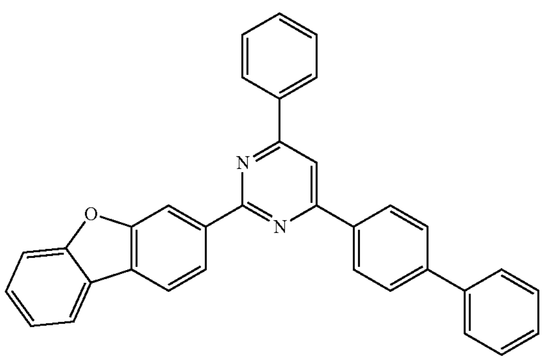
B-105
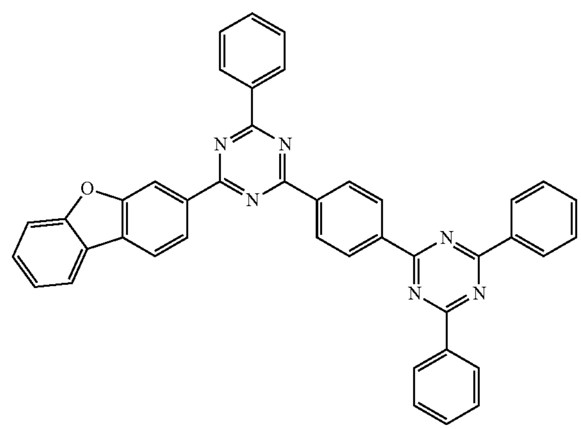
B-106
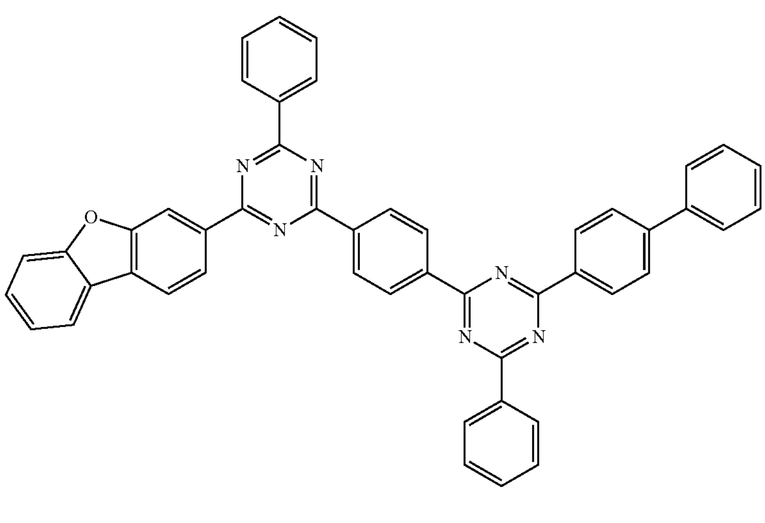

-continued
B-107
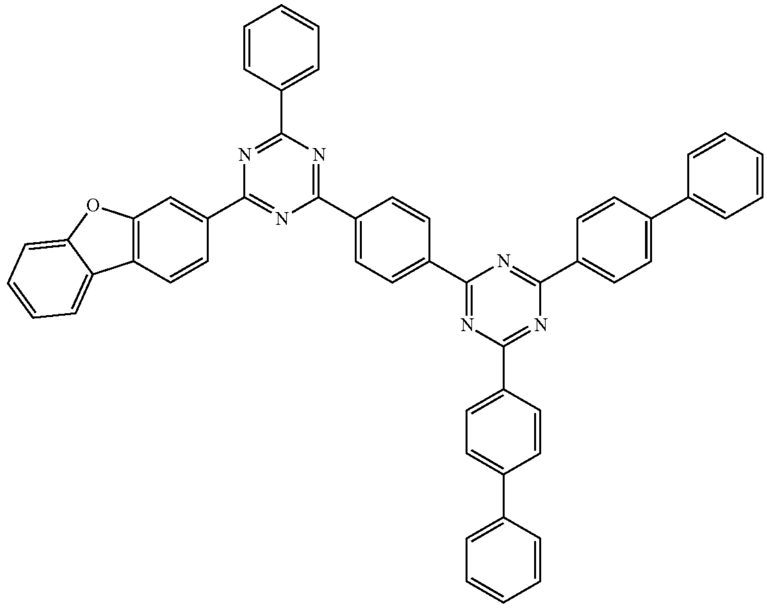
B-108
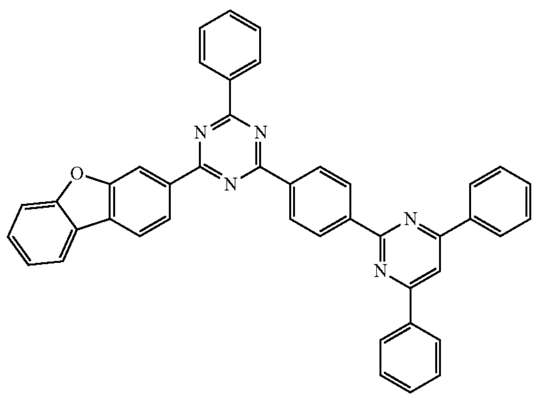
B-109
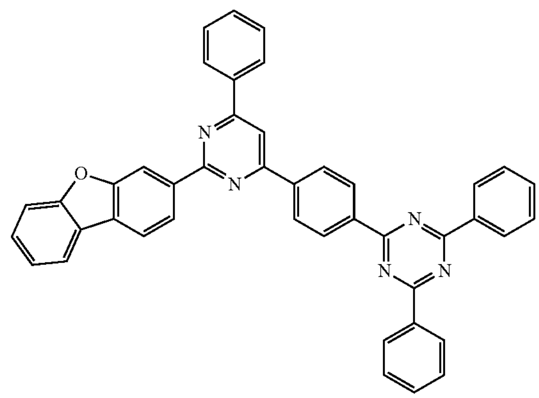
B-110
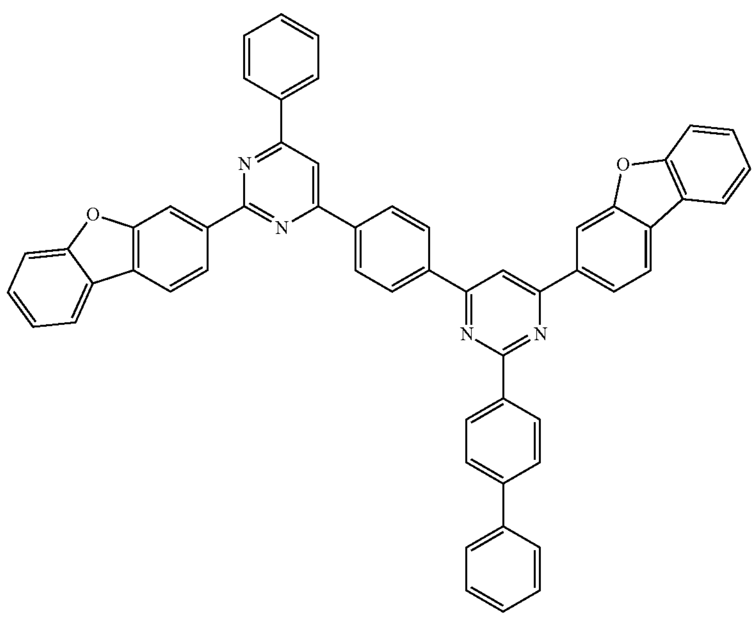

-continued
B-111
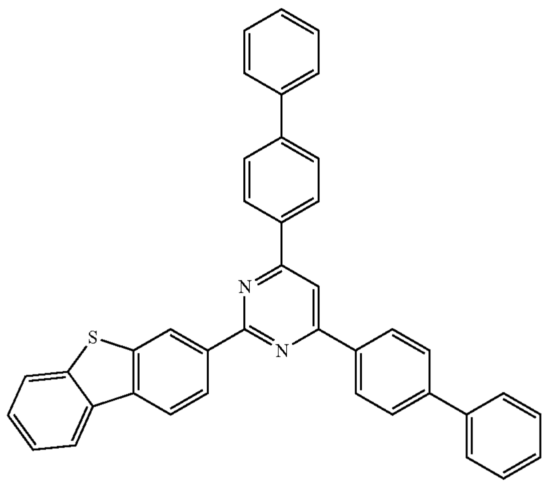
B-112
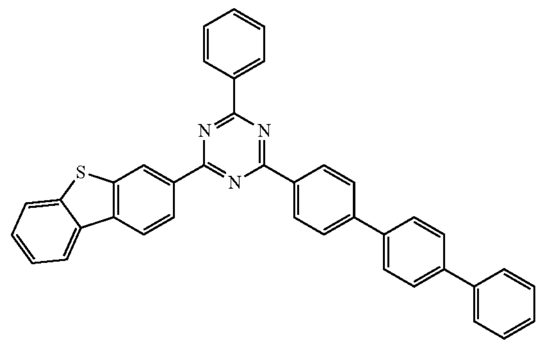
B-113
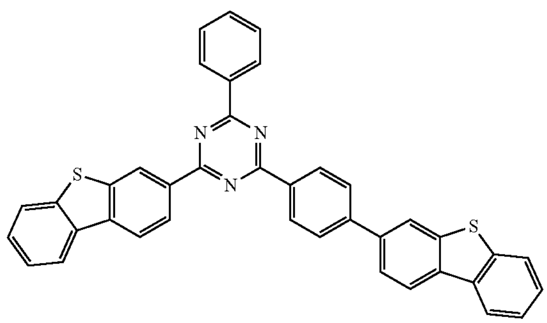
B-114
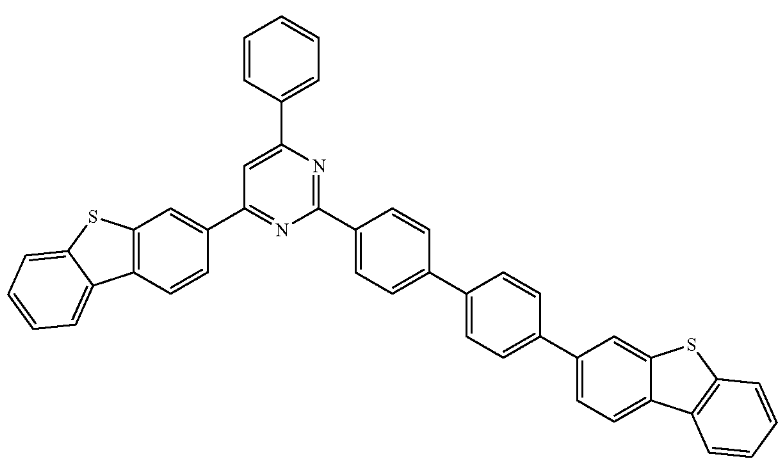

-continued
B-115
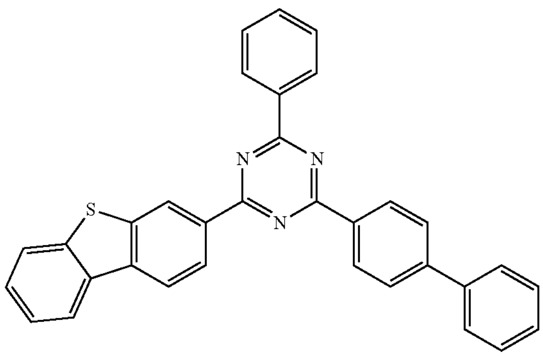
B-116
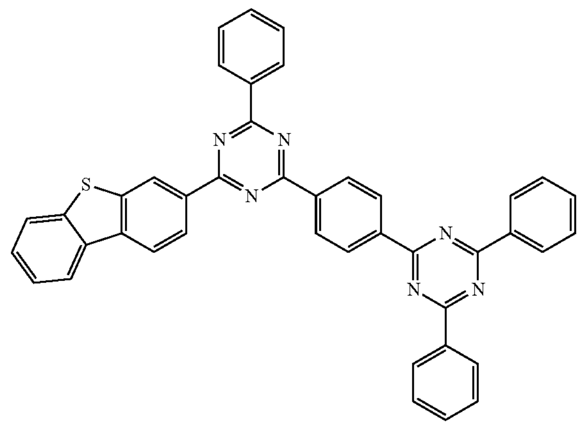
B-117
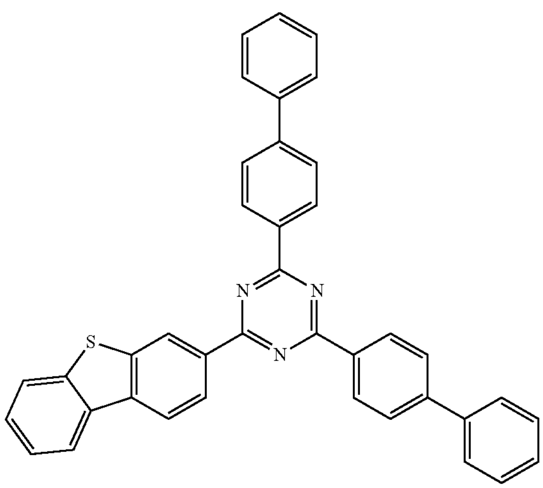
B-118
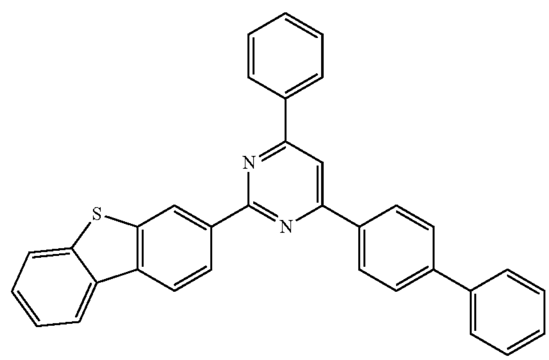
B-119
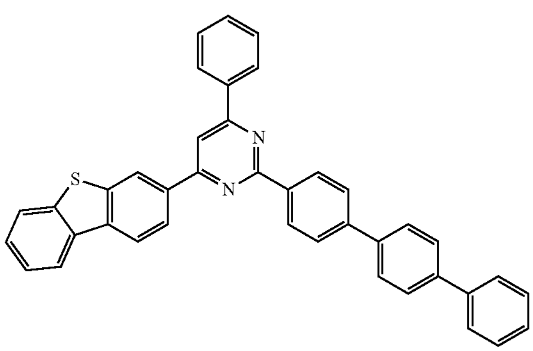

-continued
B-120
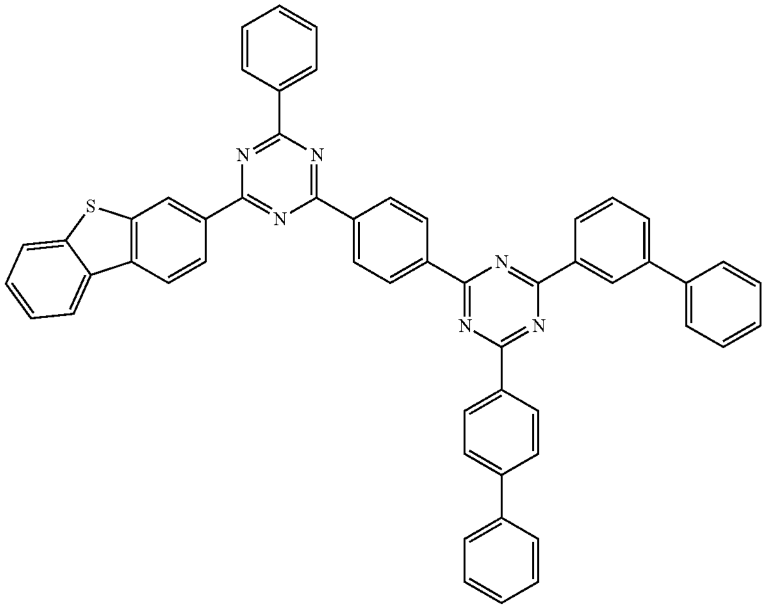
B-121
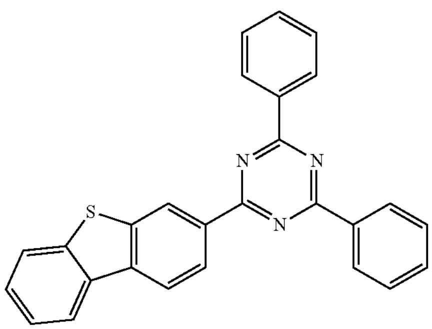
B-122
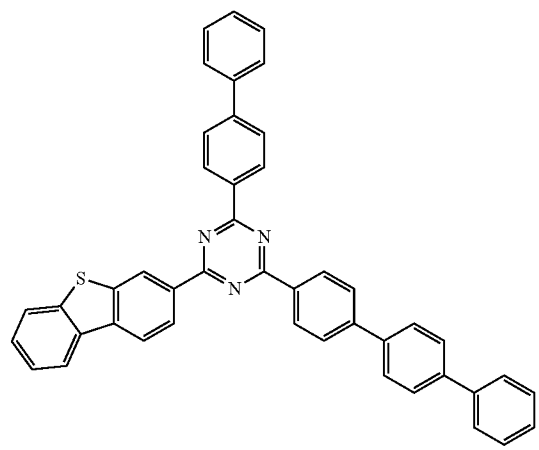
B-123
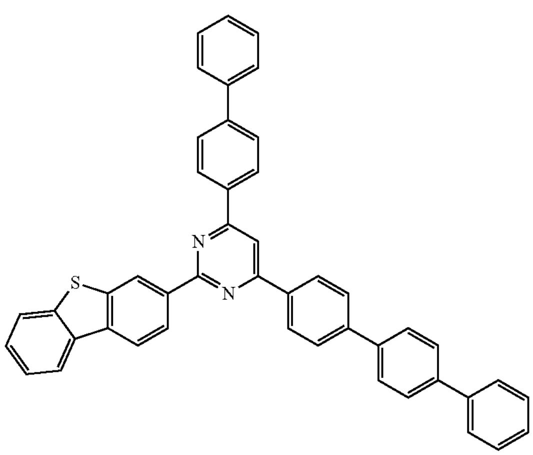
B-124
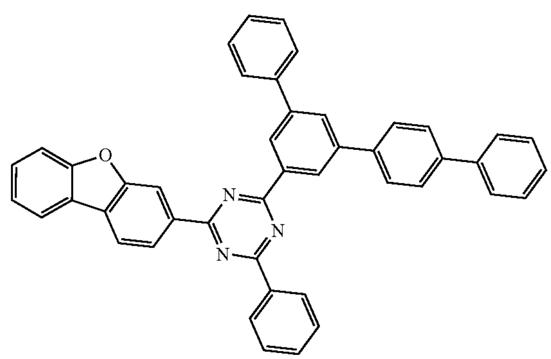

-continued
B-125
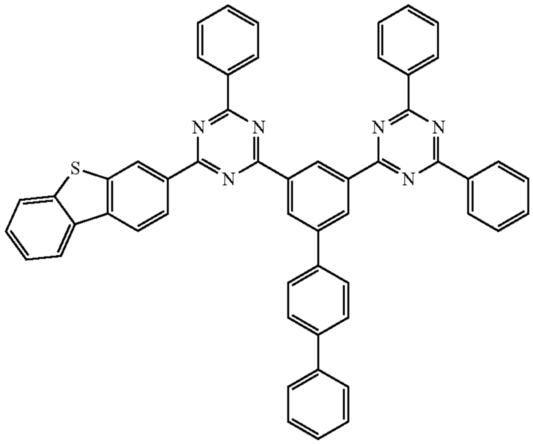
B-126
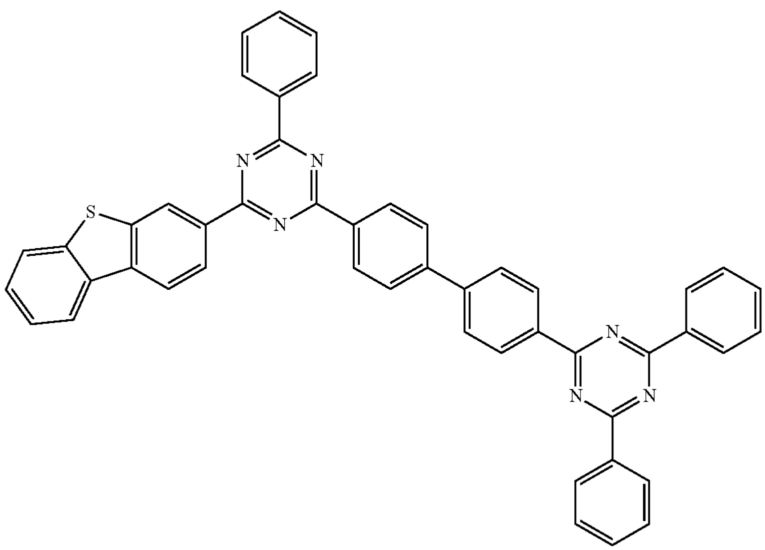
B-127
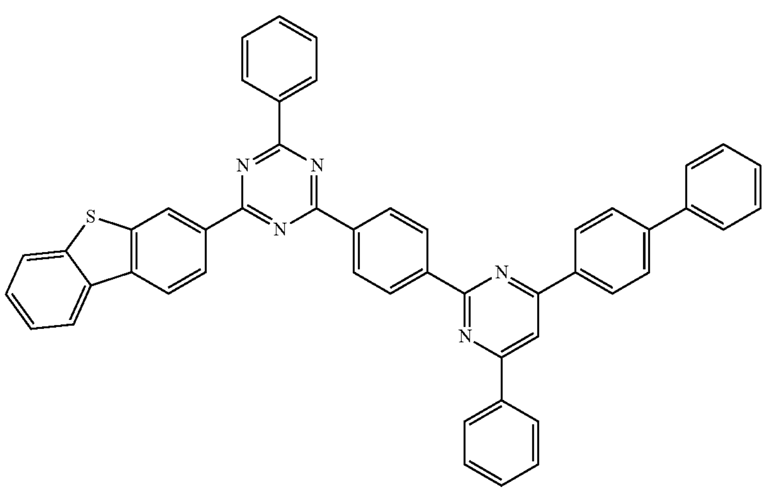

-continued
B-128
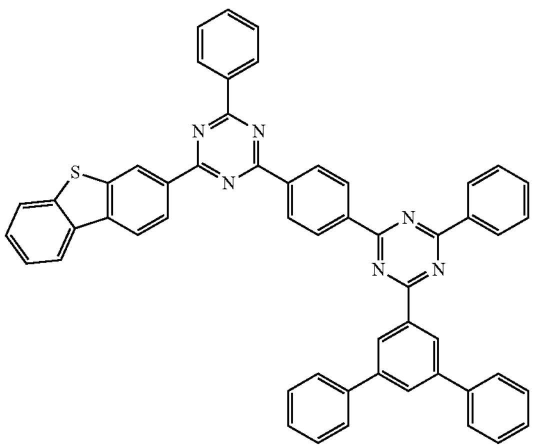
B-129
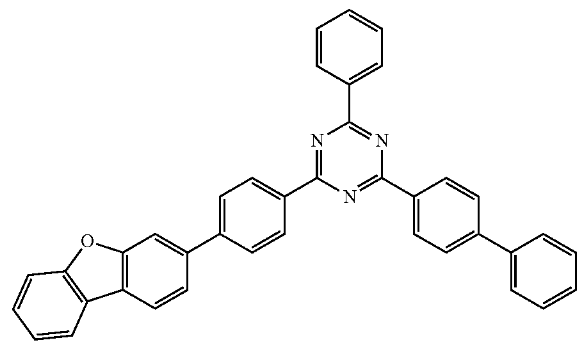
B-130
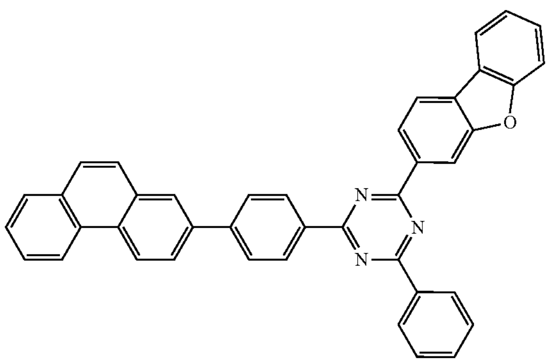
B-131
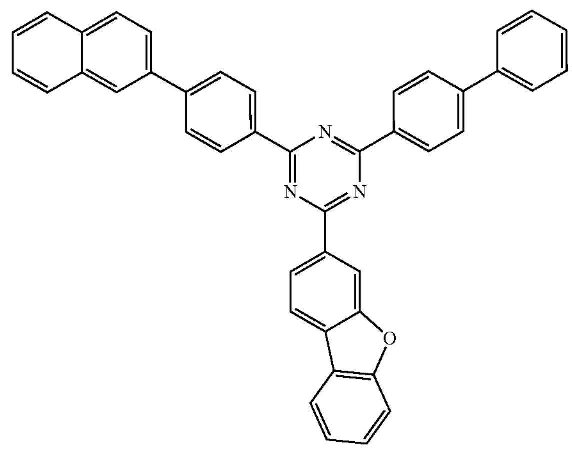
B-132
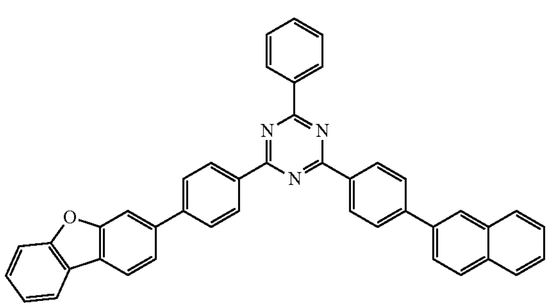
B-133
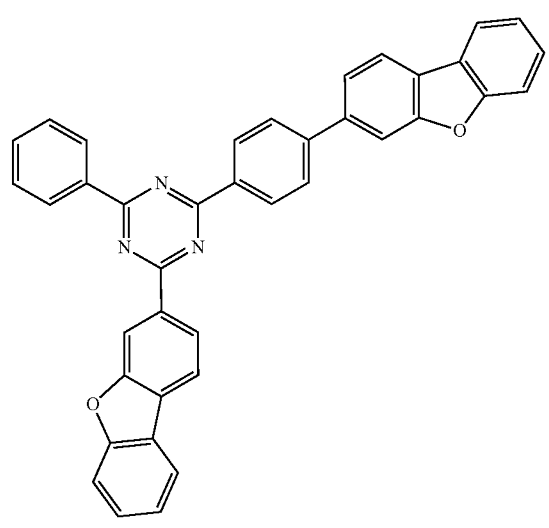

-continued
B-134
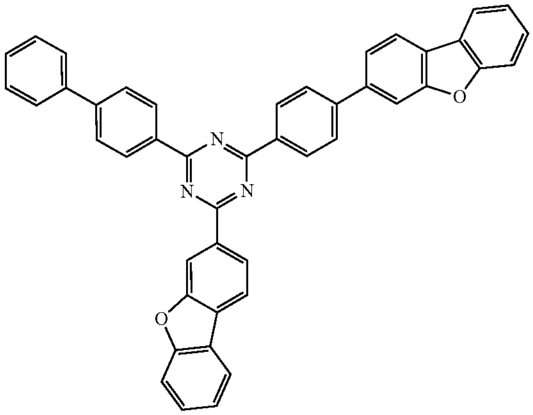
B-135
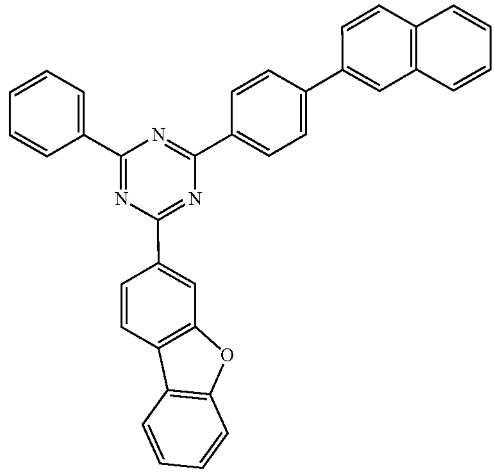
B-136
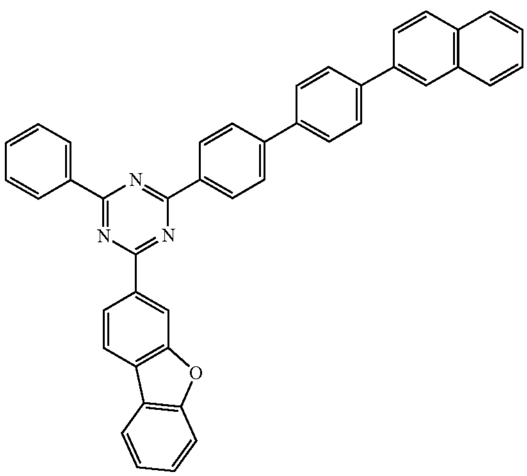
B-137
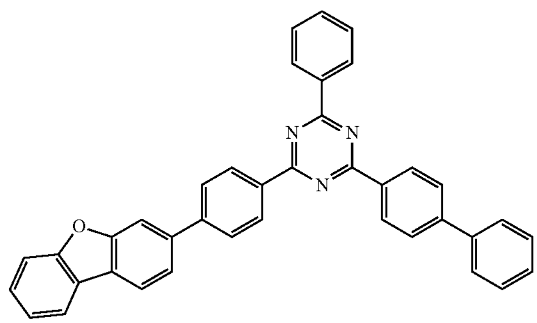
B-138
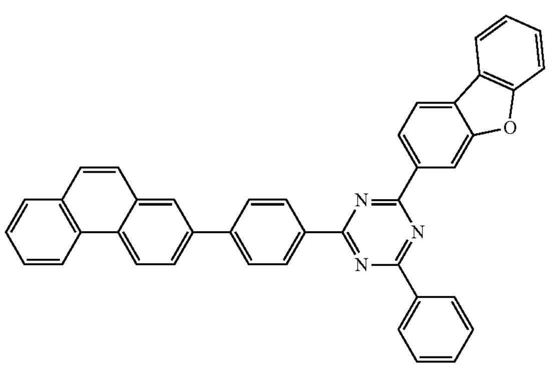
B-139
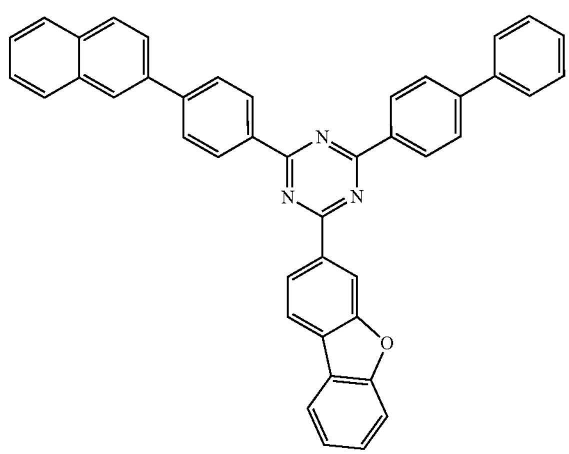

-continued
B-140
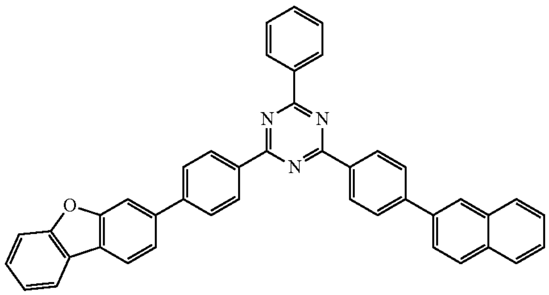
B-141
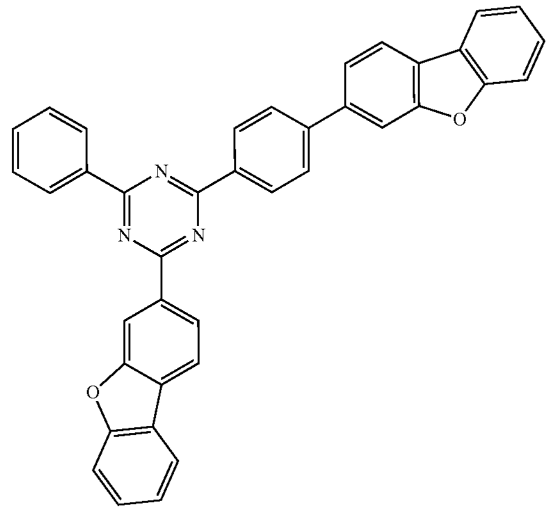
B-142
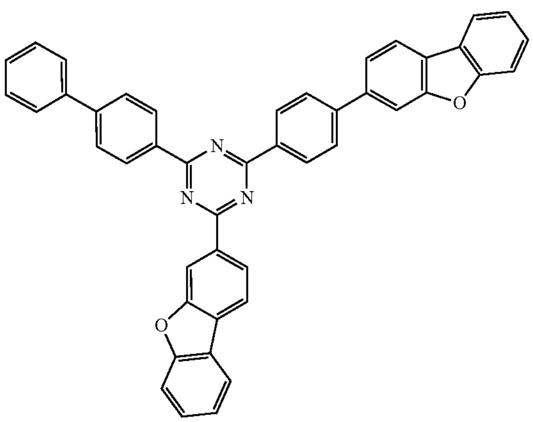
B-143
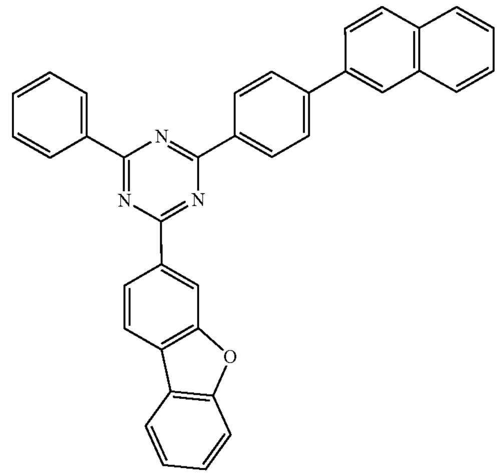
B-144
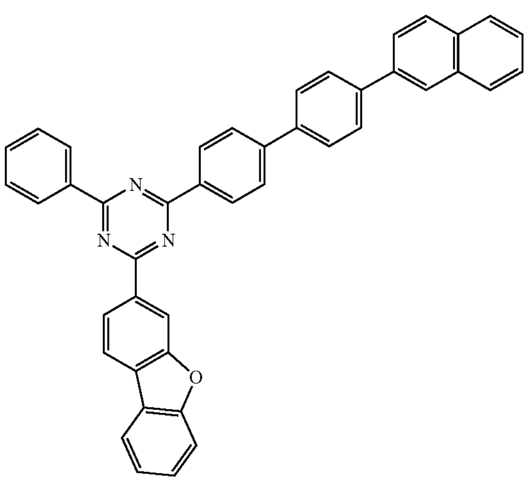
B-145
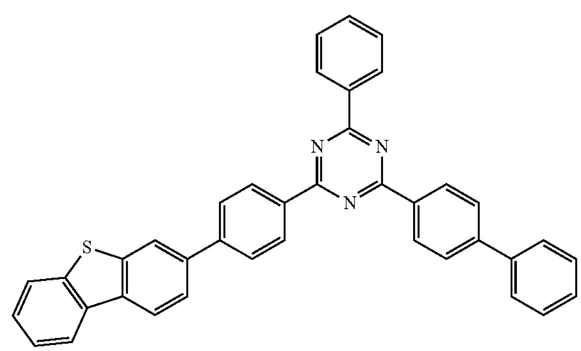

-continued
B-146
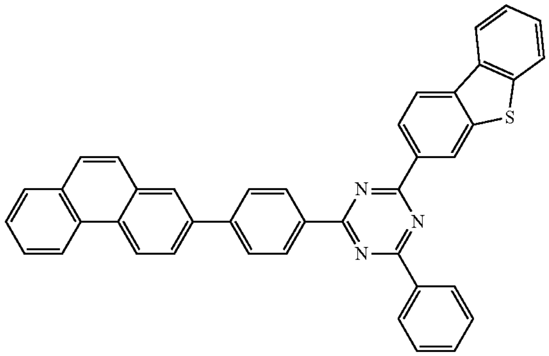
B-147
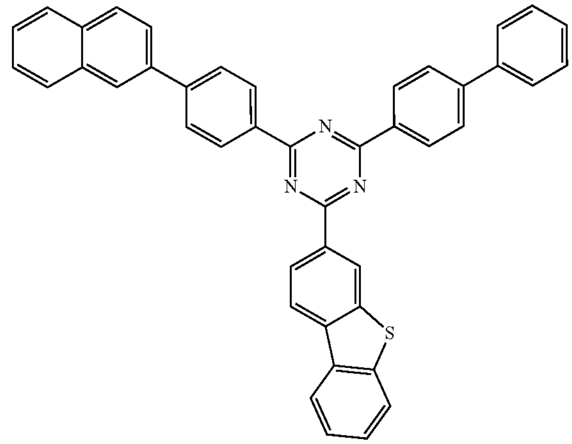
B-148
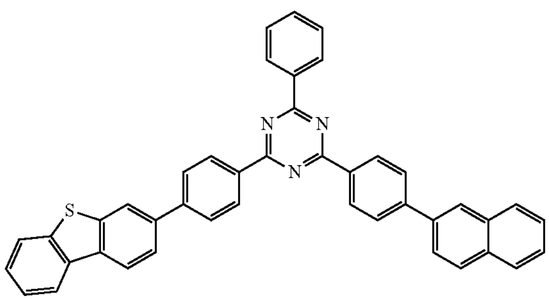
B-149
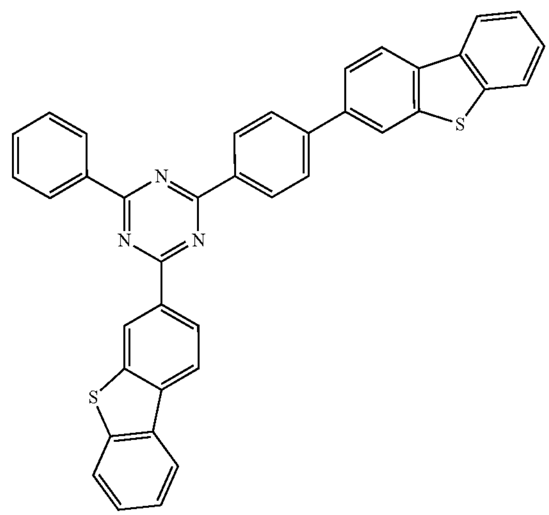
B-150
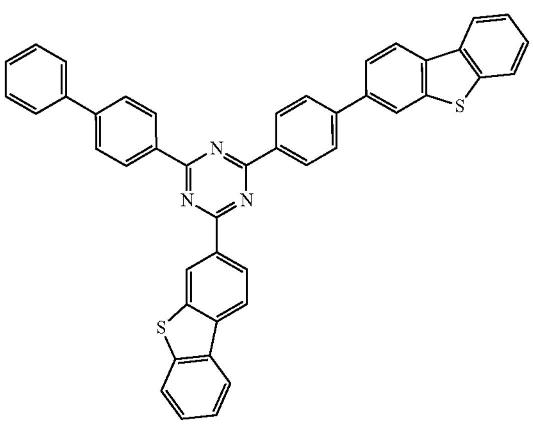
B-151
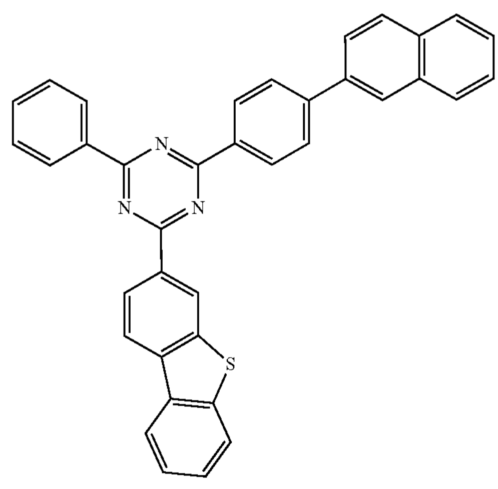

-continued
B-152
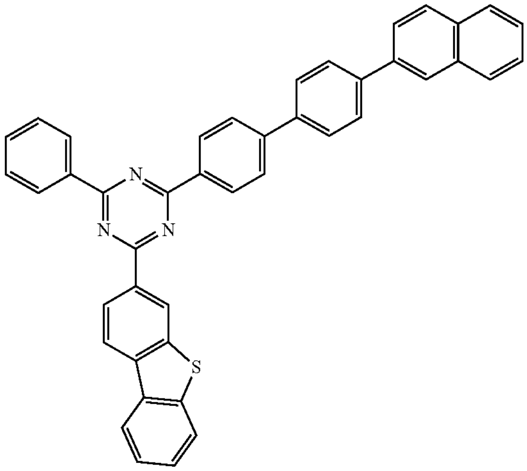
B-153
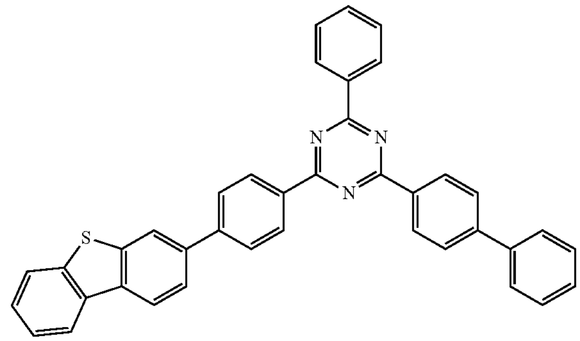
B-154
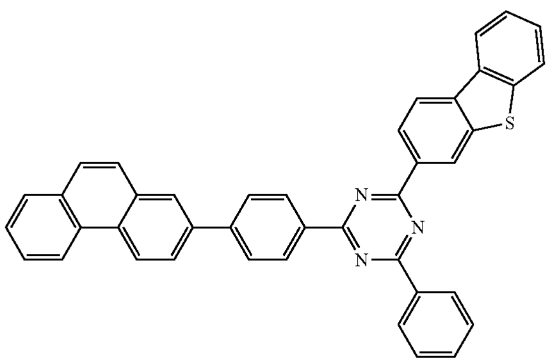
B-155
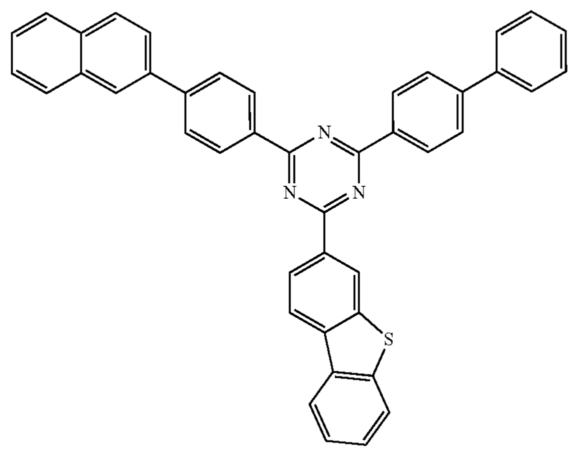
B-156
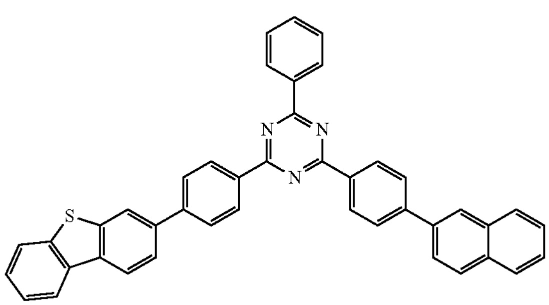
B-157
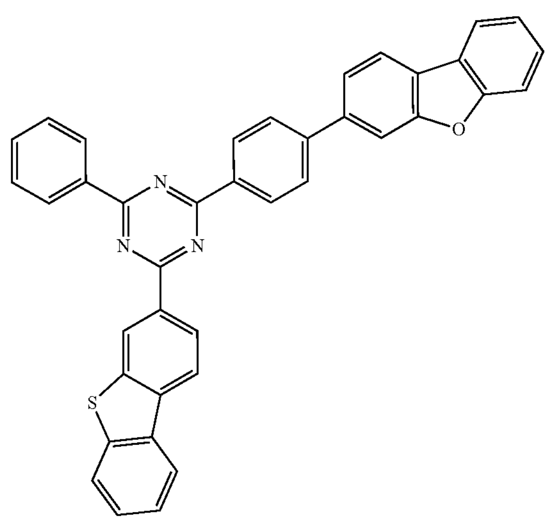

-continued
B-158
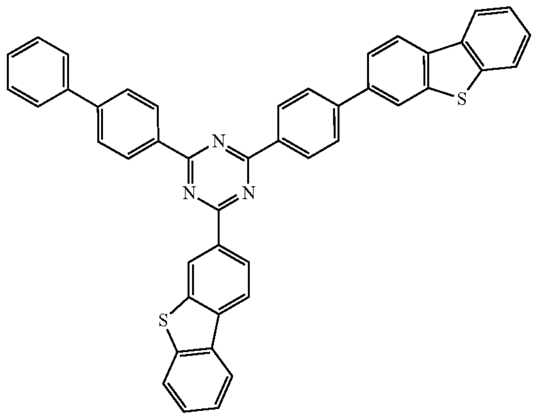
B-159
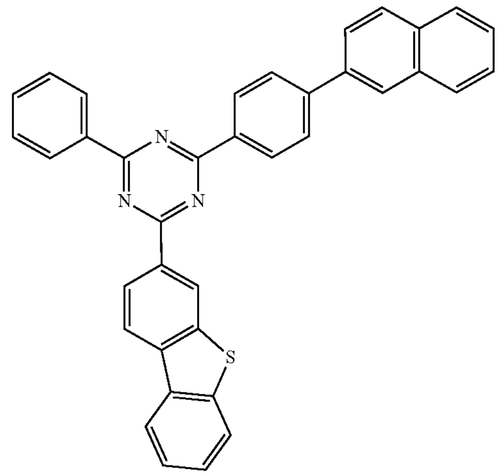
B-160
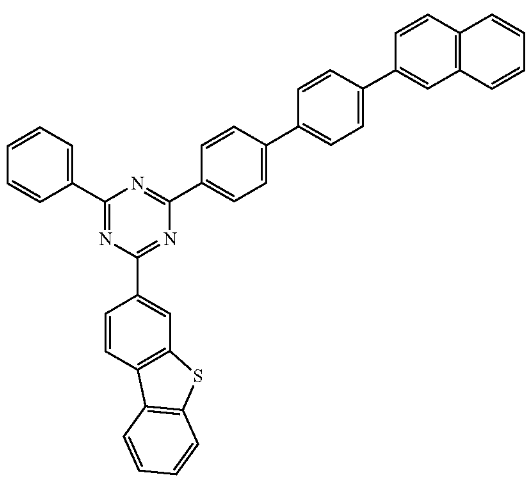
C-1
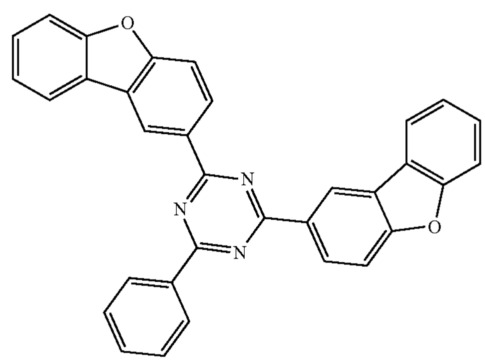
C-2
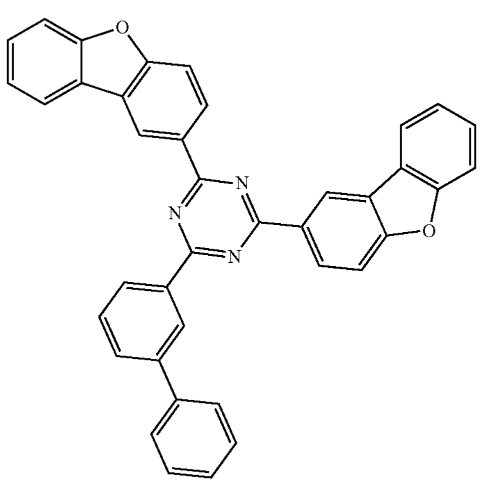
C-3
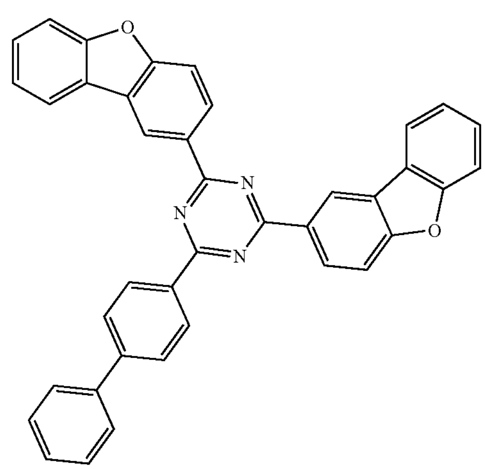

-continued
C-4
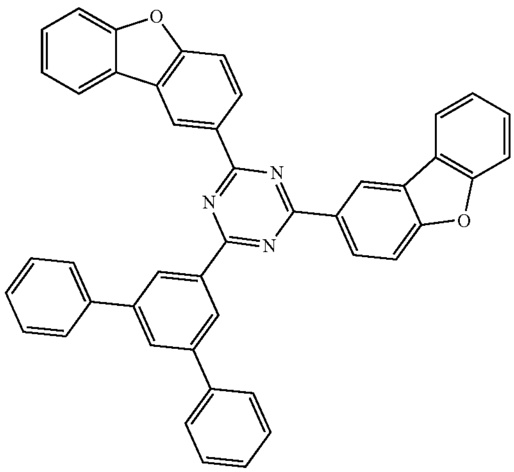
C-5
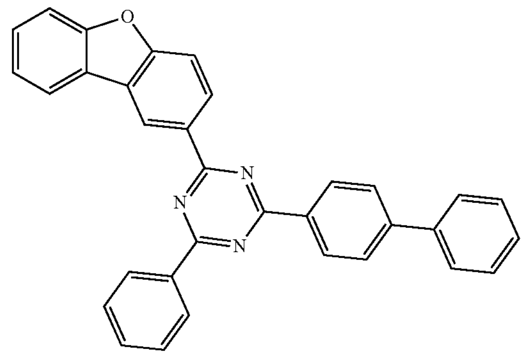
C-6
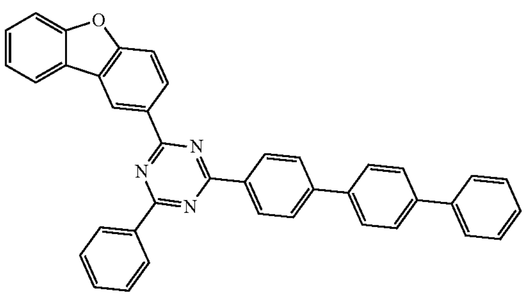
C-7
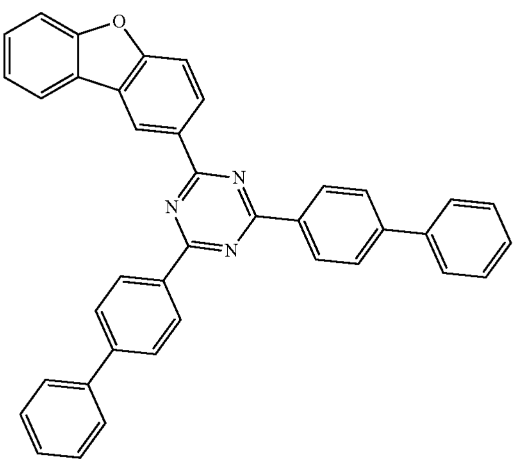
C-8
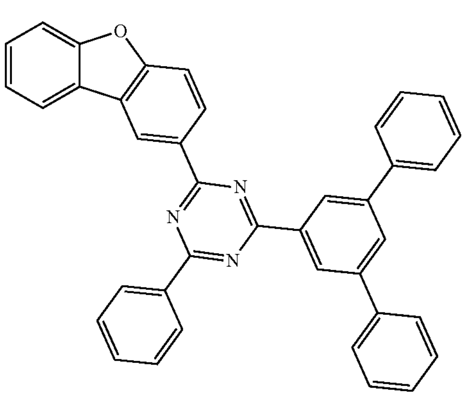
C-9
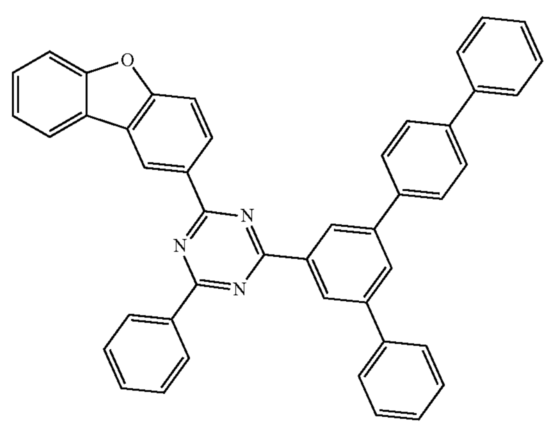

-continued
C-10
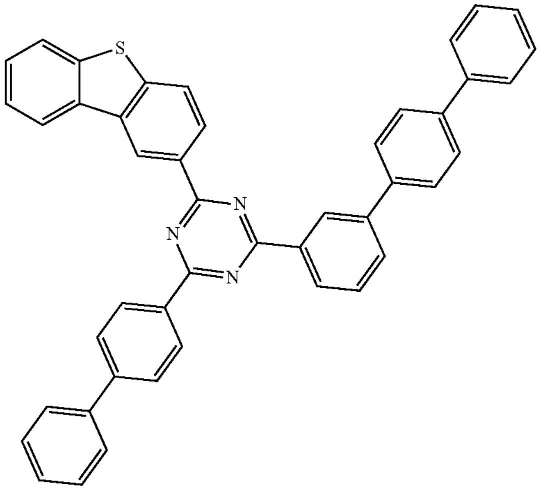
C-11
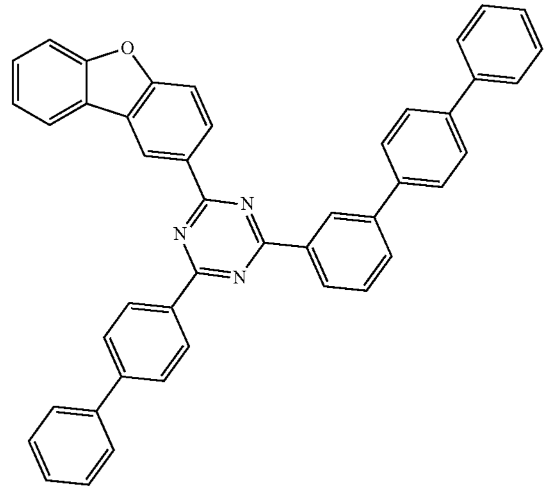
C-12
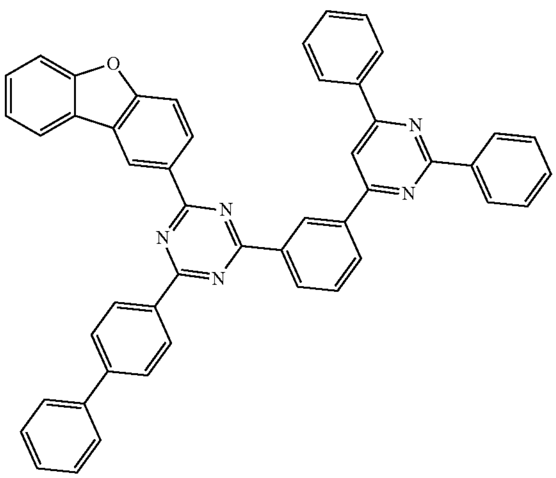
C-13
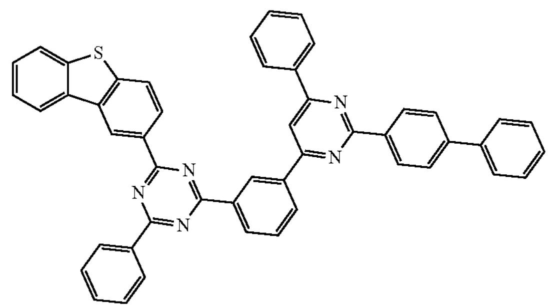
C-14
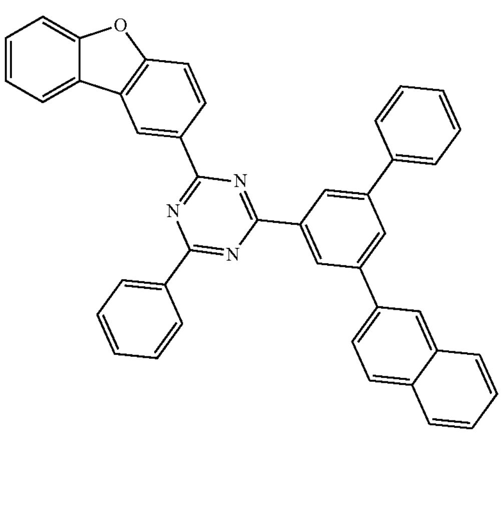
C-15
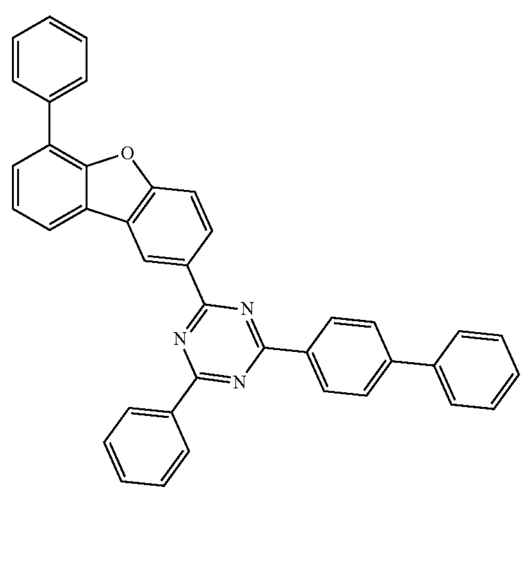

-continued
C-16
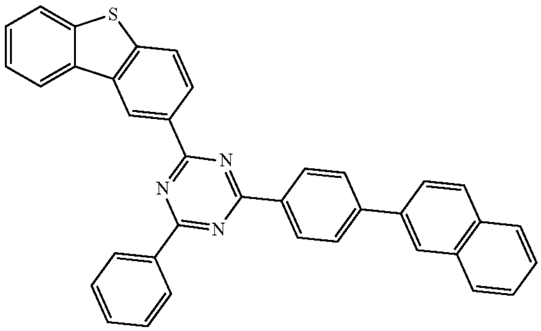
C-17
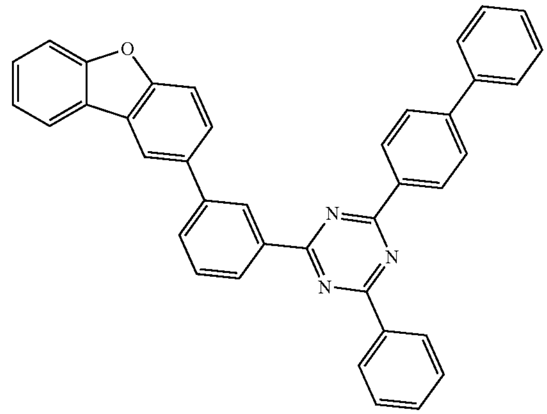
C-18
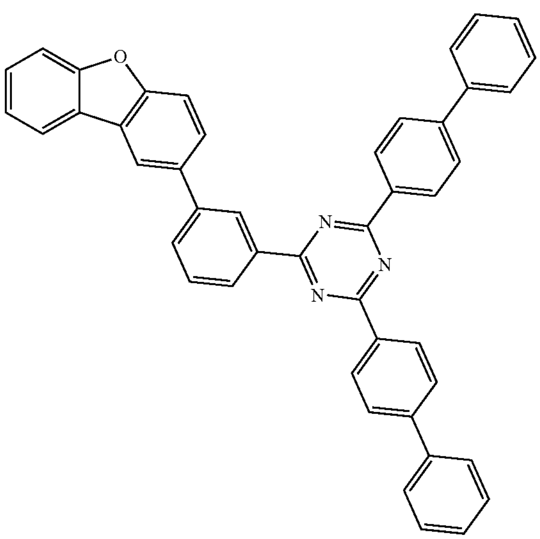
C-19
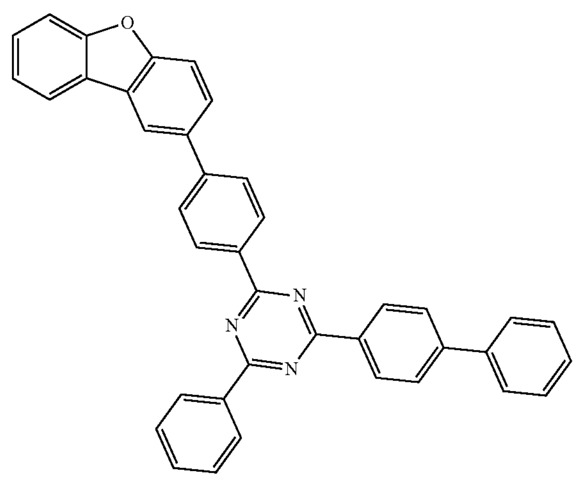
C-20
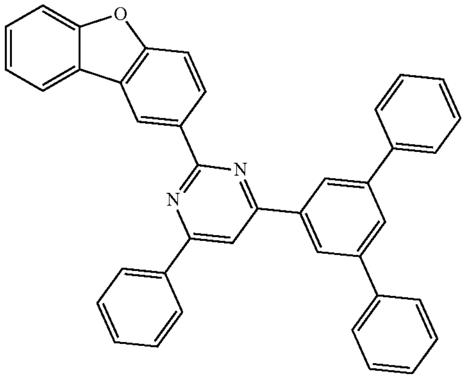
D-1
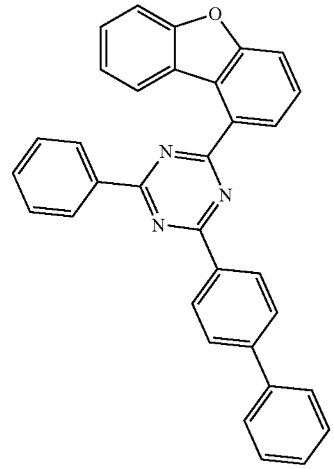

-continued
D-2
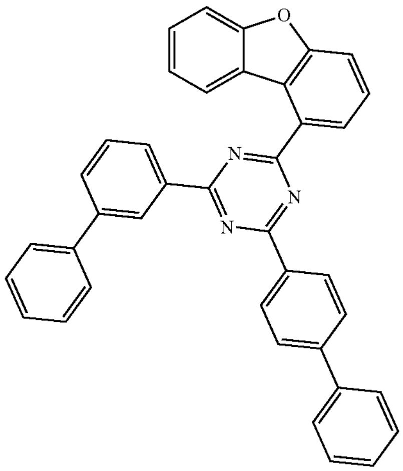
D-3
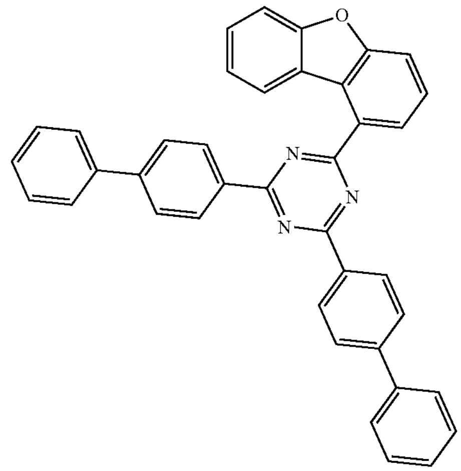
D-4
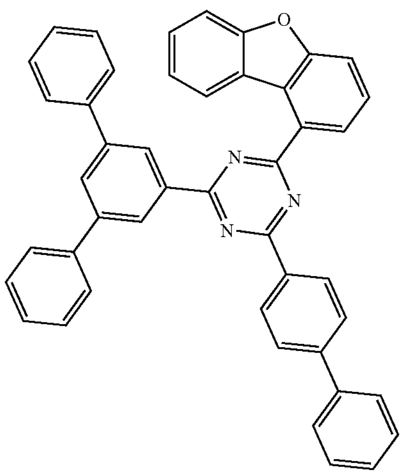
D-5
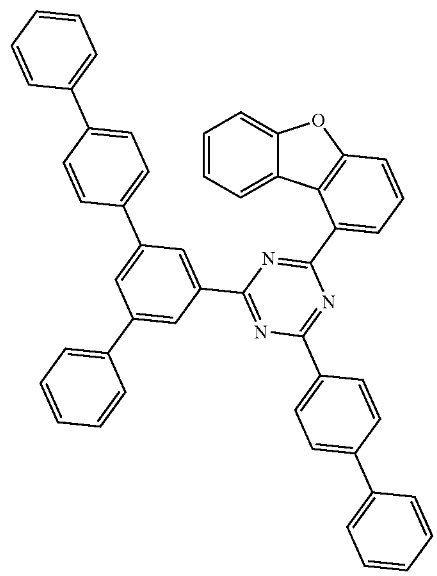
D-6
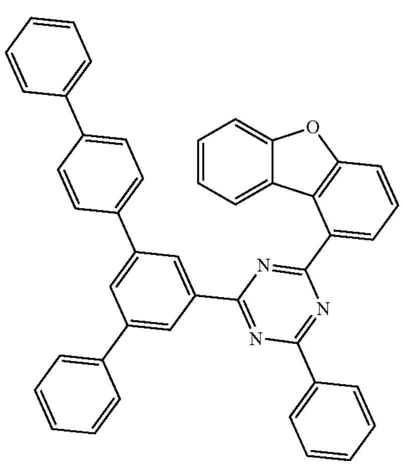
D-7
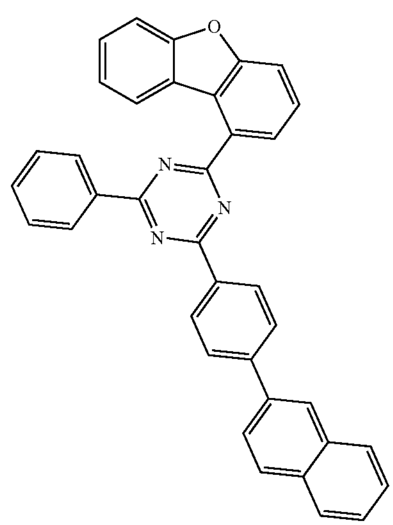

-continued
D-8
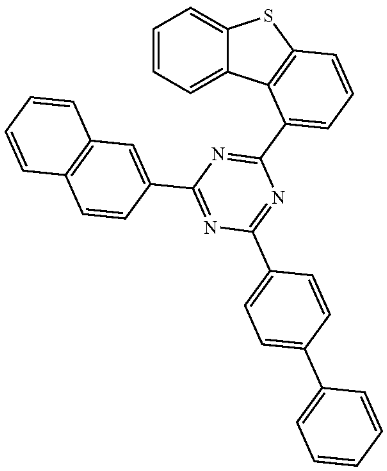
D-9
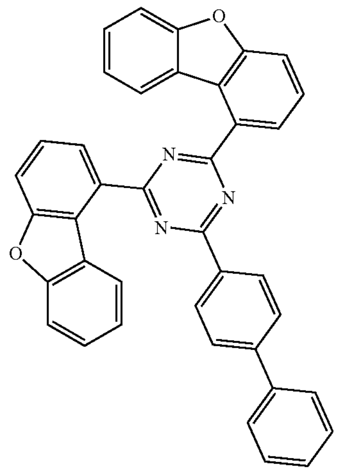
D-10
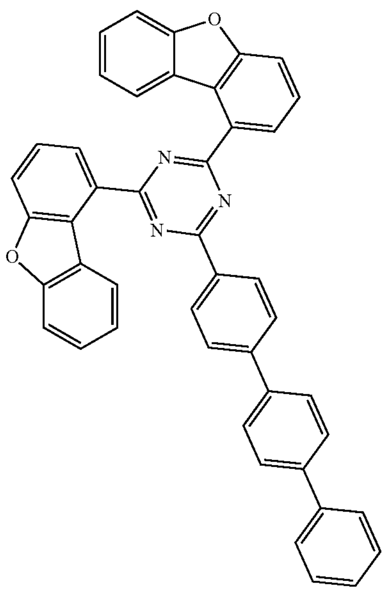
D-11
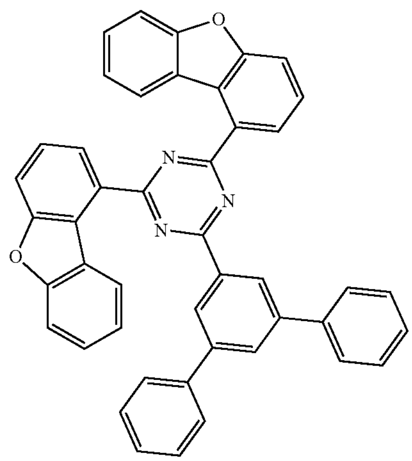
D-12
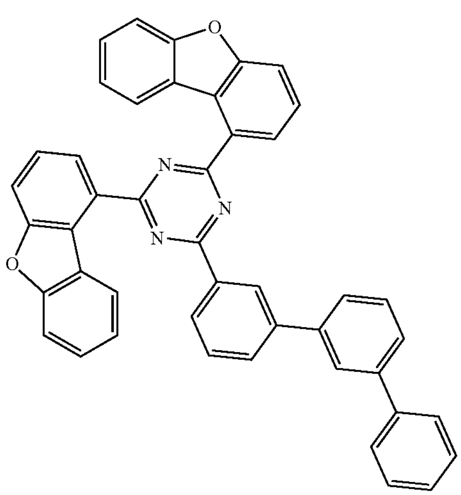
D-13
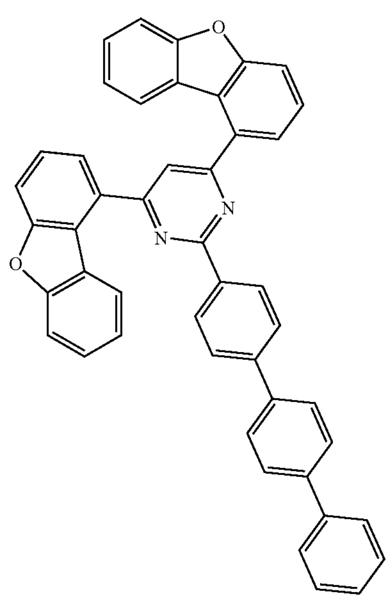

-continued
D-14
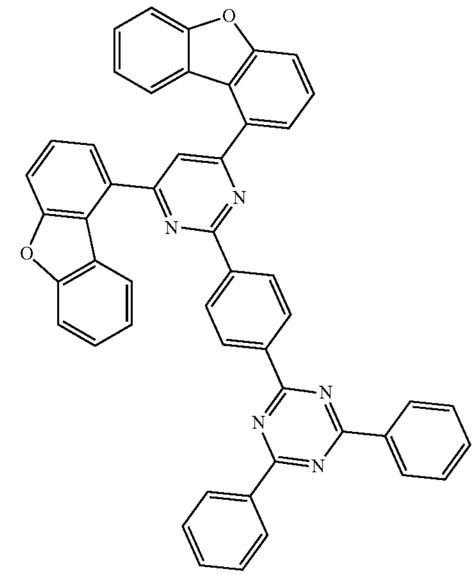
D-15
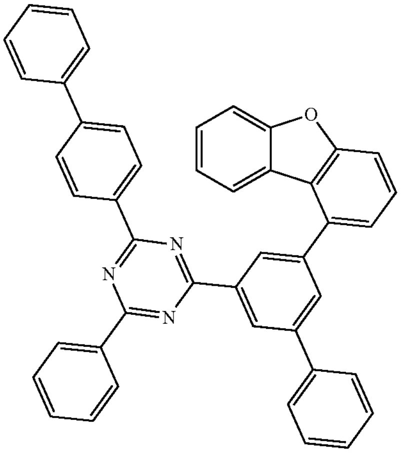
D-16
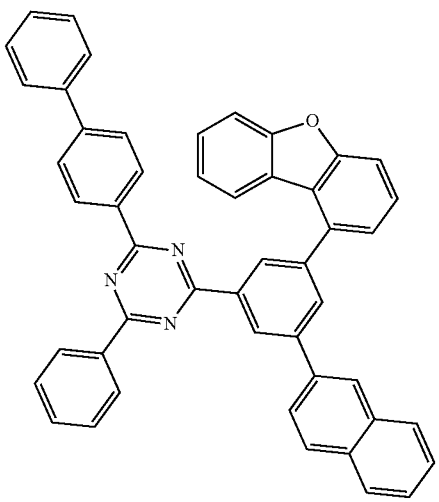
D-17
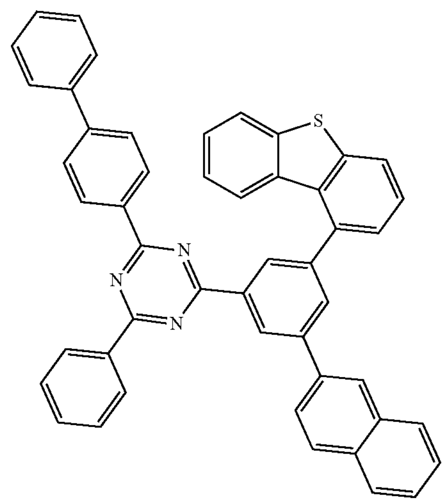
D-18
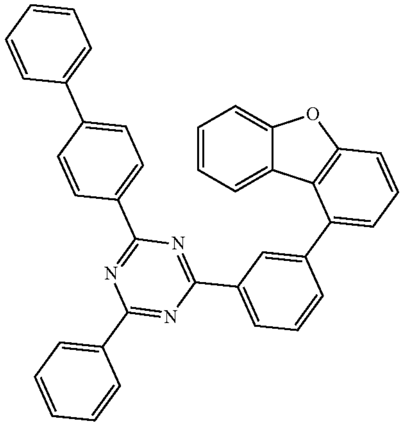
D-19
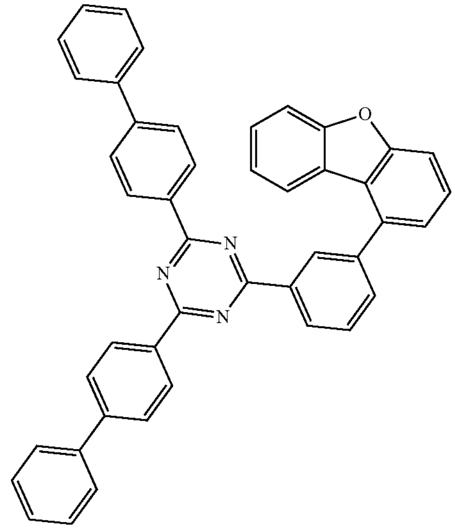

-continued
D-20
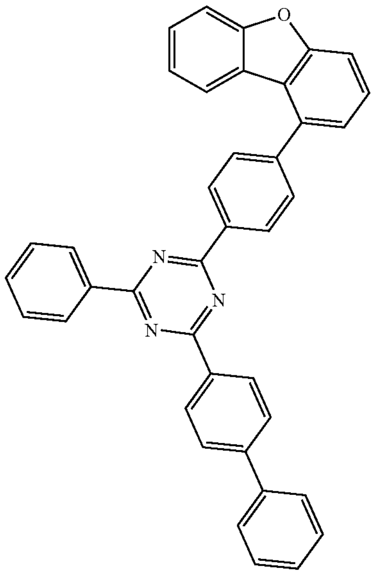
D-21
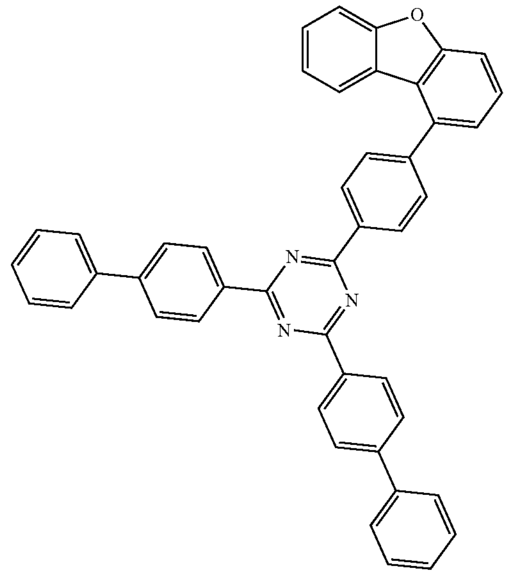
D-22
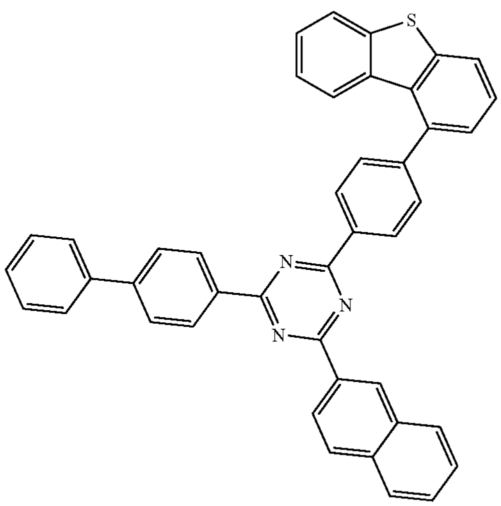
D-23
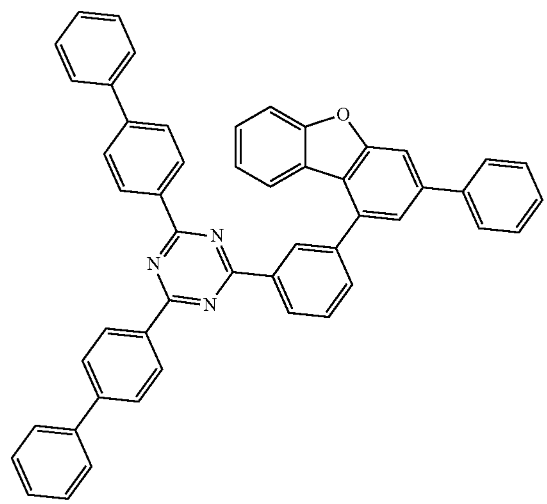
D-24
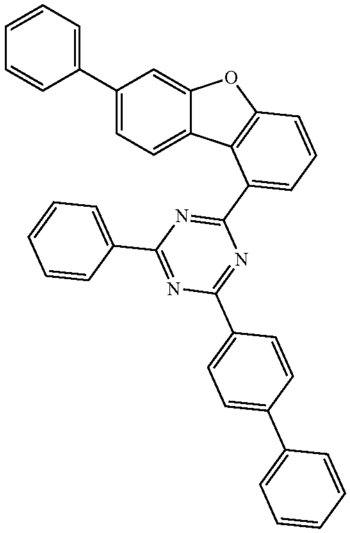
D-25
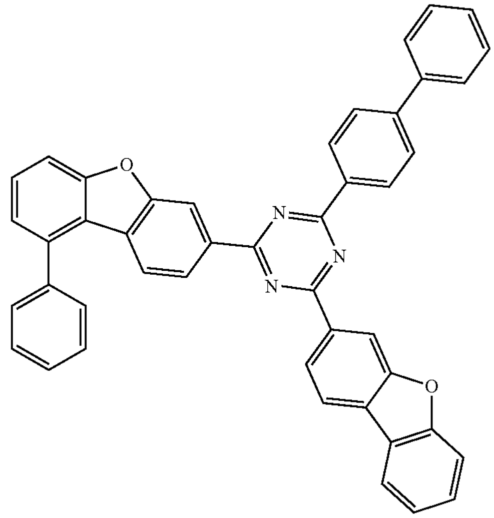

-continued

D-26

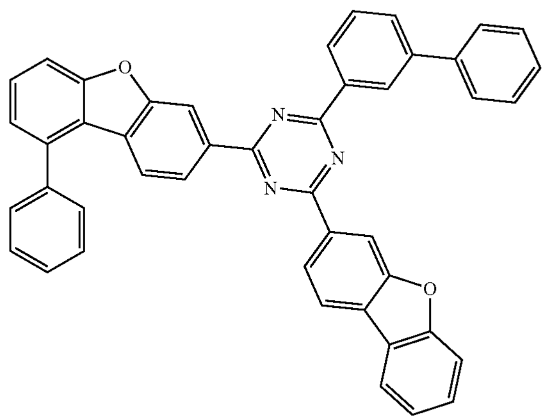

D-27

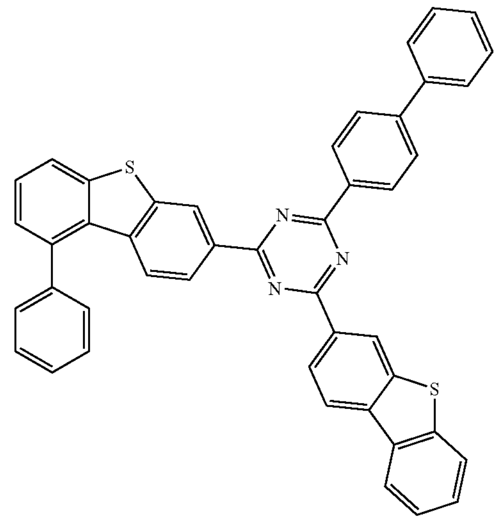

D-28

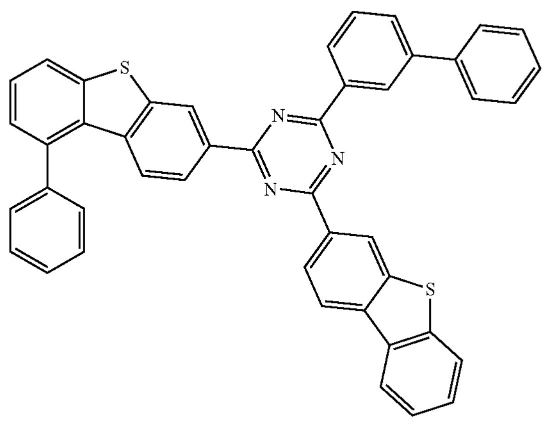

The first compound for an organic optoelectronic device and the second compound for an organic optoelectronic device may be for example included in a weight ratio of 1:99 to 99:1. Within the range, a desirable weight ratio may be adjusted using an electron transport capability of the first compound for an organic optoelectronic device and a hole transport capability of the second compound for an organic optoelectronic device to realize bipolar characteristics and thus to improve efficiency and a life-span. Within the range, they may be for example included in a weight ratio of about 90:10 to 10:90, about 80:20 to 20:80, or about 70:30 to 30:70. For example, they may be for example included in a weight ratio of 70:30 to 40:60 or 70:30 to 50:50, for another example, 70:30, 60:40, or 50:50.

For example, the composition for an organic optoelectronic device according to an embodiment of the present invention may include the compound represented by Chemical Formula 1E-2-2 as the first compound for an organic optoelectronic device and the compound represented by Chemical Formula 3A or Chemical Formula 3B as the second compound for an organic optoelectronic device.

For example, in Chemical Formula 1E-2-2, $L^a$, $L^b$, $L^c$, and $L^1$ to $L^4$ may independently be a single bond, a substituted or unsubstituted phenylene group, a substituted or unsubstituted biphenylene group, a substituted or unsubstituted terphenylene group, or a substituted or unsubstituted naphthylene group, $R^a$, $R^1$, $R^2$, and $R^4$ may independently be hydrogen, deuterium, a cyano group, a substituted or unsubstituted C1 to C30 alkyl group, a substituted or unsubstituted C6 to C30 aryl group, a substituted or unsubstituted C2 to C30 heterocyclic group, or a combination thereof, $R^b$ and $R^c$ may independently be a substituted or unsubstituted phenyl group, a substituted or unsubstituted biphenyl group, a substituted or unsubstituted naphthyl group, a substituted or unsubstituted fluorenyl group, a substituted or unsubstituted carbazolyl group, a substituted or unsubstituted dibenzofuranyl group, a substituted or unsubstituted dibenzothiophenyl group, or a fused ring represented by a combination of Chemical Formulae 1 and 2, in Chemical Formula 3A and Chemical Formula 3B, $Z^1$ to $Z^3$ may independently be N, $L^5$ to $L^7$ may independently be a single bond, a substituted or unsubstituted phenylene group, a substituted or unsubstituted biphenylene group, a substituted or unsubstituted terphenylene group, or a substituted or unsubstituted naphthylene group, $X^2$ and $X^3$ may independently be O or S, and $R^{e1}$ and $R^{e2}$, $R^{f1}$ and $R^{f2}$, $R^{g1}$ and $R^{g2}$, and $R^{h1}$ and $R^{h2}$ may independently be hydrogen or a phenyl group, $R^8$ and $R^9$ of Chemical Formula 3A may independently be a substituted or unsubstituted phenyl group, a substituted or unsubstituted biphenyl group, a substituted or unsubstituted terphenyl group, a substituted or unsubstituted quaterphenyl group, or a substituted or unsubstituted naphthyl group, and $R^9$ of Chemical Formula 3B may independently be a substituted or unsubstituted phenyl group, a substituted or unsubstituted biphenyl group, a substituted or unsubstituted terphenyl group.

For example, Chemical Formula 3A may be represented by Chemical Formula 3A-1 or Chemical Formula 3A-2.

For example, Chemical Formula 3B may be represented by Chemical Formula 3B-1.

The composition for an organic optoelectronic device may further include at least one compound in addition to the first compound for an organic optoelectronic device and the second compound for an organic optoelectronic device.

The composition for an organic optoelectronic device may further include a dopant. The dopant may be for example a phosphorescent dopant, for example a red, green, or blue phosphorescent dopant, and may be for example a red phosphorescent dopant.

The dopant is a material mixed with the first compound for an organic optoelectronic device and the second compound for an organic optoelectronic device in a small amount to cause light emission and generally a material such as a metal complex that emits light by multiple excitation into a triplet or more. The dopant may be, for example an inorganic, organic, or organic/inorganic compound, and one or more kinds thereof may be used.

Examples of the dopant may be a phosphorescent dopant and examples of the phosphorescent dopant may be an organometal compound including Ir, Pt, Os, Ti, Zr, Hf, Eu, Tb, Tm, Fe, Co, Ni, Ru, Rh, Pd, or a combination thereof. The phosphorescent dopant may be, for example a compound represented by Chemical Formula Z, but is not limited thereto.

$L^8MX^5$ [Chemical Formula Z]

In Chemical Formula Z, M is a metal, and $L^8$ and $X^5$ are the same or different and are a ligand to form a complex compound with M.

The M may be for example Ir, Pt, Os, Ti, Zr, Hf, Eu, Tb, Tm, Fe, Co, Ni, Ru, Rh, Pd, or a combination thereof and $L^8$ and $X^4$ may be for example a bidendate ligand.

The composition for an organic optoelectronic device may be formed by a dry film formation method such as chemical vapor deposition (CVD).

Hereinafter, an organic optoelectronic device including the composition for an organic optoelectronic device is described.

The organic optoelectronic device may be any device to convert electrical energy into photoenergy and vice versa without particular limitation, and may be for example an organic photoelectric device, an organic light emitting diode, an organic solar cell, and an organic photo conductor drum.

Herein, an organic light emitting diode as one example of an organic optoelectronic device is described referring to drawings.

FIGS. 1 and 2 are cross-sectional views showing organic light emitting diodes according to embodiments.

Referring to FIG. 1, an organic light emitting diode 100 according to an embodiment includes an anode 120 and a cathode 110 and facing each other and an organic layer 105 disposed between the anode 120 and the cathode 110.

The anode 120 may be made of a conductor having a large work function to help hole injection, and may be for example a metal, a metal oxide and/or a conductive polymer. The anode 120 may be, for example a metal such as nickel, platinum, vanadium, chromium, copper, zinc, gold, and the like or an alloy thereof, metal oxide such as zinc oxide, indium oxide, indium tin oxide (ITO), indium zinc oxide (IZO), and the like; a combination of metal and oxide such as ZnO and Al or $SnO_2$ and Sb; a conductive polymer such as poly(3-methylthiophene), poly(3,4-(ethylene-1,2-dioxy)thiophene) (PEDOT), polypyrrole, and polyaniline, but is not limited thereto.

The cathode 110 may be made of a conductor having a small work function to help electron injection, and may be for example a metal, a metal oxide and/or a conductive polymer. The cathode 110 may be for example a metal such as magnesium, calcium, sodium, potassium, titanium, indium, yttrium, lithium, gadolinium, aluminum silver, tin, lead, cesium, barium, and the like or an alloy thereof; a multi-layer structure material such as LiF/Al, $LiO_2$/Al, LiF/Ca, LiF/Al and $BaF_2$/Ca, but is not limited thereto.

The organic layer 105 includes a light emitting layer 130 including the composition for an organic optoelectronic device.

The light emitting layer 130 may include for example the composition for an organic optoelectronic device.

The composition for an organic optoelectronic device may be for example a red light emitting composition.

The light emitting layer 130 may include for example the first compound for an organic optoelectronic device and the second compound for an organic optoelectronic device as a phosphorescent host.

Referring to FIG. 2, an organic light emitting diode 200 further includes a hole auxiliary layer 140 in addition to the light emitting layer 130. The hole auxiliary layer 140 may further increase hole injection and/or hole mobility while blocking electrons between the anode 120 and the light emitting layer 130. The hole auxiliary layer 140 may include for example at least one of a hole transport layer, a hole injection layer, and/or an electron blocking layer.

The hole auxiliary layer 140 may include for example at least one of compounds of Group E.

Specifically, the hole auxiliary layer 140 may include a hole transport layer between the anode 120 and the light emitting layer 130 and a hole transport auxiliary layer between the light emitting layer 130 and the hole transport layer, and at least one of compounds of Group D may be included in the hole transport auxiliary layer.

[Group F]
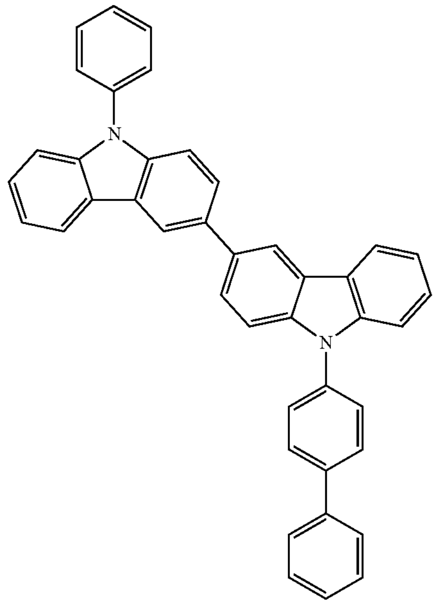
-continued
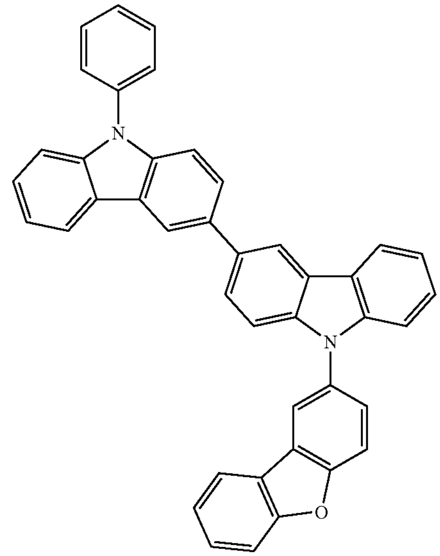
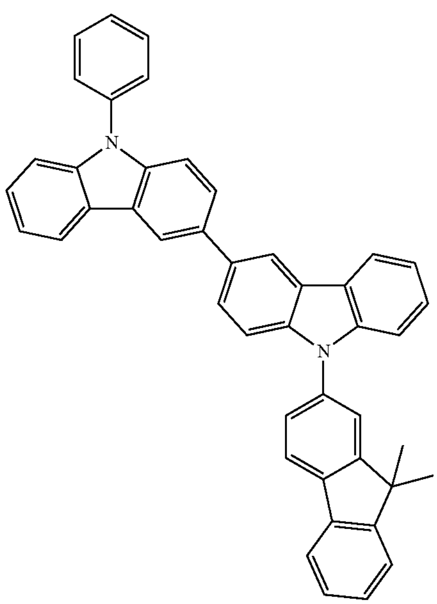
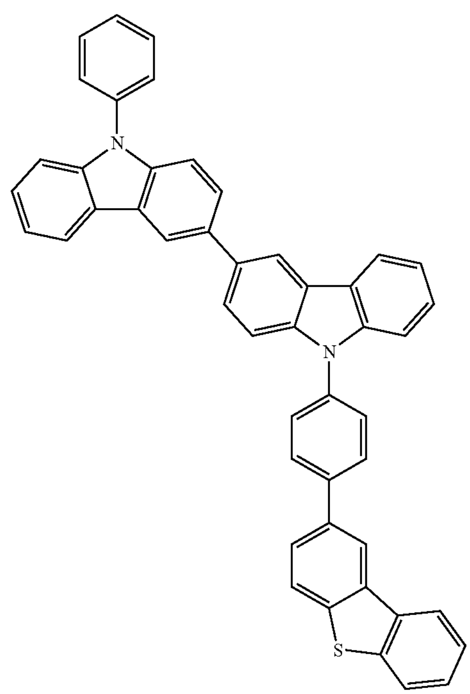

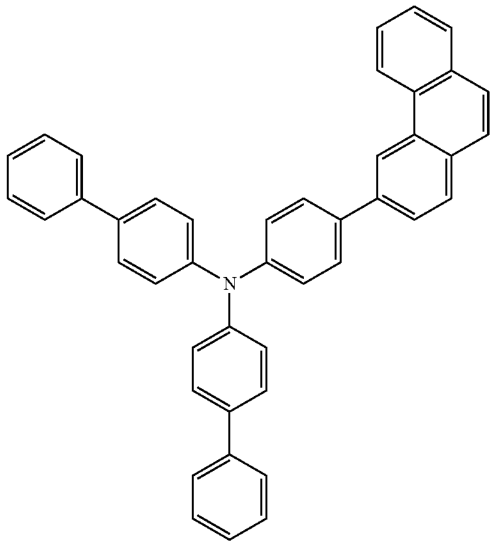
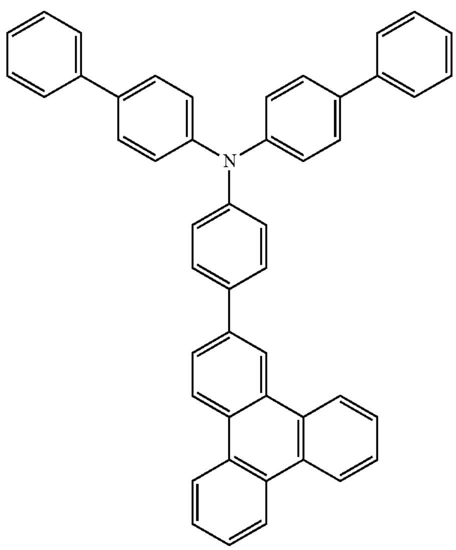
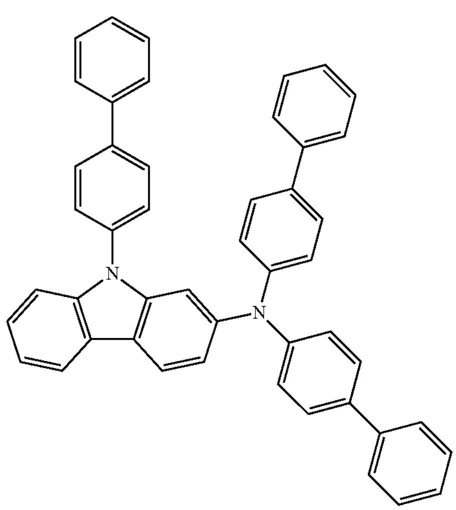
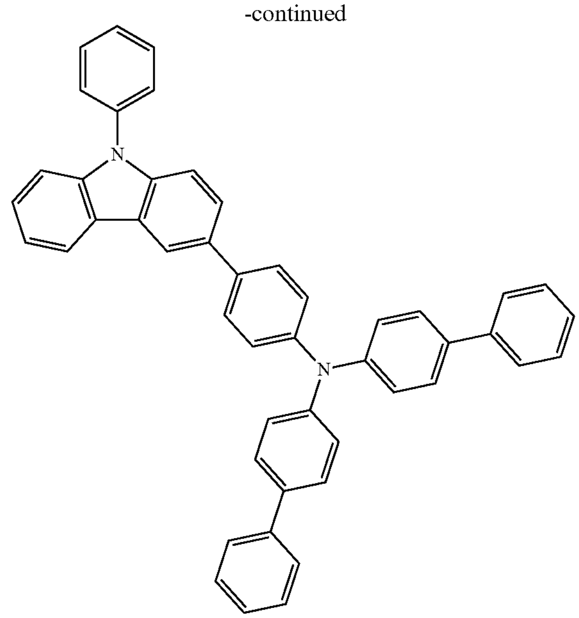
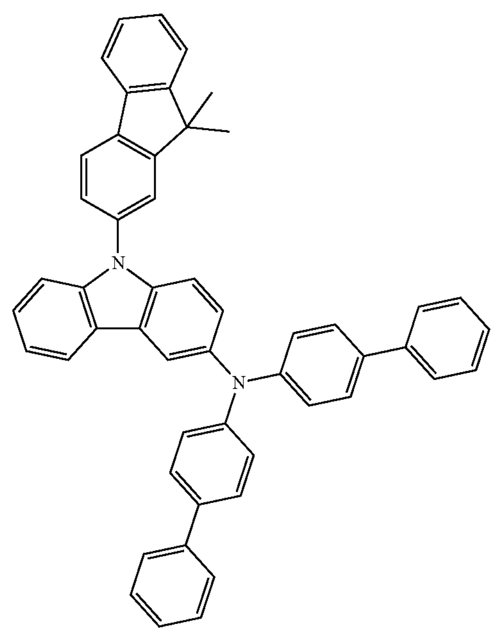

-continued
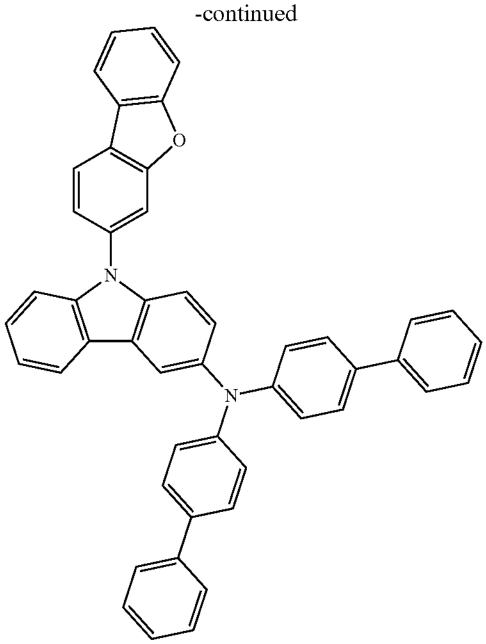
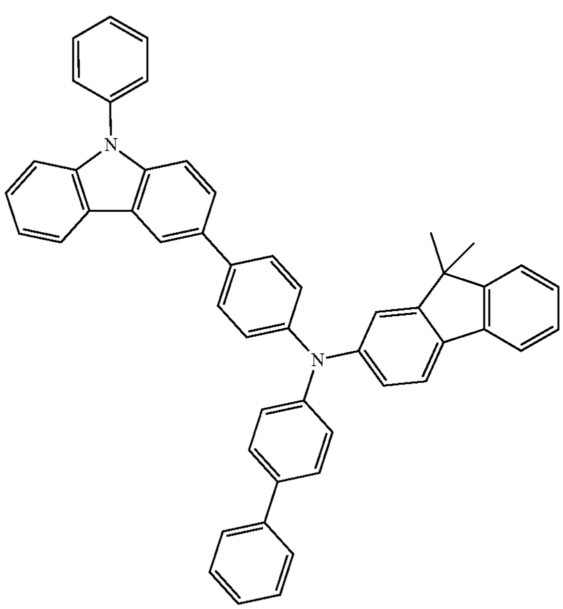
-continued
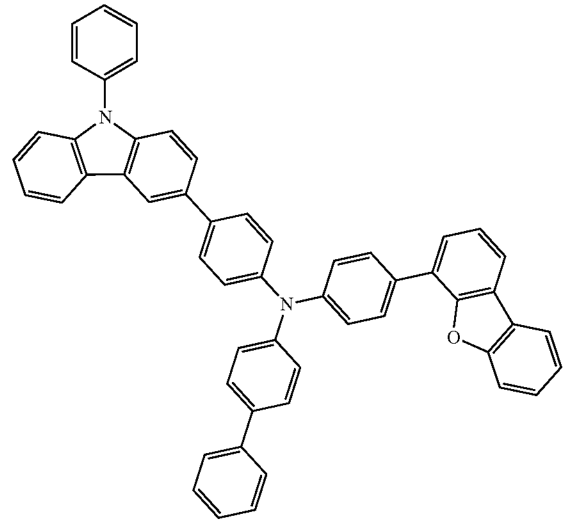
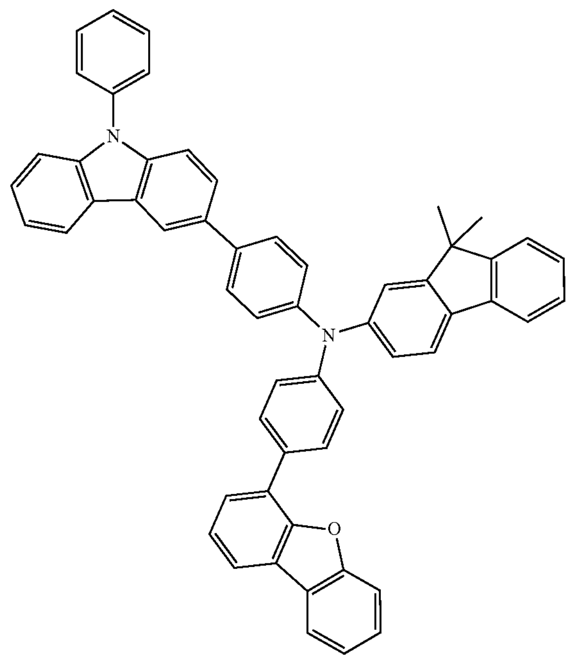
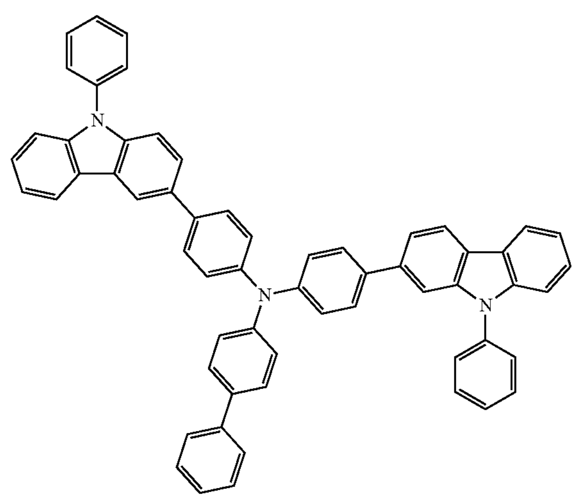

-continued
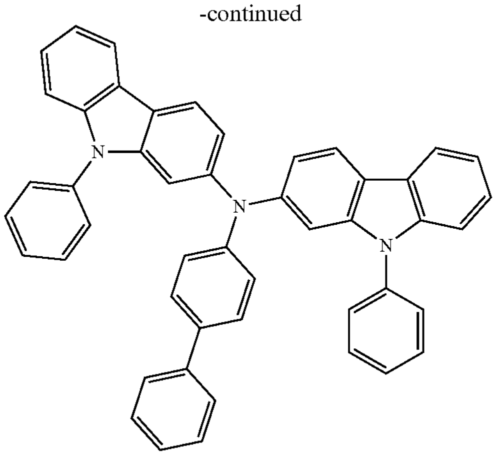
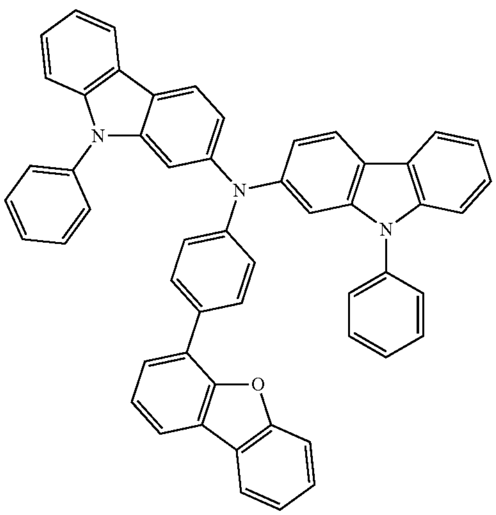
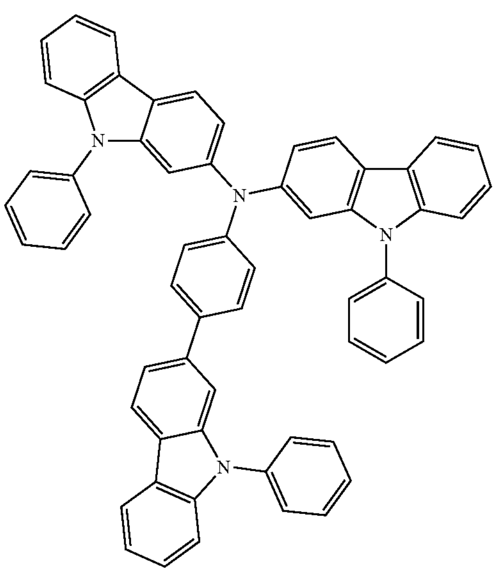
-continued
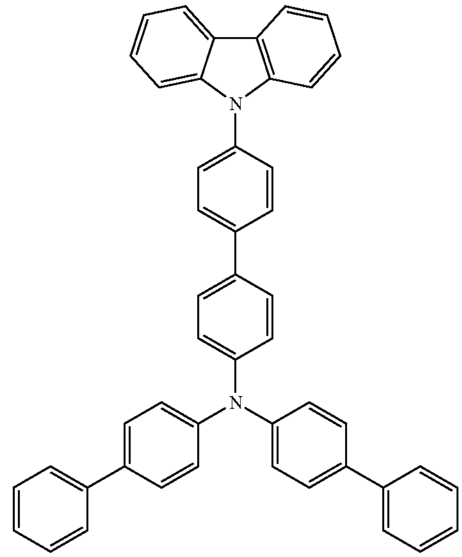
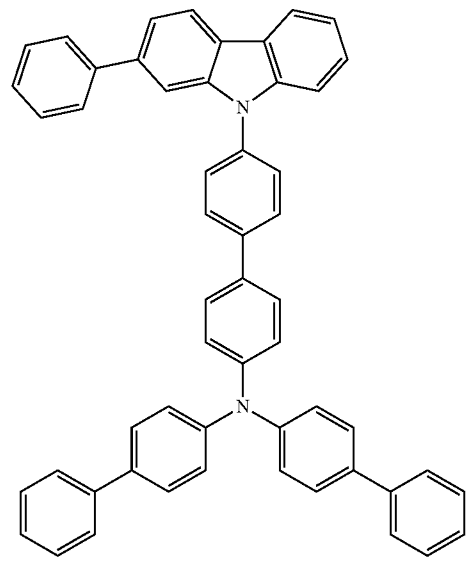
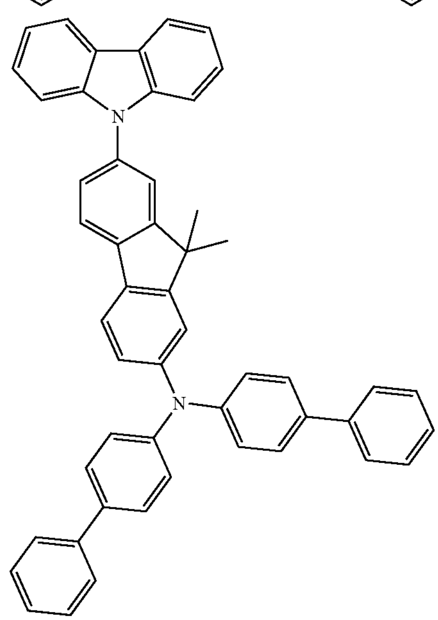

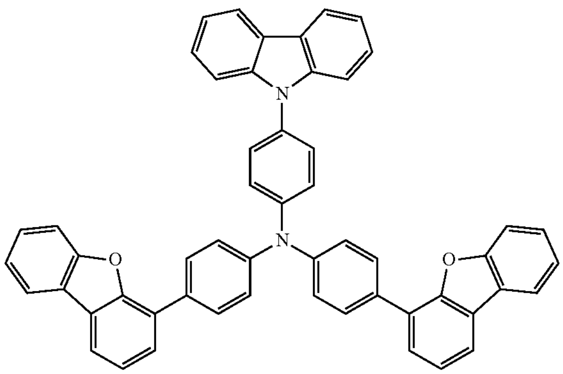
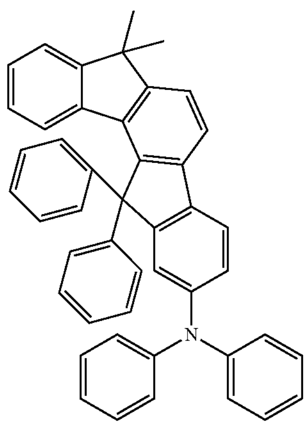
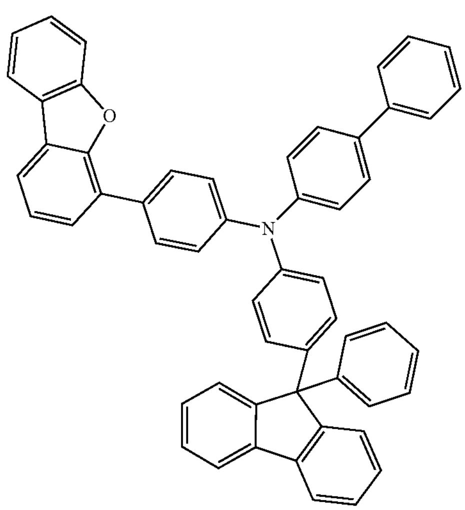
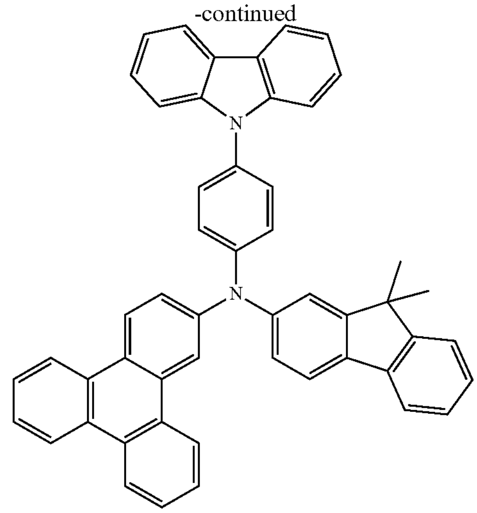
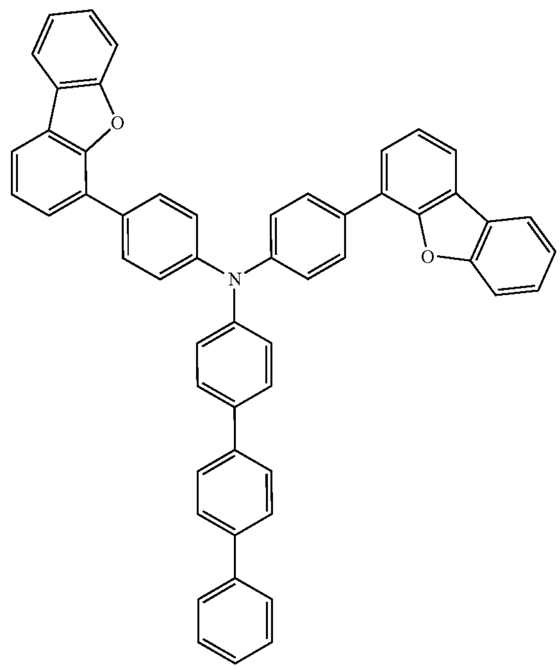
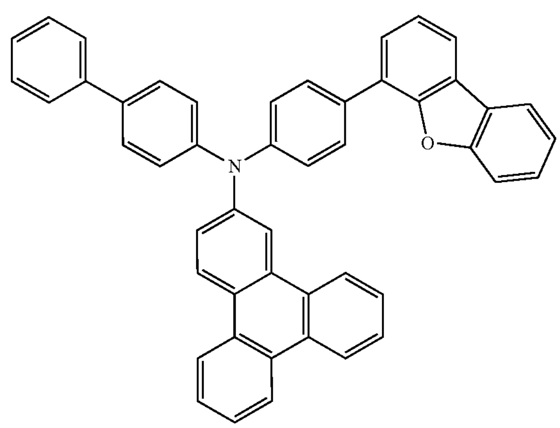
N
O

-continued
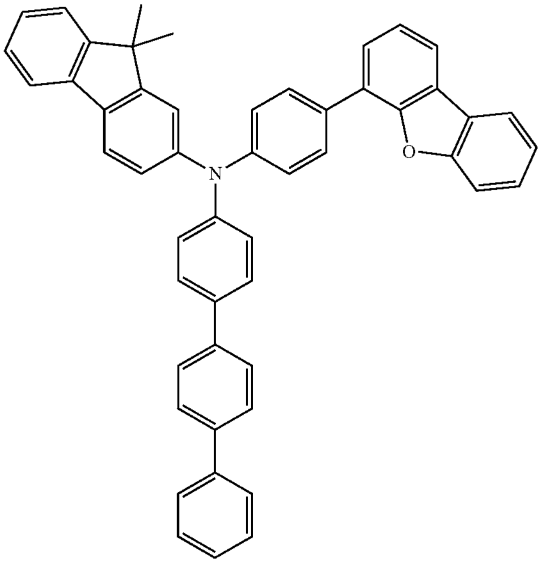
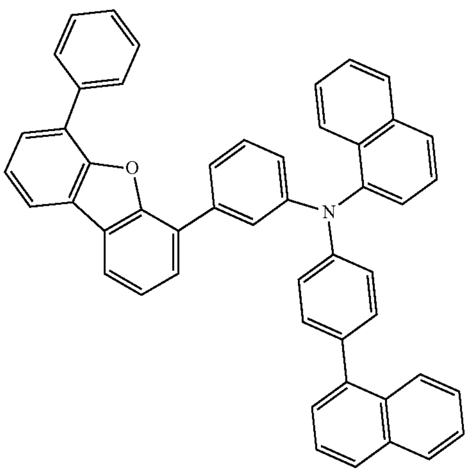
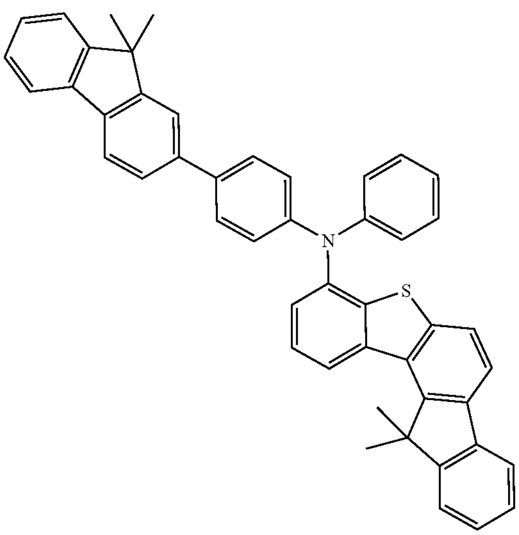
-continued
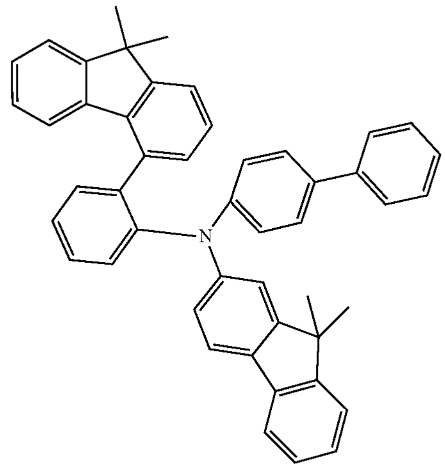
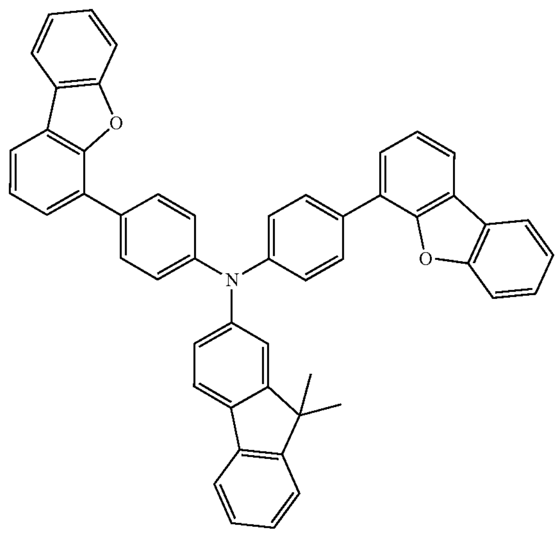
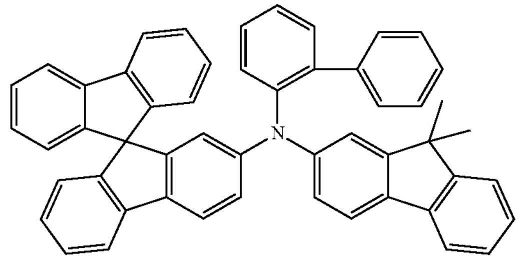

-continued
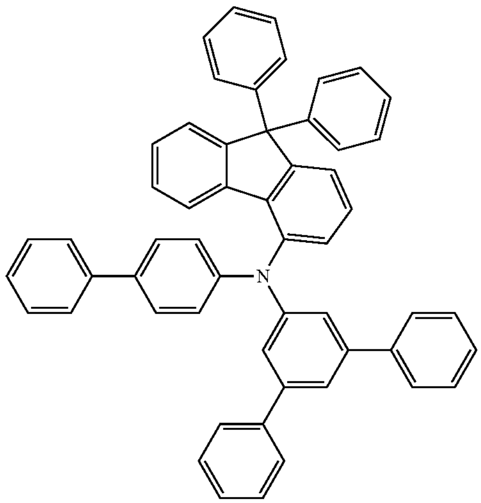
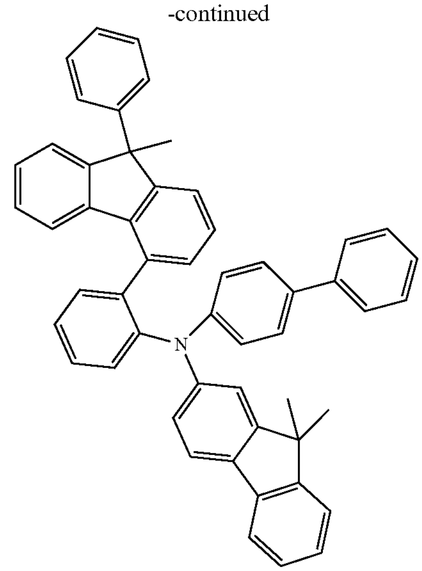
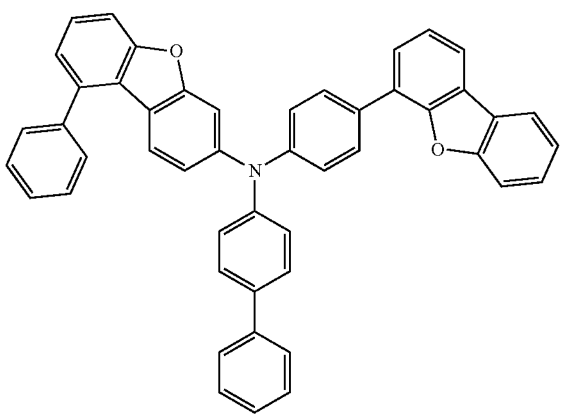
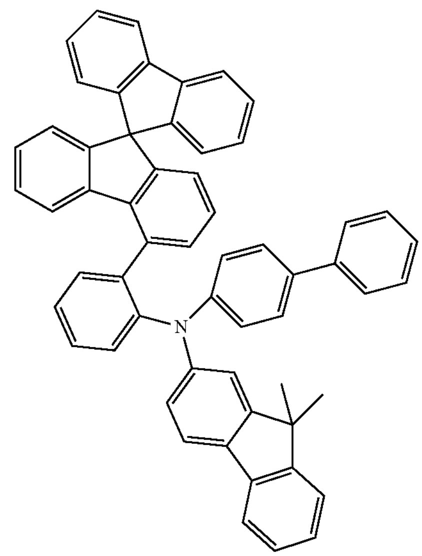
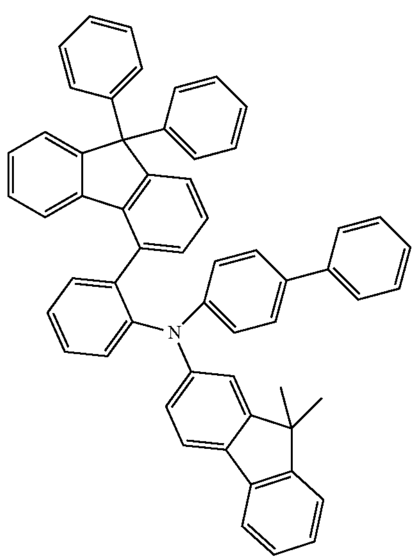
-continued
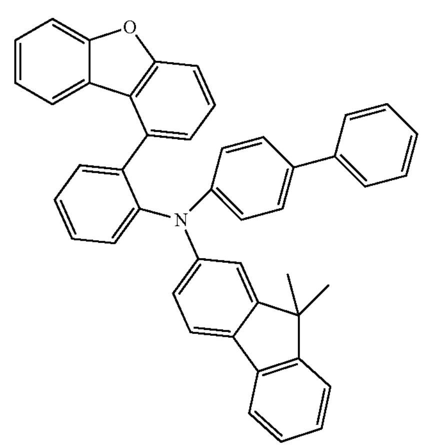

-continued
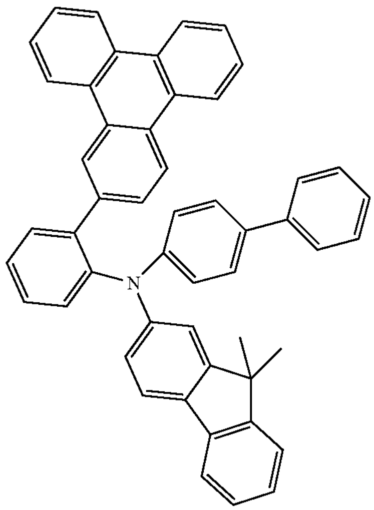
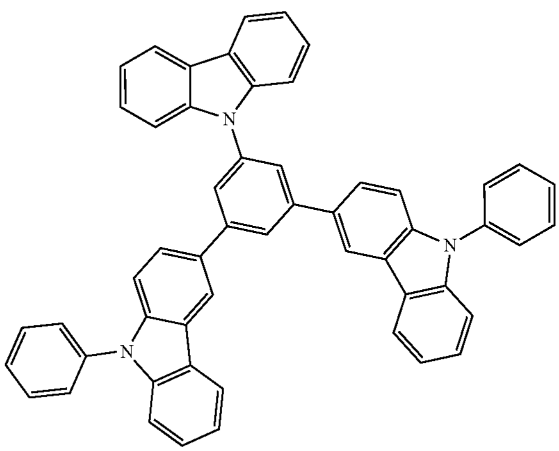
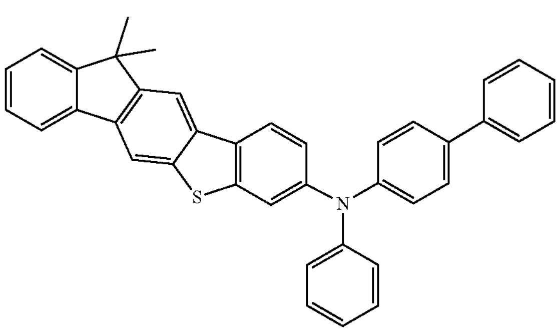
-continued
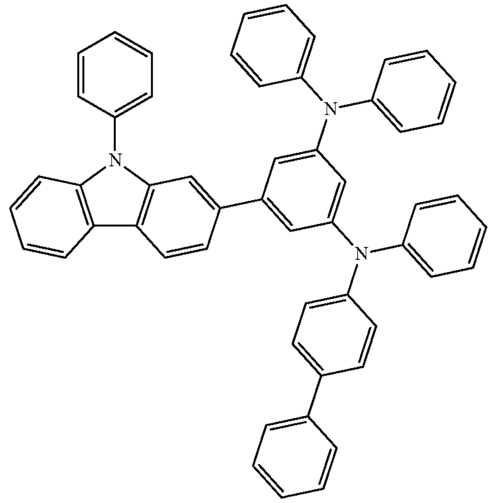
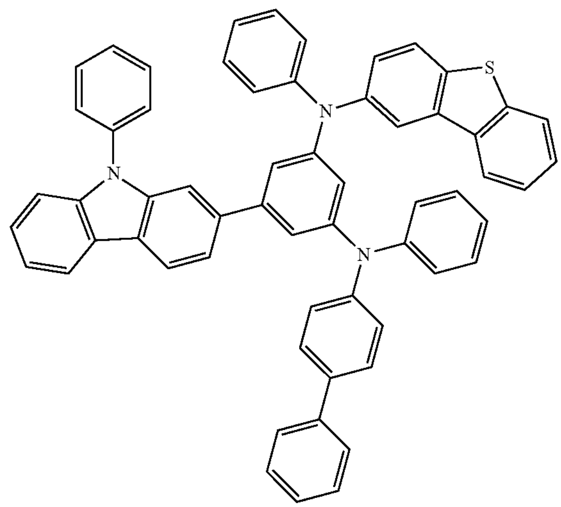
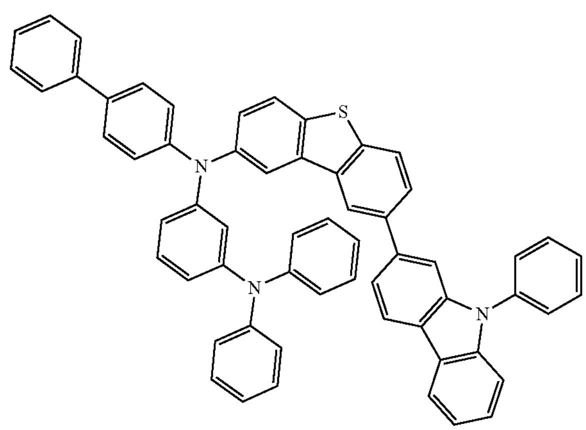

-continued
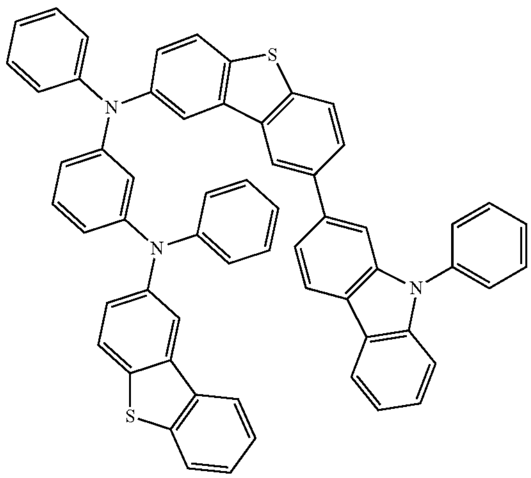
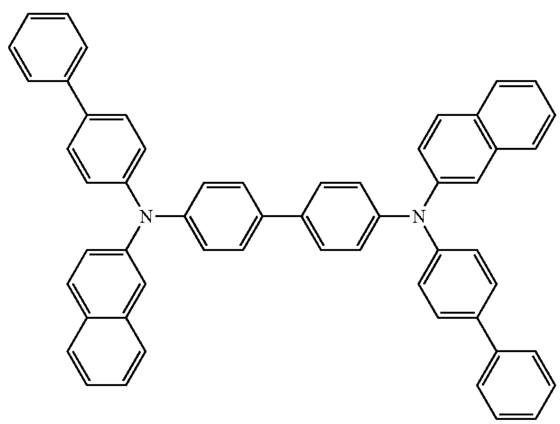
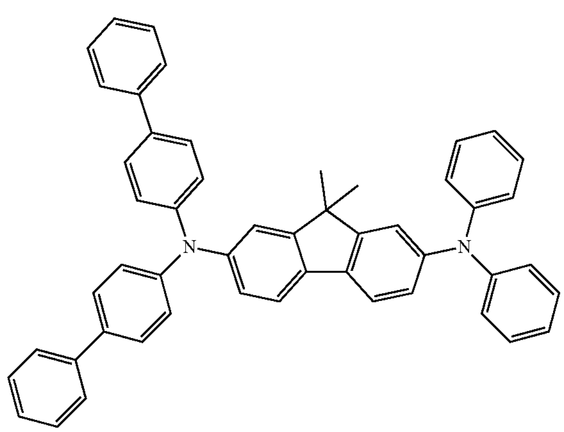
-continued
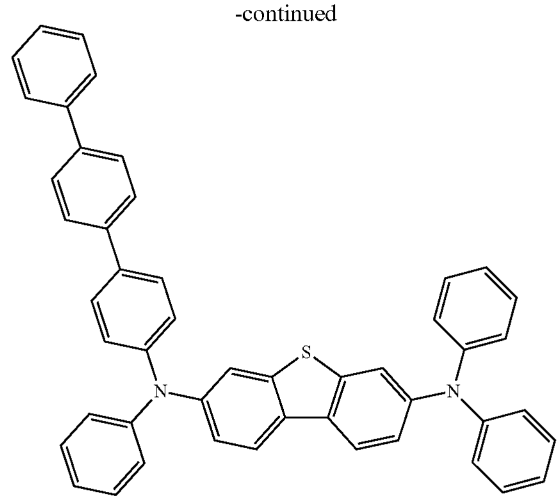
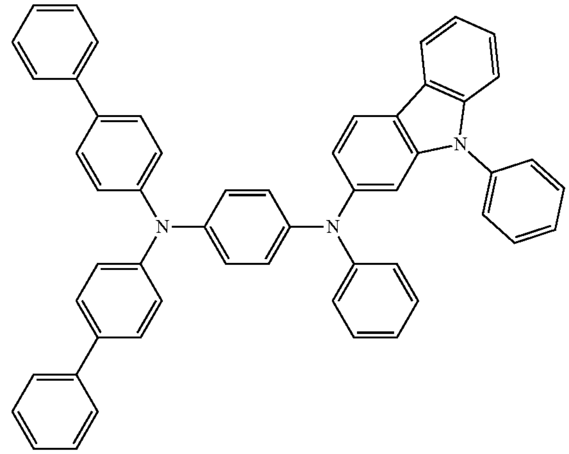
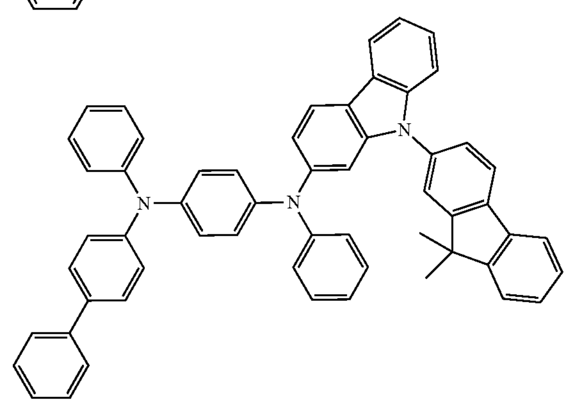
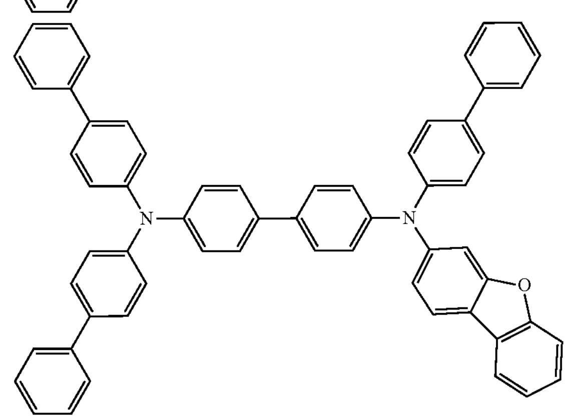

-continued
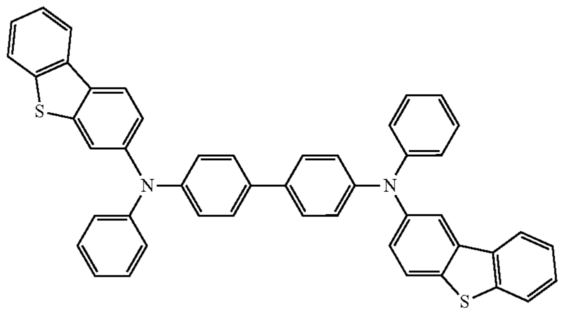
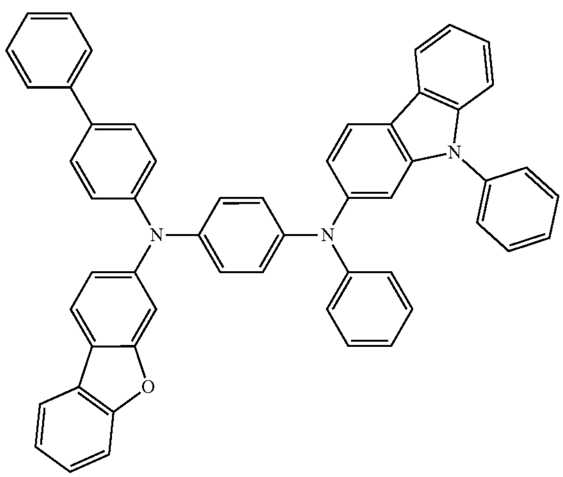
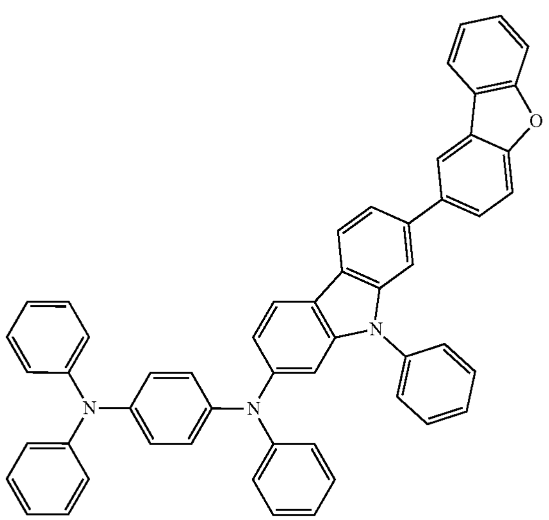
-continued
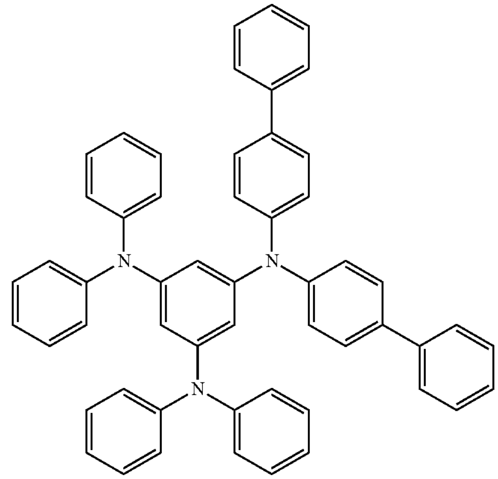
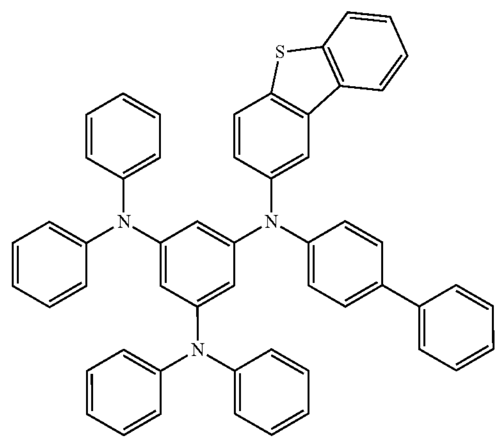
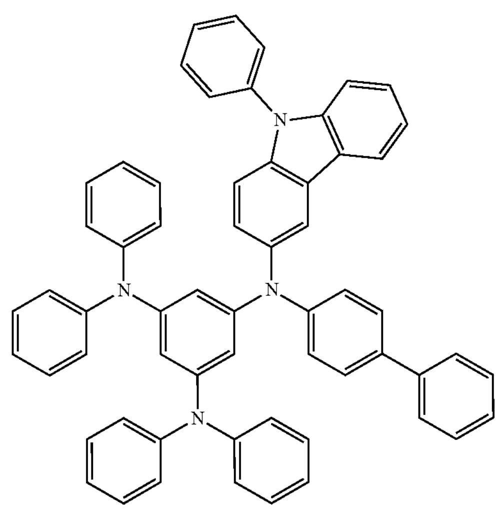

-continued
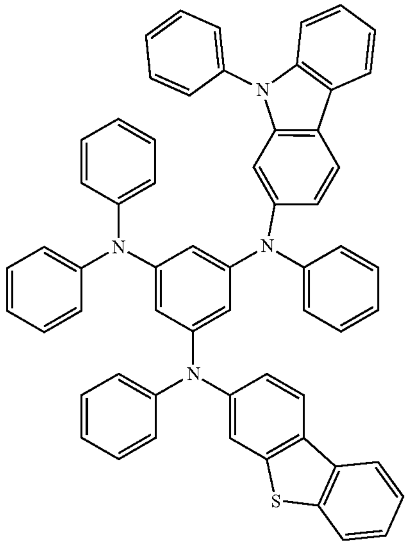
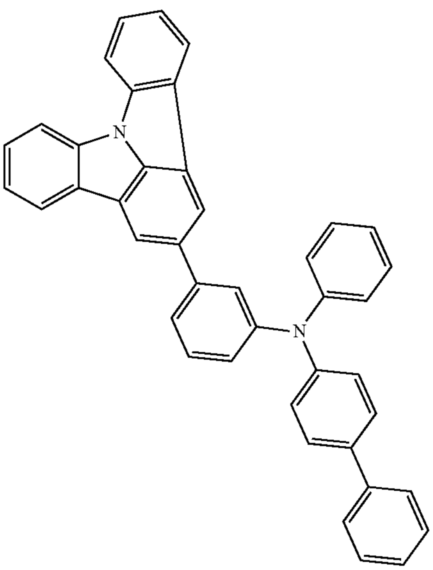
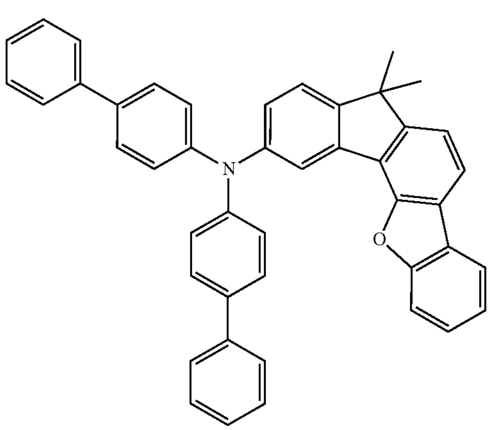
-continued
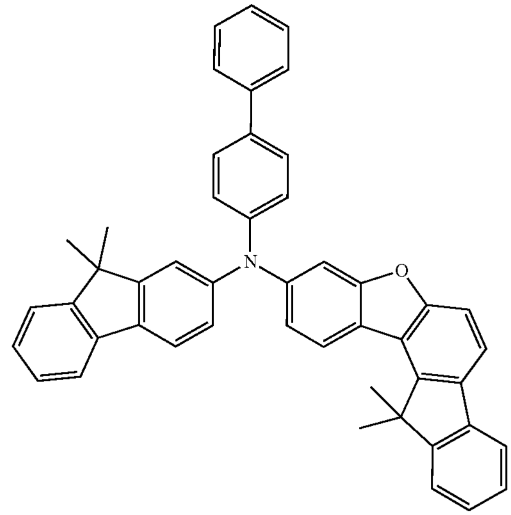
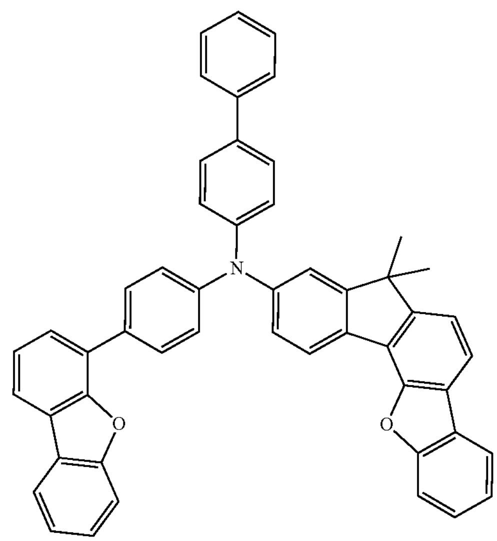
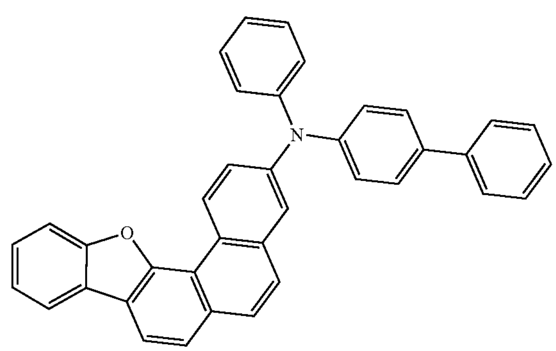

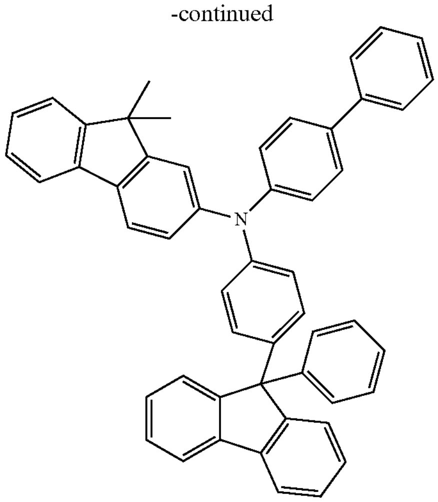
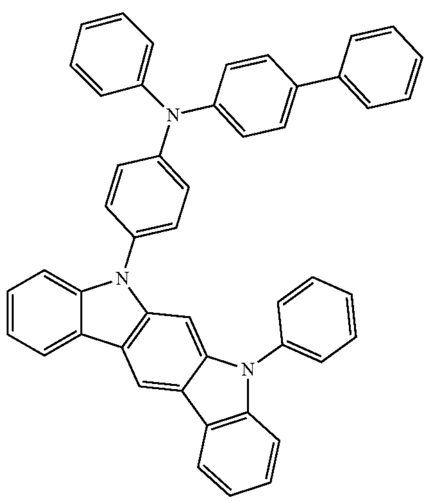
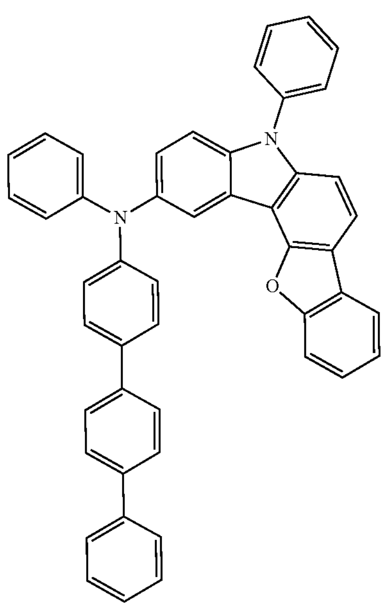
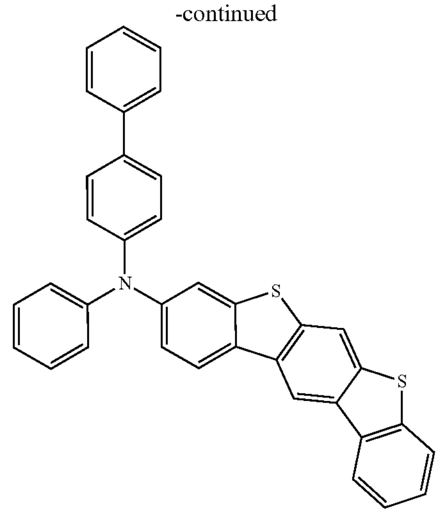
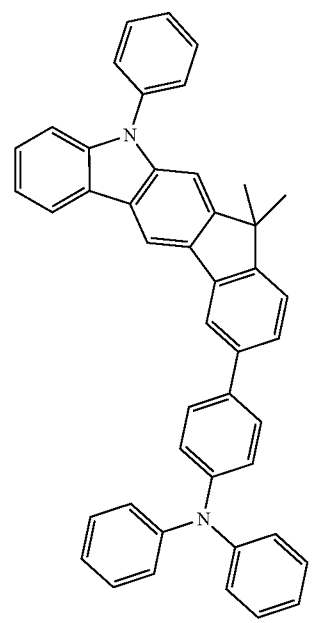
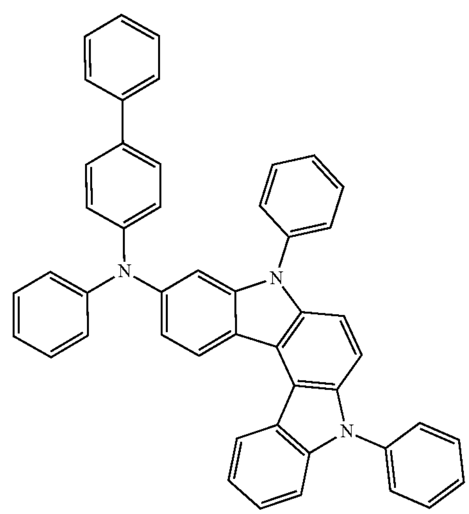

-continued

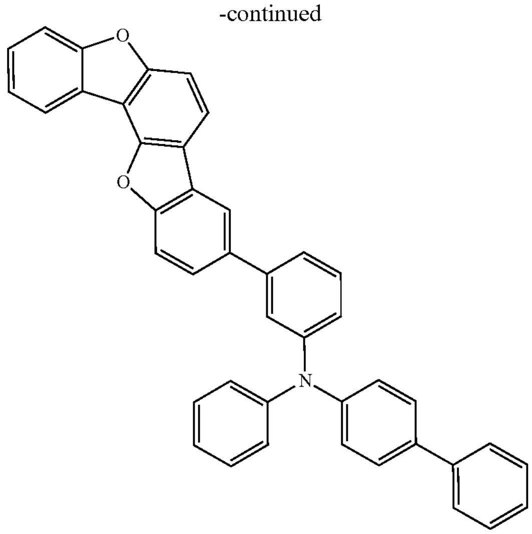

In the hole transport auxiliary layer, known compounds disclosed in U.S. Pat. No. 5,061,569A, JP1993-009471A, WO1995-009147A1, JP1995-126615A, JP1998-095973A, and the like and compounds similar thereto may be used in addition to the compounds.

In an embodiment of the present invention, in FIG. 1 or 2, an organic light emitting diode may further include an electron transport layer, an electron injection layer, or a hole injection layer as the organic layer 105.

The organic light emitting diodes 100 and 200 may be manufactured by forming an anode or a cathode on a substrate, forming an organic layer using a dry film formation method such as a vacuum deposition method (evaporation), sputtering, plasma plating, and ion plating, and forming a cathode or an anode thereon.

The organic light emitting diode may be applied to an organic light emitting display device.

MODE FOR INVENTION

Hereinafter, the embodiments are illustrated in more detail with reference to examples. However, these examples are exemplary, and the present scope is not limited thereto.

Hereinafter, starting materials and reactants used in Examples and Synthesis Examples were purchased from Sigma-Aldrich Co. Ltd., TCI Inc., Tokyo chemical industry or P&H tech as far as there in no particular comment or were synthesized by known methods.

The synthesis intermediates were synthesized referring to KR10-1423173 B1.

M-3

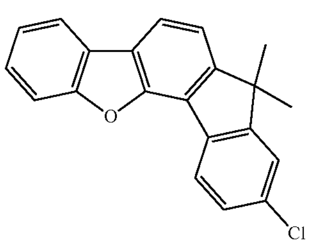

-continued

M-6

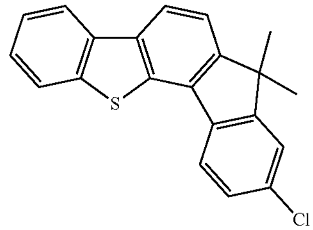

M-10

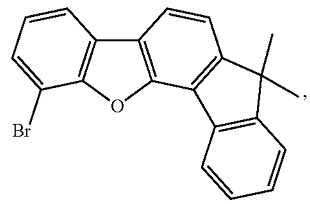

M-11

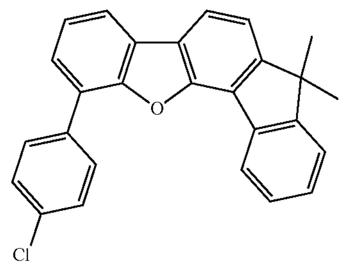

M-15

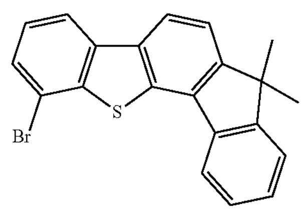

M-16

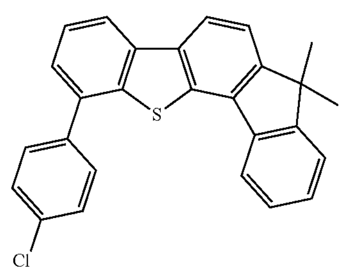

M-40

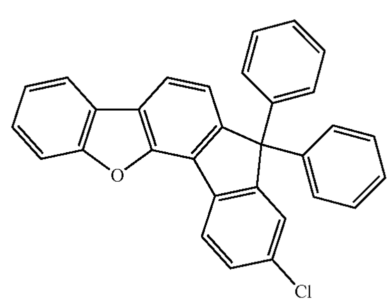

(Preparation of First Compound for Organic Optoelectronic Device)

Synthesis Example 1: Synthesis of Compound A-52

[Reaction Scheme 1]

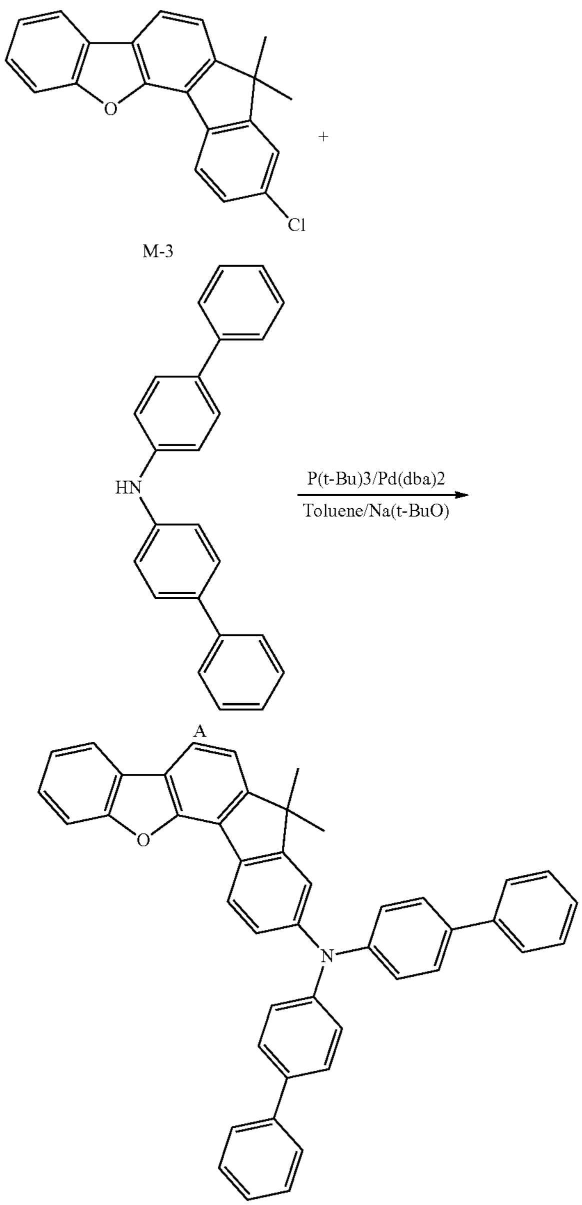

5.0 g (15.68 mmol) of Intermediate M-3, 5.04 g (15.68 mmol) of Intermediate A, 4.52 g (47.95 mmol) of sodium t-butoxide, and 0.1 g (0.47 mmol) of tri-tert-butylphosphine were dissolved in 200 ml of toluene, 0.27 g (0.47 mmol) of $Pd(dba)_2$ was put therein, and the mixture was refluxed and stirred under a nitrogen atmosphere for 12 hours. When the reaction was complete, the resultant was extracted with toluene and distilled water, the organic layer was dried with anhydrous magnesium sulfate and filtered, and then filtered solution was concentrated under a reduced pressure. The product was purified through a silica gel column chromatography by using normal hexane/dichloromethane (volume ratio of 2:1) to obtain 7.8 g (yield: 82.3%) of a target compound A-52 as a white solid.

Calculation value: C, 89.52; H, 5.51; N, 2.32; O, 2.65.

Analysis value: C, 89.51; H, 5.52; N, 2.32; O, 2.65.

Synthesis Example 2: Synthesis of Compound A-82

[Reaction Scheme 2]

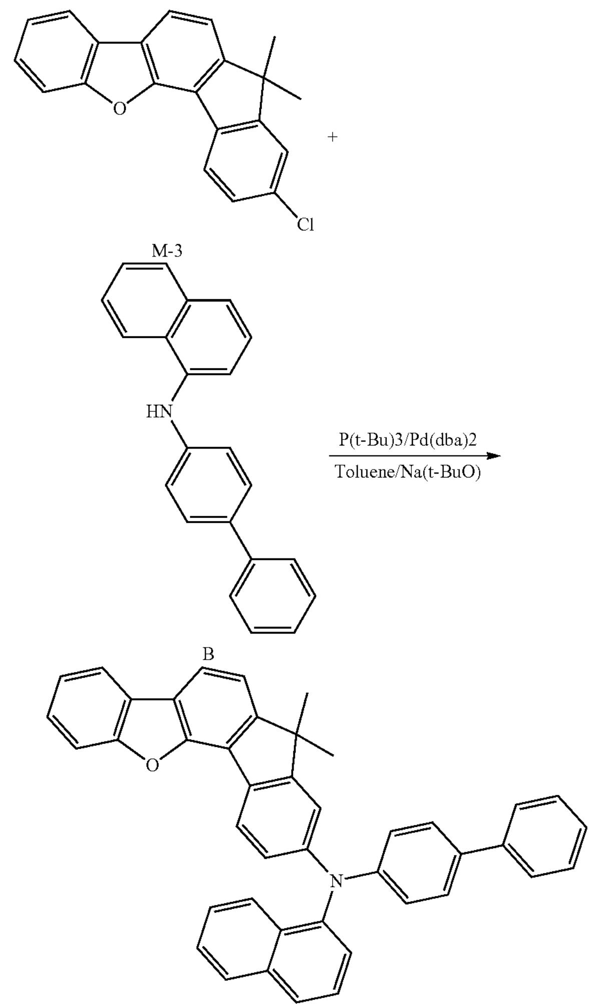

5.0 g (15.68 mmol) of Intermediate M-3, 4.63 g (15.68 mmol) of Intermediate B, 4.52 g (47.95 mmol) of sodium t-butoxide, 0.1 g (0.47 mmol) of tri-tert-butylphosphine were dissolved in 200 ml of toluene, 0.27 g (0.47 mmol) of $Pd(dba)_2$ was put therein, and the mixture was refluxed and stirred under a nitrogen atmosphere for 12 hours. When the reaction was complete, the resultant was extracted with toluene and distilled water, the organic layer was dried with anhydrous magnesium sulfate and filtered, and then filtered solution was concentrated under a reduced pressure. The product was purified through a silica gel column chromatography by using normal hexane/dichloromethane (volume ratio of 2:1) to obtain 7.3 g (yield: 80.5%) of a target compound A-82 as a white solid.

Calculation value: C, 89.40; H, 5.41; N, 2.42; O, 2.77.

Analysis value: C, 89.42; H, 5.39; N, 2.42; O, 2.77.

Synthesis Example 3: Synthesis of Compound A-83

[Reaction Scheme 3]

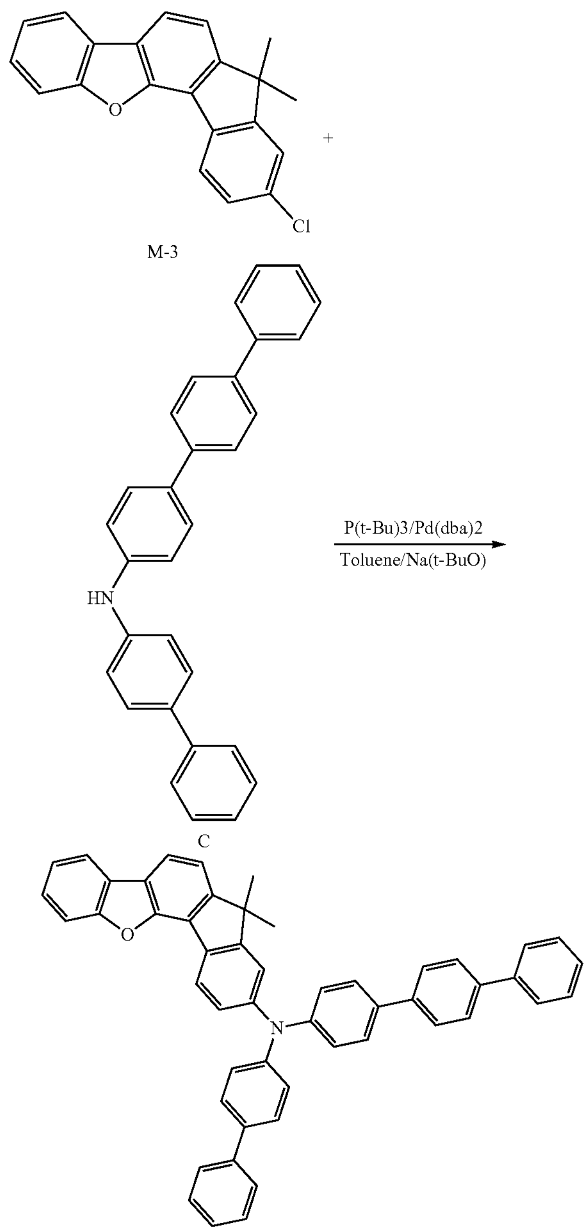

5.0 g (15.68 mmol) of Intermediate M-3, 6.23 g (15.68 mmol) of Intermediate C, 4.52 g (47.95 mmol) of sodium t-butoxide, and 0.1 g (0.47 mmol) of tri-tert-butylphosphine were dissolved in 200 ml of toluene, 0.27 g (0.47 mmol) of $Pd(dba)_2$ was put therein, and the mixture was refluxed and stirred under a nitrogen atmosphere for 12 hours. When the reaction was complete, the resultant was extracted with toluene and distilled water, the organic layer was dried with anhydrous magnesium sulfate and filtered, and then filtered solution was concentrated under a reduced pressure. The product was purified through a silica gel column chromatography by using normal hexane/dichloromethane (volume ratio of 2:1) to obtain 9.2 g (yield: 86.2%) of a target compound A-83 as a white solid.

Calculation value: C, 90.10; H, 5.49; N, 2.06; O, 2.35.

Analysis value: C, 90.12; H, 5.47; N, 2.06; O, 2.35.

Synthesis Example 4: Synthesis of Compound A-56

[Reaction Scheme 4]

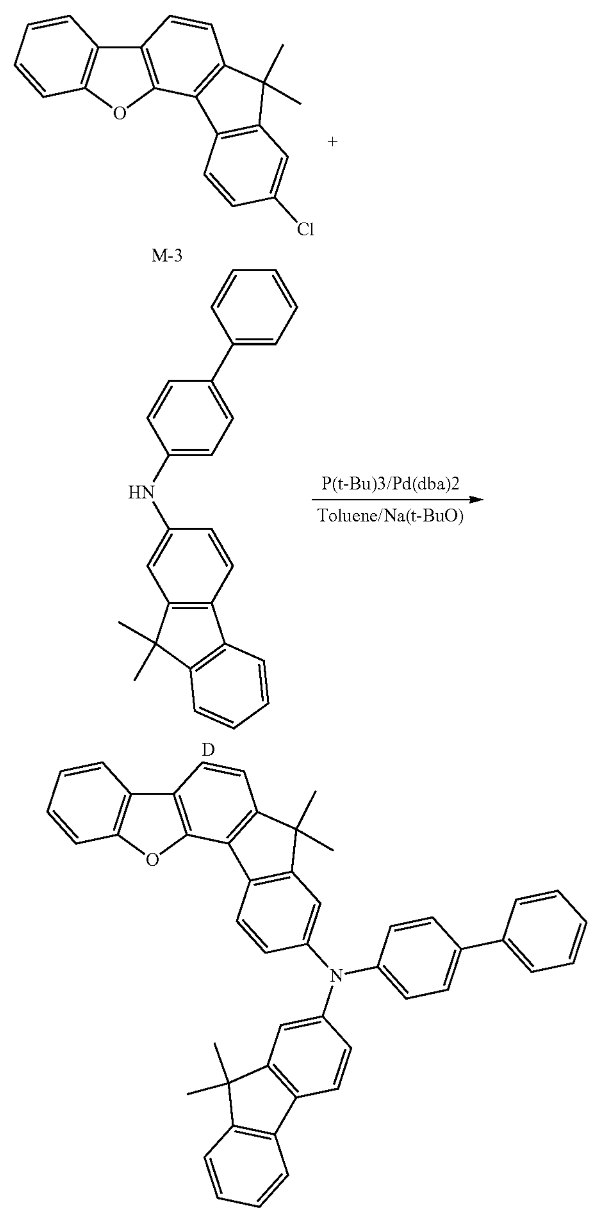

5.0 g (15.68 mmol) of Intermediate M-3, 5.67 g (15.68 mmol) of Intermediate D, 4.52 g (47.95 mmol) of sodium t-butoxide, and 0.1 g (0.47 mmol) of tri-tert-butylphosphine were dissolved in 200 ml of toluene, 0.27 g (0.47 mmol) of $Pd(dba)_2$ was put therein, and the mixture was refluxed and stirred under a nitrogen atmosphere for 12 hours. When the reaction was complete, the resultant was extracted with toluene and distilled water, the organic layer was dried with anhydrous magnesium sulfate and filtered, and then filtered solution was concentrated under a reduced pressure. The product was purified through a silica gel column chromatography by using normal hexane/dichloromethane (volume ratio of 2:1) to obtain 8.6 g (yield: 85.1%) of a target compound A-56 as a white solid.

Calculation value: C, 89.55; H, 5.79; N, 2.18; 0, 2.49.

Analysis value: C, 89.56; H, 5.78; N, 2.18; O, 2.49.

Synthesis Example 5: Synthesis of Compound A-70

[Reaction Scheme 5]

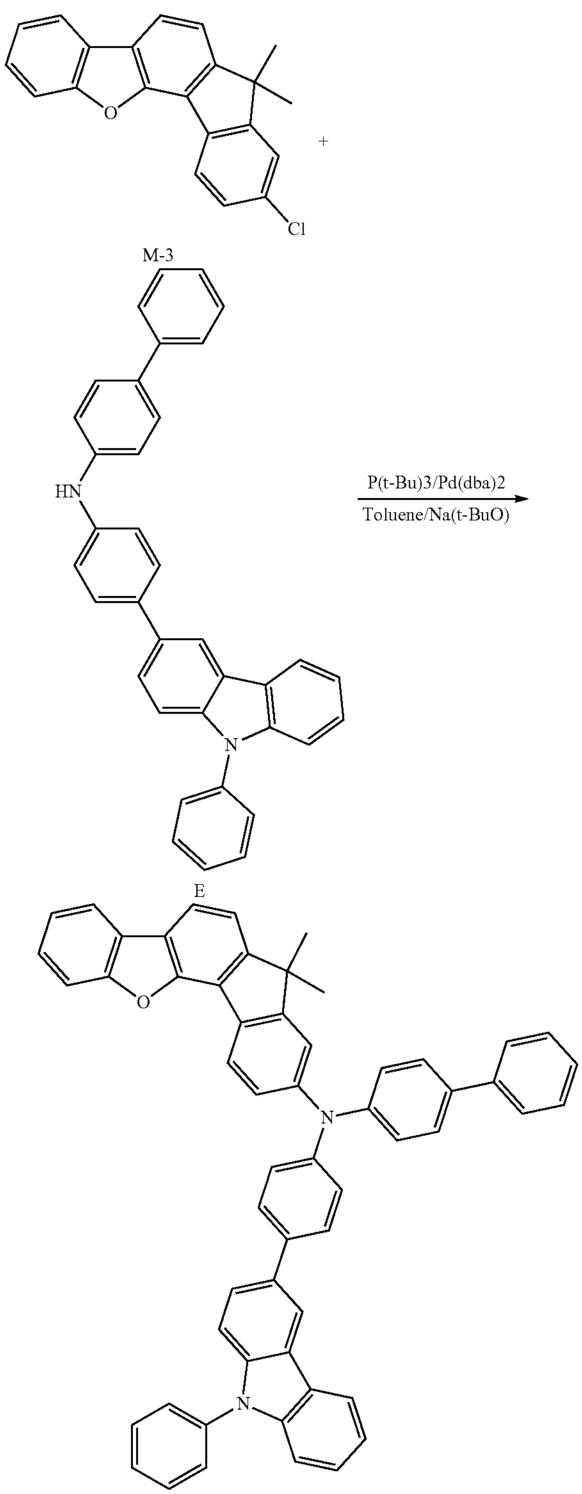

5.0 g (15.68 mmol) of Intermediate M-3, 7.63 g (15.68 mmol) of Intermediate E, 4.52 g (47.95 mmol) of sodium t-butoxide, and 0.1 g (0.47 mmol) of tri-tert-butylphosphine were dissolved in 200 ml of toluene, 0.27 g (0.47 mmol) of $Pd(dba)_2$ was put therein, and the mixture was refluxed and stirred under a nitrogen atmosphere for 12 hours. When the reaction was complete, the resultant was extracted with toluene and distilled water, the organic layer was dried with anhydrous magnesium sulfate and filtered, and then filtered solution was concentrated under a reduced pressure. The product was purified through a silica gel column chromatography by using normal hexane/dichloromethane (volume ratio of 2:1) to obtain 10.5 g (yield: 87%) of a target compound A-70 as a white solid.

Calculation value: C, 89.03; H, 5.24; N, 3.64; O, 2.08.

Analysis value: C, 89.01; H, 5.26; N, 3.64; O, 2.08.

Synthesis Example 6: Synthesis of Compound A-76

[Reaction Scheme 6]

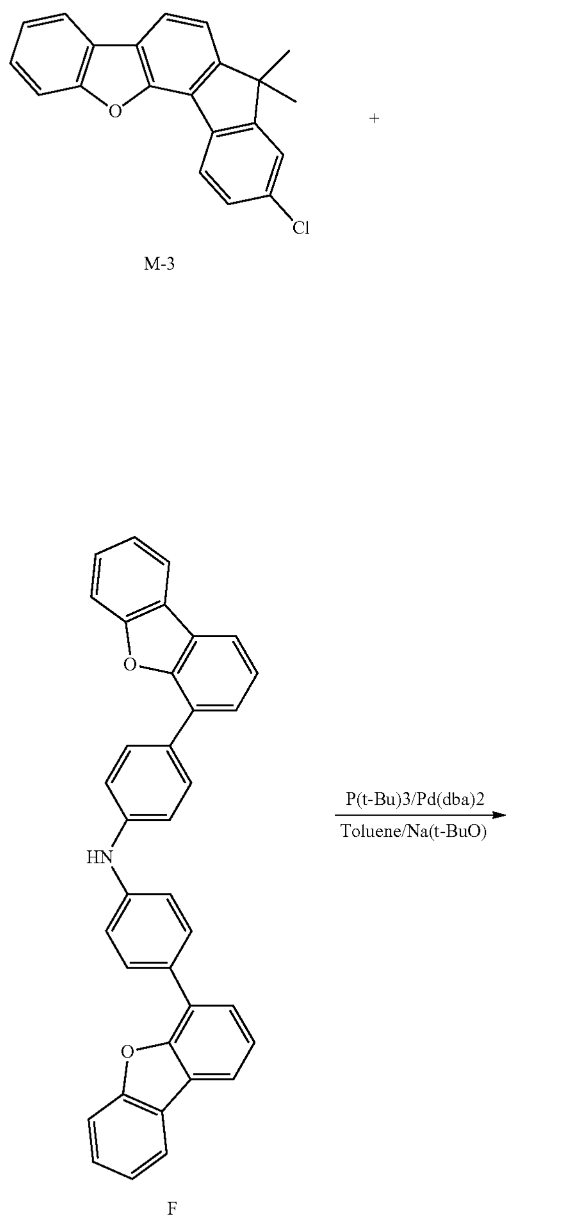

-continued

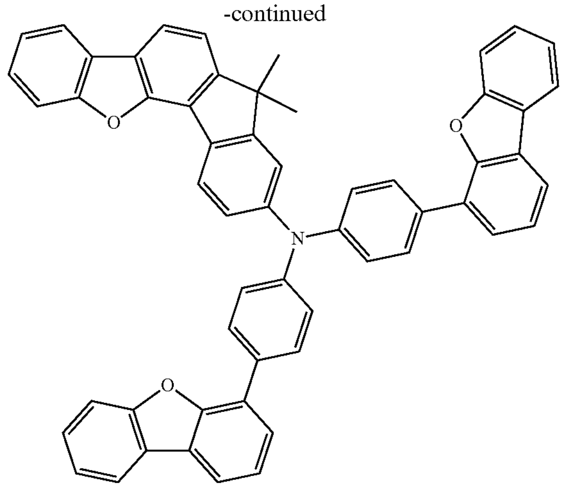

5.0 g (15.68 mmol) of Intermediate M-3, 7.87 g (15.68 mmol) of Intermediate F, 4.52 g (47.95 mmol) of sodium t-butoxide, and 0.1 g (0.47 mmol) of tri-tert-butylphosphine were dissolved in 200 ml of toluene, 0.27 g (0.47 mmol) of $Pd(dba)_2$ was put therein, and the mixture was refluxed and stirred under a nitrogen atmosphere for 12 hours. When the reaction was complete, the resultant was extracted with toluene and distilled water, the organic layer was dried with anhydrous magnesium sulfate and filtered, and then filtered solution was concentrated under a reduced pressure. The product was purified through a silica gel column chromatography by using normal hexane/dichloromethane (volume ratio of 2:1) to obtain 10.7 g (yield: 87%) of a target compound A-76 as a white solid.

Calculation value: C, 87.33; H, 4.76; N, 1.79; O, 6.12.

Analysis value: C, 87.31; H, 4.78; N, 1.79; O, 6.12.

Synthesis Example 7: Synthesis of Compound A-78

[Reaction Scheme 7]

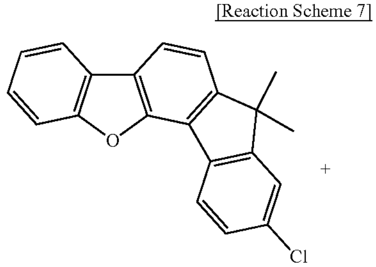

M-3

-continued

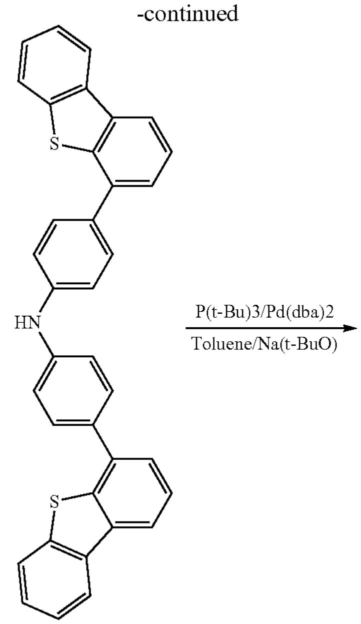

G

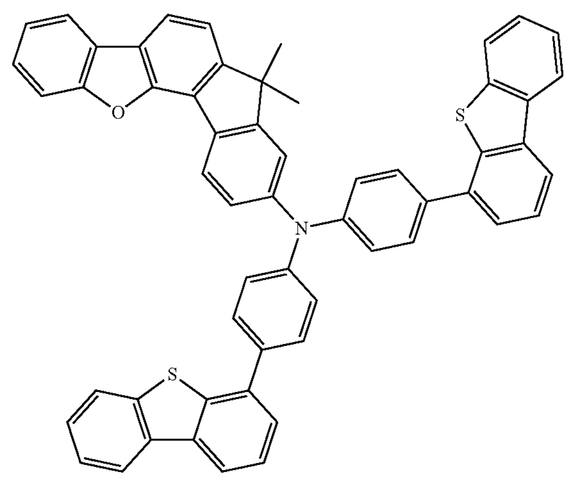

5.0 g (15.68 mmol) of Intermediate M-3, 8.37 g (15.68 mmol) of Intermediate G, 4.52 g (47.95 mmol) of sodium t-butoxide, and 0.1 g (0.47 mmol) of tri-tert-butylphosphine were dissolved in 200 ml of toluene, 0.27 g (0.47 mmol) of $Pd(dba)_2$ was put therein, and the mixture was refluxed and stirred under a nitrogen atmosphere for 12 hours. When the reaction was complete, the resultant was extracted with toluene and distilled water, the organic layer was dried with anhydrous magnesium sulfate and filtered, and then filtered solution was concentrated under a reduced pressure. The product was purified through a silica gel column chromatography by using normal hexane/dichloromethane (volume ratio of 2:1) to obtain 10.4 g (yield: 81.2%) of a target compound A-78 as a white solid.

Calculation value: C, 83.89; H, 4.57; N, 1.72; O, 1.96; S, 7.86.

Analysis value: C, 83.86; H, 4.59; N, 1.72; O, 1.96; S, 7.86.

Synthesis Example 8: Synthesis of Compound A-80

[Reaction Scheme 8]

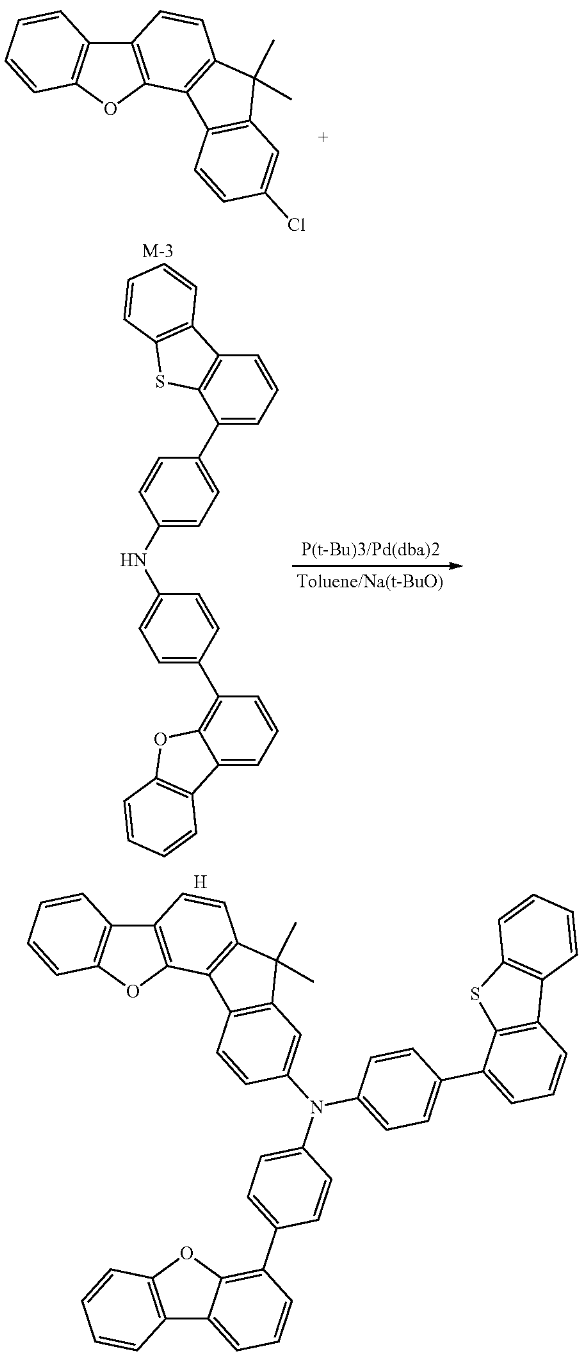

5.0 g (15.68 mmol) of Intermediate M-3, 8.12 g (15.68 mmol) of Intermediate H, 4.52 g (47.95 mmol) of sodium t-butoxide, and 0.1 g (0.47 mmol) of tri-tert-butylphosphine were dissolved in 200 ml of toluene, 0.27 g (0.47 mmol) of $Pd(dba)_2$ was put therein, and the mixture was refluxed and stirred under a nitrogen atmosphere for 12 hours. When the reaction was complete, the resultant was extracted with toluene and distilled water, the organic layer was dried with anhydrous magnesium sulfate and filtered, and then filtered solution was concentrated under a reduced pressure. The product was purified through a silica gel column chromatography by using normal hexane/dichloromethane (volume ratio of 2:1) to obtain 10.8 g (yield: 86%) of a target compound A-80 as a white solid.

calculation value: C, 85.58; H, 4.66; N, 1.75; O, 4.00; S, 4.01.

Analysis value: C, 85.59; H, 4.67; N, 1.75; O, 4.00; S, 4.01.

Synthesis Example 9: Synthesis of Compound A-84

[Reaction Scheme 9]

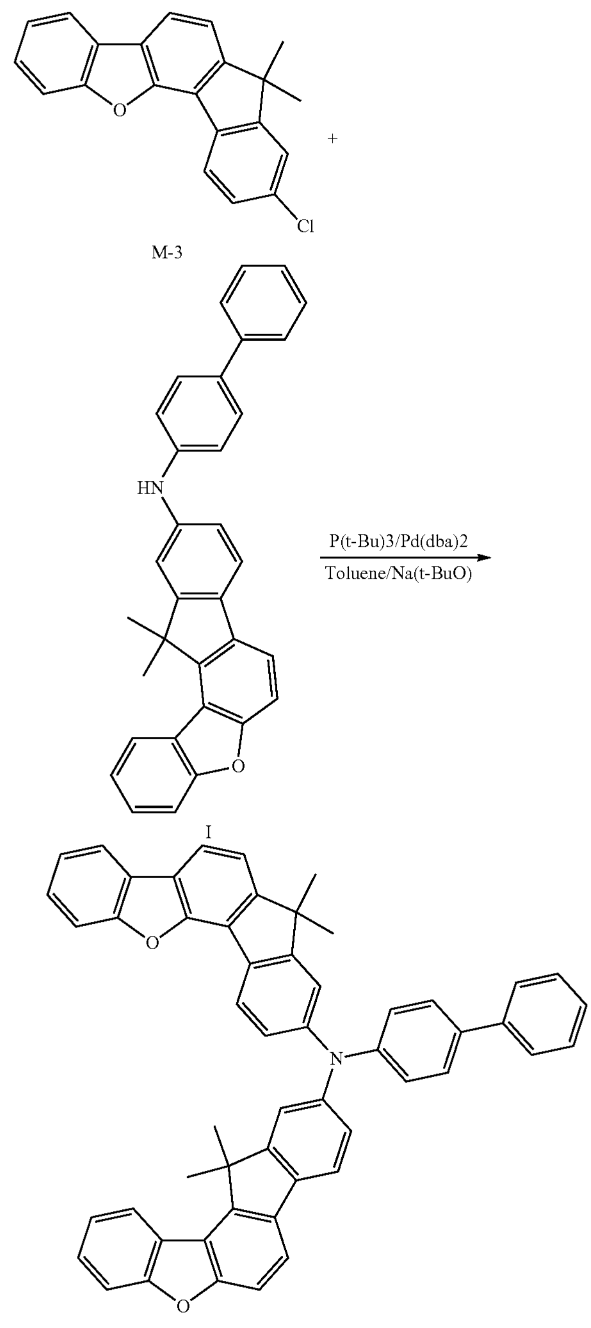

5.0 g (15.68 mmol) of Intermediate M-3, 7.08 g (15.68 mmol) of Intermediate I, 4.52 g (47.95 mmol) of sodium t-butoxide, and 0.1 g (0.47 mmol) of tri-tert-butylphosphine were dissolved in 200 ml of toluene, 0.27 g (0.47 mmol) of $Pd(dba)_2$ was put therein, and the mixture was refluxed and stirred under a nitrogen atmosphere for 12 hours. When the reaction was complete, the resultant was extracted with toluene and distilled water, the organic layer was dried with anhydrous magnesium sulfate and filtered, and then filtered solution was concentrated under a reduced pressure. The product was purified through a silica gel column chromatography by using normal hexane/dichloromethane (volume ratio of 2:1) to obtain 9.4 g (yield: 81.6%) of a target compound A-84 as a white solid.

calculation value: C, 88.37; H, 5.36; N, 1.91; O, 4.36.

Analysis value: C, 88.35; H, 5.38; N, 1.91; O, 4.36.

Synthesis Example 10: Synthesis of Compound A-85

[Reaction Scheme 10]

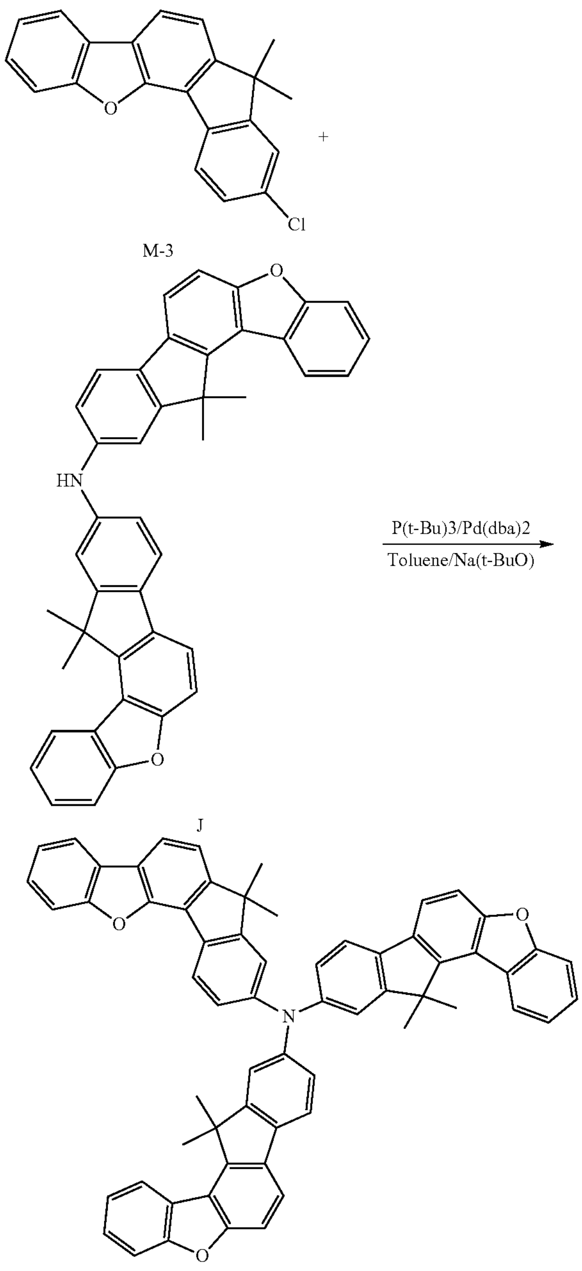

5.0 g (15.68 mmol) of Intermediate M-3, 9.12 g (15.68 mmol) of Intermediate J, 4.52 g (47.95 mmol) of sodium t-butoxide, and 0.1 g (0.47 mmol) of tri-tert-butylphosphine were dissolved in 200 ml of toluene, 0.27 g (0.47 mmol) of $Pd(dba)_2$ was put therein, and the mixture was refluxed and stirred under a nitrogen atmosphere for 12 hours. When the reaction was complete, the resultant was extracted with toluene and distilled water, the organic layer was dried with anhydrous magnesium sulfate and filtered, and then filtered solution was concentrated under a reduced pressure. The product was purified through a silica gel column chromatography by using normal hexane/dichloromethane (volume ratio of 2:1) to obtain 10.4 g (yield: 76.7%) of a target compound A-85 as a white solid.

Calculation value: C, 87.57; H, 5.25; N, 1.62; O, 5.56.

Analysis value: C, 87.59; H, 5.23; N, 1.62; O, 5.56.

Synthesis Example 11: Synthesis of Compound A-53

[Reaction Scheme 11]

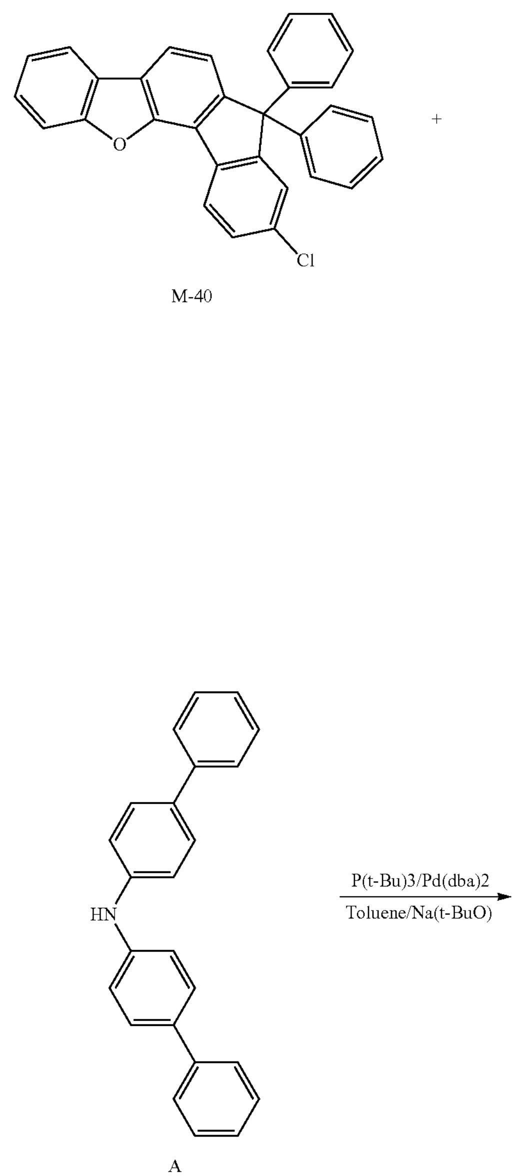

-continued

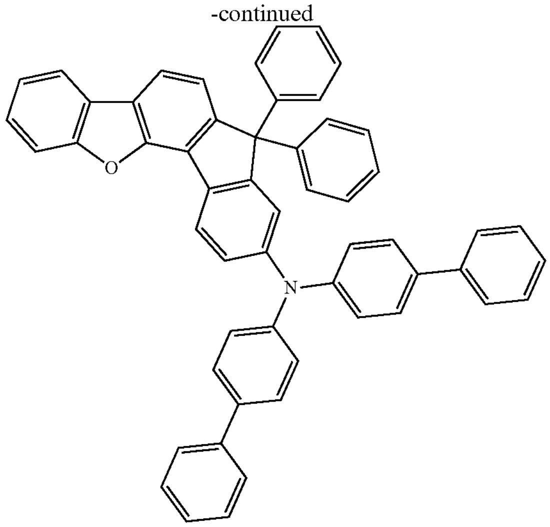

5.0 g (11.29 mmol) of Intermediate M-40, 3.63 g (11.29 mmol) of Intermediate A, 3.25 g (33.87 mmol) of sodium t-butoxide, and 0.07 g (0.34 mmol) of tri-tert-butylphosphine were dissolved in 200 ml of toluene, 0.19 g (0.34 mmol) of $Pd(dba)_2$ was put therein, and the mixture was refluxed and stirred under a nitrogen atmosphere for 12 hours. When the reaction was complete, the resultant was extracted with toluene and distilled water, the organic layer was dried with anhydrous magnesium sulfate and filtered, and then filtered solution was concentrated under a reduced pressure. The product was purified through a silica gel column chromatography by using normal hexane/dichloromethane (volume ratio of 2:1) to obtain 7.3 g (yield: 88.8%) of a target compound A-53 as a white solid.

Calculation value: C, 90.75; H, 5.12; N, 1.92; O, 2.20.

Analysis value: C, 90.73; H, 5.14; N, 1.92; O, 2.20.

Synthesis Example 12: Synthesis of Compound A-54

[Reaction Scheme 12]

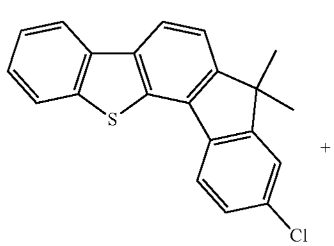

M-6

-continued

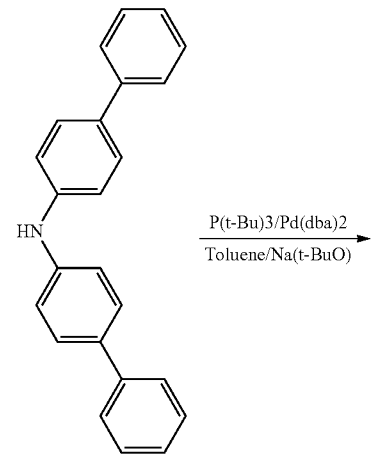

A

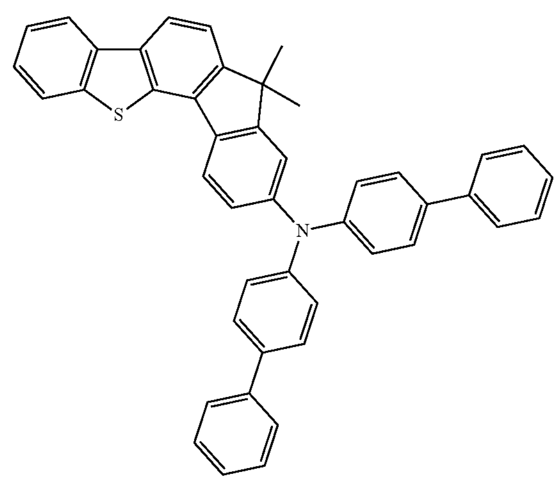

5.0 g (14.93 mmol) of Intermediate M-6, 4.8 g (14.93 mmol) of Intermediate A, 4.31 g (44.79 mmol) of sodium t-butoxide, and 0.09 g (0.45 mmol) of tri-tert-butylphosphine were dissolved in 200 ml of toluene, 0.26 g (0.45 mmol) of $Pd(dba)_2$ was put therein, and the mixture was refluxed and stirred under a nitrogen atmosphere for 12 hours. When the reaction was complete, the resultant was extracted with toluene and distilled water, the organic layer was dried with anhydrous magnesium sulfate and filtered, and then filtered solution was concentrated under a reduced pressure. The product was purified through a silica gel column chromatography by using normal hexane/dichloromethane (volume ratio of 2:1) to obtain 7.5 g (yield: 81%) of a target compound A-54 as a white solid.

Calculation value: C, 87.20; H, 5.37; N, 2.26; S, 5.17.

Analysis value: C, 87.22; H, 5.35; N, 2.26; S, 5.17.

Synthesis Example 13: Synthesis of Compound A-87

[Reaction Scheme 13]

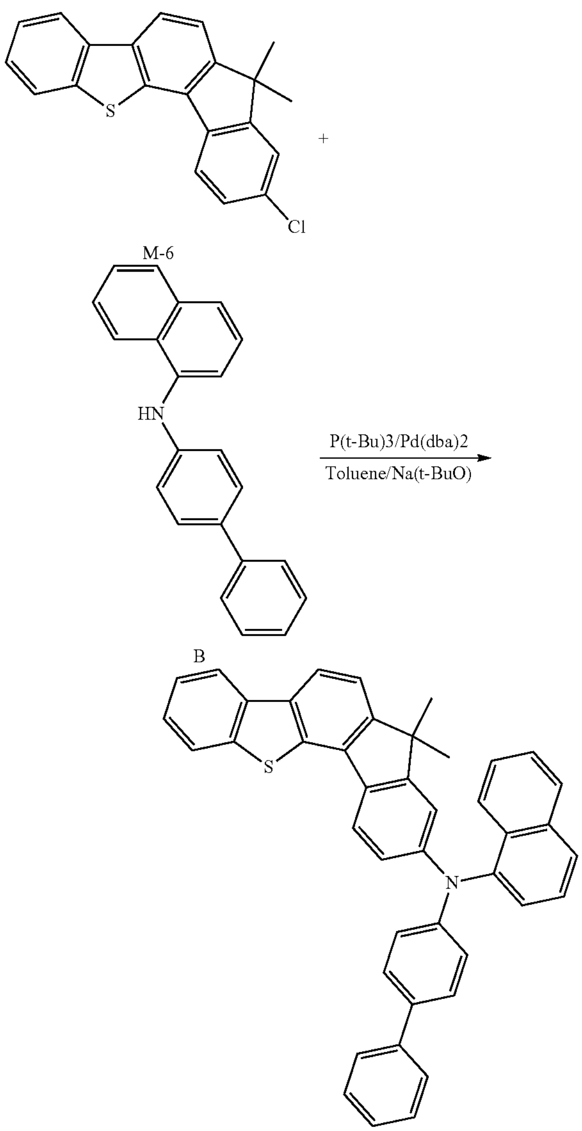

5.0 g (14.93 mmol) of Intermediate M-6, 4.41 g (14.93 mmol) of Intermediate B, 4.31 g (44.79 mmol) of sodium t-butoxide, and 0.09 g (0.45 mmol) of tri-tert-butylphosphine were dissolved in 200 ml of toluene, 0.26 g (0.45 mmol) of $Pd(dba)_2$ was put therein, and the mixture was refluxed and stirred under a nitrogen atmosphere for 12 hours. When the reaction was complete, the resultant was extracted with toluene and distilled water, the organic layer was dried with anhydrous magnesium sulfate and filtered, and then filtered solution was concentrated under a reduced pressure. The product was purified through a silica gel column chromatography by using normal hexane/dichloromethane (volume ratio of 2:1) to obtain 7.6 g (yield: 85.7%) of a target compound A-87 as a white solid.

calculation value: C, 86.98; H, 5.26; N, 2.36; S, 5.40.

Analysis value: C, 86.99; H, 5.25; N, 2.36; S, 5.40.

Synthesis Example 14: Synthesis of Compound A-88

[Reaction Scheme 14]

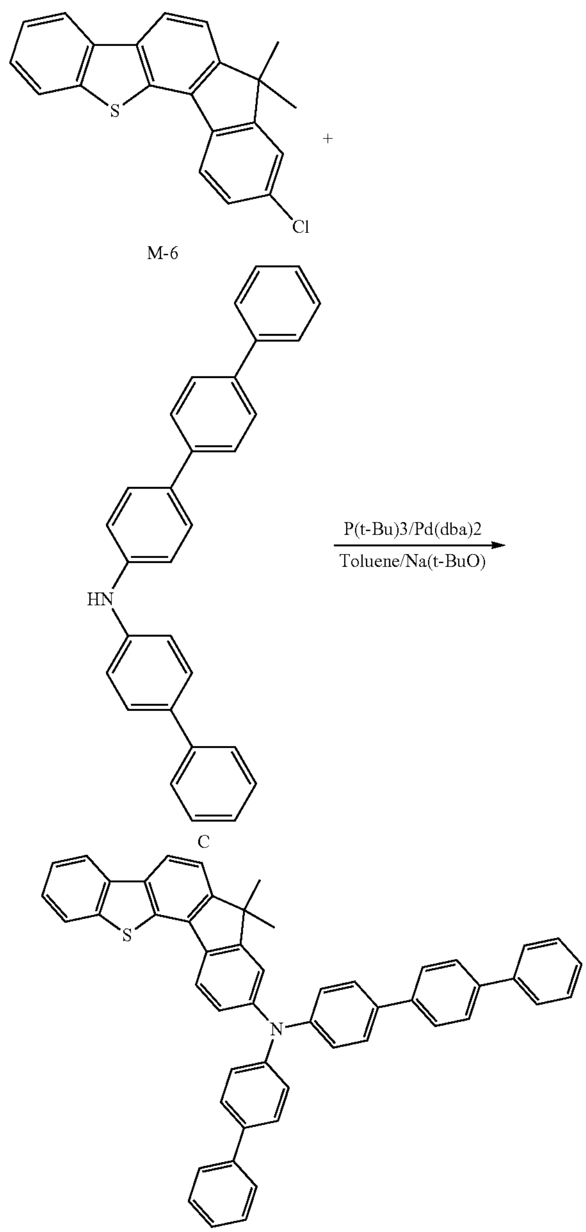

5.0 g (14.93 mmol) of Intermediate M-6, 5.94 g (14.93 mmol) of Intermediate C, 4.31 g (44.79 mmol) of sodium t-butoxide, and 0.09 g (0.45 mmol) of tri-tert-butylphosphine were dissolved in 200 ml of toluene, 0.26 g (0.45 mmol) of $Pd(dba)_2$ was put therein, and the mixture was refluxed and stirred under a nitrogen atmosphere for 12 hours. When the reaction was complete, the resultant was extracted with toluene and distilled water, the organic layer was dried with anhydrous magnesium sulfate and filtered, and then filtered solution was concentrated under a reduced pressure. The product was purified through a silica gel column chromatography by using normal hexane/dichloromethane (volume ratio of 2:1) to obtain 8.2 g (yield: 78.9%) of a target compound A-88 as a white solid.

Calculation value: C, 88.02; H, 5.36; N, 2.01; S, 4.61.

Analysis value: C, 88.00; H, 5.38; N, 2.01; S, 4.61.

Synthesis Example 15: Synthesis of Compound A-59

[Reaction Scheme 15]

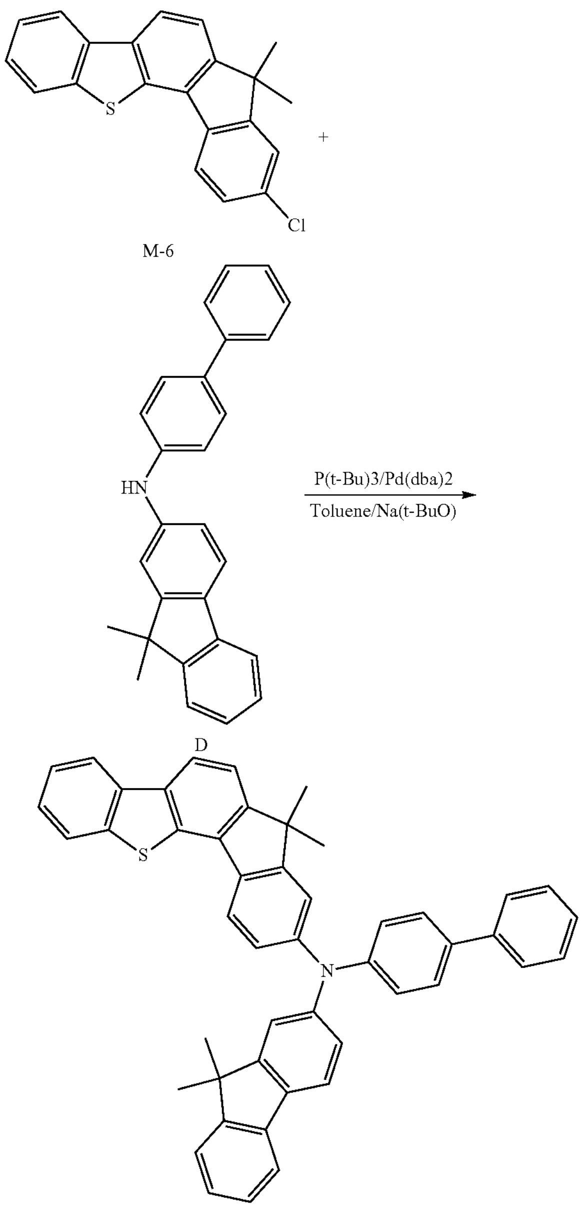

5.0 g (14.93 mmol) of Intermediate M-6, 5.4 g (14.93 mmol) of Intermediate D, 4.31 g (44.79 mmol) of sodium t-butoxide, and 0.09 g (0.45 mmol) of tri-tert-butylphosphine were dissolved in 200 ml of toluene, 0.26 g (0.45 mmol) of $Pd(dba)_2$ was put therein, and the mixture was refluxed and stirred under a nitrogen atmosphere for 12 hours. When the reaction was complete, the resultant was extracted with toluene and distilled water, the organic layer was dried with anhydrous magnesium sulfate and filtered, and then filtered solution was concentrated under a reduced pressure. The product was purified through a silica gel column chromatography by using normal hexane/dichloromethane (volume ratio of 2:1) to obtain 8.4 g (yield: 85.2%) of a target compound A-59 as a white solid.

Calculation value: C, 87.37; H, 5.65; N, 2.12; S, 4.86.

Analysis value: C, 87.35; H, 5.67; N, 2.12; S, 4.86.

Synthesis Example 16: Synthesis of Compound A-28

[Reaction Reaction 16]

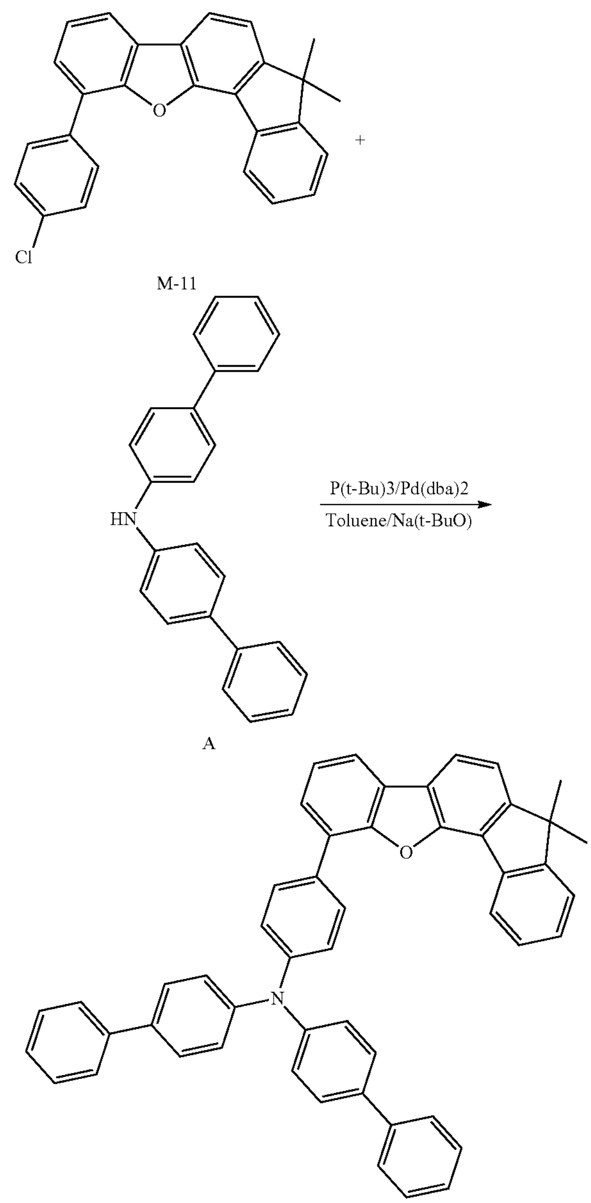

5.0 g (12.66 mmol) of Intermediate M-11, 4.07 g (12.66 mmol) of Intermediate A, 3.65 g (37.99 mmol) of sodium t-butoxide, and 0.08 g (0.38 mmol) of tri-tert-butylphosphine were dissolved in 200 ml of toluene, 0.22 g (0.38 mmol) of $Pd(dba)_2$ was put therein, and the mixture was refluxed and stirred under a nitrogen atmosphere for 12 hours. When the reaction was complete, the resultant was extracted with toluene and distilled water, the organic layer was dried with anhydrous magnesium sulfate and filtered, and then filtered solution was concentrated under a reduced pressure. The product was purified through a silica gel column chromatography by using normal hexane/dichloromethane (volume ratio of 2:1) to obtain 7.3 g (yield: 84.8%) of a target compound A-28 as a white solid.

Calculation value: C, 90.10; H, 5.49; N, 2.06; O, 2.35.

Analysis value: C, 90.12; H, 5.47; N, 2.06; O, 2.35.

Synthesis Example 17: Synthesis of Compound A-30

[Reaction Reaction 17]

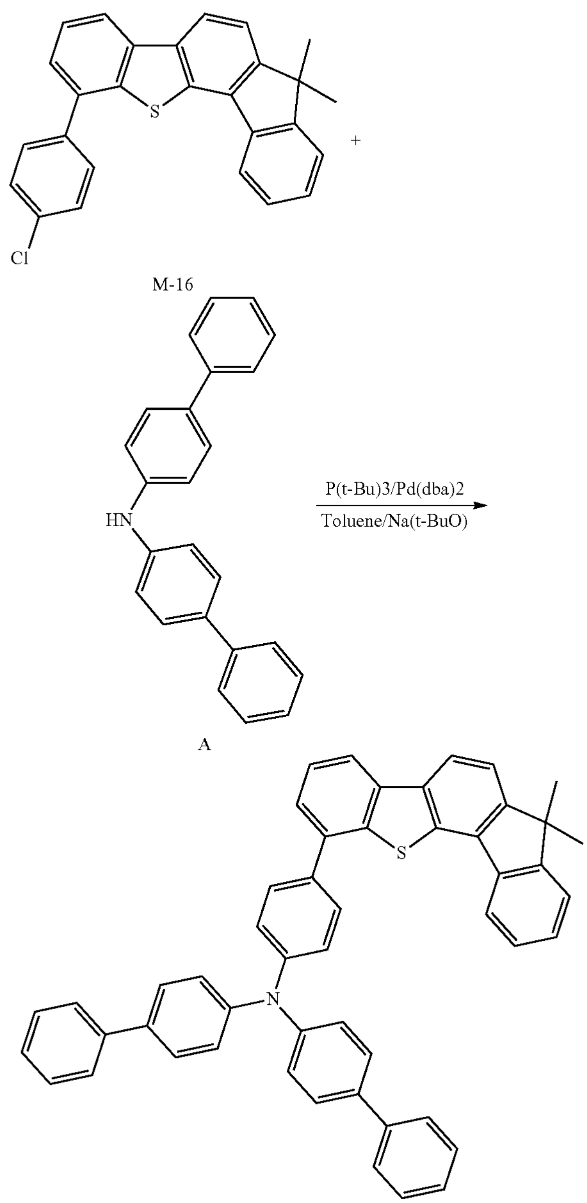

5.0 g (12.17 mmol) of Intermediate M-16, 3.91 g (12.17 mmol) of Intermediate A, 3.65 g (37.99 mmol) of sodium t-butoxide, and 0.07 g (0.36 mmol) of tri-tert-butylphosphine were dissolved in 200 ml of toluene, 0.22 g (0.38 mmol) of $Pd(dba)_2$ was put therein, and the mixture was refluxed and stirred under a nitrogen atmosphere for 12 hours. When the reaction was complete, the resultant was extracted with toluene and distilled water, the organic layer was dried with anhydrous magnesium sulfate and filtered, and then filtered solution was concentrated under a reduced pressure. The product was purified through a silica gel column chromatography by using normal hexane/dichloromethane (volume ratio of 2:1) to obtain 7.1 g (yield: 83.8%) of a target compound A-30 as a white solid.

Calculation value: C, 88.02; H, 5.36; N, 2.01; S, 4.61.

Analysis value: C, 88.04; H, 5.34; N, 2.01; S, 4.61.

Synthesis Example 18: Synthesis of Compound A-93

[Reaction Scheme 18]

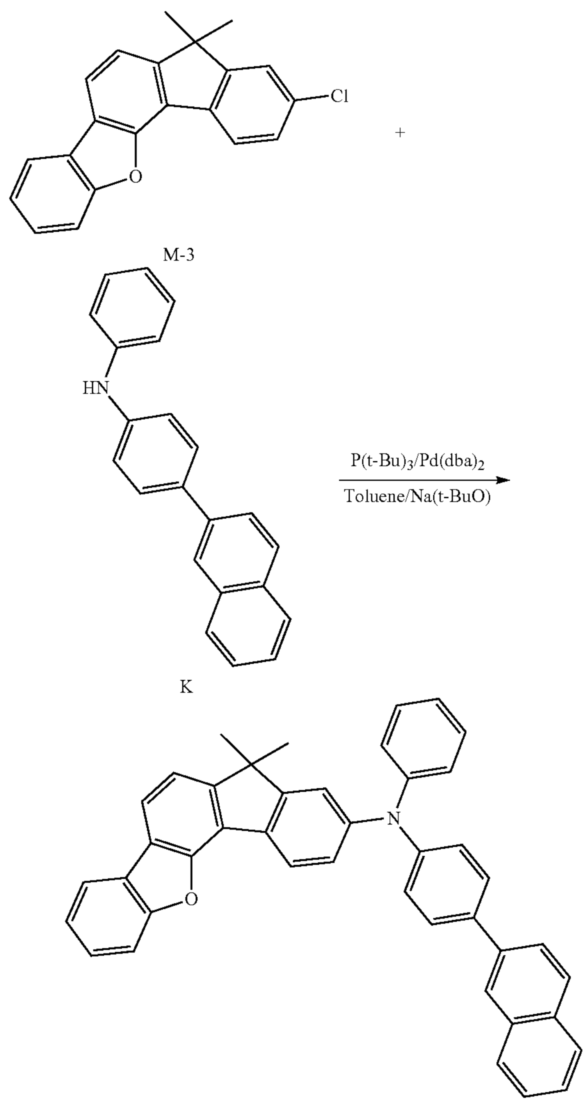

Compound A-93 was synthesized according to the same method as Synthesis Example 1 using Intermediate M-3 and Intermediate K in an equivalent ratio of 1:1.

LC/MS calculated for: C43H31NO Exact Mass: 577.24 found for 577.77 [M+H]

Synthesis Example 19: Synthesis of Compound A-94

[Reaction Scheme 19]

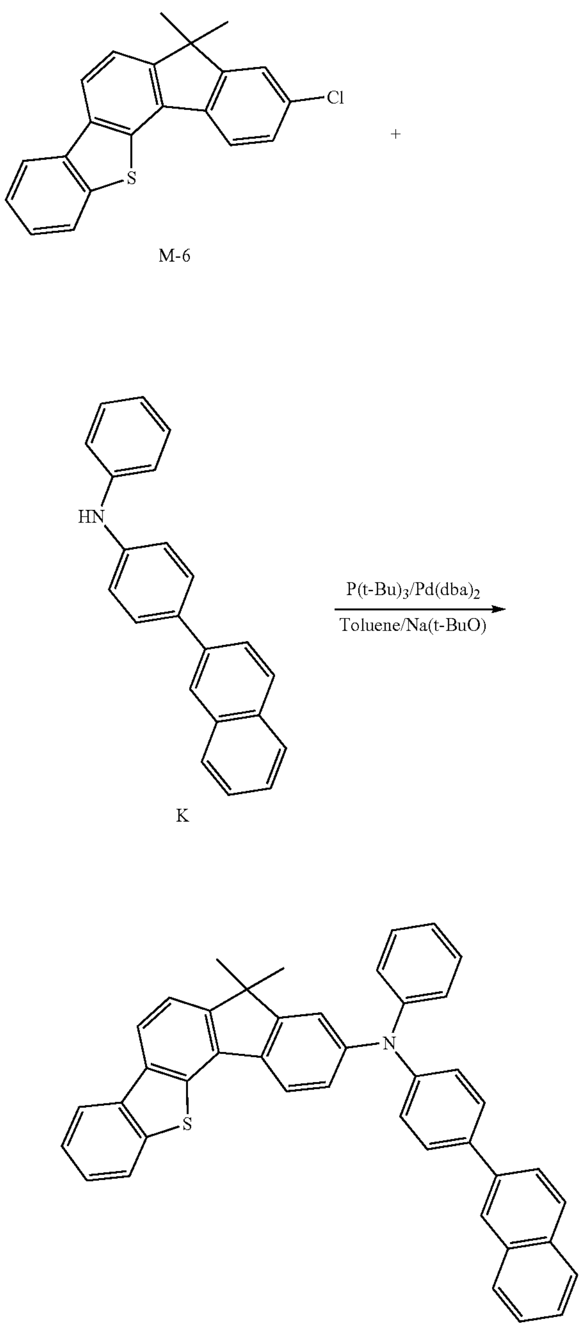

Compound A-94 was synthesized according to the same method as Synthesis Example 1 using Intermediate M-6 and Intermediate K in an equivalent ratio of 1:1.

LC/MS calculated for: C43H31NS Exact Mass: 593.22 found for 593.78 [M+H]

Comparative Synthesis Example 1: Synthesis of Compound V-1

[Reaction Scheme 20]

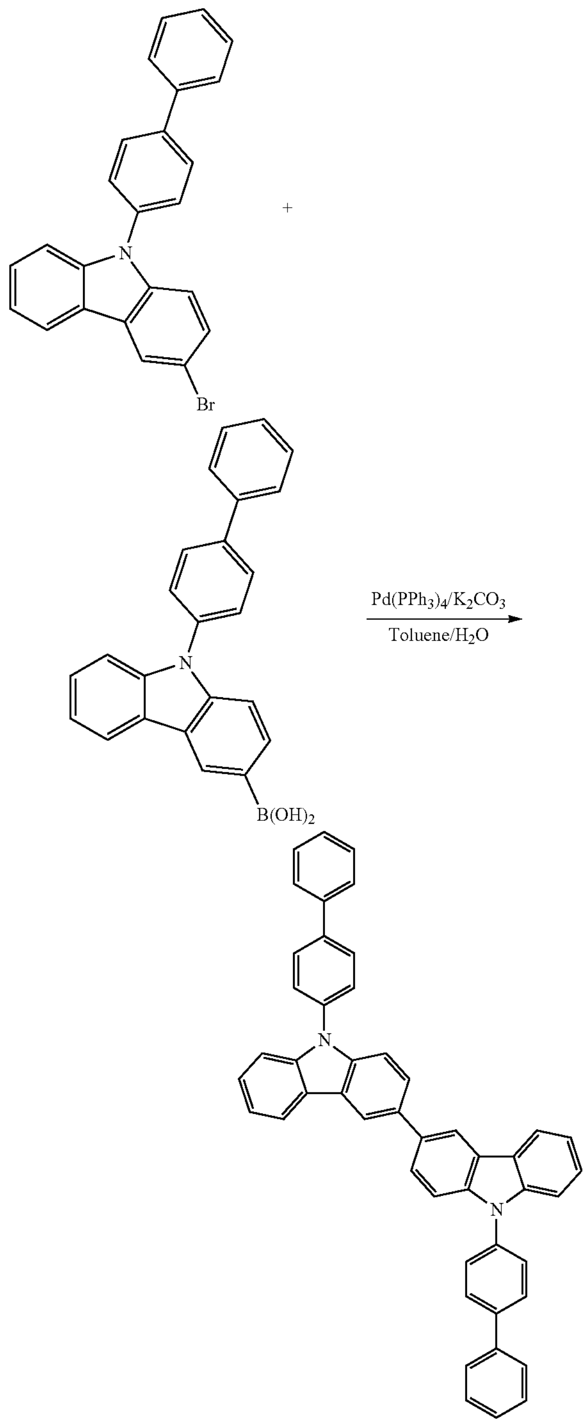

V-1

The compound, biphenylcarbazolyl bromide (12.33 g, 30.95 mmol) was dissolved in 200 mL of toluene in an nitrogen environment, biphenylcarbazolylboronic acid (12.37 g, 34.05 mmol) and tetrakis(triphenylphosphine)

palladium (1.07 g, 0.93 mmmol) are added thereto, and the obtained mixture was stirred. Potassium carbonate saturated in water (12.83 g, 92.86 mmol) was added thereto, and the obtained mixture was heated and refluxed at 90° C. for 12 hours. When a reaction was complete, water was added to the reaction solution, and an extract was obtained by using dichloromethane (DCM), filtered after removing moisture therefrom by using anhydrous $MgSO_4$, and concentrated under a reduced pressure. A residue obtained therefrom was separated and purified through flash column chromatography to obtain Compound V-1 (18.7 g, 92%).

LC/MS calculated for: $C_{48}H_{32}N_2$ Exact Mass: 636.26 found for 636.30 [M+H]

Comparative Synthesis Example 2: Synthesis of Compound V-2

[Reaction Scheme 21]

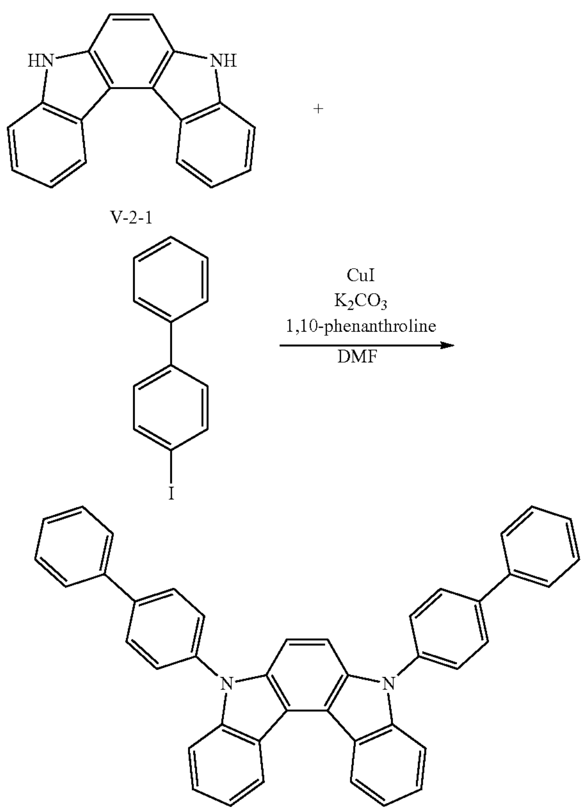

V-2-1

V-2

8 g (31.2 mmol) of Intermediate V-2-1 (5,8-dihydroindolo[2,3-C]carbazole), 20.5 g (73.32 mmol) of 4-iodobiphenyl, 1.19 g (6.24 mmol) of CuI, 1.12 g (6.24 mmol) of 1,10-phenanthoroline, and 12.9 g (93.6 mmol) of $K_2CO_3$ were put in a round-bottomed flask, 50 ml of DMF was added thereto to dissolve them, and the solution was refluxed and stirred under a nitrogen atmosphere for 24 hours. When a reaction was complete, distilled water was added thereto, and a precipitate therefrom was filtered. The solid was dissolved in 250 ml of xylene, filtered with silica gel, and precipitated into a white solid to obtain 16.2 g of Compound V-2 (yield: 93%).

LC/MS calculated for: $C_{42}H_{28}N_2$ Exact Mass: 560.23 found for 560.27 [M+H]

(Preparation of Second Compound for Organic Optoelectronic Device)

Synthesis Example 20: Synthesis of Compound B-1

[Reaction Scheme 22]

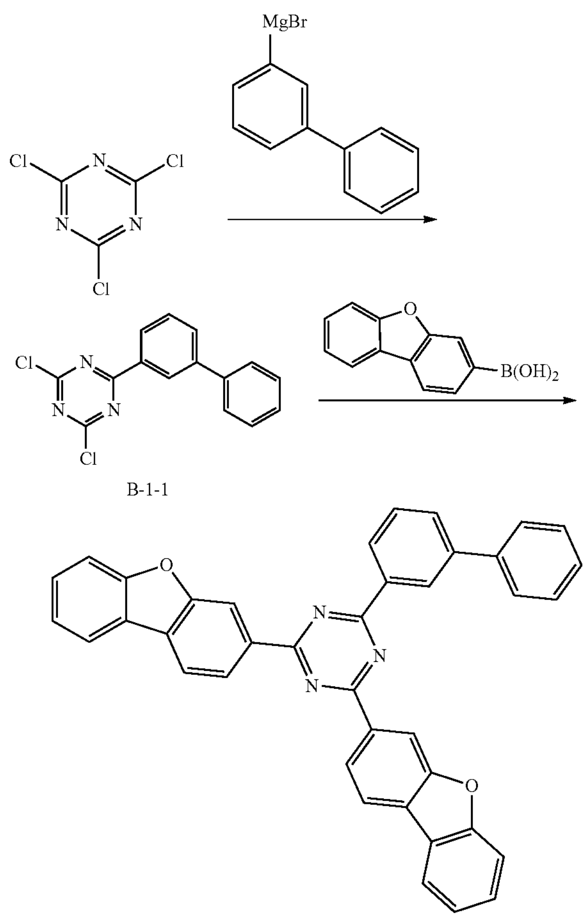

B-1-1

B-1 a) Synthesis of Intermediate B-1-1

15 g (81.34 mmol) of cyanuric chloride was dissolved in 200 mL of anhydrous tetrahydrofuran in a 500 mL round-bottomed flask, 1 equivalent of a 3-biphenyl magnesium bromide solution (0.5M tetrahydrofuran) was added thereto in a dropwise fashion at 0° C. under a nitrogen atmosphere, and the mixture was slowly heated up to room temperature. The reaction solution was stirred at the room temperature for 1 hour and then, poured into 500 mL of ice water to separate layers. An organic layer was separated therefrom and then, treated with anhydrous magnesium sulfate and concentrated. The concentrated residue was recrystallized with tetrahydrofuran and methanol to obtain 17.2 g of Intermediate B-1-1.

b) Synthesis of Compound B-1

17.2 g (56.9 mmol) of Intermediate B-1-1 was added to 200 mL of tetrahydrofuran and 100 mL of distilled water in a 500 mL round-bottomed flask, 2 equivalent of dibenzofuran-3-boronic acid (cas: 395087-89-5), 0.03 equivalent of tetrakistriphenylphosphine palladium, and 2 equivalent of potassium carbonate were added thereto, and the mixture was heated and refluxed under a nitrogen atmosphere. After 18 hours, the reaction solution was cooled down, and a solid precipitated therein was filtered and washed with 500 mL of water. The solid was recrystallized with 500 mL of monochlorobenzene to obtain 12.87 g of Compound B-1.

LC/MS calculated for: $C_{39}H_{23}N_3O_2$ Exact Mass: 565.1790 found for: 566.18 [M+H]

Synthesis Example 21: Synthesis of Compound B-3

[Reaction Scheme 23]

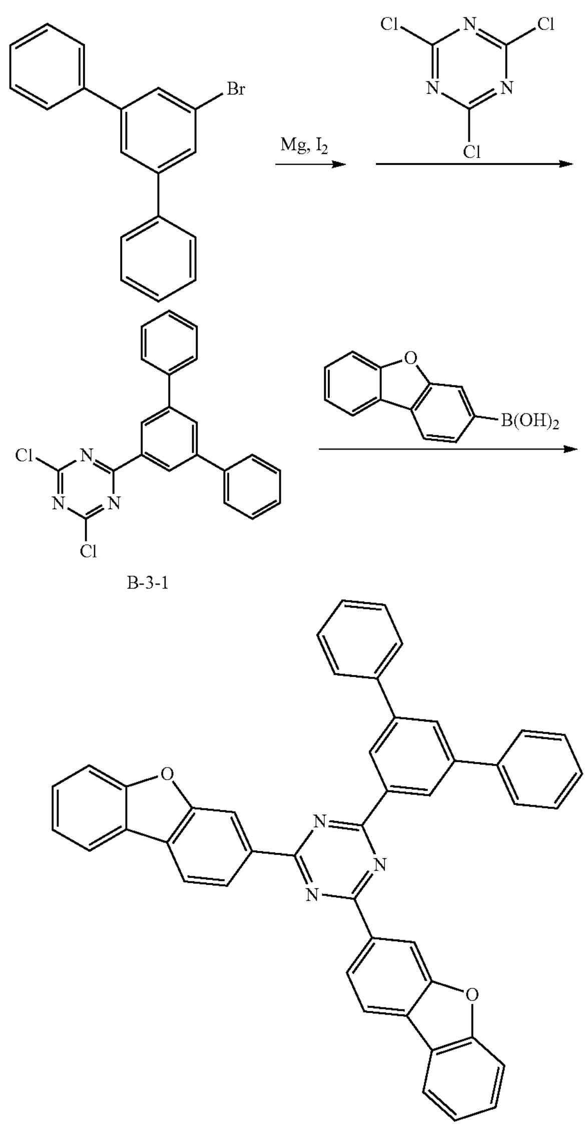

B-3-1

B-3 a) Synthesis of Intermediate B-3-1

Magnesium (7.86 g, 323 mmol) and iodine (1.64 g, 6.46 mmol) were added to 0.1 L of tetrahydrofuran (THF) in a nitrogen environment, the mixture was stirred for 30 minutes, 1-bromo-3,5-diphenylbenzene (100 g, 323 mmol) dissolved in 0.3 L of THF was slowly added thereto in a dropwise fashion at 0° C. over 30 minutes. This obtained mixed solution was slowly added in a dropwise fashion to 64.5 g (350 mmol) of cyanuricchloride dissolved in 0.5 L of THF at 0° C. over 30 minutes. When a reaction was complete, water was added to the reaction solution, and an extract was obtained by using dichloromethane (DCM), filtered after removing moisture therefrom with anhydrous $MgSO_4$, and concentrated under a reduced pressure. The obtained residue was separated and purified through flash column chromatography to obtain Intermediate B-3-1 (79.4 g, 65%).

b) Synthesis of Compound B-3

Compound B-3 was synthesized according to the same method as the b) of Synthesis Example 20 using Intermediate B-3-1.

LC/MS calculated for: $C_{45}H_{27}N_3O_2$ Exact Mass: 641.2103 found for 642.21 [M+H]

Synthesis Example 22: Synthesis of Compound B-17

[Reaction Scheme 24]

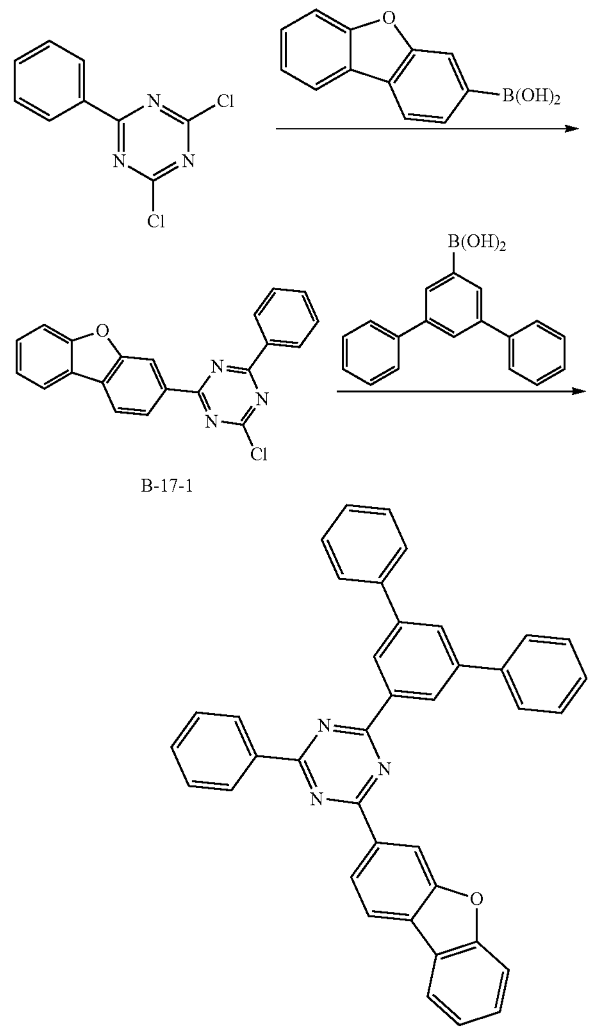

B-17 a) Synthesis of Intermediate B-17-1

22.6 g (100 mmol) of 2,4-dichloro-6-phenyltriazine was added to 100 mL of tetrahydrofuran, 100 mL of toluene, and 100 mL of distilled water in a 500 mL round-bottomed flask, 0.9 equivalent of dibenzofuran-3-boronic acid (CAS No.: 395087-89-5), 0.03 equivalent of tetrakistriphenylphosphine palladium, and 2 equivalent of potassium carbonate were added thereto, and the mixture was heated and refluxed under a nitrogen atmosphere. After 6 hours, the reaction solution was cooled down, an aqueous layer was removed therefrom, and an organic layer therein was dried under a reduced pressure. A solid obtained therefrom was washed with water and hexane and recrystallized with 200 mL of toluene to obtain 21.4 g of Intermediate B-17-1 (60% of a yield).

b) Synthesis of Compound B-17

Intermediate B-17-1 (56.9 mmol) was added to 200 mL of tetrahydrofuran and 100 mL of distilled water in a 500 mL round-bottomed flask, 1.1 equivalent of 3,5-diphenylbenzeneboronic acid (CAS No.: 128388-54-5), 0.03 equivalent of tetrakistriphenylphosphine palladium, and 2 equivalent of potassium carbonate were added thereto, and the mixture was heated and refluxed under a nitrogen atmosphere. After 18 hours, the reaction solution was cooled down, and a solid precipitated therein was filtered and washed with 500 mL of water. The solid was recrystallized with 500 mL of monochlorobenzene to obtain Compound B-17.

LC/MS calculated for: $C_{39}H_{25}N_3O$ Exact Mass: 555.1998 found for 556.21 [M+H]

Synthesis Example 23: Synthesis of Compound B-20

[Reaction Scheme 25]

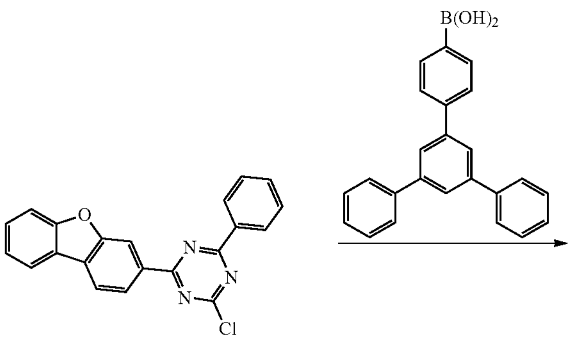

B-17-1

-continued

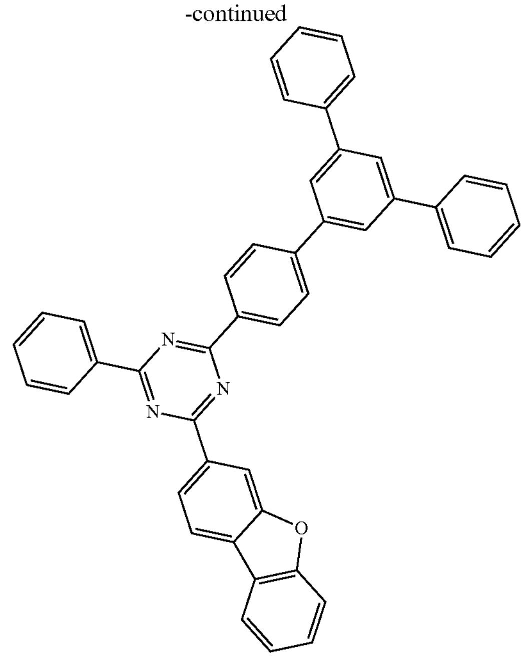

B-20

Compound B-20 was synthesized according to the same method as the b) of Synthesis Example 22 by using Intermediate B-17-1 and 1.1 equivalent of (5'-phenyl[1,1':3',1"-terphenyl]-4-yl)-boronic acid (CAS No.: 491612-72-7).

LC/MS calculated for: $C_{45}H_{29}N_3O$ Exact Mass: 627.2311 found for 628.24 [M+H]

Synthesis Example 24: Synthesis of Compound B-23

[Reaction Scheme 26]

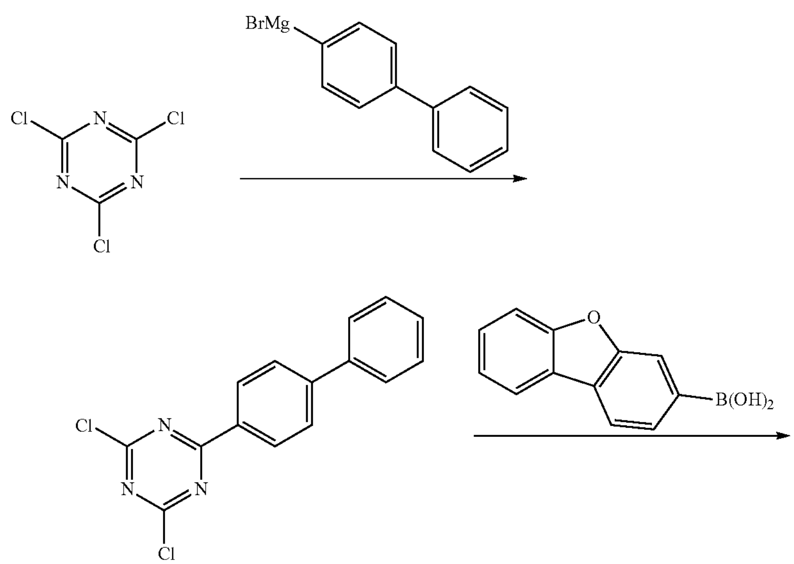

B-23-1

-continued

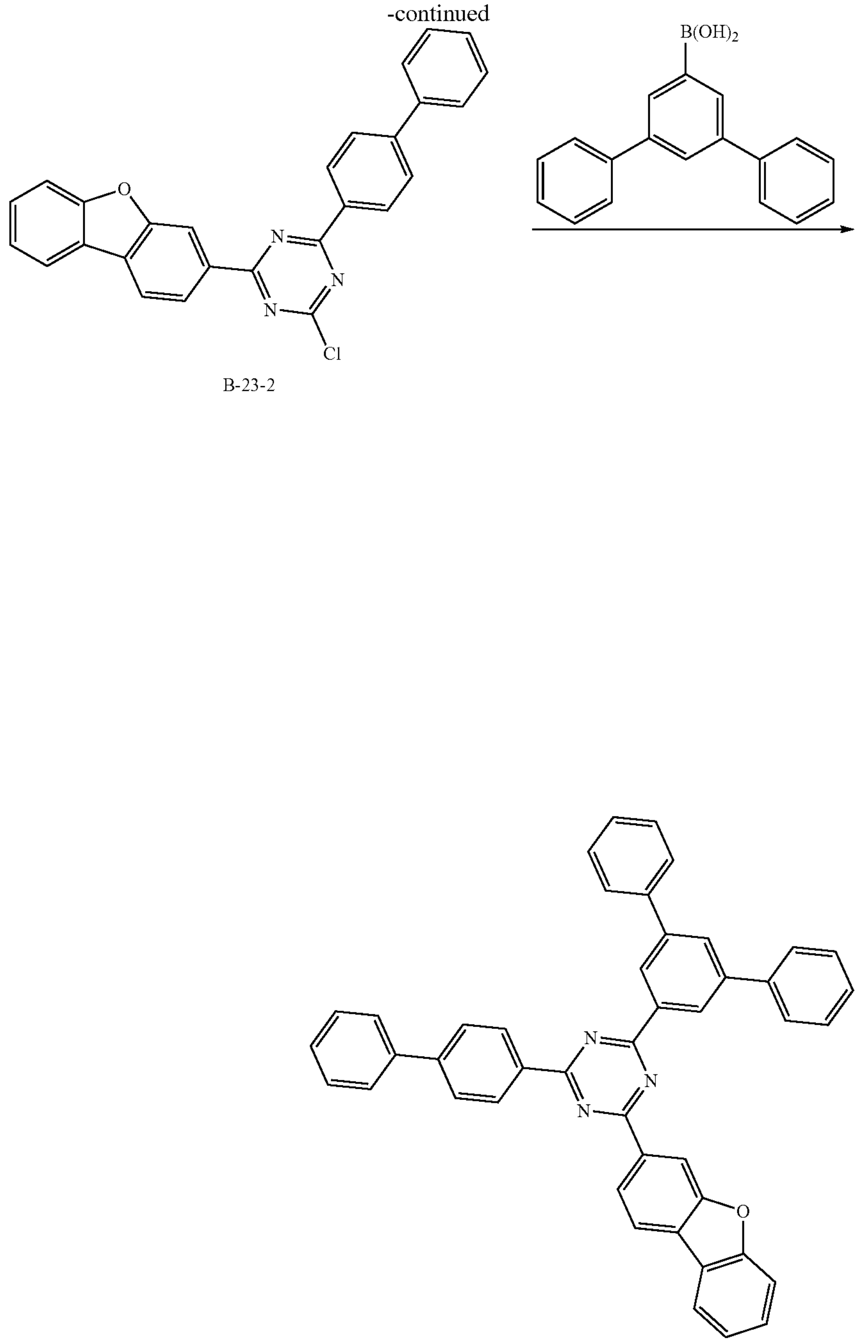

B-23-2

B-23 a) Synthesis of Intermediate B-23-1

15 g (81.34 mmol) of cyanuric chloride is dissolved in 200 mL of anhydrous tetrahydrofuran in a 500 mL round-bottomed flask, 1 equivalent of a 4-biphenyl magnesium bromide solution (0.5 M tetrahydrofuran) was added thereto in a dropwise fashion at 0° C. under a nitrogen atmosphere, and the mixture was slowly heated up to room temperature. The reaction solution was stirred at the room temperature for 1 hour and then, poured into 500 mL of ice water to separate layers. An organic layer was separated, treated with anhydrous magnesium sulfate, and concentrated. The concentrated residue was recrystallized with tetrahydrofuran and methanol to obtain 17.2 g of Intermediate B-23-1.

b) Synthesis of Intermediate B-23-2

Intermediate B-23-2 was synthesized according to the same method as the a) of Synthesis Example 22 by using Intermediate B-23-1.

c) Synthesis of Compound B-23

Compound B-23 was synthesized according to the same method as the b) of Synthesis Example 22 by using Intermediate B-23-2 and 1.1 equivalent of 3,5-diphenyl benzene boronic acid.

LC/MS calculated for: $C_{45}H_{29}N_3O$ Exact Mass: 627.2311 found for 628.24 [M+H]

Synthesis Example 25: Synthesis of Compound B-24
[Reaction Scheme 27]
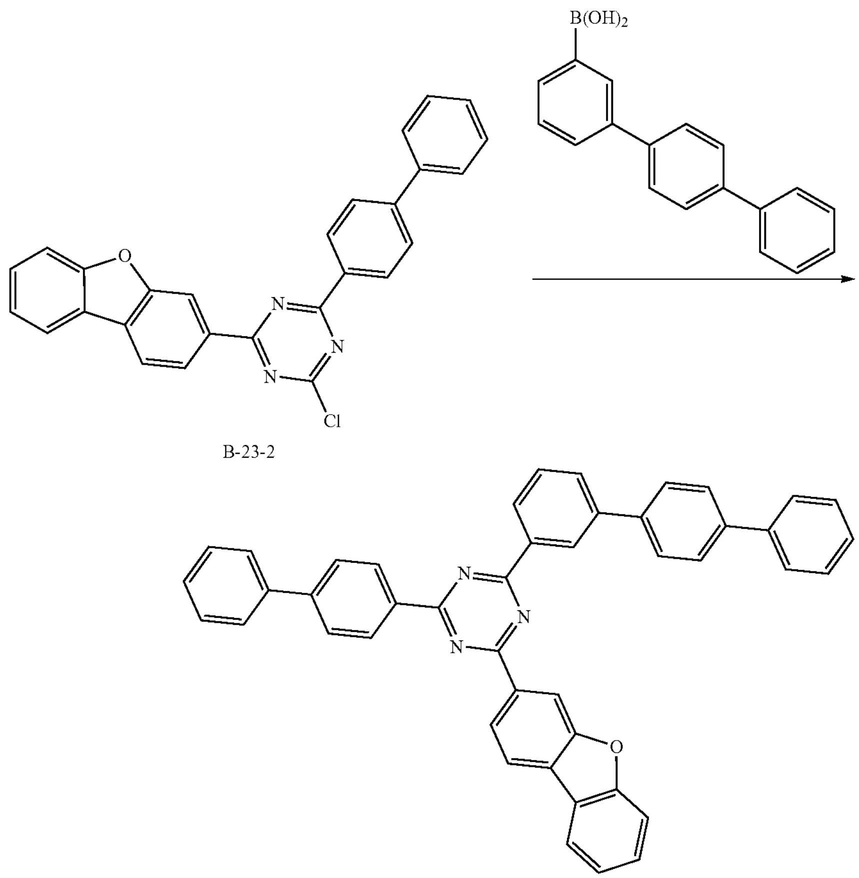
B-23-2
B-24
Compound B-24 was synthesized according to the same method as the b) of Synthesis Example 22 by using Intermediate B-23-2 and 1.1 equivalent of B-[1,1':4',1"-terphenyl]-3-yl boronic acid.
LC/MS calculated for: $C_{45}H_{29}N_3O$ Exact Mass: 627.2311 found for 628.24 [M+H]
Synthesis Example 26: Synthesis of Compound B-71
[Reaction Scheme 28]
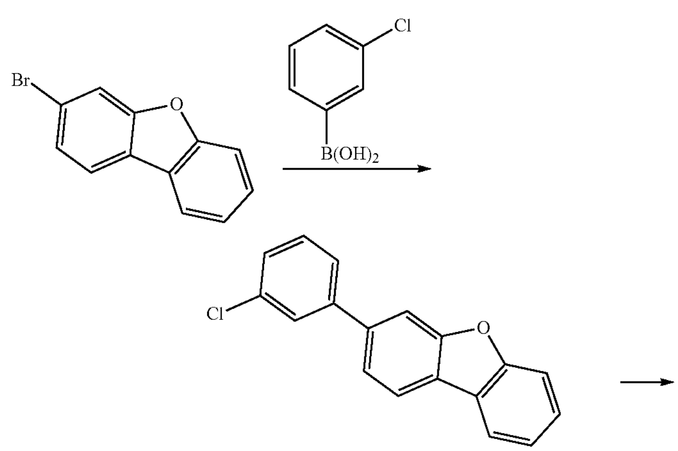
B-71-1

-continued

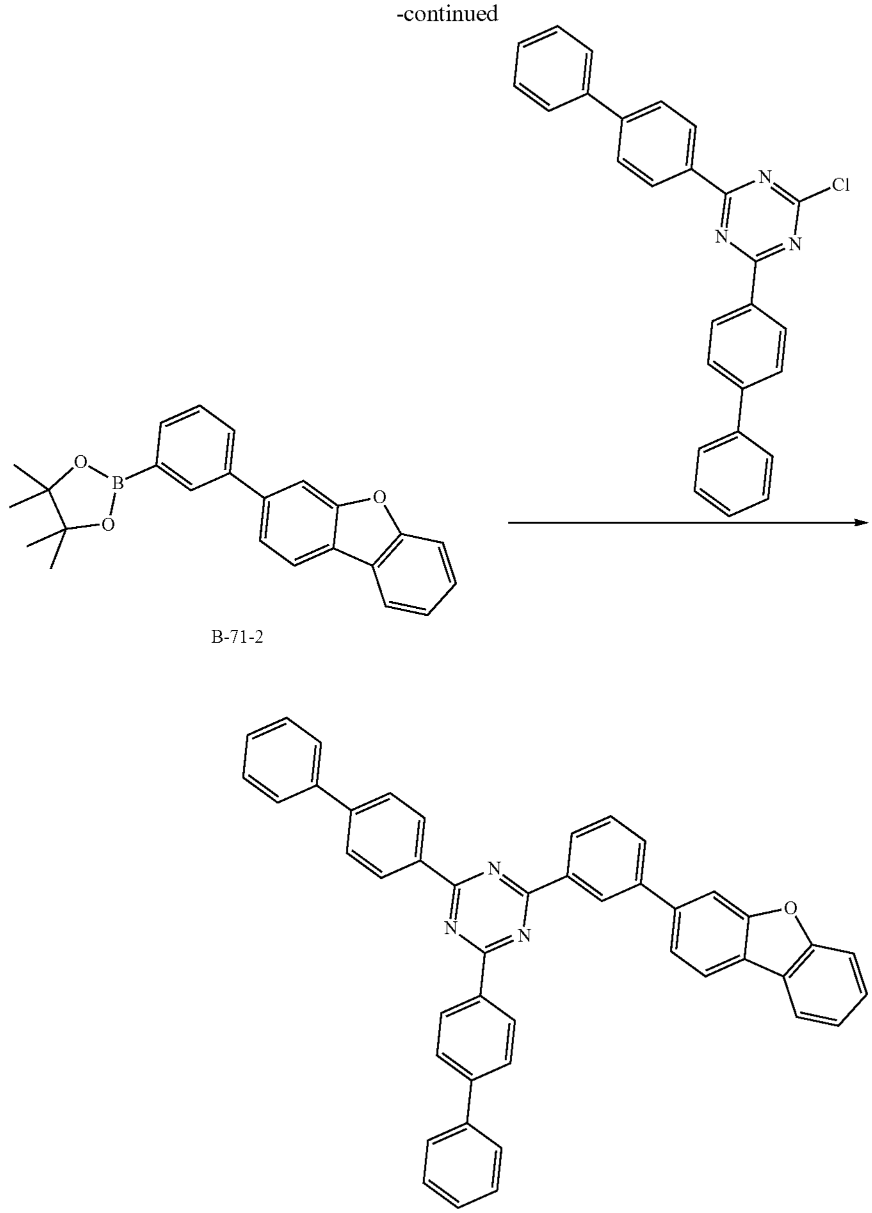

B-71-2

B-71 a) Synthesis of Intermediate B-71-1

14.06 g (56.90 mmol) of 3-bromo-dibenzofuran, 200 mL of tetrahydrofuran, and 100 mL of distilled water were put in a 500 mL round-bottomed flask, 1 equivalent of 3'-chlorophenylboronic acid, 0.03 equivalent of tetrakistriphenylphosphine palladium, and 2 equivalents of potassium carbonate were added thereto, and the mixture was heated and refluxed under a nitrogen atmosphere. After 18 hours, the reaction solution was cooled down, and a solid precipitated therein was filtered and washed with 500 mL of water. The solid was recrystallized with 500 mL of monochlorobenzene to obtain 12.05 g of Intermediate B-71-1. (yield: 76%)

b) Synthesis of Intermediate B-71-2

24.53 g (88.02 mmol) of Intermediate B-71-1 was added to 250 mL of DMF in a 500 mL round-bottomed flask, 0.05 equivalent of dichlorodiphenylphosphinoferrocene palladium, 1.2 equivalent of bispinacolato diboron, and 2 equivalent of potassium acetate were added thereto, and the mixture was heated and refluxed under a nitrogen atmosphere for 18 hours. The reaction solution was cooled down and then, added to 1 L of water in a dropwise fashion to obtain a solid. The solid was dissolved in boiling toluene, treated with activated carbon, and filtered with silica gel, and the filtrate was concentrated. The concentrated solid was stirred with a small amount of hexane and filtered to obtain 22.81 g of Intermediate B-71-2. (yield: 70%)

c) Synthesis of Compound B-71

Compound B-71 was synthesized according to the same method as the b) of Synthesis Example 22 by using Intermediate B-71-2 and 2,4-bis([1,1'-biphenyl]-4-yl)-6-chloro-1,3,5-triazine in each amount of 1.0 equivalent.

LC/MS calculated for: $C_{45}H_{29}N_3O$ Exact Mass: 627.2311 found for 628.25 [M+H]

Synthesis Example 27: Synthesis of Compound B-124 from was not recrystallized but purified through flash column by using hexane.

[Reaction Scheme 29]

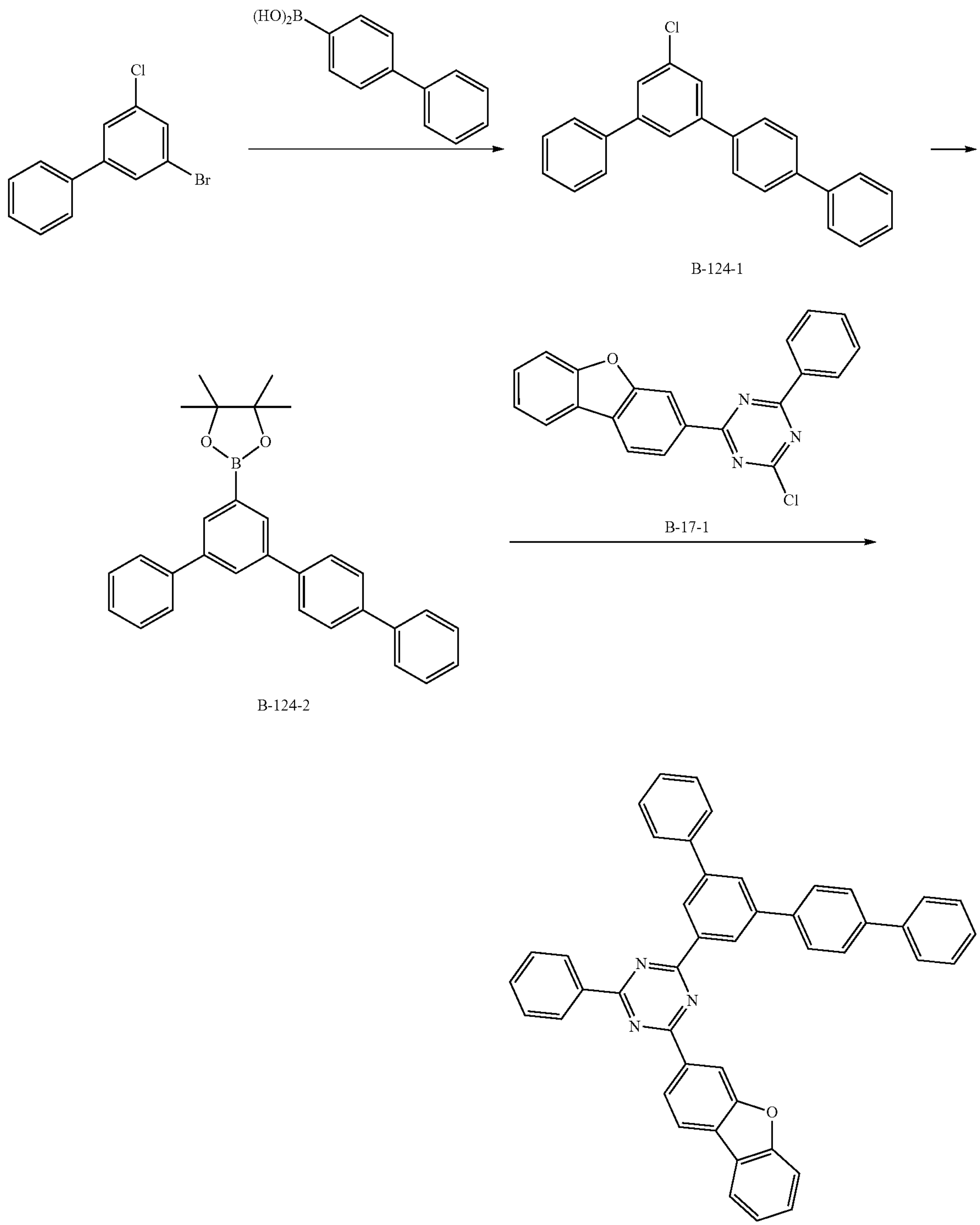

B-124-1

B-124-2

B-17-1

B-124 a) Synthesis of Intermediate B-124-1

Intermediate B-124-1 was synthesized according to the same method as a) of Synthesis Example 22 by using 1-bromo-3-chloro-5-phenylbenzene and biphenyl-4-boronic acid respectively by 1.1 equivalent. Herein, a product thereb) Synthesis of Intermediate B-124-2

30 g (88.02 mmol) of Intermediate B-124-1 was added to 250 mL of DMF in a 500 mL round-bottomed flask, 0.05 equivalent of dichlorodiphenylphosphinoferrocene palladium, 1.2 equivalent of bispinacolato diboron, and 2 equivalent of potassium acetate were added thereto, and the mixture was heated and refluxed under a nitrogen atmosphere for 18 hours. The reaction solution was cooled down and then, added to 1 L of water in a dropwise fashion to obtain a solid. The solid was dissolved in boiling toluene, treated with activated carbon, and filtered with silica gel, and the filtrate was concentrated. The concentrated solid was stirred with a small amount of hexane and filtered to obtain 28.5 g of Intermediate B-124-2 (yield: 70%).

c) Synthesis of Compound B-124

Compound B-124 was synthesized according to the same method as b) of Synthesis Example 22 by using Intermediate B-124-2 and Intermediate B-17-1 in each amount of 1.0 equivalent.

LC/MS calculated for: $C_{45}H_{29}N_3O$ Exact Mass: 627.2311 found for 628.22 [M+H]

Synthesis Example 28: Synthesis of Compound B-129

[Reaction Scheme 30]

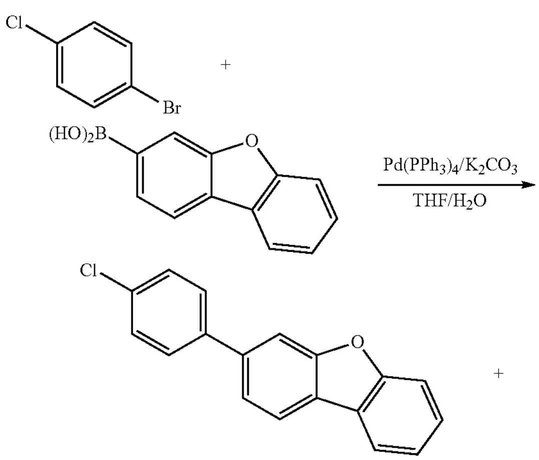

B-129-1

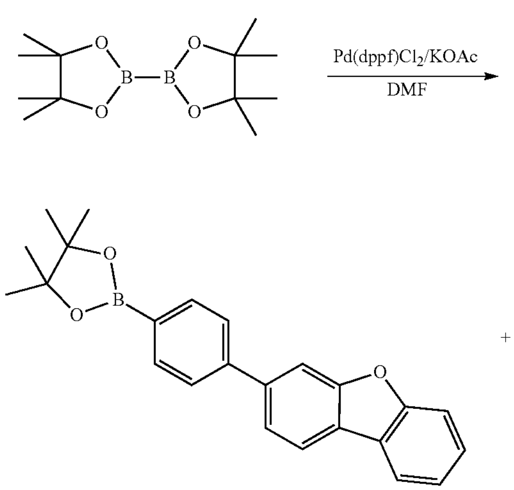

B-129-2

-continued

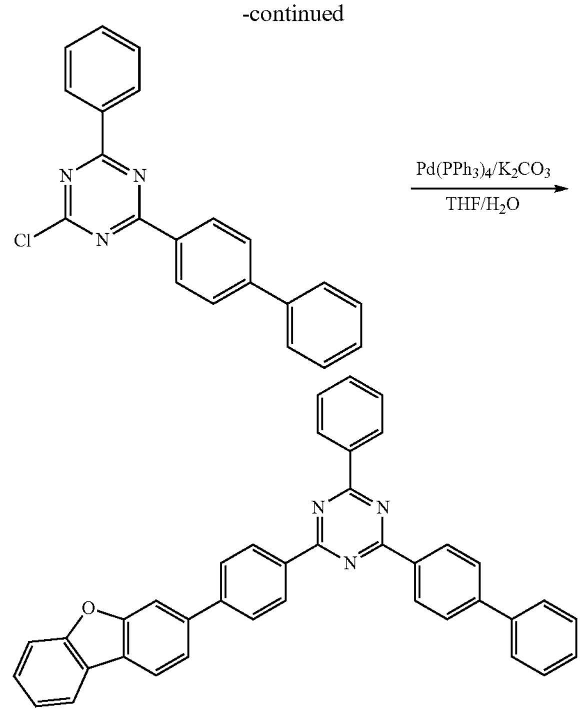

B-129 a) Synthesis of Intermediate B-129-1

Intermediate B-129-1 was synthesized according to the same method as the a) of Synthesis Example 26 by using 1-bromo-4-chloro-benzene and 3-dibenzofuranylboronic acid in each amount of 1.0 equivalent.

b) Synthesis of Intermediate B-129-2

Intermediate B-129-2 was synthesized according to the same method as the b) of Synthesis Example 26 by using Intermediate B-129-1 and bispinacolato diboron in an equivalent ratio of 1:1.2.

c) Synthesis of Compound B-129

Compound B-129 was synthesized according to the same method as the b) of Synthesis Example 22 by using Intermediate B-129-2 and 2-chloro-4-(biphenyl-4-yl)6-phenyl-1,3,5-triazine in each amount of 1.0 equivalent.

LC/MS calculated for: $C_{39}H_{25}N_3O$ Exact Mass: 551.20 found for 551.24 [M+H]

Synthesis Example 29: Synthesis of Compound B-131

[Reaction Scheme 31]

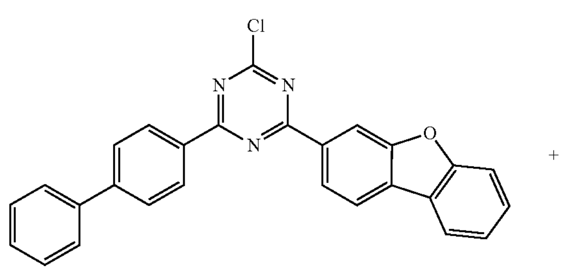

B-23-2

-continued

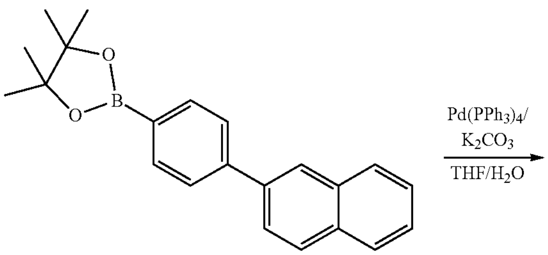

B-135-2

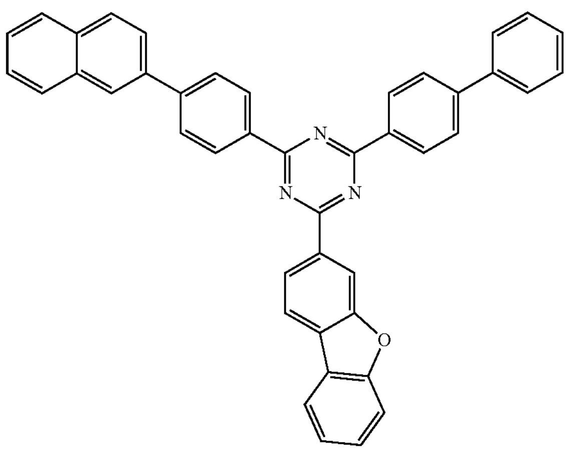

B-131

Compound B-131 was synthesized according to the same method as the b) of Synthesis Example 22 by using Intermediate B-23-2 and Intermediate B-135-2 in each amount of 1.0 equivalent.

LC/MS calculated for: $C_{43}H_{27}N_3O$ Exact Mass: 601.22 found for 601.26 [M+H]

Synthesis Example 30: Synthesis of Compound B-133

[Reaction Scheme 32]

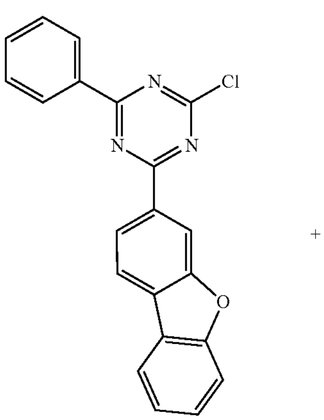

B-17-1

-continued

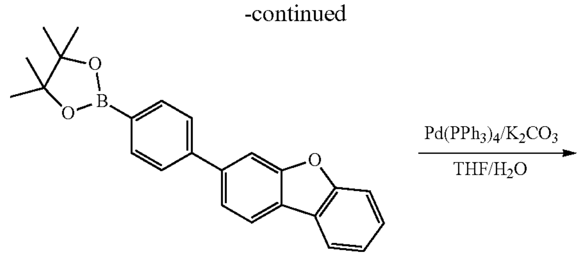

B-129-2

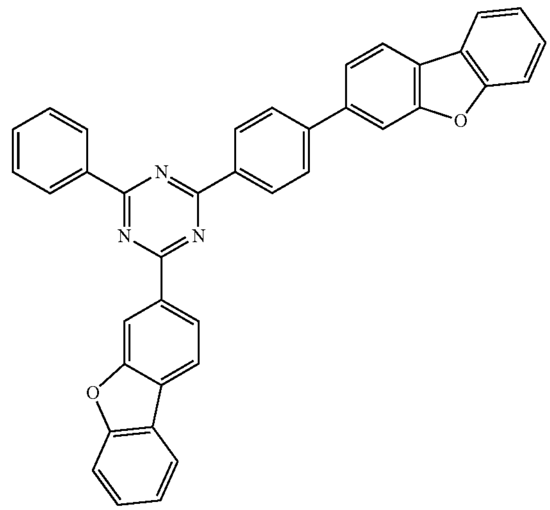

B-133

Compound B-133 was synthesized according to the same method as the b) of Synthesis Example 22 by using Intermediate B-17-1 and Intermediate B-129-2 in each amount of 1.0 equivalent.

LC/MS calculated for: $C_{39}H_{23}N_3O_2$ Exact Mass: 565.18 found for 565.22 [M+H]

Synthesis Example 31: Synthesis of Compound B-135

[Reaction Scheme 33]

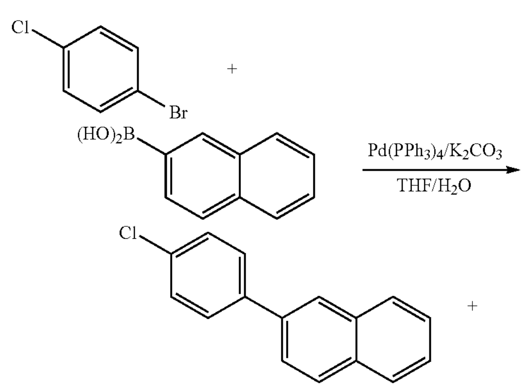

B-135-1

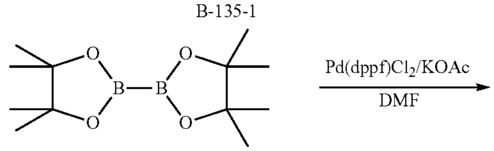

-continued

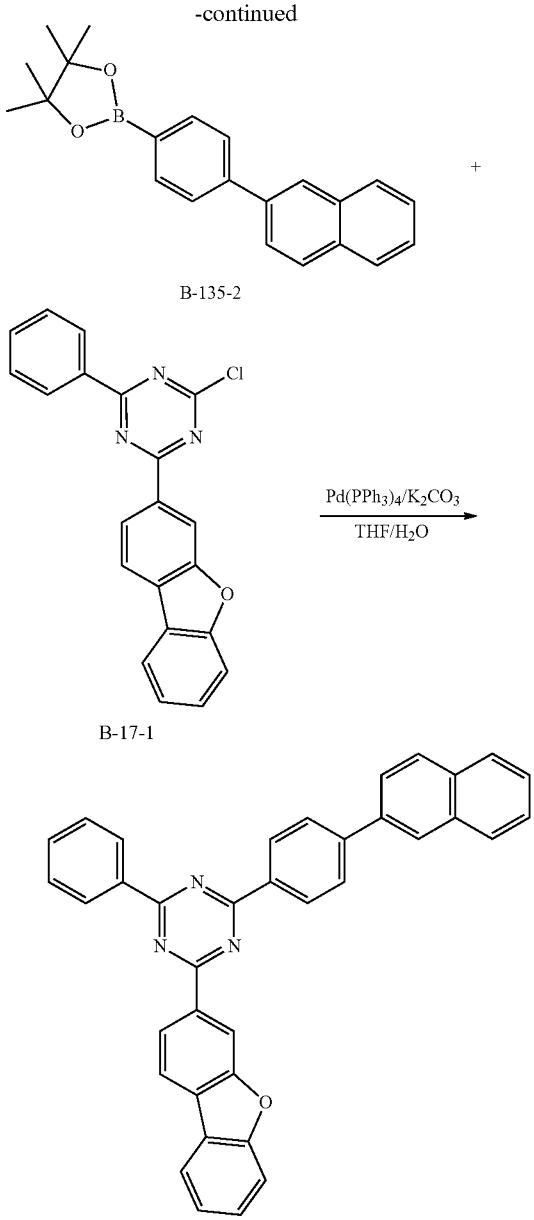

B-135-2 B-17-1 B-135 a) Synthesis of Intermediate B-135-1

Intermediate B-135-1 was synthesized according to the same method as the a) of Synthesis Example 26 by using 1-bromo-4-chloro-benzene and 2-naphthalene boronic acid in each amount of 1.0 equivalent.

b) Synthesis of Intermediate B-135-2

Intermediate B-135-2 was synthesized according to the same method as the b) of Synthesis Example 26 by using Intermediate B-135-1 and bispinacolato diboron in an equivalent ratio of 1:1.2.

c) Synthesis of Compound B-135

Compound B-135 was synthesized according to the same method as the b) of Synthesis Example 22 by using Intermediate B-135-2 and Intermediate B-17-1 in each amount of 1.0 equivalent.

LC/MS calculated for: $C_{37}H_{23}N_3O$ Exact Mass: 525.18 found for 525.22 [M+H]

Synthesis Example 32: Synthesis of Compound D-25

[Reaction Scheme 34]

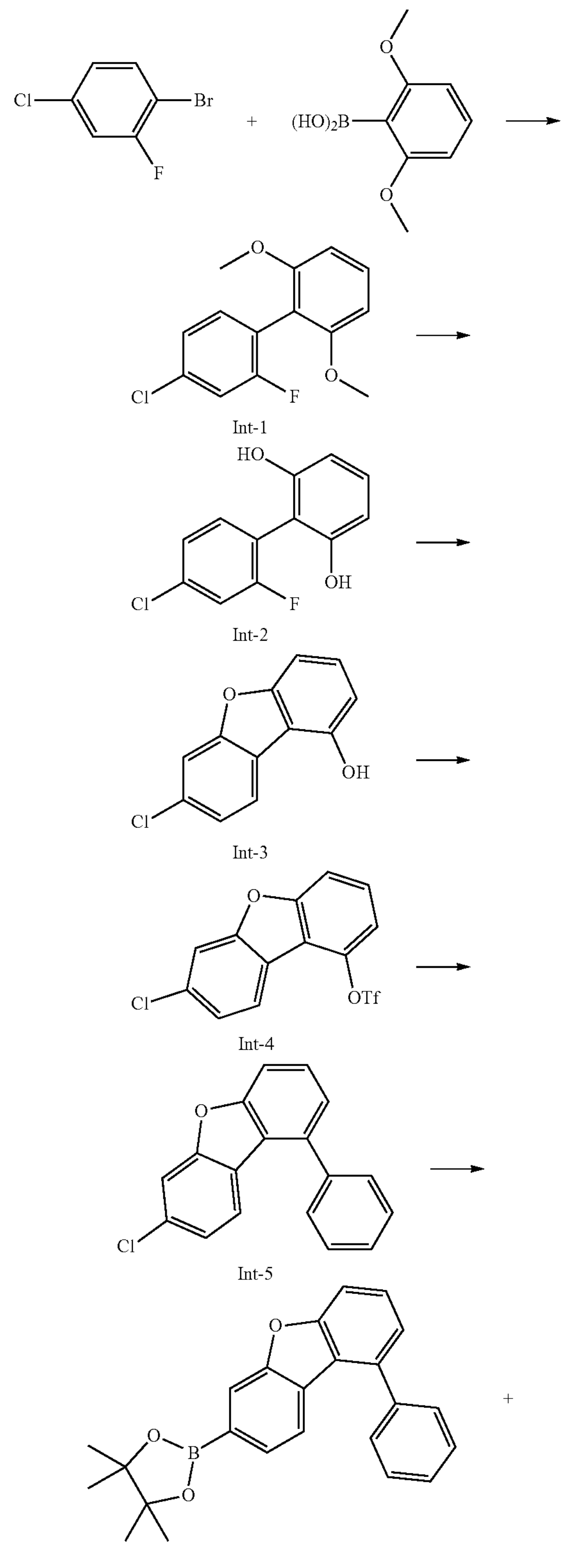

Int-1 Int-2 Int-3 Int-4 Int-5 Int-6

-continued

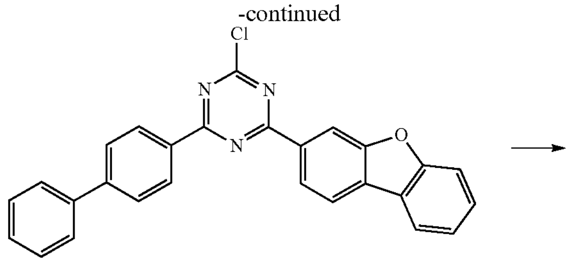

B-23-2

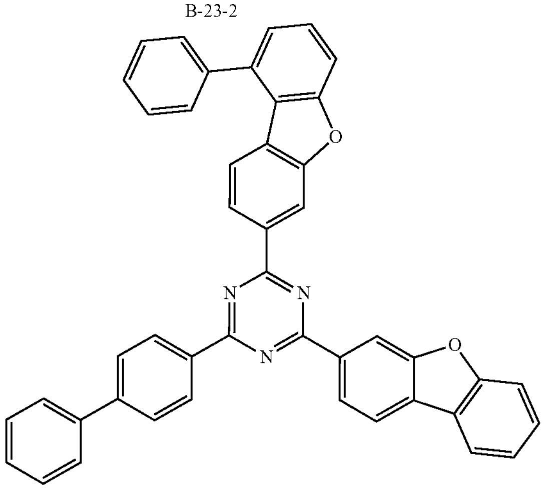

D-25 a) Synthesis of Intermediate Int-1

1-bromo-4-chloro-2-fluorobenzene (61 g, 291 mmol), 2,6-dimethoxyphenylboronic acid (50.4 g, 277 mmol), $K_2CO_3$ (60.4 g, 437 mmol) and $Pd(PPh_3)_4$ (10.1 g, 8.7 mmol) were put in a round-bottomed flask and then, dissolved in 500 ml of THF and 200 ml of distilled water, and the solution was refluxed and stirred at 60° C. for 12 hours. When a reaction was complete, an aqueous layer was removed, and the rest thereof was treated through column chromatography (hexane:DCM 20%) to obtain 38 g of Intermediate Int-1 (51%).

b) Synthesis of Intermediate Int-2

Intermediate Int-1 (38 g, 142 mmol) and pyridine hydrochloride (165 g, 1425 mmol) were put in a round-bottomed flask and then, refluxed and stirred at 200° C. for 24 hours. When a reaction was complete, the resultant is cooled down to room temperature and then, slowly poured into distilled water, and the mixture was stirred for 1 hour. A solid therein was filtered to obtain 23 g of Intermediate Int-2 (68%).

c) Synthesis of Intermediate Int-3

Intermediate Int-2 (23 g, 96 mmol) and $K_2CO_3$ (20 g, 144 mmol) were put in a round-bottomed flask and dissolved in 100 ml of NMP, and the solution was refluxed and stirred at 180° C. for 12 hours. When a reaction was complete, the mixture was poured into an excessive amount of distilled water. A solid therein was filtered, dissolved in ethylacetate, and then dried with $MgSO_4$, and an organic layer was removed therefrom under a reduced pressure. Column chromatography (hexane:EA 30%) was used to obtain 16 g of Intermediate Int-3 (76%).

d) Synthesis of Intermediate Int-4

Intermediate Int-3 (16 g, 73 mmol) and pyridine (12 ml, 146 mmol) were put in a round-bottomed flask and dissolved in 200 ml of DCM. The solution was cooled down to 0° C., and trifluoromethane sulfonic anhydride (14.7 ml, 88 mmol) was slowly added thereto in a dropwise fashion. The mixture was stirred for 6 hour, and when a reaction was complete, an excessive amount of distilled water was added thereto, and the obtained mixture was stirred for 30 minutes and extracted with DCM. Subsequently, an organic solvent was removed under a reduced pressure, and the rest thereof was vacuum-dried to obtain 22.5 g of Intermediate Int-4 (88%).

e) Synthesis of Intermediate Int-5

14.4 g of Intermediate Int-5 (81%) was synthesized according to the same method as Synthesis Example 26 by using Intermediate Int-4 (22.5 g, 64 mmol), phenylboronic acid (7.8 g, 64 mmol), $K_2CO_3$ (13.3 g, 96 mmol), and $Pd(PPh_3)_4$ (3.7 g, 3.2 mmol).

f) Synthesis of Intermediate Int-6

Intermediate Int-5 (22.5 g, 80 mmol), bis(pinacolato) diboron (24.6 g, 97 mmol), $Pd(dppf)Cl_2$ (2 g, 2.4 mmol), tricyclohexylphosphine (3.9 g, 16 mmol), and potassium acetate (16 g, 161 mmol) were put in a round-bottomed flask and dissolved in 320 ml of DMF. The mixture was refluxed and stirred at 120° C. for 10 hours. When a reaction was complete, the mixture was poured into an excessive amount of distilled water, and the obtained mixture was stirred for one hour. A solid therein was filtered and dissolved in DCM. $MgSO_4$ was used to remove moisture therefrom, and an organic solvent was filtered by using a silica gel pad and removed under a reduced pressure. A solid was recrystallized with EA and hexane to obtain 26.9 g of Intermediate Int-6 (90%).

g) Synthesis of Compound D-25

15.5 g of Compound D-25 (70%) was synthesized according to the same method as the b) of Synthesis Example 22 by using Intermediate B-23-2 (15 g, 35 mmol), Intermediate Int-6 (12.8 g, 35 mmol), $K_2CO_3$ (7.2 g, 52 mmol), and $Pd(PPh_3)_4$ (2 g, 1.7 mmol) under a nitrogen condition in a round-bottomed flask.

LC/MS calculated for: $C_{45}H_{27}N_3O_2$ Exact Mass: 641.21 found for 641.25 [M+H]

Synthesis Example 33: Synthesis of Compound D-3

[Reaction Scheme 35]

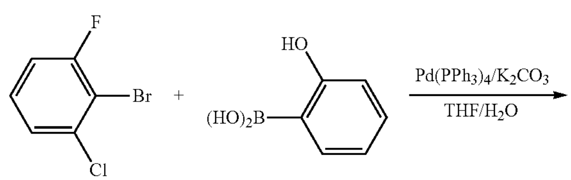

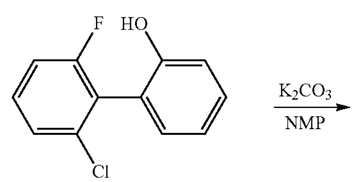

D-3-1

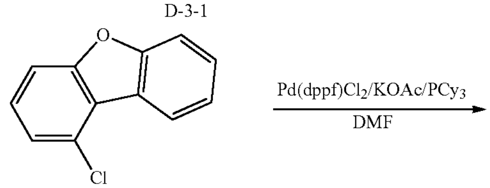

D-3-2

-continued

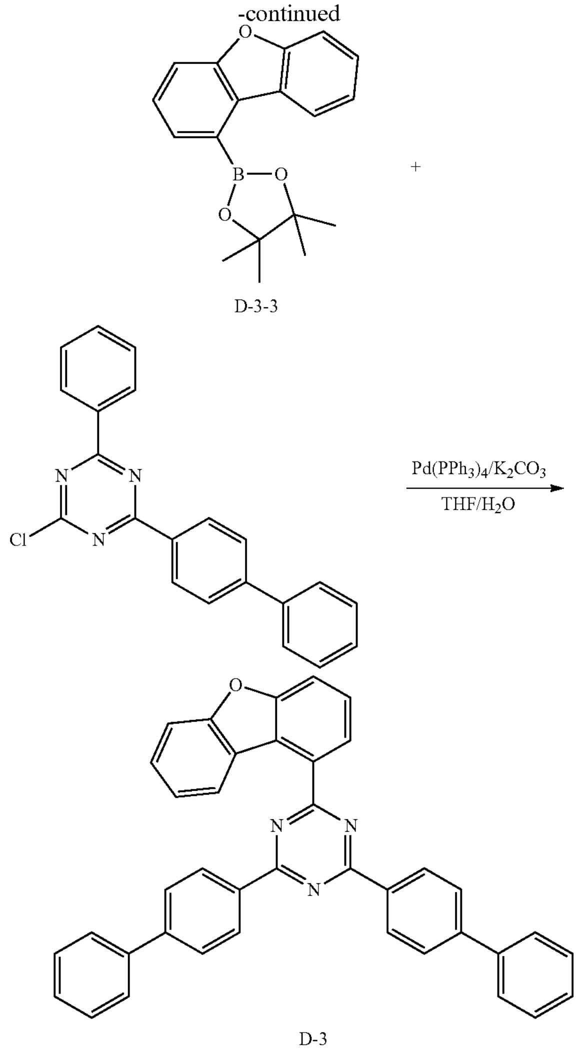

a) Synthesis of Intermediate D-3-1

Intermediate D-3-1 was synthesized according to the same method as the a) of Synthesis Example 30 by using 2-bromo-1-chloro-3-fluoro-benzene and 2-hydroxyphenylboronic acid in each amount of 1.0 equivalent.

b) Synthesis of Intermediate D-3-2

Intermediate D-3-2 was synthesized according to the same method as the c) of Synthesis Example 32 by using Intermediate D-3-1 and $K_2CO_3$ in an equivalent ratio of 1:1.5.

c) Synthesis of Intermediate D-3-3

Intermediate D-3-3 was synthesized according to the same method as the f) of Synthesis Example 32 by using Intermediate D-3-2 and bis(pinacolato)diboron in an equivalent ratio of 1:1.2.

d) Synthesis of Compound D-3

Compound D-3 was synthesized according to the same method as the b) of Synthesis Example 22 by using Intermediate D-3-3 and 2,4-bis([1,1'-biphenyl]-4-yl)-6-chloro-1,3,5-triazine in each amount of 1.0 equivalent.

LC/MS calculated for: $C_{39}H_{25}N_3O$ Exact Mass: 551.20 found for 551.24 [M+H]

(Manufacture of Organic Light Emitting Diode)

Example 1

A glass substrate coated with ITO (indium tin oxide) as a 1500 Å-thick thin film was washed with distilled water. After washing with the distilled water, the glass substrate was ultrasonic wave-washed with a solvent such as isopropyl alcohol, acetone, methanol, and the like and dried and then, moved to a plasma cleaner, cleaned by using oxygen plasma for 10 minutes, and moved to a vacuum depositor. This obtained ITO transparent electrode was used as an anode, Compound A was vacuum-deposited on the ITO substrate to form a 700 Å-thick hole injection layer, Compound B was deposited to be 50 Å thick on the injection layer, and Compound C was deposited to be 700 Å thick to form a hole transport layer. On the hole transport layer, a 400 Å-thick hole transport auxiliary layer was formed by depositing Compound C-1. On the hole transport auxiliary layer, a 400 Å-thick light emitting layer was formed by vacuum-depositing Compounds A-52 and B-135 as a host simultaneously and 2 wt % of $[Ir(piq)_2acac]$ as a dopant. Herein Compound A-52 and Compound B-135 were used in a weight ratio of 7:3, and their ratio in the following Examples was separately provided. Subsequently, on the light emitting layer, a 300 Å-thick electron transport layer was formed by simultaneously vacuum-depositing the compound D and Liq in a ratio of 1:1, and on the electron transport layer, Liq and Al were sequentially vacuum-deposited to be 15 Å thick and 1200 Å thick, manufacturing an organic light emitting diode.

The organic light emitting diode had a five-layered organic thin layer, and specifically the following structure.

ITO/Compound A (700 Å)/Compound B (50 Å)/Compound C (700 Å)/Compound C-1 (400 Å)/EML[Compound A-52: B-135: $[Ir(piq)_2acac]$ (2 wt %)] (400 Å)/Compound D: Liq (300 Å)/Liq (15 Å)/Al (1200 Å).

Compound A: N4,N4'-diphenyl-N4,N4'-bis(9-phenyl-9H-carbazol-3-yl)biphenyl-4,4'-diamine Compound B: 1,4,5,8,9,11-hexaazatriphenylene-hexacarbonitrile (HAT-CN)

Compound C: N-(biphenyl-4-yl)-9,9-dimethyl-N-(4-(9-phenyl-9H-carbazol-3-yl)phenyl)-9H-fluoren-2-amine Compound C-1: N,N-di([1,1'-biphenyl]-4-yl)-7,7-dimethyl-7H-fluoreno[4,3-b]benzofuran-10-amine Compound D: 8-(4-(4,6-di(naphthalen-2-yl)-1,3,5-triazin-2-yl)phenyl)quinoline Examples 2 to Example 16, Comparative Example 1 and Comparative Example 2

Each organic light emitting diode was manufactured according to the same method as Example 1 except for changing compositions as shown in Table 1.

Evaluation

Power efficiency of the organic light emitting diodes according to Examples 1 to 16 and Comparative Examples 1 and 2 was evaluated.

Specific measurement methods are as follows, and the results are shown in Table 1.

(1) Measurement of Current Density Change Depending on Voltage Change

The obtained organic light emitting diodes were measured regarding a current value flowing in the unit device, while increasing the voltage from 0 V to 10 V using a current-voltage meter (Keithley 2400), and the measured current value was divided by area to provide the results.

(2) Measurement of Luminance Change Depending on Voltage Change

Luminance was measured by using a luminance meter (Minolta Cs-1000A), while the voltage of the organic light emitting diodes was increased from 0 V to 10 V.

(3) Measurement of Power Efficiency

Power efficiency (cd/A) at the same current density (10 $mA/cm^2$) were calculated by using the luminance, current density, and voltages (V) from the items (1) and (2).

(4) Measurement of Life-Span

The results were obtained by measuring a time when current efficiency (cd/A) was decreased down to 97%, while luminance ($cd/m^2$) was maintained to be 9000 $cd/m^2$.

(5) Measurement of Driving Voltage

A driving voltage of each diode was measured using a current-voltage meter (Keithley 2400) at 15 $mA/cm^2$.

TABLE 1

| | First host | Second host | First host: Second host ratio (wt:wt) | Color | Power efficiency (cd/A) | Driving voltage (V) | Life-span T97 (h) |
|---|---|---|---|---|---|---|---|
| Example 1 | A-52 | B-135 | 7:3 | red | 21.7 | 3.96 | 100 |
| Example 2 | A-54 | B-135 | 6:4 | red | 22.1 | 3.92 | 95 |
| Example 3 | A-56 | B-135 | 6:4 | red | 22.4 | 3.80 | 80 |
| Example 4 | A-59 | B-135 | 7:3 | red | 22.1 | 3.81 | 106 |
| Example 5 | A-82 | B-135 | 7:3 | red | 23.6 | 3.94 | 70 |
| Example 6 | A-93 | B-133 | 7:3 | red | 21.9 | 3.96 | 130 |
| Example 7 | A-93 | B-133 | 6:4 | red | 22.3 | 3.86 | 110 |
| Example 8 | A-93 | B-135 | 7:3 | red | 23.0 | 3.94 | 140 |
| Example 9 | A-93 | B-135 | 6:4 | red | 23.4 | 3.90 | 120 |
| Example 10 | A-94 | B-3 | 7:3 | red | 22.0 | 3.97 | 95 |
| Example 11 | A-94 | B-20 | 7:3 | red | 22.2 | 3.97 | 100 |
| Example 12 | A-94 | B-133 | 7:3 | red | 21.8 | 3.92 | 138 |
| Example 13 | A-94 | B-133 | 6:4 | red | 21.9 | 3.89 | 145 |
| Example 14 | A-94 | B-135 | 7:3 | red | 22.5 | 3.95 | 150 |
| Example 15 | A-94 | B-135 | 6:4 | red | 21.8 | 3.84 | 150 |
| Example 16 | A-94 | D-3 | 7:3 | red | 21.5 | 3.84 | 100 |
| Comparative Example 1 | V-1 | B-20 | 5:5 | red | 15.6 | 4.77 | 4 |
| Comparative Example 2 | V-2 | B-20 | 5:5 | red | 19.0 | 4.1 | 34 |

Referring to Table 1, organic light emitting diodes according to Examples 1 to 16 exhibited remarkably improved driving voltage, efficiency, and life-span compared with those of Comparative Examples 1 and 2.

While this invention has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

The invention claimed is:

1. A composition for an organic optoelectronic device, comprising:

a first compound for an organic optoelectronic device represented by Chemical Formula 1E, and a second compound for an organic optoelectronic device represented by Chemical Formula 3A-1 or Chemical Formula 3B-1:

[Chemical Formula 1E]

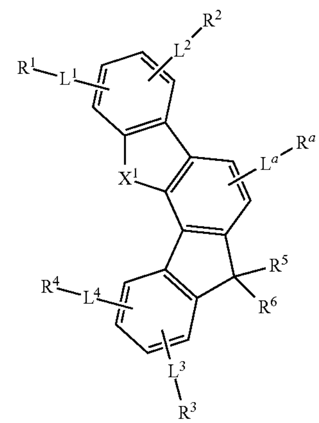

wherein, in Chemical Formula 1E, $X^1$ is O or S, $L^a$ and $L^1$ to $L^4$ are independently a single bond or a substituted or unsubstituted phenylene group, $R^a$ and $R^1$ to $R^4$ are independently hydrogen, deuterium, a cyano group, a substituted or unsubstituted amine group, or a substituted or unsubstituted C1 to C10 alkyl group, $R^5$ and $R^6$ are independently a substituted or unsubstituted C1 to C4 alkyl group or a substituted or unsubstituted C6 to C12 aryl group, and at least one of $R^1$ to $R^4$ is a group represented by Chemical Formula a,

[Chemical Formula a]

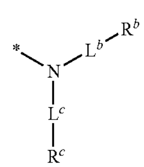

wherein, in Chemical Formula a, $L^b$ and $L^c$ are independently a single bond, a substituted or unsubstituted phenylene group, or a substituted or unsubstituted biphenylene group, $R_b$ and $R^c$ are independently a substituted or unsubstituted phenyl group, a substituted or unsubstituted biphenyl group, a substituted or unsubstituted naphthyl group, a substituted or unsubstituted fluorenyl group, a substituted or unsubstituted carbazolyl group, a substituted or unsubstituted dibenzofuranyl group, a substituted or unsubstituted dibenzothiophenyl group, or a fused ring represented by Chemical Formula 1E,

* is a linking point with $L^1$ to $L^4$,

[Chemical Formula 3A-1]

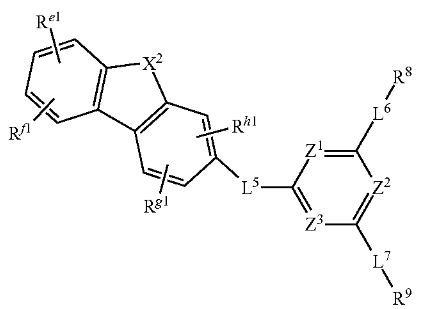

wherein, in Chemical Formula 3A-1, $Z^1$ to $Z^3$ are independently N, $L^5$ is a single bond, $L^6$ and $L^7$ are independently a single bond, a substituted or unsubstituted phenylene group, a substituted or unsubstituted biphenylene group, a substituted or unsubstituted terphenylene group, or a substituted or unsubstituted naphthylene group, $R^8$ and $R^9$ are independently a substituted or unsubstituted phenyl group, a substituted or unsubstituted biphenyl group, a substituted or unsubstituted terphenyl group, a substituted or unsubstituted quaterphenyl group, or a substituted or unsubstituted naphthyl group, $X^2$ is O or S, at least one of $L^6$, $L^7$, $R^8$, and $R^9$ is a substituted or unsubstituted naphthyl group or a substituted or unsubstituted naphthylene group, and $R^{cl}$, $R^{f1}$, $R^{g1}$, and $R^{h1}$ are independently hydrogen, deuterium, or a phenyl group,

[Chemical Formula 3B-1]

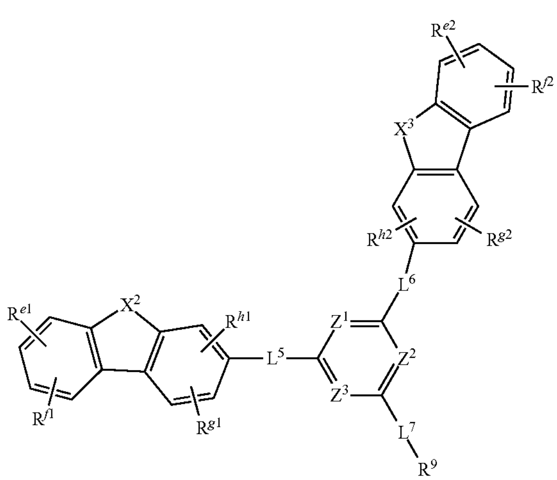

wherein, in Chemical Formula 3B-1, $Z^1$ to $Z^3$ are independently N, $L^5$ is a single bond, $L^6$ is a substituted or unsubstituted phenylene group, a substituted or unsubstituted biphenylene group, a substituted or unsubstituted terphenylene group or a substituted or unsubstituted naphthylene group, $L^7$ is a single bond, a substituted or unsubstituted phenylene group, a substituted or unsubstituted biphenylene group, a substituted or unsubstituted terphenylene group, or a substituted or unsubstituted naphthylene group, $R^9$ is a substituted or unsubstituted phenyl group, a substituted or unsubstituted biphenyl group, a substituted or unsubstituted terphenyl group, a substituted or unsubstituted quaterphenyl group, or a substituted or unsubstituted naphthyl group, at least one of $L^7$ and $R^9$ is a substituted or unsubstituted naphthyl group or a substituted or unsubstituted naphthylene group, $X^2$ and $X^3$ are independently O or S, and $R^{cl}$, $R^{c2}$, $R^{f1}$, $R^{f2}$, $R^{g1}$, $R^{g2}$, $R^{h1}$ and $R^{h2}$ are independently hydrogen, deuterium, or a phenyl group.

2. The composition for an organic optoelectronic device of claim 1, wherein the first compound for an organic optoelectronic device is represented by Chemical Formula 1E-1-1 or Chemical Formula 1E-2-2:

[Chemical Formula 1E-1-1]

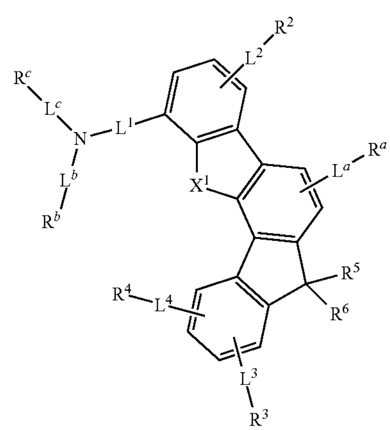

[Chemical Formula 1E-2-2]

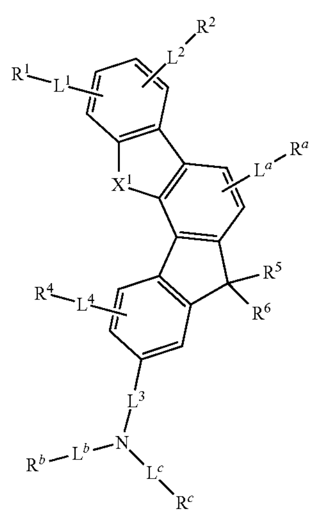

wherein, in Chemical Formula 1E-1-1 and Chemical Formula 1E-2-2, $X^1$ is O or S, $L^a$ and $L^1$ to $L^4$ are independently a single bond or a substituted or unsubstituted phenylene group, $R^a$ and $R^1$ to $R^4$ are independently hydrogen, deuterium, a cyano group, or a substituted or unsubstituted C1 to C10 alkyl group, $R^5$ and $R^6$ are independently a substituted or unsubstituted C1 to C4 alkyl group or a substituted or unsubstituted C6 to C12 aryl group, $L^b$ and $L^c$ are independently a single bond, a substituted or unsubstituted phenylene group, or a substituted or unsubstituted biphenylene group, and $R^b$ and $R^c$ are independently a substituted or unsubstituted phenyl group, a substituted or unsubstituted biphenyl group, a substituted or unsubstituted terphenyl group, a substituted or unsubstituted anthracenyl group, a substituted or unsubstituted naphthyl group, a substituted or unsubstituted phenanthrenyl group, a substituted or unsubstituted triphenylene group, a substituted or unsubstituted fluorenyl group, a substituted or unsubstituted carbazolyl group, a substituted or unsubstituted dibenzofuranyl group, a substituted or unsubstituted dibenzothiophenyl group, or a fused ring represented by Chemical Formula 1E.

3. The composition for an organic optoelectronic device of claim 1, wherein the first compound for an organic optoelectronic device is represented by Chemical Formula 1E-2-2,

[Chemical Formula 1E-2-2]

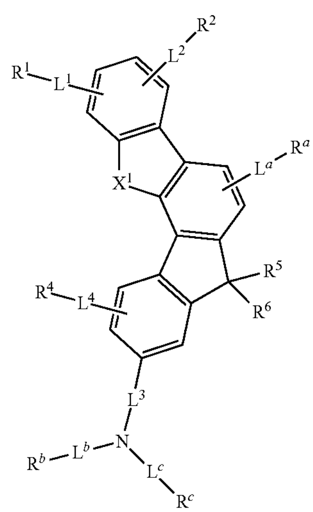

wherein, in Chemical Formula 1E-2-2, $X^1$ is O or S, $L^a$ and $L^1$ to $L^4$ are independently a single bond or a substituted or unsubstituted phenylene group, $L^b$ and $L^c$ are independently a single bond, a substituted or unsubstituted phenylene group, or a substituted or unsubstituted biphenylene group, $R^a$, $R^1$, $R^2$, and $R^4$ are independently hydrogen, deuterium, a cyano group, or a substituted or unsubstituted C1 to C10 alkyl group, and $R^b$ and $R^c$ are independently a substituted or unsubstituted phenyl group, a substituted or unsubstituted biphenyl group, a substituted or unsubstituted anthracenyl group, a substituted or unsubstituted naphthyl group, a substituted or unsubstituted phenanthrenyl group, a substituted or unsubstituted triphenylene group, a substituted or unsubstituted fluorenyl group, a substituted or unsubstituted carbazolyl group, a substituted or unsubstituted dibenzofuranyl group, a substituted or unsubstituted dibenzothiophenyl group, or a fused ring represented by Chemical Formula 1E.

4. The composition for an organic optoelectronic device of claim 1, further comprising a dopant.

5. An organic optoelectronic device, comprising:

an anode and a cathode facing each other, at least one organic layer disposed between the anode and the cathode, wherein the organic layer comprises the composition for an organic optoelectronic device of claim 1.

6. The organic optoelectronic device of claim 5, wherein:

the organic layer comprises a light emitting layer, and the light emitting layer comprises the composition for an organic optoelectronic device.

7. The organic optoelectronic device of claim 6, wherein the first compound for an organic optoelectronic device and the second compound for an organic optoelectronic device are each a phosphorescent host of the light emitting layer.

8. The organic optoelectronic device of claim 5, wherein the composition for an organic optoelectronic device is a red light emitting composition.

9. A display device comprising the organic optoelectronic device of claim 5.

* * * * *